(12) United States Patent
Arai et al.

(10) Patent No.: US 7,851,777 B2
(45) Date of Patent: Dec. 14, 2010

(54) MEMORY DEVICE INCLUDING RESISTANCE-CHANGING FUNCTION BODY

(75) Inventors: Nobutoshi Arai, Nara (JP); Hiroshi Iwata, Nara (JP); Seizo Kakimoto, Nara (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 0 days.

(21) Appl. No.: 12/271,837

(22) Filed: Nov. 14, 2008

(65) Prior Publication Data

US 2009/0085025 A1 Apr. 2, 2009

Related U.S. Application Data

(62) Division of application No. 10/528,052, filed on Nov. 1, 2005, now Pat. No. 7,462,857.

(51) Int. Cl.
H01L 29/02 (2006.01)
(52) U.S. Cl. .............. 257/2; 257/3; 257/4; 257/5; 257/E29.002; 438/102; 438/103; 365/163
(58) Field of Classification Search ............. 257/1–5, 257/E29.002; 438/102–103; 365/163
See application file for complete search history.

(56) References Cited

U.S. PATENT DOCUMENTS

| | | | |
|---|---|---|---|
| 3,719,933 A | | 3/1973 | Wakabayashi et al. |
| 5,731,598 A | * | 3/1998 | Kado et al. ............. 257/30 |
| 6,057,556 A | | 5/2000 | Gubin et al. |
| 6,060,743 A | | 5/2000 | Sugiyama et al. |
| 6,541,859 B1 | | 4/2003 | Forbes et al. |
| 6,548,825 B1 | | 4/2003 | Yoshii et al. |
| 6,861,674 B2 | | 3/2005 | Perlo et al. |
| 7,030,456 B2 | | 4/2006 | Arai et al. |
| 2002/0153556 A1 | * | 10/2002 | Rumennik et al. ......... 257/325 |
| 2002/0163831 A1 | | 11/2002 | Krieger et al. |
| 2003/0137869 A1 | * | 7/2003 | Kozicki ................. 365/158 |
| 2004/0161888 A1 | | 8/2004 | Rinerson et al. |
| 2005/0151127 A1 | | 7/2005 | Iwata et al. |

FOREIGN PATENT DOCUMENTS

| | | |
|---|---|---|
| EP | 0 750 353 A2 | 12/1996 |
| JP | 2000-22005 A | 1/2000 |
| JP | 2001-313342 A | 11/2001 |
| JP | 2002-252290 A | 9/2002 |
| WO | WO-02/067320 A1 | 8/2002 |

* cited by examiner

*Primary Examiner*—Bradley K Smith
*Assistant Examiner*—Jami M Valentine
(74) *Attorney, Agent, or Firm*—Birch, Stewart, Kolasch & Birch, LLP

(57) ABSTRACT

A resistance-changing function body includes an object made of a first substance and interposed between a first electrode and a second electrode, and a plurality of particles made of a second substance and arranged within the object so that an electrical resistance between the first electrode and the second electrode is changed before and after application of a specified voltage to between the first electrode and the second electrode. The first substance makes an electrical barrier against the second substance. With this constitution, by applying a specified voltage to between the first electrode and the second electrode, the electrical resistance can be changed depending on a state of the particles made of the second substance. Also, by virtue of a simple structure, a resistance-changing function body of small size is provided with low cost.

32 Claims, 64 Drawing Sheets

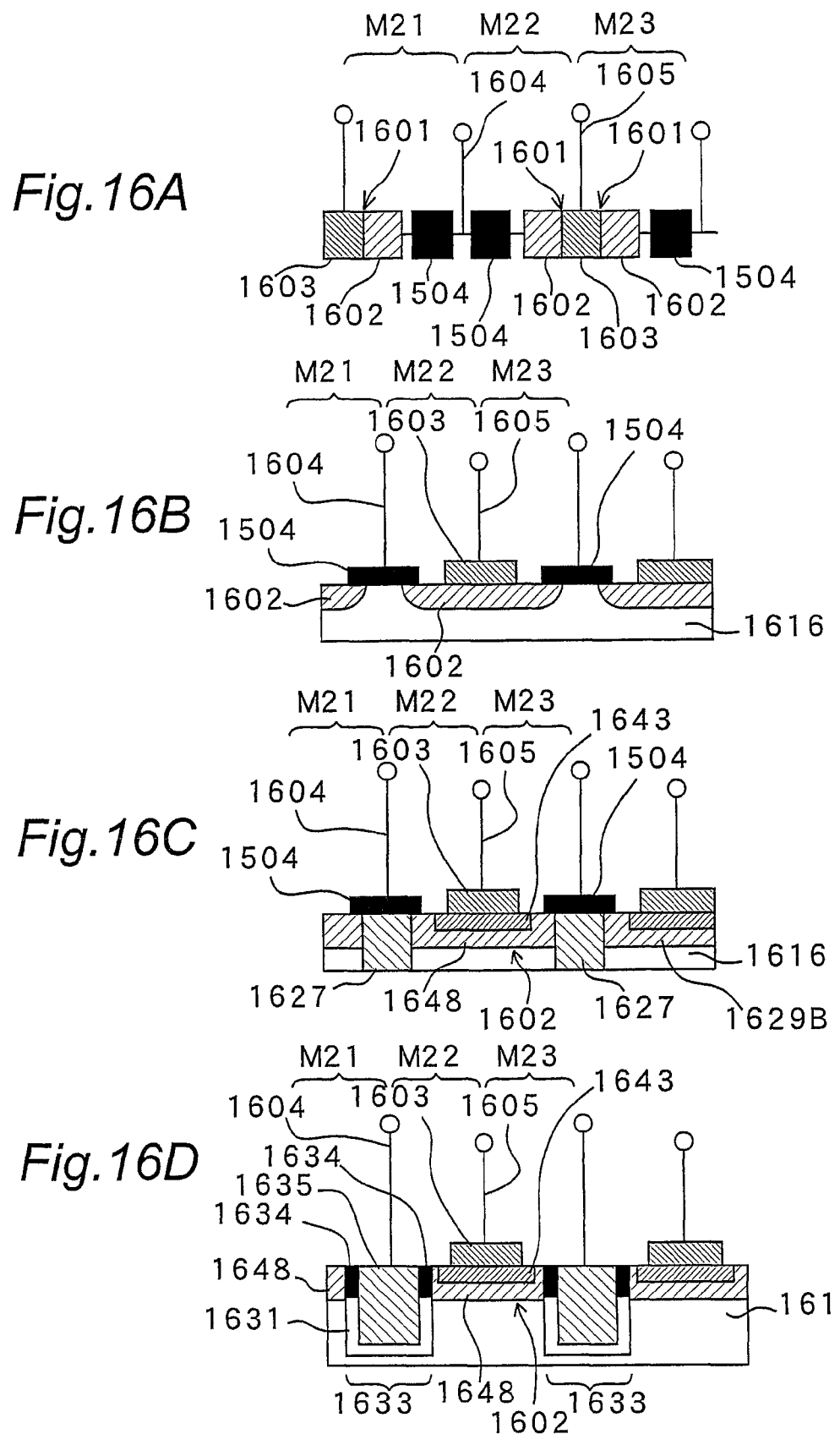

- 2113
- 2112
- 2111
- 2352
- 2353
- 2109
- 2108
- 2107
- 2352
- 2353
- 2105
- 2104
- 2103
- 2352
- 2353
- 2101

- 2113
- 2112
- 2111
- 2352
- 2353
- 2109
- 2108
- 2107
- 2352
- 2353
- 2105
- 2104
- 2103
- 2352
- 2353
- 2101

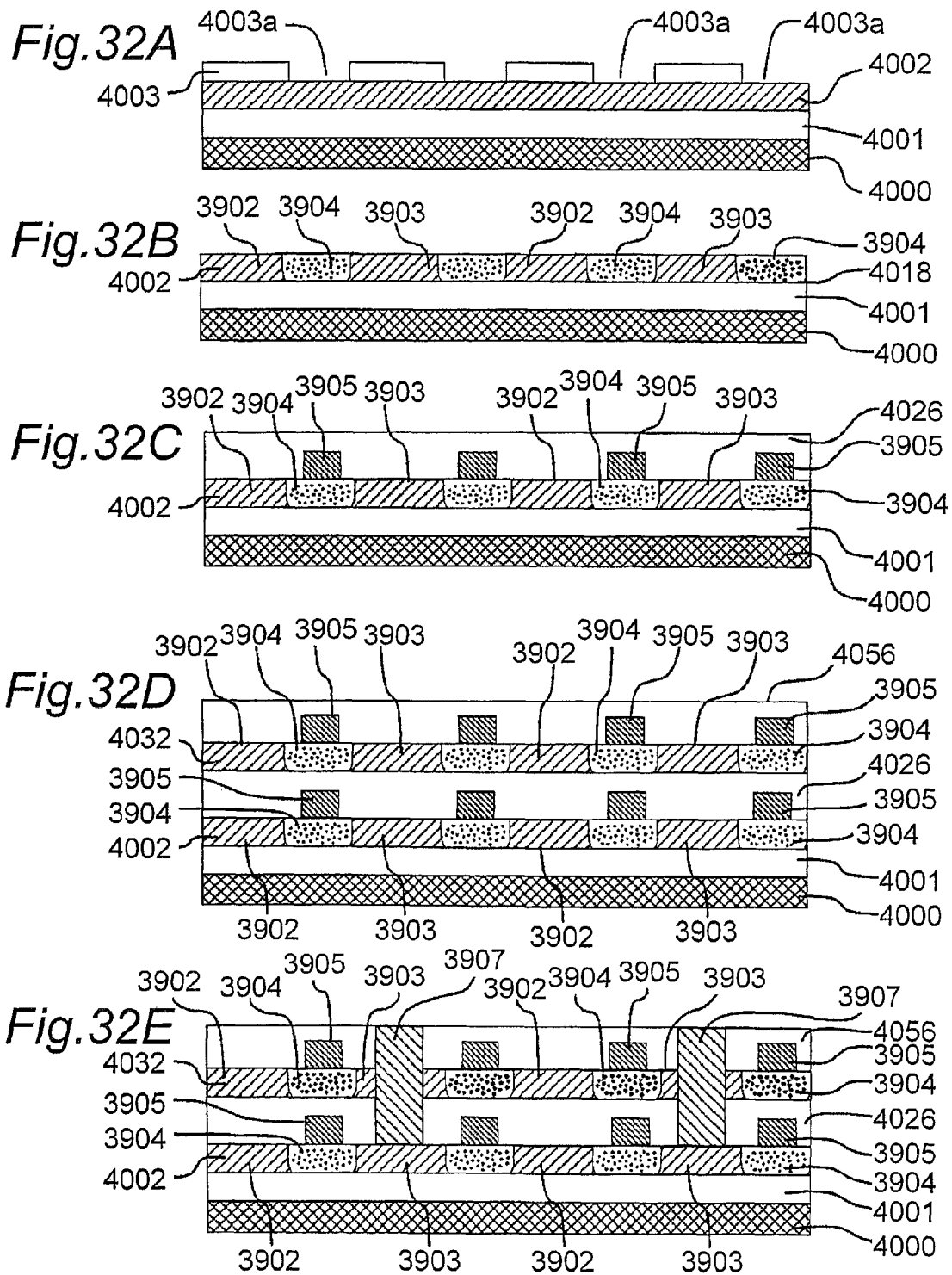

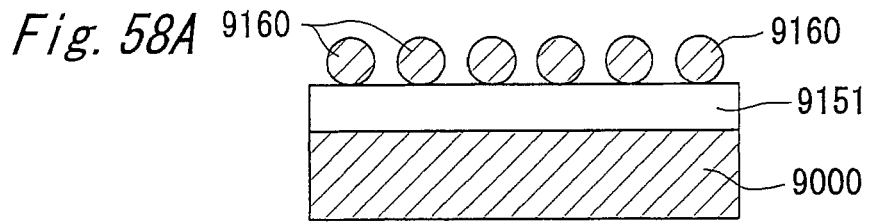
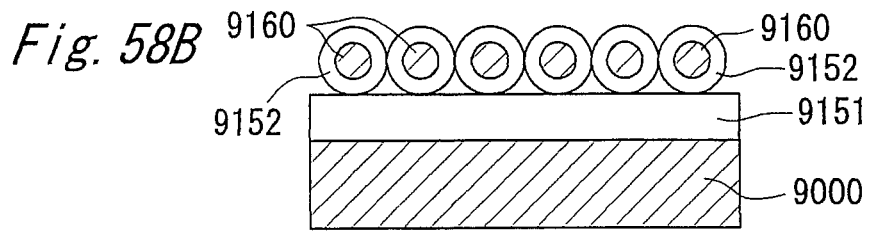
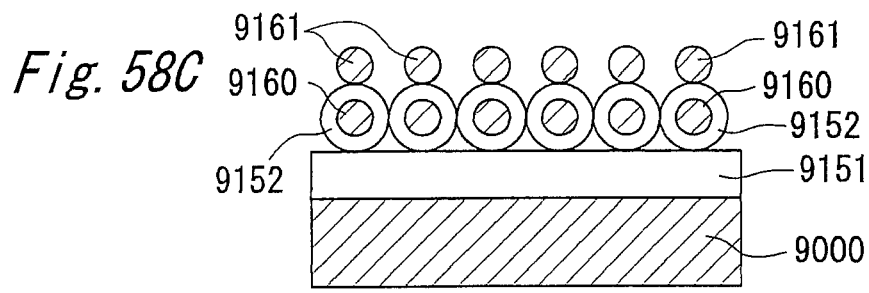
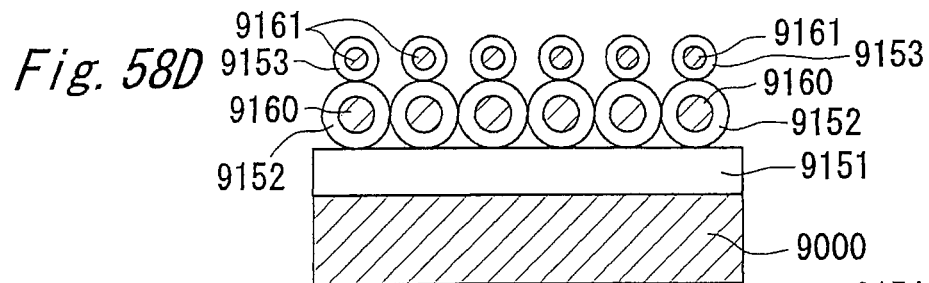
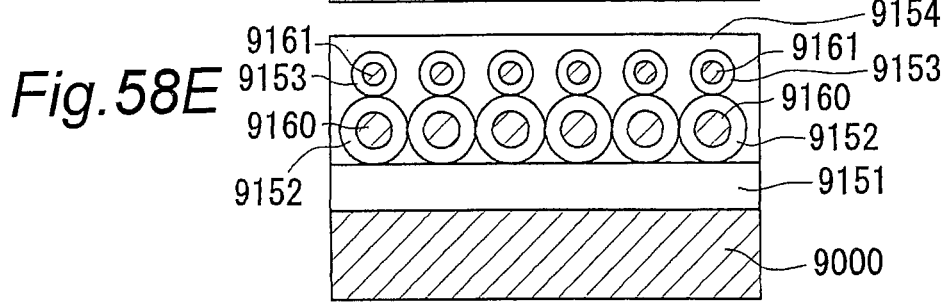
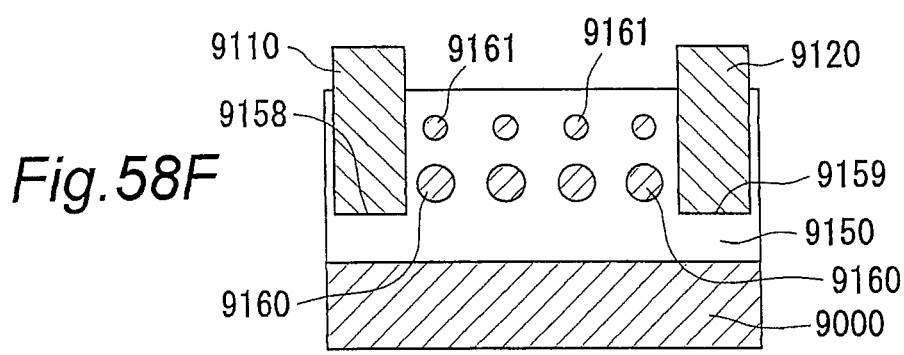

7,851,777 B2

MEMORY DEVICE INCLUDING RESISTANCE-CHANGING FUNCTION BODY

CROSS-REFERENCE

This application is a Divisional of Application Ser. No. 10/528,052 filed on Nov. 1, 2005, now U.S. Pat. No. 7,462,857 which claims priority of Japanese Application Nos. 2002-273370 and 2002-273384, filed Sep. 19, 2002, the entire contents of which are hereby incorporated by reference and for which priority is claimed under 35 U.S.C. §120.

TECHNICAL FIELD

The present invention relates to a resistance-changing function body including a plurality of fine particles and a manufacturing method therefor. The invention also relates to memories, circuits and electronic equipment having such a resistance-changing function body.

It is noted that the terms "resistance-changing function body" refer to a device or element that changes in electrical resistance after application of a voltage. Typically, the resistance-changing function body has a plurality of electrically conductive fine particles contained in a dielectric. Since such a resistance-changing function body is capable of being operated as a memory function body having a memory effect, the terms "resistance-changing function body" and the terms "memory function body" will be used herein as appropriate, where the former is a concept containing the latter unless the case is apparently different in the following description.

BACKGROUND ART

In recent years, with the use of nanometer-size particles, there have been proposed ultramicro electronic devices such as single-electron transistors, single-electron memories, and memories in which fine particles called nanodots or nanocrystals are contained in the gate insulator. Memories of this kind are expected to operate with low power consumption by taking advantage of a quantum size effect of Coulomb blockade phenomenon or the like.

However, conventional single-electron transistors or single-electron memories are difficult to integrate because very fine processing is required to fabricate a nanosize dot capable of storing just one or several electrons and to detect a flow of several electrons. Moreover, in many cases, there has been a need for keeping the memories or the like at extremely low temperature in order to suppress the occurrence of malfunctions due to thermal fluctuations. Therefore, memory devices utilizing the Coulomb blockade phenomenon or the like lack practicability and stay at an experimental level.

As shown in FIG. 62, a conventional memory device that employs particles in its floating gate has, on a channel region located between source and drain regions 2806 formed in a p-type silicon substrate 2801, its components including an oxide film 2802 that has a thickness of 2 nm and is formed by thermal oxidation, silicon particles 2803 that have a particle size of 5 nm and are formed on the oxide film, an oxide film 2804 formed so as to cover the silicon particles and a polysilicon layer 2805 that serves as a gate electrode.

As a method for forming the silicon particles 2803 in an insulation film, there is proposed a method for depositing amorphous silicon on the silicon thermal oxidation film 2802 by an LPCVD (Low-Pressure Chemical Vapor Deposition) apparatus, thereafter forming the silicon particles 2803 through an annealing process and further depositing the silicon oxide film 2804 on the silicon particles 2803 by a CVD (Chemical Vapor Deposition) process (see, e.g., JP 2000-22005 A).

As a method for forming particles as shown above, there are proposed a method for forming crystals on a substrate by using CVD, evaporation, MBE (Molecular Beam Epitaxy) or the like and a method for forming a thin film and thereafter using etching or other fine processing technique. In such methods, after particles are formed, an insulator layer is stacked on the particles.

With memory devices of this kind, it is often the case that the surface density of particles is insufficient or that the scale-down of the particle size is insufficient. As a result, there are disadvantages such as narrow memory windows, larger variations and poor retention characteristics.

With the method of forming the particles by using the CVD, evaporation, MBE and so on, the particles can be formed only on one surface through one-time process in order to raise the surface density. Therefore, it has been the case that similar process needs to be repeated many times.

Also, with the method of using the fine processing technique of photolithography, etching and the like, it is extremely difficult to reduce both particle size and particle-to-particle distance to the nanometer order at the same time.

Meanwhile, there have not yet been known any resistor devices in which a multiplicity of conductive particles, which are fabricated at once, are nanometer-size particles (nanodots) superior in thermal stability.

DISCLOSURE OF THE INVENTION

Accordingly, an object of the present invention is to provide a resistance-changing function body which includes a plurality of particles and which changes in electrical resistance after voltage application and yet which has practicability.

Another object of the present invention is to provide a resistance-changing function body manufacturing method capable of manufacturing such a resistance-changing function body with high productivity.

Still another object of the present invention is to provide memories, circuits and electronic equipment provided with such a resistance-changing function body.

In order to achieve the above objects, according to the present invention, there is provided a resistance-changing function body comprising:

an object made of a first substance and interposed between a first electrode and a second electrode; and a plurality of particles made of a second substance and arranged within the object so that an electrical resistance between the first electrode and the second electrode is changed before and after application of a specified voltage to between the first electrode and the second electrode, wherein the first substance makes an electrical barrier against the second substance.

With this constitution, when a specified voltage is applied to between the first electrode and the second electrode, the electrical resistance between the first electrode and the second electrode is changed depending on the state of the plurality of particles made of the second substance. That is, the electrical resistance can be controlled electrically. Also, since the first substance makes an electrical barrier against the second substance, the electrical resistance can be changed chiefly depending on the state of the particles made of the second substance. Further, since the structure is such a simple one that particles made of the second substance are contained in the object made of the first substance, the resistance-changing function body is fabricated so as to be small in size and low in cost. Thus, there can be provided a resistance-changing function body having practicability.

In one embodiment of the resistance-changing function body, the object made of the first substance is an insulator, and the particles made of the second substance are electrically conductive particles.

In other words, this resistance-changing function body comprises:

an insulator interposed between a first electrode and a second electrode; and a plurality of particles arranged within the insulator so that an electrical resistance between the first electrode and the second electrode is changed before and after application of a specified voltage to between the first electrode and the second electrode.

With this constitution, since the conductive particles are placed within the insulator, the possibility that a large current may flow upon application of a voltage to between the first electrode and the second electrode can be suppressed, so that power consumption can be suppressed. Also, by virtue of the use of conductive particles, the resistance-changing function body is excellent in electricity storability and electrical conductivity, thus allowing its state to be easily changed electrically. Accordingly, there is provided a resistance-changing function body that can change in resistance electrically with high efficiency.

It is noted here that the term "conductive particle" refers to a particle formed from a substance having electrical conductivity in a bulk state. Otherwise, it refers to a particle having a capability of storing at least one electric charge.

In one embodiment, in the resistance-changing function body described above, the conductive particles are distributed in the insulator so that the magnitude of a current flowing between the first electrode and the second electrode is changed due to the charge blocking effect and a storage state is discriminated according to the magnitude of the current.

With this constitution, by virtue of electric charges stored on the conductive particles, it becomes possible to exert an influence on the charges that form the current to thereby block the flow of a current. Therefore, the magnitude of the current can be changed depending on the presence or absence or amount of electric charges stored on the conductive particles. Also, since the conductive particles are distributed in the insulator, the electric charges stored on the particles are retained stably for long time. Therefore, the power necessary for retaining a storage state can be reduced, and lower power consumption becomes achievable. Thus, with the use of the resistance-changing function body, there can be fabricated a memory that discriminates a storage state depending on the magnitude of the current.

In one embodiment of the resistance-changing function body, the conductive particles include those having particle sizes not less than 0.2 nm and less than 4 nm.

With this constitution, the magnitude of the current flowing through the resistance-changing function body can be largely changed. If the particles are too large or too small in size, there would occur functional deterioration due to an increase in necessary voltage or unstable characteristics. Too large a size of the particles would make it harder to scale down the resistance-changing function body.

According to the present invention, there is provided a memory having the resistance-changing function body, wherein a rectifying function body having a rectification effect is electrically connected in series with the resistance-changing function body so as to determine a direction of a current that flows through the resistance-changing function body.

With this constitution, the direction of the current flowing through the resistance-changing function body is limited to one direction by the rectifying function body. As a result, in an attempt to select and operate particular cells from among a plurality of cells each of which includes the resistance-changing function body and which are arranged in a matrix form, the possibility that a useless current flows through any non-select cell can be blocked by the rectifying function body. Therefore, selection of cells becomes easier to achieve.

Desirably, the rectifying function body has a Schottky junction. This Schottky junction can be fabricated by a junction of a metal and a semiconductor. Therefore, the junction can easily be manufactured by the existing semiconductor apparatus and is excellent in productivity.

Also, desirably, the rectifying function body has a pn junction. This pn junction can be fabricated by using a semiconductor. Therefore, the junction can easily be manufactured by the existing semiconductor apparatus and is excellent in productivity. Moreover, since the characteristics of the junction can easily be changed by adjusting the concentrations of the p-type semiconductor and the n-type semiconductor, the junction is excellent in versatility.

Also, desirably, the rectifying function body has a junction having a rectification effect, and at least one of substances that constitute this junction is made of continuous grain boundary silicon. In this case, there is no need for such a high temperature as in epitaxial growth in order to form the junction. Moreover, since the crystallinity is better than that of normal polysilicon, it becomes possible to increase the mobility and achieve high-speed operation.

In another aspect, according to the present invention, there is provided a memory having the resistance-changing function body, wherein a select transistor for selecting the resistance-changing function body is electrically connected in series with the resistance-changing function body.

With this constitution, the memory cell can be selected or nonselected by turning on or off the select transistor. Moreover, since the current can be prevented from flowing through the resistance-changing function body by turning off the select transistor, it is possible to prevent any change in the easiness of flow of the current through the resistance-changing function body. Therefore, a stable function can be maintained for a long time.

In another aspect, according to the present invention, there is provided a memory comprising at least two memory cells including the resistance-changing function body, wherein the objects made of the first substance in the two memory cells are integrally continuously formed, and of the two memory cells, one electrode of one memory cell and one electrode of the other memory cell are electrically connected to each other, and the other electrode of the one memory cell and the other electrode of the other memory cell are electrically isolated from each other.

In the memory of this invention, the objects made of the first substance of the two memory cells are integrally continuously formed. Moreover, one electrode of one memory cell and one electrode of the other memory cell of the two memory cells are electrically connected to each other. Therefore, no isolation region is required to be formed in comparison with the case where the two memory cells are independently formed, and therefore, the occupation area can be reduced. Since the other electrode of the one memory cell and the other electrode of the other memory cell are electrically isolated from each other, the two memory cells can operate independently of each other.

In another aspect, according to the present invention, there is provided a memory comprising at least five memory cells including the resistance-changing function body, a select transistor for selecting the resistance-changing function body and a rectifying function body for determining a direction of a current that flows through the resistance-changing function body, wherein each of the memory cells is connected between a bit line and a source line extended in a direction of column, and the select transistor of each of the memory cells is controlled by a word line extended in a direction of row, second and fourth cells are arranged mutually adjacently in the direction of row, and third and fifth cells are arranged mutually adjacently in the direction of column, with respect to a first cell of the five memory cells, the first cell and the second cell have a shared bit line, a shared word line and unshared source lines, the first cell and the third cell have a shared bit line, a shared source line and unshared word lines, the first cell and the fourth cell have a shared source line, a shared word line and unshared bit lines, and the first cell and the fifth cell have a shared word line, a source line of the first cell and a bit line of the fifth cell are shared, and a bit line of the first cell and a source line of the fifth cell are shared.

In the memory of this invention, the word line, the bit line and the source line can be largely shared, and the interconnections can be reduced. Therefore, a reduction in the occupation area becomes possible.

Also, desirably, at least two memory cells including the resistance-changing function body are arranged in a direction parallel to a substrate; and the objects made of the first substance of memory cells mutually adjacent in the direction parallel to the substrate are integrally continuously formed.

With this constitution, the process of separating the resistance-changing function body every cell can be eliminated, and therefore, the productivity is improved.

Desirably, at least two memory cells including the resistance-changing function body and a rectifying function body for determining a direction of a current that flows through the resistance-changing function body are arranged in a direction parallel to a substrate, and the objects made of the first substance and/or the rectifying function bodies of memory cells mutually adjacent in the direction parallel to the substrate are integrally continuously formed.

With this constitution, the process of separating the resistance-changing function body every cell can be eliminated, and therefore, the productivity is improved.

In one embodiment of the resistance-changing function body, a third electrode which allows a voltage to be applied to the object made of the first substance in a direction substantially perpendicular to a direction in which the first electrode and the second electrode are opposed to each other is adjacent to the object made of the first substance.

In other words, this resistance-changing function body comprises:

an object made of a first substance and interposed between a first electrode and a second electrode; and a plurality of particles made of a second substance and arranged within the object so that an electrical resistance between the first electrode and the second electrode is changed before and after application of a specified voltage to between the first electrode and the second electrode, wherein the first substance makes an electrical barrier against the second substance, and a third electrode which allows a voltage to be applied to the object made of the first substance in a direction substantially perpendicular to a direction in which the first electrode and the second electrode are opposed to each other is adjacent to the object made of the first substance.

Herein, the arrangement that the third electrode is "adjacent" to the resistance-changing function body includes the case where the third electrode is in direct contact with the object made of the first substance and the case where the contact is made via an insulation film. Also, the description, "allows a voltage to be applied" "in a direction substantially perpendicular to," refers to an arrangement that an electric line of force derived from the third electrode contains a component perpendicular to the direction in which the first electrode and the second electrode are opposed to each other, and preferably, an arrangement that most of directional components of the electric line of force is the perpendicular component.

The present inventor conducted experiments and discovered the fact that when a voltage was applied in the direction perpendicular to the direction in which the first electrode and the second electrode were opposed to each other by the third electrode, the magnitude of the current that flowed through the resistance-changing function body, i.e. through between the first electrode and the second electrode changed more largely. That is, the width of resistance change is increased, and the function is improved. Further, with the resistance-changing function body used as a memory function body, the width of the memory window (hysteresis) is increased, so that read errors in reading the storage state are reduced, and the reliability of the memory is improved.

In one embodiment of the resistance-changing function body, its electrical characteristics vary depending on whether the voltage applied to the third electrode is positive or negative.

That is, the resistance-changing function body has asymmetrical electrical characteristics with respect to the direction in which the third electrode faces.

As a result, it becomes possible to control the resistance of the resistance-changing function body depending on whether the voltage applied to the third electrode is positive or negative. Accordingly, without using ultraviolet irradiation or the like, it becomes easier to control the resistance depending on whether the voltage applied to the third electrode is positive or negative. Thus, there can be provided a resistance-changing function body which is electrically controllable, easy to use, and versatile. It also becomes easier to change the resistance electrically reversibly depending on the voltage applied to the third electrode or the state of the current. Thus, there can be provided a rewritable memory, which is capable of high-speed operation.

The electrical characteristics become asymmetrical if the average capacity of the particles is changed with respect to the direction in which the third electrode faces, for example, due to the reason that the particles closer to the third electrode are smaller in size and the particles farther from the third electrode are larger in size, or that the particles farther from the third electrode are smaller in size and the particles closer to the third electrode are larger in size.

In one embodiment of the resistance-changing function body, the plurality of particles include at least two kinds of particles, which are a relatively small particle and a relatively large particle.

With this constitution, the two kinds of particles can bear mutually different roles. Therefore, it becomes possible to avoid occurrence of any trade-off between performances of two functions as would occur in the case where one kind of particle is used to bear two functions. Thus, there can be provided a resistance-changing function body of good performance.

For example, with the particles divided into at least two kinds, which are particles intended mainly to have electric charges accumulated thereon and particles intended mainly to transfer electric charges to make a current flow therethrough, a stable operation of the resistance-changing function body becomes implementable. Further, with this resistance-changing function body used as a memory function body, it becomes possible to suppress any mis-write or mis-erase in reading operation, making it implementable to provide a nonvolatile or semi-nonvolatile memory.

In one embodiment of the resistance-changing function body, the particles are distributed uniformly with respect to a layer direction substantially parallel to the direction in which the first electrode and the second electrode are interconnected, and moreover the particles are distributed within a certain range with respect to a thickness direction perpendicular to the layer direction.

With this constitution, since the particles are distributed within a certain range with respect to the thickness direction, the possibilities that the current becomes excessively hard flowing or excessively easy flowing with respect to the thickness direction are suppressed. Accordingly, changes in the electrical resistance between the first electrode and the second electrode provided on opposite sides of the layer direction are stabilized. As a result, stable characteristics are obtained.

In one embodiment of the resistance-changing function body, concentration of an element constituting the particles is maximized in one position within the distribution and reduced away from the position in the thickness directions.

In one embodiment of the resistance-changing function body, density of the particles is maximized in one position within the distribution and reduced away from the position in the thickness directions.

In one embodiment of the resistance-changing function body, particle size of the particles is maximized in one position within the distribution and reduced away from the position in the thickness directions.

In these embodiments, the possibilities that the current becomes excessively hard flowing or excessively easy flowing with respect to the thickness direction are suppressed. Accordingly, stable characteristics are obtained.

In one embodiment of the resistance-changing function body, the particles include at least two kinds of particles, which are a relatively small particle and a relatively large particle, and an angle at which a straight line interconnecting the two particles intersects with a plane extending along the layer direction is not less than 45 degrees.

With this constitution, when a current is passed between the first electrode and the second electrode, the possibility that the current flows along both comparatively large particles and comparatively small particles can be suppressed. Also, the possibility that electric charge transfers between comparatively large particles and comparatively small particles can be suppressed. Accordingly, electric charge can be prevented from coming into and out of comparatively small particles while the current is flowing along comparatively large particles. Therefore, it becomes implementable to divide the particles into at least two kinds, which are particles intended mainly to have electric charges accumulated thereon and particles intended mainly to transfer electric charges to make a current flow therethrough. Thus, a stable operation of the resistance-changing function body becomes implementable. Further, with this resistance-changing function body used as a memory function body, it becomes possible to suppress any mis-write or mis-erase in reading operation, making it implementable to provide a nonvolatile or semi-nonvolatile memory.

In one embodiment of the resistance-changing function body, the distribution of particle sizes of the particles is asymmetrical between opposite sides of the position at which the particle size is maximized with respect to the thickness direction.

With such a constitution, it can be arranged that particles of relatively uniform particle sizes are gathered along the layer direction while particles of different particle sizes are gathered along the thickness direction. Accordingly, electric charges are enabled to move smoothly toward the first electrode and the second electrode, while electric charges derived from the third electrode are more likely to be trapped by halfway particles. As a result, the resistance between the first electrode and the second electrode becomes smaller so that wasteful power consumption can be suppressed, so that electric charges can be prevented from flowing out from the third electrode and wasteful power consumption can be suppressed. Thus, electrical characteristics of the resistance-changing function body are improved.

For example, it is desirable that the particles closer to the third electrode are smaller in size and the particles farther from the third electrode are larger in size. Otherwise, it is desirable that the particles farther from the third electrode are smaller in size and the particles closer to the third electrode are larger in size.

Also, it is desirable that the particles closer to the third electrode are smaller in electric capacity and the particles farther from the third electrode are larger in electric capacity. Otherwise, it is desirable that the particles farther from the third electrode are smaller in electric capacity and the particles closer to the third electrode are larger in electric capacity. It is desirable that the average capacity of the particles is changed with respect to the direction in which the third electrode faces.

With such a constitution as described above, when a voltage is applied or a current is passed toward a direction generally perpendicular to the direction in which the first electrode and the second electrode are interconnected, the resistance of the resistance-changing function body can be changed more easily by the application direction or current direction. Thus, the resistance-changing function body can be operated efficiently, allowing a reduction in power consumption to be achieved.

In one embodiment of the resistance-changing function body, the object made of the first substance is an insulator, and film thickness of the insulator in the thickness direction is not less than 2 nm and less than 50 nm.

With such a constitution, since the film thickness of the insulator is less than 50 nm, the effect upon the application of a voltage to the third electrode becomes more remarkable. Accordingly, it becomes implementable to lower the voltage to be applied to the third electrode. Also, since the film thickness is not less than 2 nm, the possibility that electric charges are permitted to tunnel through from the particles to the third electrode or that the particles and the third electrode are short-circuited is suppressed. Thus, wasteful leakage currents can be suppressed and the power consumption can be reduced.

In another aspect, according to the present invention, there is provided a memory having the resistance-changing function body described above, wherein
the first electrode and the second electrode are diffusion regions, respectively, formed on a surface of a semiconductor substrate, and
the object made of the first substance is formed in a region located between the diffusion regions within the surface of the substrate.

In another aspect, according to the present invention, there is provided a memory having the resistance-changing function body, wherein
the first electrode and the second electrode are diffusion regions, respectively, formed on a surface of a semiconductor substrate,
the object made of the first substance is formed in a region located between the diffusion regions within the surface of the semiconductor substrate, and
the third electrode is provided on the object made of the first substance.

In one embodiment, in the memory described above, the first electrode and the second electrode are formed by replacing part of the substrate with a conductive substance.

With such a constitution, the resistance-changing function body can be formed into a structure close to a structure in which the resistance-changing function body is integrated in the channel portion of a MOS type transistor. In this case, since the structure bears a close resemblance to that of a logic transistor, its manufacture and circuit design can be fulfilled with low cost. Moreover, it becomes easy to consolidate the resistance-changing function body with a logic circuit. Further, a storage circuit can be made up with the resistance-changing function body used as a memory, which facilitates consolidation of a logic circuit and a storage circuit, allowing electronic equipment to be downsized.

Also, in another aspect, there is provided a memory having the resistance-changing function body, wherein
the first electrode and the second electrode are conductors, respectively, formed on a substrate,
the object made of the first substance is formed in a region interposed between the conductors, and
the third electrode is provided on the insulator.

With such a constitution, the resistance-changing function body has a structure nearly identical or close to a structure in which the resistance-changing function body is integrated into the insulation film portion of a MOS type transistor with a stacked diffusion layer lacking the source, drain and channel.

With such a constitution, the resistance-changing function body can be formed into a structure close to a structure in which the resistance-changing function body is integrated into the insulator portion of a TFT (thin film transistor). In this case, since the structure has a close resemblance to a logic transistor, its manufacture and circuit design can be fulfilled with low cost. Also, the resistance-changing function body can also be integrated into a logic circuit. Further, a storage circuit can be made up with the resistance-changing function body used as a memory. Therefore, it becomes easy to consolidate the memory with a logic circuit, allowing electronic equipment to be downsized. Moreover, it is also possible to form the memory function body on a glass substrate or organic substance.

In one embodiment of the resistance-changing function body, a fourth electrode is provided at a position confronting the third electrode with the object made of the first substance interposed therebetween,
the plurality of particles are so arranged that an electrical resistance between the first electrode and the second electrode is changed before and after application of a specified voltage to between the third electrode and the fourth electrode.

In other words, this resistance-changing function body comprises:
an object made of a first substance and interposed between a first electrode and a second electrode; and
a plurality of particles made of a second substance and arranged within the object so that an electrical resistance between the first electrode and the second electrode is changed before and after application of a specified voltage to between the first electrode and the second electrode, wherein
the first substance makes an electrical barrier against the second substance,
a third electrode which allows a voltage to be applied to the object made of the first substance in a direction perpendicular to a direction in which the first electrode and the second electrode are opposed to each other is adjacent to the object made of the first substance,
a fourth electrode is provided at a position confronting the third electrode with the object made of the first substance interposed therebetween, and wherein
the plurality of particles are arranged in such a manner that the electrical resistance between the first electrode and the second electrode is changed before and after application of a specified voltage to between the third electrode and the fourth electrode.

It was found that with such a constitution, the current flowing through between the first electrode and the second electrode is further largely changed when a voltage is applied to between the third electrode and the fourth electrode. It was also found that application time necessary for enough resistance change to occur can be shortened. That is, the width of resistance change is increased, or the speed of resistance change is increased, allowing the function to be improved. Further, with this resistance-changing function body used as a memory function body, the width of the memory window (hysteresis) is increased, so that read errors in reading the storage state are reduced, and the reliability of the memory is improved. Moreover, the operating speed is increased and the function is improved.

In another aspect, in the memory of this invention, at least two resistance-changing function bodies described above are stacked in a direction perpendicular to the substrate.

With such a constitution, at least two resistance-changing function bodies are stacked in a direction perpendicular to the substrate so as to be three-dimensionally integrated. Therefore, it is possible to largely reduce the effective occupation area and increase the memory capacity. When the resistance-changing function body is used as a memory function body, it becomes possible to increase the memory capacity.

Moreover, it is acceptable to constitute a random-access memory by arranging the aforementioned memories in a matrix form. In this case, since the structure becomes simple unlike the floating gate type memory, the structure is suitable for high integration and excellent in productivity. Also, a random-access memory which is compact and capable of low-voltage operation can be fulfilled.

According to the present invention, there is provided a method for manufacturing the resistance-changing function body, comprising a step of implanting the second substance for forming the particles into the object made of the first substance by a negative ion implantation method.

Desirably, the object made of the first substance is an insulator, and the particles made of the second substance are electrically conductive particles.

With such a method, the conductive particles can be formed by one-time negative ion implantation. Therefore, the resistance-changing function body can be fabricated with good productivity.

As a method for forming the conductive particles in the substance, there can be considered a method for depositing a conductive substance by CVD (Chemical Vapor Deposition), evaporation, MBE (Molecular Beam Epitaxy) and so on and carrying out heat treatment to form the conductive particles and a method for depositing a conductive thin film and using fine processing techniques of photolithography, etching and so on. However, using ion implantation is preferable. According to the ion implantation, the conductive particles can be formed in the substance to a high density in a short time through one-time processing, and moreover the conductive particles can easily be distributed in the thickness direction of the substance.

Accordingly, it is easily achievable to form the conductive particles in the substance to such a specified density (high density) that the resistance change is effectively developed or to distribute the conductive particles in the thickness direction of the insulator so that the resistance change is developed, where the productivity is good. Furthermore, according to the ion implantation, the fine processing techniques of photolithography, etching and so on are not required for the formation of the conductive particles. Therefore, the ion implantation is excellent in productivity.

Moreover, if conductive particles are formed in the insulator by the ion implantation as shown above, then the fabricated resistance-changing function body can easily be made to have a state in which the region where the concentration of the element that constitutes the conductive particles is low is present in adjacency to a region where the concentration of the element is high in the thickness direction of the substance. Moreover, the resistance-changing function body can easily be made to have a state in which a region where the density of the conductive particles is low is present in adjacency to a region where the density of the conductive particles is high in the thickness direction of the substance. Furthermore, the resistance-changing function body can easily be made to have a state in which the region where the size of the conductive particles is small is present in adjacency to the region where the size of the conductive particles is large in the thickness direction of the substance. With such a state, the characteristics of the resistance-changing function body are stabilized as already described.

Moreover, the substance for forming conductive particles is implanted by the negative ion implantation method, and therefore, the first substance and the substrate that supports the first substance can be restrained from being electrically charged during the implantation. Therefore, the implantation energy can be accurately controlled, and variations in implantation position can be suppressed. Moreover, since the electric charging is suppressed, the first substance can be prevented from being destroyed by the electrical charging and from causing defects. As a result of these, a resistance-changing function body of high reliability is formed.

In one embodiment, the method for manufacturing the resistance-changing function body includes the steps of forming the first electrode, the insulator and the second electrode so that these are arrayed in this order along the surface of the substrate, and implanting the substance for forming the conductive particles into the insulator by a negative ion implantation method.

Also, in one embodiment, the method for manufacturing the resistance-changing function body includes the steps of forming the insulator on the surface of the substrate, implanting the substance for forming the conductive particles in the insulator by a negative ion implantation method, and forming the first electrode and the second electrode in adjacency to opposite sides of the insulator, respectively.

Also, in one embodiment, the method for manufacturing the resistance-changing function body further includes the step of further forming a third electrode on the insulator.

Also, in one embodiment, the method for manufacturing the resistance-changing function body includes the steps of forming one of the third electrode and the fourth electrode in the resistance-changing function body, forming the insulator on the formed one electrode, and implanting the substance for forming the conductive particles in the insulator by a negative ion implantation method.

With this constitution, the substance for forming the conductive particles is implanted into the insulator formed on one of the third electrode and the fourth electrode by ion implantation. Accordingly, the conductive particles are distributed in the thickness direction of the insulator so that an electrical resistance between the third electrode and the fourth electrode is changed by a size effect. That is, the conductive particles that exhibit desired functions are formed in a short time with good productivity through one-time ion implantation.

One embodiment of the method for manufacturing the resistance-changing function comprises a step of carrying out hydrogen sintering after the negative ion implantation ends.

By doing this step, charge trapping factors other than particles of the interface state or the like are suppressed, so that the operating characteristics are stabilized and the reliability is improved.

Also, one embodiment of the method for manufacturing the resistance-changing function body comprises a step of carrying out heat treatment at a temperature of not lower than 500° C. after the negative ion implantation ends.

By doing this step, since defects in the insulator (first substance) can be reduced, electrical characteristics are improved with the characteristics stabilized, and the reliability is improved.

In another aspect, the memory of this invention includes the above-described resistance-changing function body.

In the memory of this invention, the memory is formed compact in comparison with conventional ones by virtue of the use of a resistance-changing function body that employs particles. This resistance-changing function body is operable on relatively low voltage.

Further, there can be obtained a nonvolatile memory which is high in productivity, excellent in leakage tolerance and capable of being scaled down.

The circuit of this invention has the above-described memory.

According to the circuit of this invention, since the memory can easily be scaled down, it becomes possible to reduce the occupation area of the circuit, allowing the circuit to be downsized.

Also, in the semiconductor device having the above-described circuit, by virtue of the use of cells that can be reduced in occupation area, the occupation area of the circuit can be reduced and formed smaller in size, as compared with conventional counterparts. The resistance-changing function body can be used as a memory and is operable on relatively low voltage. Therefore, a power source can be shared by a memory circuit that includes such a memory and a logic circuit or the like, and this facilitates the consolidation of the memory circuit with the logic circuit or the like. As a result, power consumption reduction becomes possible.

The electronic equipment of this invention includes the above-described circuit.

According to the electronic equipment of this invention, since the occupation area of the circuit needs to be only a small one, the electronic equipment can be downsized.

In the electronic equipment of this invention, the circuit is formed smaller in size, and so the equipment can be downsized. Also, since the circuit is low in power consumption, the serve life of the battery mounted on this equipment is prolonged. Accordingly, this electronic equipment is suitable for portable use.

In another aspect, according to the present invention, there is provided a resistance-changing function body comprising:
 a medium made of a first material and formed between a first conductor and a second conductor; and
 at least one conductive particle which is formed within the medium and which is covered with a second material and made of a third material, wherein
 the second material is a material serving as a barrier against passage of electric charges therethrough, and
 the third material is a material having a function of retaining electric charges.

In the resistance-changing function body of this invention, the particles made of the third material are covered with the second material. Therefore, the migration of electric charges between the particles and the medium made of the first material is suppressed. Therefore, the amount of electric charges retained in the particles less fluctuates for a long time. Therefore, with the resistance-changing function body used as a memory function body, its memory function becomes stable for a long time.

Herein, the "conductor" or "conductive substance" includes metals and semiconductors and also includes those made of an organic substance so long as it has conductivity. Moreover, the "particle" refers to a particle having a particle size (diameter) of smaller than 1 μm.

In one embodiment of the resistance-changing function body, the second material is obtained by compositionally changing or chemically modifying the third material.

In the resistance-changing function body of this one embodiment, the second material is obtained by compositionally changing or chemically modifying the third material. The interface between the second material and the third material is in a satisfactory state in which there is, for example, a comparatively small number of interface states, as compared with cases where the second material is other than those obtained by compositionally changing or chemically modifying the third material. Therefore, the particles made of the third material come to have a smaller leakage of the retained electric charges than in conventional memory devices. Thus, a memory function body capable of retaining electric charges for a longer time can be provided.

In one embodiment of the resistance-changing function body, the second material is obtained by oxidizing or nitriding the third material.

In the resistance-changing function body of this one embodiment, since the second material is obtained by oxidizing or nitriding the third material. Therefore, the resistance-changing function body can be manufactured by means of the existing oxidation furnace or the like widely used in the semiconductor industry. This therefore obviates the need for new manufacturing equipment for the resistance-changing function body and allows the reduction in the investment for the equipment and the obtainment of an inexpensive memory function body.

In another aspect, in the memory of this invention, a memory function body having a plurality of conductive particles contained in the insulator is interposed between the first electrode and the second electrode. The conductive particles are distributed in the insulator so that the magnitude of a current flowing through the memory function body is changed by the Coulomb blockade effect before and after application of a specified voltage to between the first electrode and the second electrode and a storage state is discriminated according to the magnitude of the current.

It is to be noted that the "conductive particle" means a particle that has conductivity in itself. Therefore, the "conductive particles" also include those made of a metal or semiconductor and further include those made of an organic substance so long as they have conductivity. Moreover, the "particle" means a particle that has a particle size smaller than 1 μm.

The "storage state" of the memory includes, for example, a written state corresponding to a logic 1 and an erased state corresponding to a logic 0.

In the memory of this invention, the magnitude of the current that flows through the memory function body is changed due to the Coulomb blockade effect before and after application of a specified voltage to between the first electrode and the second electrode by virtue of the plurality of conductive particles distributed in the insulator of the memory function body. That is, by applying a specified voltage (for write or erase) to between the first electrode and the second electrode for the flow of the current through the memory function body, one to several electric charges are accumulated on one conductive particle, and the accumulated electric charges exert Coulomb interaction on the electrons in a current path. Accordingly, the magnitude of the current flowing through the memory function body is changed depending on the presence or absence or amount of electric charges accumulated on the conductive particles. When a specified voltage (for read) is applied to between the first electrode and the second electrode, the storage state is discriminated according to the magnitude of the current that flows through the memory function body. In this memory, the magnitude of the current that flows through the memory function body can be changed by electrical control with a comparatively low voltage at normal temperature. Therefore, this memory has practicability.

In one embodiment, in the memory described above, a plurality of unit areas to each of which four conductive particles are present in the insulator so as to be adjacent to one another and spaced from one another. Of the four conductive particles, a first particle and a second particle are located closest to the first electrode and the second electrode, respectively, and the remaining third particle and the fourth particle are located between the first particle and the second particle with respect to the thickness direction of the insulator, respectively. In the resistance-changing function body of this one embodiment, if a distance between the first particle and the third particle is d13 and a distance between the second particle and the third particle is d23 and a distance between the first particle and the fourth particle is d14 and a distance between the second particle and the fourth particle 124 is d24, then relationships that d13<d14 and that d23<d24 are satisfied.

In the memory of this one embodiment, with a sufficient voltage difference given between the first electrode and the second electrode, a current mostly flows along a path through the first particle, the third particle and the second particle. In this case, by the charge stored on the fourth particle, it is enabled to exert the Coulomb interaction on the electrons in the current path through the first particle, the third particle and the second particle. Accordingly, the easiness of flow of the current, i.e. magnitude of the current, in the unit area can be changed according to the presence or absence or amount of the charge stored on the fourth particle. Since a plurality of such unit areas are present in the insulator, the magnitude of the current flowing through the memory function body can be changed at a macro-level.

In one embodiment, in the memory described above, given that a distance between the third particle and the fourth particle is d34, relationships that d13>d34 and that d23>d34 are satisfied.

In the memory of this one embodiment, the fourth particle is present at a position closer to the third particle as compared with the first and second particles, i.e., a position relatively close to the main current path. Accordingly, it becomes easier to put charge into and out of the fourth particle. Also, since the fourth particle is present at a position close to the third particle, it is easily attainable to change the potential of the third particle depending on the presence or absence or amount of the charge stored in the fourth particle. Therefore, the easiness of flow of the current, i.e. magnitude of the current, in the unit area can be easily changed.

In one embodiment, in the memory described above, particles having particle sizes of not less than 0.4 nm and not more than 4 nm are present as the conductive particles in the insulator.

In the memory of this one embodiment, since particles having particle sizes of not less than 0.4 nm and not more than 4 nm are present as the conductive particles in the insulator, the magnitude of the current flowing through the memory function body can be largely changed. If the conductive particles are too large or too small in size, the memory function would deteriorate (which will be detailed later).

In one embodiment, in the memory described above, a region where the concentration of the element that constitutes the conductive particles is low is present in adjacency to a region where the concentration of the element is high in the thickness direction of the insulator.

The "thickness direction of the insulator" refers to a direction perpendicular to a direction (layer direction) of a layer-shaped insulator in which the layer extends.

In the memory of this one embodiment, the concentration of the element constituting the conductive particles is not uniform but higher and lower, that is, a region of lower concentration of the element constituting the conductive particles is present in adjacency to a region of higher concentration of the element in the thickness direction of the insulator. In this case, the possibilities that the current becomes excessively hard flowing or excessively easy flowing with respect to the thickness direction of the insulator, i.e. the direction in which the first electrode and the second electrode are opposed to each other, are suppressed. Accordingly, stable characteristics of the memory are obtained.

In one embodiment, in the memory described above, a region of low density of the conductive particles is present in adjacency to a region of high density of the conductive particles in the thickness direction of the insulator.

In the memory of this one embodiment, the density of the conductive particles is not uniform but a region of low density of the conductive particles is present in adjacency to a region of high density of the conductive particles in the thickness direction of the insulator. In this case, the possibilities that the current becomes excessively hard flowing or excessively easy flowing with respect to the thickness direction of the insulator, i.e. the direction in which the first electrode and the second electrode are opposed to each other, are suppressed. Accordingly, stable characteristics of the memory are obtained.

In one embodiment, in the memory described above, a region where the size of the conductive particles is small is present in adjacency to a region where the size of the conductive particles is large in the thickness direction of the insulator.

In the memory of this one embodiment, the size of the conductive particles is not uniform, and a region where the size of the conductive particles is small is present in adjacency to a region where the size of the conductive particles is large in the thickness direction of the insulator. In this case, the possibilities that the current becomes excessively hard flowing or excessively easy flowing with respect to the thickness direction of the insulator, i.e. the direction in which the first electrode and the second electrode are opposed to each other, are suppressed. Accordingly, stable characteristics of the memory are obtained.

Desirably, the insulator is made of silicon oxide and the conductive particles are made of a semiconductor or a metal. In this case, the memory can be fabricated by the existing apparatus used in the semiconductor industry.

In one embodiment, in the memory described above, a rectifying function body having a rectification effect is electrically connected in series with the memory function body so as to determine a direction of a current that flows through the memory function body.

In the memory of this one embodiment, the direction of the current flowing through the memory function body is limited to one direction by the rectifying function body. As a result, in an attempt to select and operate particular cells from among a plurality of cells each of which includes the memory function body and which are arranged in a matrix form, the possibility that a useless current flows through any nonselect cell can be blocked by the rectifying function body. Therefore, selection of cells becomes easier to achieve.

Desirably, the rectifying function body has a Schottky junction. This Schottky junction can be fabricated by using a semiconductor. Therefore, the junction can easily be manufactured by the existing semiconductor apparatus and is excellent in productivity.

Also, desirably, the rectifying function body has a pn junction. This pn junction can be fabricated by using a semiconductor. Therefore, the junction can easily be manufactured by the existing semiconductor apparatus and is excellent in productivity. Moreover, since the characteristics of the junction can easily be changed by adjusting the concentrations of the p-type semiconductor and the n-type semiconductor, the junction is excellent in versatility.

Also, desirably, the rectifying function body has a junction having a rectification effect, and at least one of the substances that constitute this junction is made of continuous grain boundary silicon. In this case, there is no need for such a high temperature as in epitaxial growth in order to form the junction. Moreover, since the crystallinity is better than that of normal polysilicon, it becomes possible to increase the mobility and achieve high-speed operation.

In one embodiment, in the memory described above, a select transistor for selecting the memory function body is electrically connected in series with the memory function body.

In the memory of this one embodiment, the memory cell can be selected or nonselected by turning on or off the select transistor. Moreover, since the current can be prevented from flowing through the memory function body by turning off the select transistor, it is possible to prevent any change in the easiness of flow of the current through the memory function body. Therefore, a stable memory function can be maintained for a long time.

In one embodiment, the memory has, between the first electrode and the second electrode, a device for applying a voltage for destroying the insulation film of the memory function body. This memory is used as a so-called fuse memory by destroying the insulation film of the memory function body. In this memory, it becomes possible to execute write at a low voltage unlike the conventional fuse memory that employs an insulator containing no particle as a fuse.

Moreover, it is acceptable to constitute a random-access memory by arranging the aforementioned memories in a matrix form. In this case, since the structure becomes simple unlike the floating gate type memory, the structure is suitable for high integration and excellent in productivity.

In another aspect, the memory of this invention comprises at least two memory cells including the memory function body as described above, wherein the insulators forming the memory function bodies of the two memory cells are integrally continuously formed. Then, of the two memory cells, one electrode of one memory cell and one electrode of the other memory cell are electrically connected to each other, and the other electrode of the one memory cell and the other electrode of the other memory cell are electrically isolated from each other.

In the memory of this invention, the insulators forming the memory function bodies of the two memory cells are integrally continuously formed. Further, of the two memory cells, one electrode of one memory cell and one electrode of the other memory cell are electrically connected to each other. Therefore, no isolation region is required to be formed in comparison with the case where the two memory cells are independently formed, and therefore, the occupation area can be reduced. Since the other electrode of the one memory cell and the other electrode of the other memory cell are electrically isolated from each other, the two memory cells can operate independently of each other.

In still another aspect, the memory of the present invention comprises at least five memory cells including the memory function body as described above, a select transistor for selecting the memory function body and a rectifying function body for determining a direction of a current that flows through the memory function body. Each of the memory cells is connected between a bit line and a source line extended in a direction of column, and the select transistor of each of the memory cells is controlled by a word line extended in a direction of row. Second and fourth cells are arranged mutually adjacently in the direction of row, and third and fifth cells are arranged mutually adjacently in the direction of column, with respect to a first cell of the five memory cells. The first cell and the second cell have a shared bit line, a shared word line and unshared source lines. The first cell and the third cell have a shared bit line, a shared source line and unshared word lines. The first cell and the fourth cell have a shared source line, a shared word line and unshared bit lines. The first cell and the fifth cell have a shared word line, a source line of the first cell and a bit line of the fifth cell are shared, and a bit line of the first cell and a source line of the fifth cell are shared.

In the memory of this invention, the word line, the bit line and the source line can be shared to a large extent, so that interconnections can be reduced. Thus, the occupation area can be reduced.

In one embodiment, in the memory described above, at least two memory function bodies as described above are stacked in a direction perpendicular to the substrate.

In the memory of this one embodiment, at least two memory function bodies are stacked in a direction perpendicular to the substrate so as to be three-dimensionally integrated. Therefore, it is possible to largely reduce the effective occupation area and increase the memory capacity.

Desirably, at least two memory cells including the memory function body as described above are arranged in a direction parallel to the substrate, and the insulators of memory cells mutually adjacent in the direction parallel to the substrate are integrally continuously formed. In this case, the process of separating the memory function body every cell can be eliminated, and therefore, the productivity is improved.

Also, desirably, at least two memory cells including the memory function body as described above and a rectifying function body for determining a direction of a current that flows through the memory function body are arranged in a direction parallel to the substrate, and the insulators and/or the rectifying function bodies of memory cells mutually adjacent in the direction parallel to the substrate are integrally continuously formed. In this case, the process of separating the memory function body every cell or the process of separating the rectifying function body every cell can be eliminated, and therefore, the productivity is improved.

A semiconductor device of the present invention includes a memory circuit having the memory described above.

The semiconductor device of this invention employs the memory cell of which the occupation area can be reduced. Therefore, the occupation area of the memory circuit can be reduced and constructed compact in comparison with the conventional case. Since the aforementioned memory can operate with a comparatively low voltage, a power source can be shared by a memory circuit including such a memory and a logic circuit or the like, and this facilitates the consolidation of the memory circuit with the logic circuit or the like. As a result, power consumption reduction becomes possible.

The electronic equipment of this invention includes the semiconductor device described above.

In the electronic equipment of this invention, the above-mentioned semiconductor device is constructed compact, and this equipment can consequently be made compact. Moreover, since the semiconductor device has low power consumption, the operating life of the battery mounted in this equipment is prolonged. Therefore, this electronic equipment is suitable for portable use.

According to the present invention, there is provided a memory manufacturing method comprising, for the manufacture of the above-described memory, the steps of: forming the insulator on the first electrode or the second electrode, and implanting a substance for forming the conductive particles into the insulator by a negative ion implantation method. Thereafter, the other electrode is formed on the insulator.

According to the memory manufacturing method of this invention, the conductive particles can be formed in the insulator at a specified density (high density) by one-time negative ion implantation in the fabricated memory so that the magnitude of the current flowing through the memory function body is changed by the Coulomb blockade effect before and after a specified voltage is applied to between the first electrode and the second electrode, and moreover the conductive particles can be distributed in the thickness direction of the insulator. Therefore, the memory can be fabricated with good productivity.

As a method for forming the conductive particles in the insulator, there can be considered a method for depositing a conductive substance by CVD (Chemical Vapor Deposition), evaporation, MBE (Molecular Beam Epitaxy) method and so on and carrying out heat treatment to form the conductive particles and a method for depositing a conductive thin film and using fine processing techniques of photolithography, etching and so on. With these methods, however, it is hard to form the conductive particles in the insulator to such a specified density (high density) that the Coulomb blockade effect is developed. Further, the conductive particles can be formed only on one plane by one-time processing. Accordingly, there is a need for repeating the processing over and over in order to make the conductive particles distributed in the thickness direction of the insulator so that the Coulomb blockade effect is developed. As a result, productivity is not satisfactory. In contrast to this, according to the ion implantation, the conductive particles can be formed in the insulator to a high density in a short time through one-time processing, and moreover the conductive particles can be distributed in the thickness direction of the insulator. Furthermore, according to the ion implantation, the fine processing techniques of photolithography, etching and so on are not required for the formation of the conductive particles. Therefore, the ion implantation is excellent in productivity.

Moreover, if conductive particles are thus formed in the insulator by the ion implantation, then the memory function body of the fabricated memory comes to have a state in which the region where the concentration of the element that constitutes the conductive particles is low is present in adjacency to the region where the concentration of the element is high in the thickness direction of the insulator. Moreover, there results a state in which the region where the density of the conductive particles is low is present in adjacency to the region where the density of the conductive particles is high in the thickness direction of the insulator. Furthermore, there results a state in which the region where the size of the conductive particles is small is present in adjacency to the region where the size of the conductive particles is large in the thickness direction of the insulator. In such a state as described above, the characteristics of the memory are stabilized as already described.

Moreover, the substance for forming conductive particles is implanted into the insulator by the negative ion implantation method, and therefore, the insulator and the substrate that supports the insulator can be restrained from being electrically charged during the implantation. Therefore, the implantation energy can be accurately controlled, and variations in implantation can be suppressed. Moreover, since the electric charging is suppressed, the insulator can be prevented from being destroyed by the electrical charging and from causing defects. For the above reasons, the reliability of the produced memory is improved.

In another aspect, in the memory of this invention, a memory function body having a plurality of conductive particles contained in the insulator is interposed between the first electrode and the second electrode. The conductive particles are distributed in the insulator so that the magnitude of a current flowing through the memory function body is changed by the Coulomb blockade effect before and after application of a specified voltage to between the first electrode and the second electrode and a storage state is discriminated according to the magnitude of the current. Further, a third electrode which allows a voltage to be applied to the memory function body in a direction perpendicular to a direction in which the first electrode and the second electrode are opposed to each other is adjacent to the memory function body.

It is to be noted that the "conductive particle" means a particle that has conductivity in itself. Therefore, the "conductive particles" also include those made of a metal or semiconductor and further include those made of an organic substance so long as they have conductivity. Moreover, the "particle" means a particle that has a particle size smaller than 1 μm.

The "storage state" of the memory includes, for example, a written state corresponding to a logic 1 and an erased state corresponding to a logic 0.

Herein, the arrangement that the third electrode is "adjacent" to the memory function body includes the case where the third electrode is in direct contact with the memory function body and the case where the contact is made via an insulation film.

In the memory of this invention, the magnitude of the current that flows through the memory function body is changed due to the Coulomb blockade effect before and after application of a specified voltage to between the first electrode and the second electrode by virtue of the plurality of conductive particles distributed in the insulator of the memory function body. That is, by applying a specified voltage (for write or erase) to between the first electrode and the second electrode for the flow of the current through the memory function body, one to several electric charges are accumulated on one conductive particle, and the accumulated electric charges exert Coulomb interaction on the electrons in a current path. Accordingly, the magnitude of the current flowing through the memory function body is changed depending on the presence or absence or amount of electric charges stored on the conductive particles. When a specified voltage (for read) is applied to between the first electrode and the second electrode, the storage state is discriminated according to the magnitude of the current that flows through the memory function body. In this memory, the magnitude of the current that flows through the memory function body can be changed by electrical control with a comparatively low voltage at normal temperature. Therefore, this memory has practicability.

Still more, as a result of an experiment conducted by the present inventor, it was discovered that when a voltage was applied to the memory function body in the direction in which the first electrode and the second electrode were opposed to each other by the third electrode, the magnitude of the current that flowed through the memory function body changed even more largely. That is, the width of the memory window (hysteresis) is increased, so that the memory function is improved. Thus, read errors in reading the storage state are reduced, and the reliability of the memory is improved.

In one embodiment, in the memory described above, particles having particle sizes of not less than 0.4 nm and not more than 4 nm are present as the conductive particles in the insulator.

In the memory of this one embodiment, since particles having particle sizes of not less than 0.4 nm and not more than 4 nm are present as the conductive particles in the insulator, the magnitude of the current flowing through the memory function body can be largely changed. If the conductive particles are too large or too small in size, there would occur functional deterioration (which will be detailed later).

In one embodiment, in the memory described above, a region where the size of the conductive particles is small is present in adjacency to a region where the size of the conductive particles is large in the thickness direction of the insulator.

The "thickness direction of the insulator" refers to a direction perpendicular to a direction (layer direction) of a layer-shaped insulator in which the layer extends.

In the memory of this one embodiment, the size of the conductive particles is not uniform, and a region where the size of the conductive particles is small is present in adjacency to a region where the size of the conductive particles is large in the thickness direction of the insulator. In this case, the possibilities that the current becomes excessively hard flowing or excessively easy flowing through the memory function body are suppressed. Accordingly, stable characteristics of the memory are obtained.

In one embodiment, in the memory described above, the first electrode and the second electrode are diffusion regions, respectively, formed on a surface of a semiconductor substrate. The memory function body is formed in a region located between the diffusion regions within the surface of the substrate. Further, the third electrode is provided on the memory function body.

The memory of this one embodiment has a structure nearly identical or close to a structure in which the memory function body is integrated into the channel portion of a MOS type transistor. In this case, since the structure has a close resemblance to a logic transistor, its manufacture is easy. Also, it becomes easy to consolidate the memory with a logic circuit.

In one embodiment, in the memory described above, the first electrode and the second electrode are made of conductors formed on the substrate, respectively. The memory function body is formed in a region interposed between the conductors. Further, the third electrode is provided on the memory function body.

In the memory of this one embodiment, the memory has a structure nearly identical to a structure in which the memory function body is integrated into the insulation film portion of a MOS type transistor with a stacked diffusion layer lacking the source, drain and channel. In this case, since the structure has a close resemblance to a logic transistor, its manufacture is easy. Also, it becomes easy to consolidate the memory with a logic circuit. Moreover, it is also possible to form the memory function body on a glass substrate.

Moreover, it is acceptable to constitute a random-access memory by arranging the aforementioned memories in a matrix form. In this case, since the structure becomes simple unlike the floating gate type memory, the structure is suitable for high integration and excellent in productivity. Also, a random-access memory which is compact and capable of low-voltage operation can be fulfilled.

In one embodiment, in the memory described above, at least two memory function bodies are stacked in a direction perpendicular to the substrate.

In the memory of this one embodiment, at least two memory function bodies are stacked in a direction perpendicular to the substrate so as to be three-dimensionally integrated. Therefore, it is possible to largely reduce the effective occupation area and increase the memory capacity.

A semiconductor device of this invention has the above-described memory.

The semiconductor device of this invention employs the memory cell of which the occupation area can be reduced. Therefore, the occupation area of the memory circuit can be reduced and constructed compact in comparison with the conventional case. Since the aforementioned memory can operate with a comparatively low voltage, a power source can be shared by a memory circuit including such a memory and a logic circuit or the like, and this facilitates the consolidation of the memory circuit with the logic circuit or the like. As a result, power consumption reduction becomes possible.

Electronic equipment of this invention has the above-described semiconductor device.

In the electronic equipment of this invention, the above-mentioned semiconductor device is constructed compact, and this equipment can consequently be made compact. Moreover, since the semiconductor device has low power consumption, the operating life of the battery mounted in this equipment is prolonged. Therefore, this electronic equipment is suitable for portable use.

Also, the memory manufacturing method of this invention is a method for manufacturing the above-described memory comprising the steps of forming the first electrode, the insulator and the second electrode so that these are arrayed in this order along the surface of the substrate, and implanting a substance for forming the conductive particles into the insulator by a negative ion implantation method to form the memory insulator, and forming a third electrode on the memory insulator.

Otherwise, the memory manufacturing method of this invention is a memory manufacturing method for manufacturing the above-described memory, comprising the steps of forming the insulator on the surface of the substrate; implanting a substance for forming the conductive particles into the insulator by a negative ion implantation method to form the memory insulator, and forming a third electrode on the memory insulator and moreover forming a first electrode and a second electrode in adjacency to opposite sides of the memory insulator, respectively.

According to the memory manufacturing method of this invention, the conductive particles can be formed in the insulator at a specified density (high density) by one-time ion implantation in the fabricated memory so that the magnitude of the current flowing through the memory function body is changed by the Coulomb blockade effect before and after a specified voltage is applied to between the first electrode and the second electrode, and moreover the conductive particles can be distributed in the thickness direction of the insulator. Therefore, the memory can be fabricated with good productivity.

As a method for forming the conductive particles in the insulator, there can be considered a method for depositing a conductive substance by CVD (Chemical Vapor Deposition), evaporation, MBE (Molecular Beam Epitaxy) and so on and carrying out heat treatment to form the conductive particles and a method for depositing a conductive thin film and using fine processing techniques of photolithography, etching and so on. With these methods, however, it is hard to form the conductive particles in the insulator to such a specified density (high density) that the Coulomb blockade effect is developed. Further, the conductive particles can be formed only on one plane by one-time processing. Accordingly, there is a need for repeating the processing over and over in order to make the conductive particles distributed in the thickness direction of the insulator so that the Coulomb blockade effect is developed. As a result, productivity is not satisfactory. In contrast to this, according to the ion implantation, the conductive particles can be formed in the insulator to a high density in a short time through one-time processing, and moreover the conductive particles can be distributed in the thickness direction of the insulator. Furthermore, according to the ion implantation, the fine processing techniques of photolithography, etching and so on are not required for the formation of the conductive particles. Therefore, the ion implantation is excellent in productivity.

Moreover, if conductive particles are thus formed in the insulator by the ion implantation, then the memory function body of the fabricated memory comes to have a state in which the region where the concentration of the element that constitutes the conductive particles is low is present in adjacency to the region where the concentration of the element is high in the thickness direction of the insulator. Moreover, there results a state in which the region where the density of the conductive particles is low is present in adjacency to the region where the density of the conductive particles is high in the thickness direction of the insulator. Furthermore, there results a state in which the region where the size of the conductive particles is small is present in adjacency to the region where the size of the conductive particles is large in the thickness direction of the insulator. In such a state as described above, the characteristics of the memory are stabilized as already described.

Moreover, the substance for forming conductive particles is implanted into the insulator by the negative ion implantation method, and therefore, the insulator and the substrate that supports the insulator can be restrained from being electrically charged during the implantation. Therefore, the implantation energy can be accurately controlled, and variations in implantation can be suppressed. Moreover, since the electric charging is suppressed, the insulator can be prevented from being destroyed by the electrical charging and from causing defects. For the above reasons, the reliability of the produced memory is improved.

BRIEF DESCRIPTION OF THE DRAWINGS

FIG. 16A is a view schematically showing the structure whose constituent elements are shared by mutually adjacent two memory cells that include a resistance-changing function body and a rectifying function body constructed of a Schottky junction in each memory cell, and FIGS. 16B through 16D are views showing its concrete constructions, respectively;

FIGS. 32A through 32E are views showing cross sections in the fabrication processes of the memory shown in FIGS. 31A and 31B;

FIGS. 58A to 58F are views for explaining the fabrication processes of a resistance-changing function body of one embodiment of the invention;

DETAILED DESCRIPTION OF THE PREFERRED EMBODIMENTS

Figure 1A:
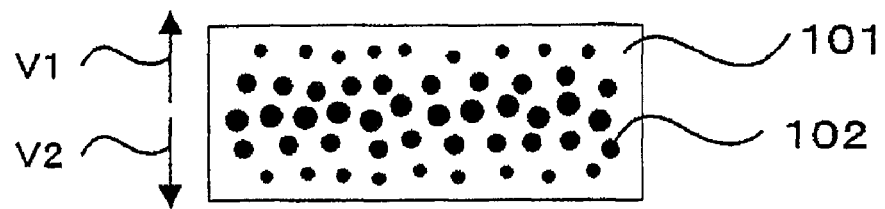
FIG. 1A is a view schematically showing a cross section of a resistance-changing function body constituting a memory of one embodiment of the present invention.

FIG. 1 shows a schematic cross-sectional structure of a resistance-changing function body of one embodiment of the present invention. This resistance-changing function body 100 includes a plurality of nanometer-size electrically conductive particles 102 which are provided in an insulator 101 sandwiched between a first electrode 111 and a second electrode so that the electrical resistance between the first and second electrodes 111, 112 changes. The insulator 101 containing the conductive particles 102 will be referred to as particle container 113.

It is noted that the resistance-changing function body according to the present invention, being usable also as a memory function body, will also be referred to as memory function body from time to time.

The resistance-changing function body 100 is fabricated in the following manner according to processes shown in FIG. 3 (FIGS. 3A to 3D associated with one another will be referred to generically as FIG. 3, so is the case also for other drawings).

Figure 3A:
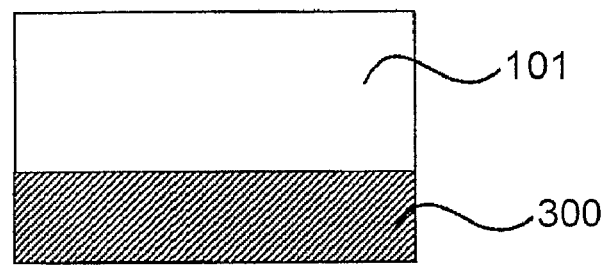
FIGS. 3A to 3D are views for explaining the fabrication processes of the memory.
Figure 3B:
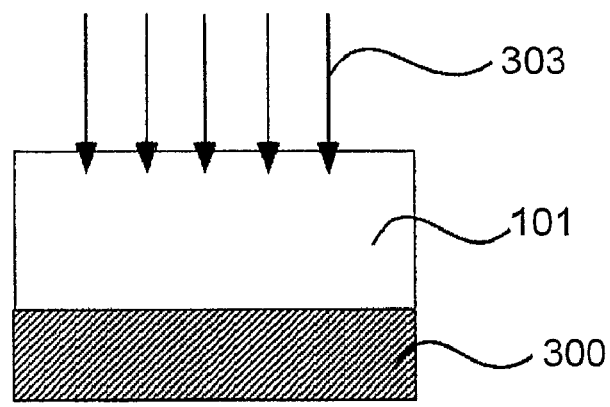

In this case, it is assumed that a silicon substrate is used as a substrate 300, silicon oxide is used as a material of the insulator 101, and silver is used as a material of the conductive particles 102 so that the resistance-changing function body can be manufactured by using existing apparatuses that have been adopted in the semiconductor industry.

i) First of all, as shown in FIG. 3A, silicon oxide 101 is formed on the surface of the silicon substrate 300 by a thermal oxidation process. In this example, the silicon oxide 101 was formed to a film thickness of about 50 nm. It is to be noted that the silicon substrate 300 is used as a second electrode 112 in this embodiment. Such process involves less number of process steps.

ii) Next, as shown in FIG. 3B, silver 303 is introduced into the silicon oxide 101 by the negative ion implantation method.

In this case, if implantation energy is excessive, then a range of distribution of the implanted silver becomes too broad, and this is improper to the implantation into the thin film 101 of several hundreds of nm or less, disadvantageously causing damage and defect on the film 101. Therefore, the implantation energy should preferably be smaller than 100 keV and more preferably be set smaller than 50 keV.

Moreover, if the implantation dosage of silver is extremely large, then the particle size of the conductive particle becomes extremely large, and the damage to the film 101 is increased. If the dosage is extremely small, the density of the conductive particles becomes extremely small. Therefore, the implantation dosage of silver should preferably be set greater than $1\times10^{12}/cm^2$ and smaller than $1\times10^{20}/cm^2$ and more preferably, for example, greater than $1\times10^{13}/cm^2$ and smaller than $1\times10^{17}/cm^2$.

In the present embodiment, the implantation energy was set to about 30 keV, and the dosage was set to about $1\times10^{15}/cm^2$. Although the most preferable settings therefor differ depending on material, film thickness, aimed particle size and density or the like, those settings are preferably set to such ones that the implantation concentration becomes 0.1 to 20% because lower than 0.1% implantation concentrations would cause the particle formation to be too small in particle size or too low in density or too long time-taking while higher than 20% implantation concentrations would cause the particle formation to be too large in particle size or too high in density. In this embodiment, those values were set so that the concentration would be about 1% at the most.

Figure 3C:
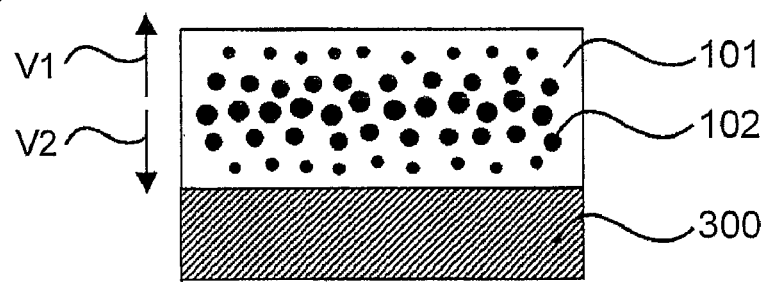

Moreover, the present embodiment adopts the negative ion implantation method as an ion implantation method. According to this implantation using negative ions, there is no possibility of the rise of the surface potential of the material (silicon oxide film 101 in the present embodiment) that undergoes the implantation to a potential close to the acceleration voltage of positive ions unlike the case where positive ions are used, so that the surface potential of the silicon oxide film 101 can be suppressed to a very low value of about several volts. In more detail, with the use of the positive ion implantation, secondary electrons of negative charge are discharged when the ions of positive charge are injected into the material surface. Therefore, the material surface keeps being positively charged in accordance, and the surface potential eventually rises to the acceleration voltage of the positive ions. In contrast to this, according to the negative ion implantation method, secondary electrons of negative charge are discharged when the ions of negative charge are injected into the material surface. Therefore, the surface potential settles within about positive and negative several volts. As a result, the fluctuation of the effective acceleration voltage is reduced in comparison with the positive ion implantation, and therefore, it becomes possible to suppress variations in the implantation depth. Moreover, since the silicon oxide film 101 that undergoes the implantation and the substrate 300 that supports the film are scarcely electrically charged, it becomes possible to suppress the occurrence of defects due to dielectric breakdown and the like.

iii) Next, the silicon oxide film 101 is subjected to heat treatment, so that the implanted element (silver in this case) is condensed or diffused. Through this process, the particles 102 of specified particle size composed of silver are formed in the silicon oxide film 101 into such a specified density as to produce a resistance changing effect as shown in FIG. 3C. In this embodiment, the particles 102 may be distributed also along thickness directions V1, V2 of the silicon oxide film 101. Moreover, defects that have occurred during the ion implantation are corrected.

The heat treatment is ineffective when its temperature is extremely low, while the implanted element (silver) is diffused and melted when the temperature is extremely high, so that particles could not be formed. Accordingly, the temperature of the heat treatment should preferably be set higher than 200° C. and lower than the melting point of the implanted element. Moreover, it is true that the effect of the heat treatment at such temperatures can be increased by prolonging the time of the heat treatment even at a certain temperature, but if the time is excessively long, there may arise cases where the particle size becomes extremely large or where the implanted element diffuses to a region outside the region in which the particles should be formed. Therefore, the heat treatment time should preferably be set shorter than 24 hours.

Figure 3D:
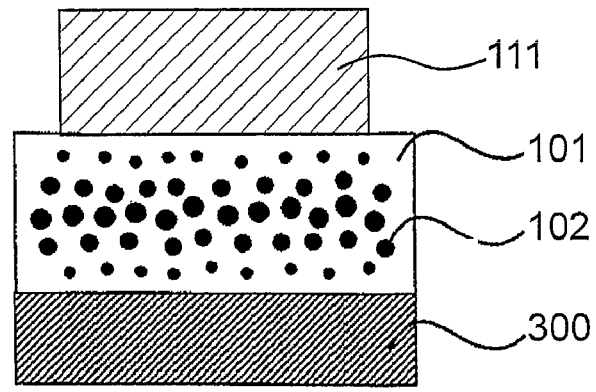

For example, with the use of a general heat treating furnace, the heat treatment should preferably be carried out in an inert atmosphere of argon, nitrogen or the like with the temperature set to within a range of 300 to 900° C. In this embodiment, a heat treatment of about 1 hour was carried out at temperatures of about 700° C. in argon atmosphere by using a ceramics electric tube furnace made by ASAHI Rika Seisakusho.

iv) Thereafter, as shown in FIG. 3D, a first electrode 111 is formed on the silicon oxide film 101 containing the particles 102.

The material of this first electrode 111 may be either a metal or a semiconductor or an organic substance so long as it has conductivity. As a method for forming the first electrode 111, there can be adopted CVD (Chemical Vapor Deposition), evaporation, MBE (Molecular Beam Epitaxy) process and so on.

In this embodiment, an Al film was formed as the first electrode 111 by evaporation.

Figure 1B:
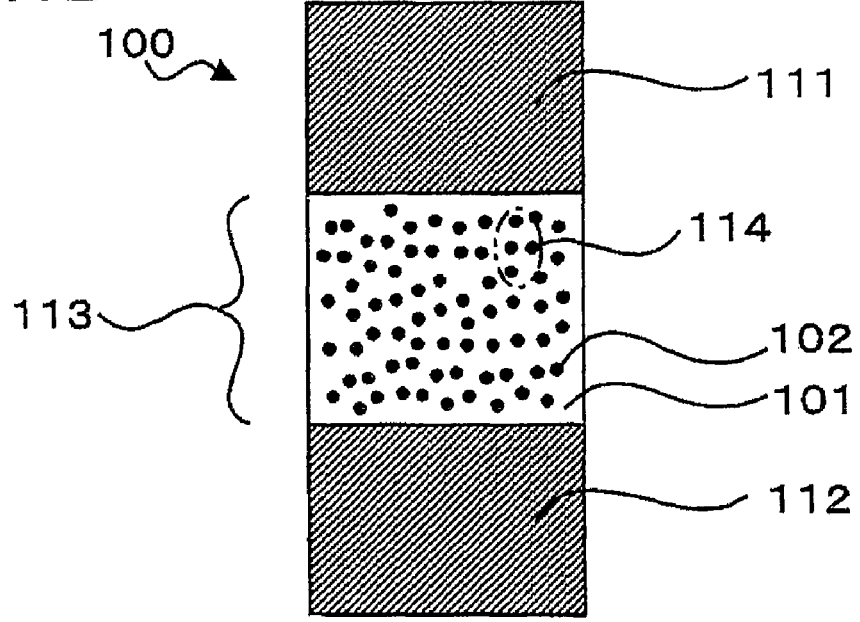
FIG. 1B is a view showing a schematic cross section of the memory.

The silicon oxide film 101 containing the particles 102 of the resistance-changing function body 100 fabricated in this way, i.e., the particle container 113 was observed by cross-sectional TEM observation. As a result, as shown in FIG. 1A, it was found that the ion-implanted silver was condensed to form nanometer-size particles 102 having about 3 nm or smaller particle sizes. Also, the particles 102 were able to be distributed along the thickness directions V1, V2 of the silicon oxide film 101 about a center of a depth that could be expected from the set implanted energy (acceleration energy of silver ions). It is noted that the distribution of the particles 102 with respect to the thickness directions V1, V2 will be described later.

As shown above, with the use of ion implantation, the conductive particles 102 can be formed in the insulator 101 at high density in a short time through one-time processing, and moreover the conductive particles 102 can be distributed along the thickness directions V1, V2 of the insulator 101. Still, the ion implantation does not require any fine processing technique such as photolithography and etching to form the conductive particles 102. Thus, the ion implantation excels in productivity.

Also in this embodiment, a substance for forming the conductive particles 102 is implanted into the insulator 101 by the negative ion implantation method. Therefore, the insulator 101 and the substrate that supports the insulator can be prevented from being electrically charged during the implantation. Therefore, the implantation energy can be accurately controlled, and variations in implantations can be suppressed. Moreover, since the electrical charge is suppressed, it is possible to suppress the occurrence of defects caused by the dielectric breakdown of the insulator 101 due to the electrical charge. As a result of these factors, the reliability of the resistance-changing function body 100 can be improved.

Figure 2:
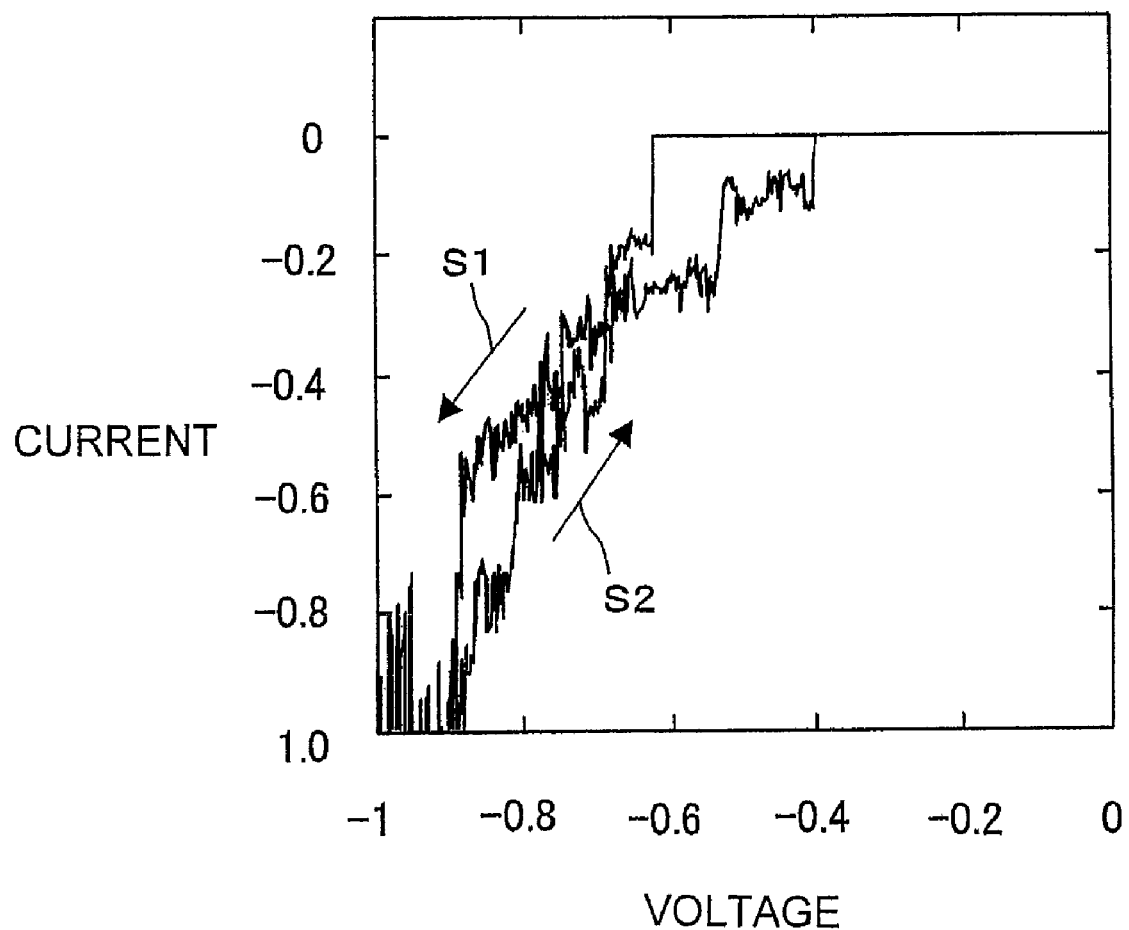
FIG. 2 is a chart showing results of measuring current-voltage (I-V) characteristics of the memory.

FIG. 2 shows a graph of current-voltage (I-V) characteristics at normal temperature 25° C. of the resistance-changing function body 100 fabricated by the above-described method.

These characteristics were obtained by grounding the second electrode 112 (silicon substrate 300), applying a voltage to the first electrode 111 and observing a current flowing through the first electrode 111. First of all, when the voltage was varied continuously from higher to lower side, then the current decreased while showing stepwise variations unique to the Coulomb blockade effect as indicated by arrow S1 in FIG. 2. Subsequently, in turn, when the voltage was varied continuously toward higher side, then the current increased while showing stepwise variations unique to the Coulomb blockade effect as indicated by arrow S2 as shown in FIG. 2. As can be seen from FIG. 2, there appeared a hysteresis in the current-voltage (I-V) characteristics.

With a sufficient voltage difference given between the first electrode 111 and the second electrode 112, a current mostly flows along a path through a string of particles arranged nearly on a straight line. In this case, one to several electrons are stored in other particles, and the stored electric charge causes the Coulomb interaction to be exerted on the electrons in the current path through the string of particles.

A potential of at least one of the string of particles is changed depending on the presence or absence or amount of electric charge stored on the above or other particles. Therefore, the degree of flowability of the current, i.e. electrical resistance, can be easily changed stepwise.

Figure 1C:
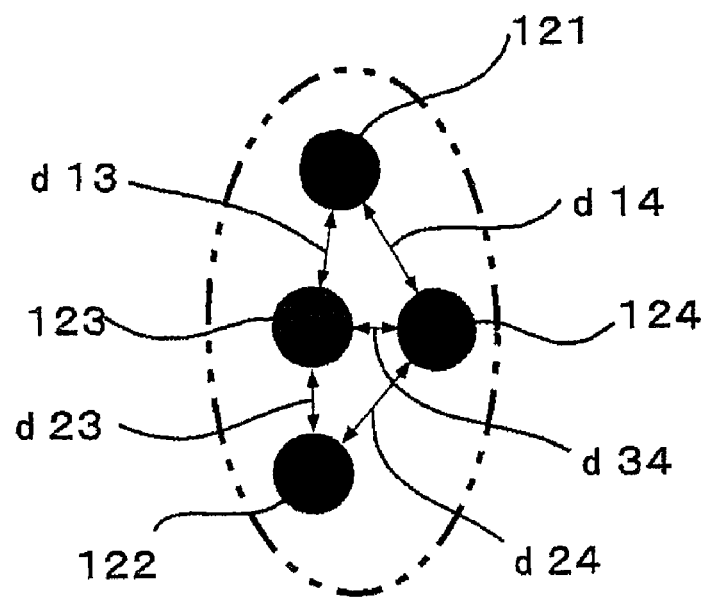
FIG. 1C is a view schematically showing the structure of a unit area of the resistance-changing function body under magnification.

The reason of this is discussed in detail below with reference to FIG. 1C. FIG. 1C schematically shows, under magnification, a unit area 114 including four conductive particles 102 within the particle container 113 shown in FIG. 1B. In this unit area 114, the four conductive particles 102 are included so as to be adjacent to each other and spaced from each other. Of the four conductive particles 102, a first particle 121 is located closest to the first electrode 111, and a second particle 122 is located closest to the second electrode 112. The remaining third particle 123 and fourth particle 124 are each located between the first particle 121 and the second particle 122 with respect to a direction in which the first electrode 111 and the second electrode 112 are opposed to each other (the direction being a vertical direction in the figure, corresponding to the thickness direction of the film 101).

Now, it is assumed that a distance between the first particle 121 and the third particle 123 is d13, a distance between the second particle 122 and the third particle 123 is d23, a distance between the first particle 121 and the fourth particle 124 is d14, and a distance between the second particle 122 and the fourth particle 124 is d24. Then, relationships that d13<d14 and that d23<d24 are satisfied. Further, given that a distance between the third particle 123 and the fourth particle 124 is d34, relationships that d13>d34 and that d23>d34 are satisfied.

With a sufficient voltage difference given between the first electrode 111 and the second electrode 112, in the unit area 114, a current mostly flows along a path through the first particle 121, the third particle 123 and the second particle 122 arranged nearly on a straight line. In this case, one to several electrons are stored in the fourth particle 124, and the stored electric charge causes the Coulomb interaction to be exerted on the electrons in the current path through the first particle 121, the third particle 123 and the second particle 122.

Still, the fourth particle 124 is present at a position closer to the third particle 123 as compared with the first and second particles 122, i.e., a position relatively close to but separated only a little sideways from the main current path. Accordingly, it becomes easier to put charge into and out from the fourth particle 124. Also, since the fourth particle 124 is present at a position close to the third particle 123, it is easily attainable to change the potential of the third particle 123 depending on the presence or absence or amount of the charge stored in the fourth particle 124. Therefore, the degree of flowability of the current, i.e. electrical resistance, can be easily changed stepwise.

The reason why the electrical resistance between the first and second electrodes 111, 112 changed stepwise at a macro-level could be attributed to the fact that a plurality of such unit areas 114 were present in the insulator 101. Also, the appearance of the hysteresis could be attributed to the fact that the potential of the third particle 123 changed in each unit area 114 between the case of a voltage decrease (S1) and the case of a voltage increase (S2) with the current-voltage (I-V) characteristics of FIG. 2.

In addition, if the distance d34 between the third particle 123 and the fourth particle 124 is too large, then the Coulomb interaction to be given to the current path becomes extremely weak to such an extent as to be substantially negligible. Under the condition that d13>d34 and d23>d34, then the effect of the electrons captured by the particle 124 on the particles that form the current path is presumed to be large, so that an increase of the hysteresis is predicted.

Moreover, it can also be considered that the cause of the occurrence of hysteresis is ascribed to the change of coulombic energy as a consequence of the diffusion, disappearance or the enlargement through cohesion of submicroscopic-sized particles among the particles due to the influence of the current. It can otherwise be considered that the coulombic energy has changed as a consequence of the discharge of electrons from the particles due to thermal energy caused by Joule heat.

This resistance-changing function body 100 is able to discriminate binary data by reading the magnitude of the current value utilizing the hysteresis effect and be used as a memory. Also, in other words, the resistance-changing function body of the present invention, which serves for capturing electrons, can also be called a charge retention function body.

In the case where an excessive voltage was applied across the first and second electrodes 111 and 112 of the resistance-changing function body 100, the current value remarkably increased. It can be considered that this is ascribed to the change of the particles 102 contained in the insulator 101 or to the occurrence of dielectric breakdown of the insulator 101 located between the particles 102, 102. It is to be noted that the insulator 101 located between the particles 102, 102, which is a tunnel barrier, scarcely causes dielectric breakdown. Accordingly, it can be considered that the above is ascribed to the diffusion or cohesion of the particles 102 or the change in the state of the particles 102 due to Joule heat or the change in the state of the particles 102 due to migration caused by the current.

Further, a fuse memory that utilizes the dielectric breakdown of normal insulation film or the like needs a high voltage for causing the dielectric breakdown of the insulation film or the like. In contrast to this, this resistance-changing function body 100 utilizing the particle container 113 has a comparatively small thickness of the substantial insulation film between the particles 102, 102, and most of the thickness of the insulation film between the particles 102, 102 allows the electrons to be tunneled through. Therefore, it becomes possible to execute write operation at a voltage lower than in the conventional fuse memory. Therefore, the resistance-changing function body 100 can also be used as a fuse memory operable on low voltage.

In this example, the particle size of fabricated particles 102 was not more than about 3 nm within the range of TEM observation. In addition, particle samples having particle sizes of about 6 nm or less and samples having particle sizes of about 10 nm or less were also fabricated by using a similar method. As a result of measuring I-V characteristics of such samples, it was observed that the step size or hysteresis in the graph of I-V characteristics became smaller as the particle size of the particles increased, and the hysteresis had the tendency of becoming indistinct even at temperatures lower than room temperature. Thus, it was found that the particle size of the particles 102 required to obtain the hysteresis was not greater than 11 nm or preferably not greater than 7 nm and more desirably not greater than 4 nm.

On the other hand, a sample whose particle size was generally smaller than 1 nm and in which a majority of particles had particle sizes smaller than 0.4 nm within the range of TEM observation were also fabricated by increasing the heat treatment temperature to further reduce the particle size of the particles 102. As a result of measuring the I-V characteristics of such samples, it became impossible to clearly observe the step size or hysteresis in the I-V characteristic graph at room temperature. The reason of this can be presumed that the electrical insulation of the insulation film 101 decreased due to the diffusion of silver ions into the overall insulation film. The ion implantation concentration in this case was $1 \times 10^{15}$ ions/cm$^2$, and the film thickness of the insulation film 101 was about 50 nm. It follows that the volumetric concentration was about $2 \times 10^{20}$ ions/cm$^3$.

Consequently, the particle size of the particles 102 is preferably not less than 0.2 nm, further preferably, not less than 0.4 nm and, more preferably, about 1 nm. It was further found that the concentration at places where no particles are present or where the particle size is less than 0.4 nm is not more than about $2 \times 10^{20}$ ions/cm$^3$.

In addition, preferably, it is desired to utilize the Coulomb blockade effect as already described. In order that the Coulomb blockade effect becomes remarkable, the energy necessary for making the electric charge broken away from a particle 102 should be sufficiently greater than the thermal energy due to the ambient temperature in consideration of the capacity of the particle 102. For this purpose, the radius that the particle 102 should have when the particle 102 is assumed to be a perfect conductive sphere can be presumed to be about 0.5 nm to 1 nm. The Coulomb blockade effect itself becomes more remarkable as the particle size of the particle 102 becomes smaller. However, a high voltage is needed across the first and second electrodes 111 and 112 when the particle size of the particle 102 is extremely small, and therefore, the extremely small particle size is not preferable from the viewpoint of device applications.

Moreover, negative ion implantation was performed to form the conductive particles 102 in the silicon oxide film 101. Therefore, the resulting silicon oxide film 101 found to have quite a high quality equivalent to that of a single thermal oxide film. Moreover, the processing time is reduced in comparison with cases of CVD or the like, and therefore, satisfactory productivity is achieved.

Moreover, according to the negative ion implantation, variations in the distribution of particles due to electrification can be suppressed as described above. Therefore, the variations in the distribution of the particles 102 in the thickness direction of the silicon oxide film 101 can be suppressed. Therefore, the particle container 113 can be formed into a thin film, allowing a scale-down to be achieved. When the particle container 113 is formed into a thin film as shown above, the effective electric field applied to the particle container 113 becomes stronger than otherwise even with the same voltage applied across the first and second electrodes 111 and 112. Therefore, it becomes possible to lower the voltage for operating the resistance-changing function body 100, and excellent productivity and low power consumption property can be obtained.

As schematically shown in FIG. 1A, the concentration of the silver element constituting the particles 102 in the silicon oxide film 101 is not uniform but higher and lower, that is, regions of lower concentration of the silver element are present in adjacency to regions of higher concentration of the silver element along the thickness directions V1, V2 of the silicon oxide film 101, respectively. Similarly, the density of the particles 102 in the silicon oxide film 101 is not uniform but higher and lower, that is, regions of lower density of the particles 102 are present in adjacency to regions of higher density of the particles 102 along the thickness directions V1, V2 of the silicon oxide film 101. Similarly, the size of the particles 102 in the silicon oxide film 101 is not uniform but higher and lower, that is, regions of smaller size of the particles 102 are present in adjacency to regions of larger size of the particles 102 along the thickness directions V1, V2 of the silicon oxide film 101. In these cases, it becomes achievable to suppress possibilities that the current becomes excessively hard flowing or excessively easy flowing with respect to the thickness directions V1, V2 of the silicon oxide film 101, i.e., directions in which the first electrode 111 and the second electrode 112 are opposed to each other. Accordingly, stable characteristics of the resistance-changing function body 100 can be obtained.

Moreover, with oblique implantation performed for the negative ion implantation, spreading of the distribution of the particles 102 with respect to the thickness direction of the silicon oxide film 101 can be suppressed. Accordingly, the particle container 113 can be formed into a thin film suitably for scale-down.

Figure 4:
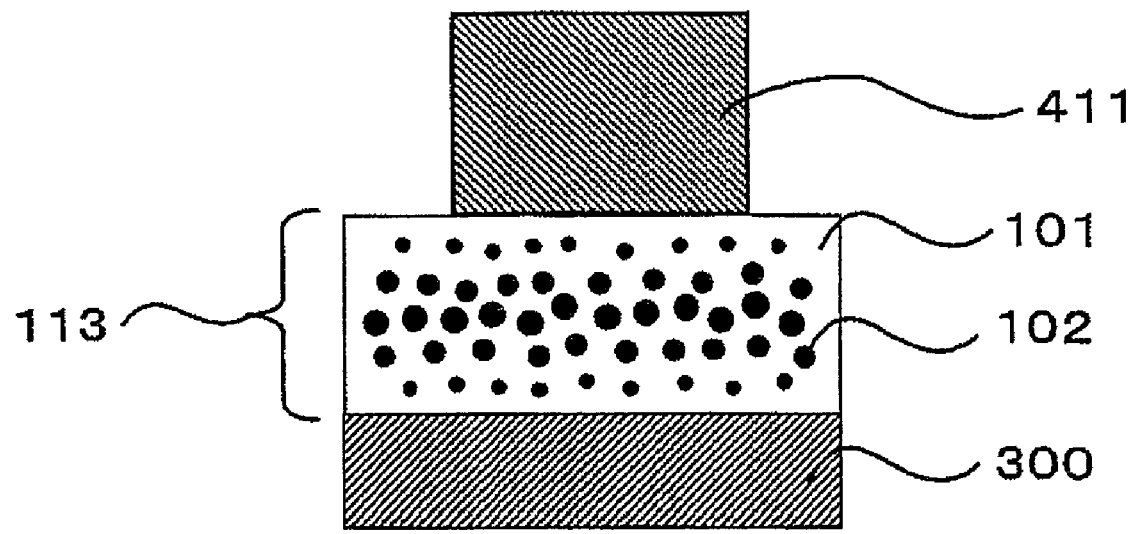
FIG. 4 is a view showing another aspect of the memory.
Figure 5:
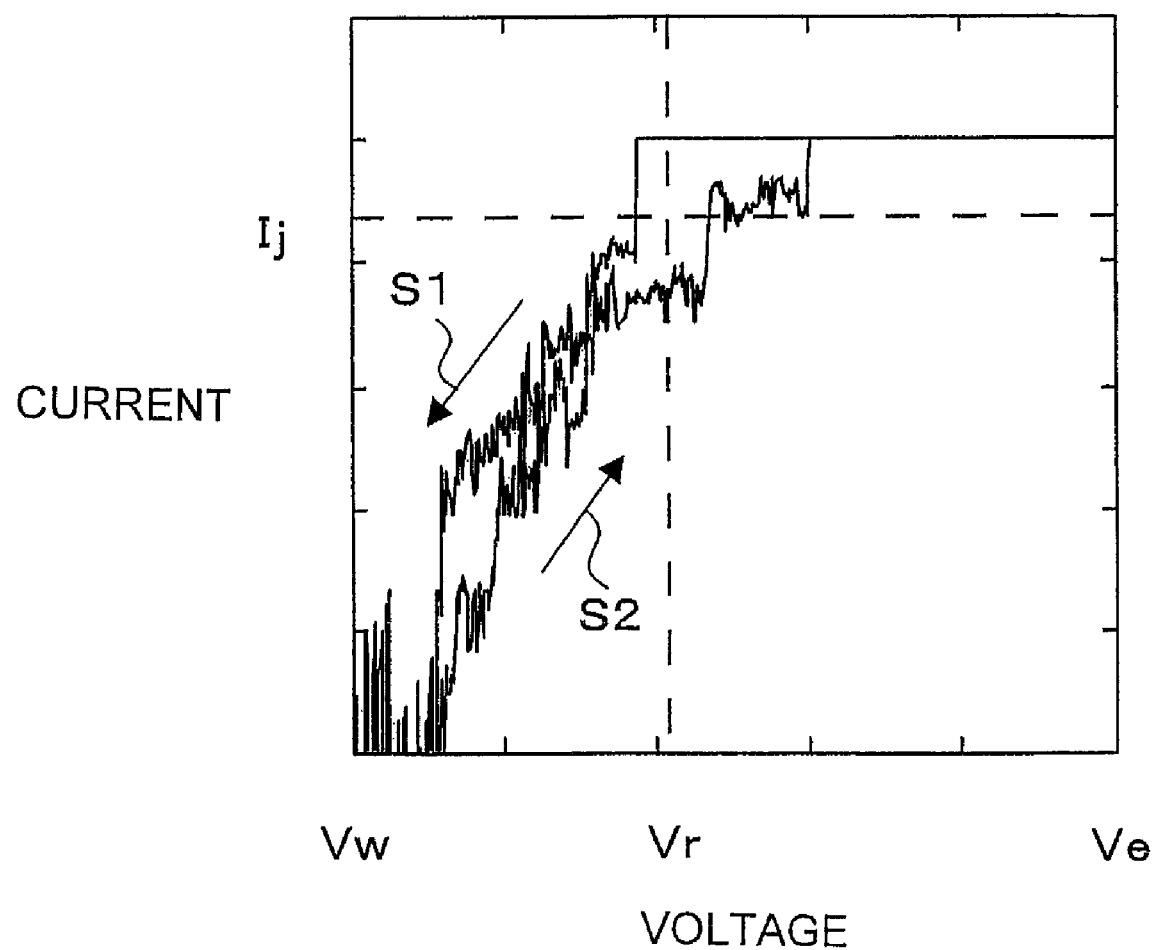
FIG. 5 is a chart for explaining the memory operation of the memory of FIG. 4.

FIG. 4 shows a mode including an electrode 411 as a first electrode formed by evaporating and patterning an Al film (where unshown power source and current sensor are connected to the electrode 411). FIG. 5 is a graph showing current-voltage (I-V) characteristics at normal temperature (25° C.) of the resistance-changing function body 100 having this electrode 411. Operation for discriminating the storage state with the use of the resistance-changing function body 100 as a memory will be described by using this graph.

These characteristics were obtained by grounding the silicon substrate 300, applying a voltage to the first electrode 411 and observing a current flowing through the first electrode 411, as in the case of FIG. 2. First of all, when the voltage was varied continuously from higher to lower side, then the current decreased while showing stepwise variations unique to the Coulomb blockade effect as indicated by arrow S1 in FIG. 5. Subsequently, in turn, when the voltage was varied continuously toward higher side, then the current increased while showing stepwise variations unique to the Coulomb blockade effect as indicated by arrow S2 as shown in FIG. 5. As can be seen from FIG. 5, there also appeared a hysteresis in the current-voltage (I-V) characteristics.

Now, for example, as shown in FIG. 5, a write voltage Vw and an erase voltage Ve are set. Then, a read voltage Vr for discriminating the written state from the erased state is so set that the voltage becomes the central voltage value of the memory window (hysteresis), and a reference current value Ij that serves as a criterion for discrimination is set. The storage state of this memory is discriminated by reading the magnitude of the current when the voltage Vr is applied according to the relation of the magnitude between the read value of the current and Ij. For example, the state is an erased state (logic 0) when the read value of the current is greater than Ij, and the state is a written state (logic 1) when the read value of the current is smaller than Ij.

As described above, the resistance-changing function body 100 can be used as a memory of at least binary or higher value. Hereinbelow, the resistance-changing function body may also be referred to as memory function body.

Figure 6A:
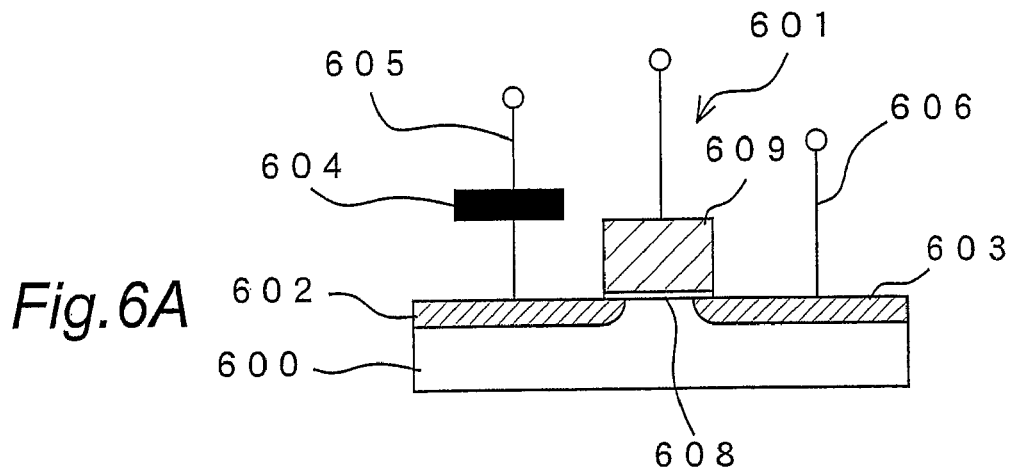
FIG. 6A is a view schematically showing a memory cell including a resistance-changing function body and a select transistor.

FIG. 6A schematically shows a mode in which a select transistor 601 for selecting the memory function body 604 (same as the foregoing particle container 113) is electrically connected in series and integrated on a silicon substrate 600. The select transistor 601 is a normal MOS transistor and includes a drain region 602 and a source region 603, which are formed mutually apart on the surface of the silicon substrate 600, a gate oxide film 608 that covers the substrate surface between the regions and a gate electrode 609. It is to be noted that contacts 605 and 606 are connected to the drain region 602 and the source region 603, respectively.

Figure 6B:
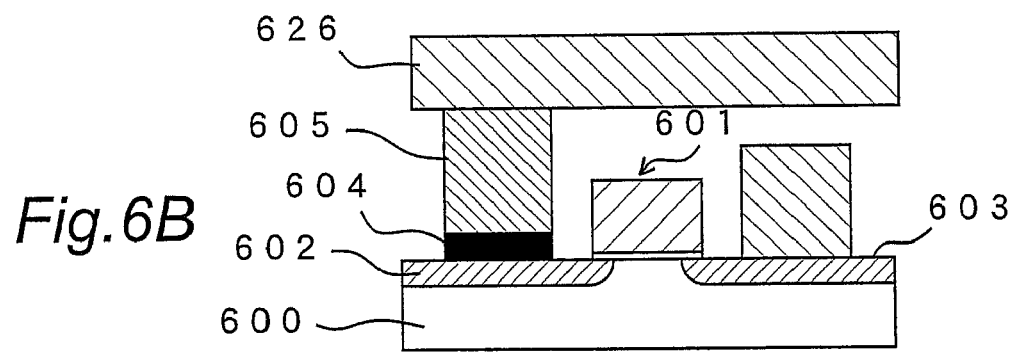
FIGS. 6B to 6D are views showing its concrete constructions, respectively.
Figure 6C:
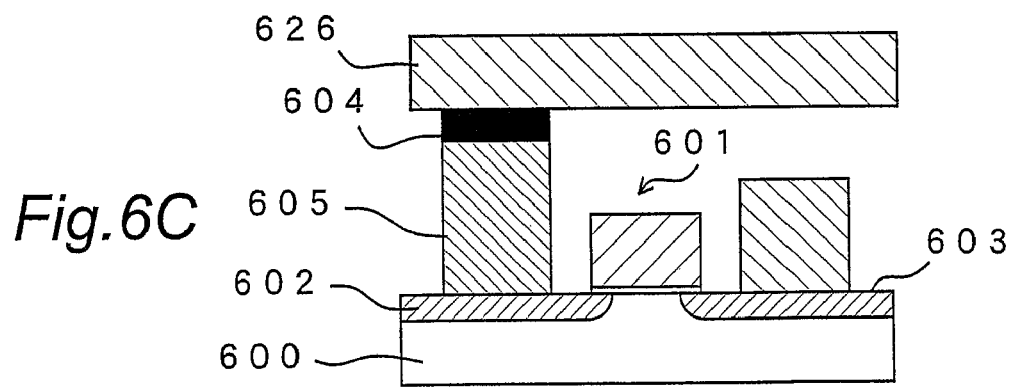
Figure 6D:
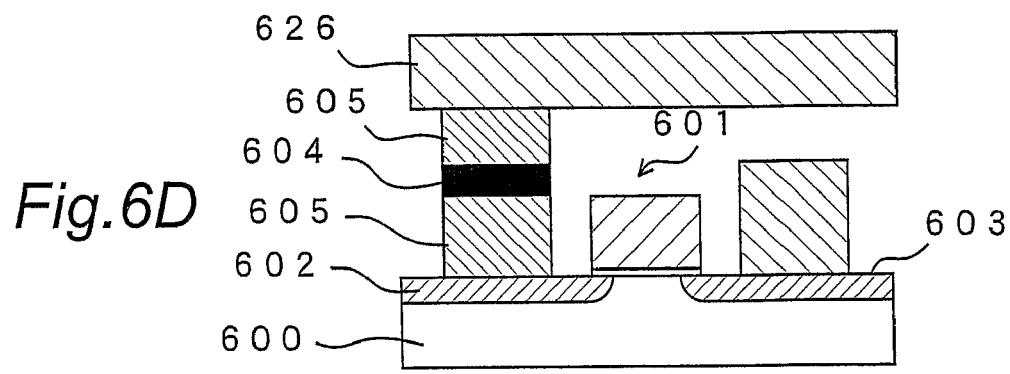

In this example, the memory function body 604 is provided as part of the contact 605 connected to the drain 602 of the select transistor 601. In concrete, FIG. 6B shows an example in which the memory function body 604 is provided so as to be in contact with the drain region 602. FIG. 6C shows an example in which the memory function body 604 is provided in contact with a metal interconnection of a bit line 626. FIG. 6D shows an example in which the memory function body 604 is provided partway in the contact 605.

Figure 7:
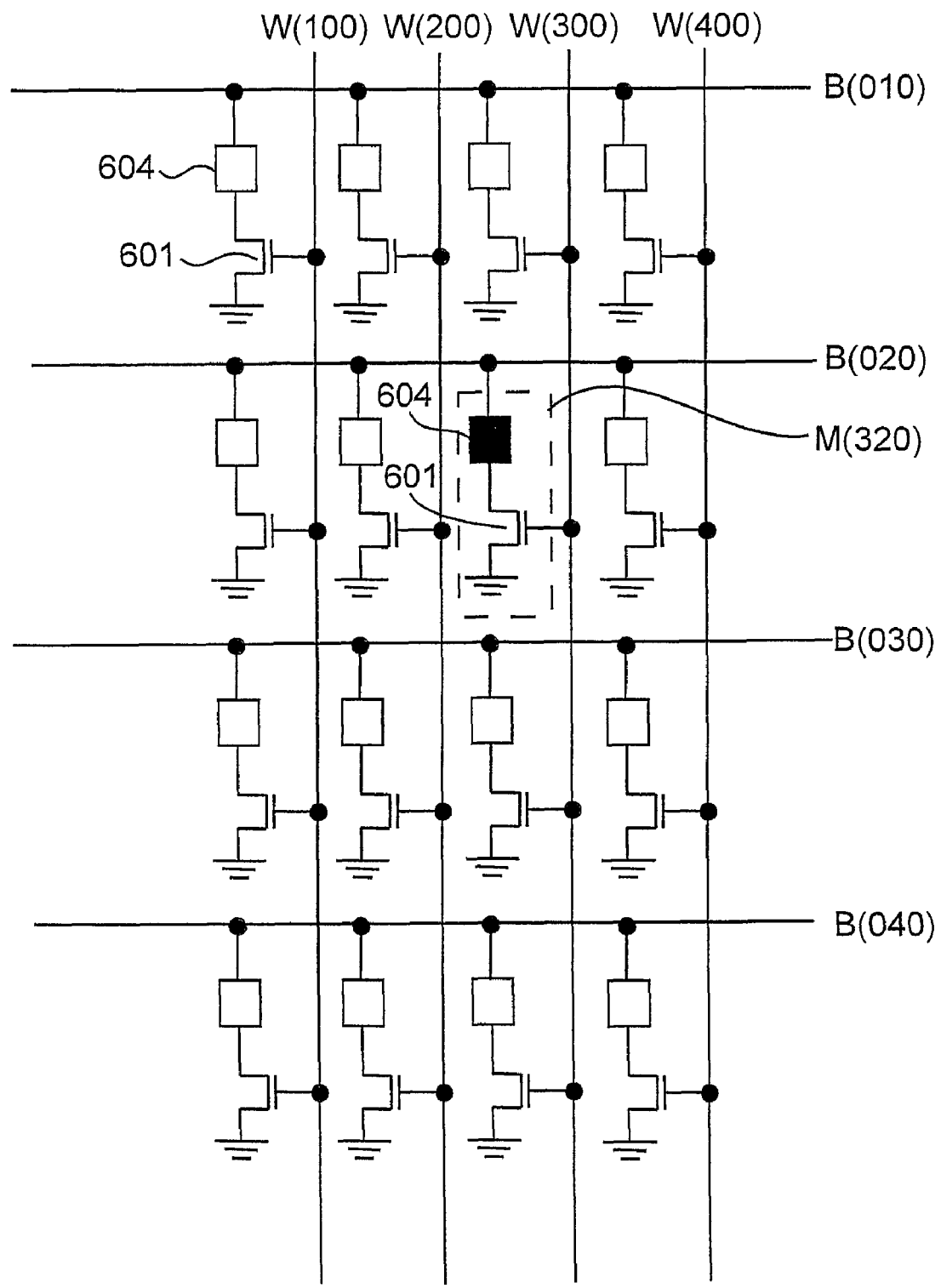
FIG. 7 is a diagram illustrating by way of example the circuit construction of a memory provided with memory cells that include the resistance-changing function body and a select transistor, which are arranged in a matrix form.

FIG. 7 shows the circuit construction of a memory provided with memory cells M each of which includes the aforementioned memory function body and select transistor, the memory cells being arranged in a matrix form. Word lines W and bit lines B are extended in the direction of row and in the direction of column, respectively. The memory function body 604 and the select transistor 601 of each of the memory cells M are connected in series between the corresponding bit line B and the ground.

For example, in selecting the memory cell M(320), a voltage VH higher than the threshold voltage of the select transistor is applied to the word line W(300) connected to the memory cell, and a voltage of 0 V (ground potential) is applied to the other word lines W(100), W(200) and W(400). In addition, a voltage Vb necessary for write, read and erase is applied to the bit line B(020) connected to the memory cell M(320), and a voltage of, for example, 0 V, which causes neither write nor erase operation even if the select transistor is in the on-state, is given to the other bit lines B(010), B(030) and B(040).

By the above operation, a voltage of a potential difference of about Vb is applied to the memory function body 604 of the memory cell M(320), by which a memory operation is performed. Since the select transistor 601 is in the off-state or the potential of the bit line B is 0 V even if the select transistor 601 is in the on-state in the other memory cells, no voltage is applied to the memory function body, so that no memory operation is performed.

Figure 8:
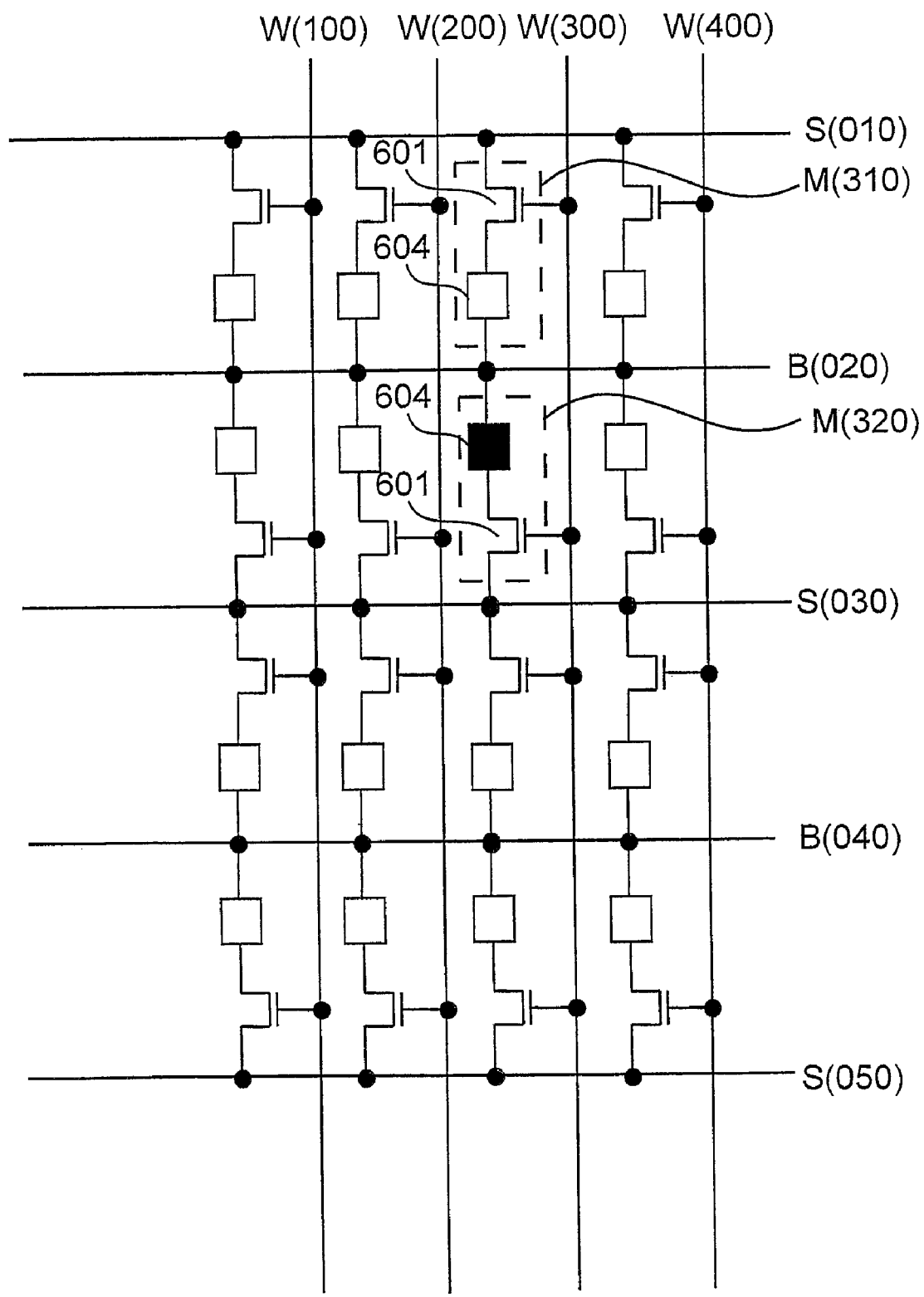
FIG. 8 is a diagram illustrating by way of example the circuit construction of a memory provided with memory cells that include the resistance-changing function body and a select transistor, which are arranged in a matrix form.

FIG. 8 shows the circuit construction of a memory provided with memory cells M each of which includes the aforementioned memory function body 604 and the select transistor 601, the memory cells being arranged in a matrix form. In this example, the arrangement of the memory function body 604 and the select transistor 601 are symmetrical (inverted) between memory cells M that are mutually adjacent in the direction of row, and the memory function body 604 and the select transistor 601 of each of the memory cells M are connected in series between the corresponding bit line B and source line S.

For example, in selecting the memory cell M(320), a voltage VH higher than the threshold voltage of the select transistor is applied to the word line W(300) connected to the memory cell, and a voltage of 0V (ground potential) is applied to the other word lines W. In addition, a voltage Vb necessary for write, read and erase is applied to the bit line B(020) connected to the memory cell M(320), and a voltage of, for example, Vb, which causes neither write nor erase operation of the memory cell M(310), is applied to the source line S(010). A voltage of, for example, 0 V, which causes neither write nor erase operation even if the select transistor is in the on-state, is applied to the other bit line (040) and source lines S(030) and S(050).

With the above arrangement, a voltage of a potential difference of about Vb is applied to the memory function body 604 of the memory cell M(320), by which the memory operation is performed. Since the select transistor 601 is in the off-state or the potential difference between the bit line B and the source line S is 0V even if the select transistor 601 is in the on-state in the other memory cells, no voltage is applied to the memory function body, so that no memory operation is performed.

Figure 9A:
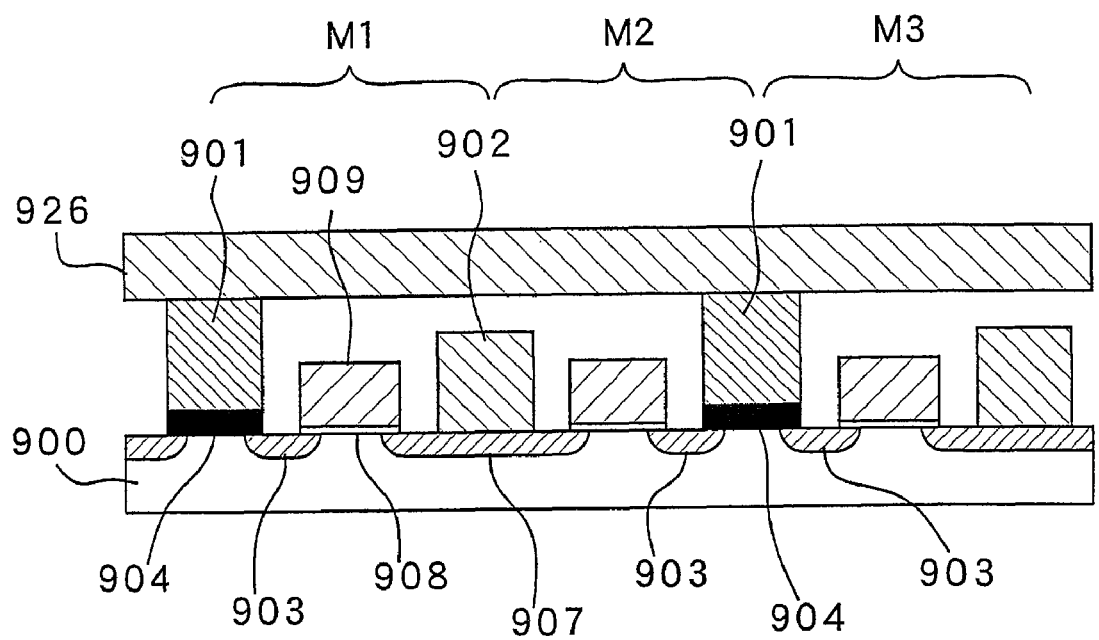
FIG. 9A is a view showing the cross-sectional structure of a memory provided with memory cells that include the resistance-changing function body and a select transistor.

FIG. 9A shows the cross-sectional structure of the memory of one embodiment in which a plurality of memory cells M1, M2, M3, . . . of the type such that the aforementioned memory function body and the select transistor are connected in series are integrated on a silicon substrate 900. The select transistor of each of the memory cells M includes a drain region 903 and a source region 907, which are formed mutually apart on the surface of the silicon substrate 900, a gate oxide film 908 that covers the substrate surface between the regions and a gate electrode 909. The mutually adjacent memory cells are constructed symmetrically with respect to a direction (transverse direction in FIG. 9) parallel to the substrate 900. Source regions 907 of the memory cells M1 and M2 are integrally continuously formed, and one source contact 902 is formed on this source region 907. That is, the source contact 902 is shared by the memory cells M1 and M2. Drain regions 903 and 903 of the memory cells M2 and M3 are isolated apart in the transverse direction, and one memory function body 904 (same as the foregoing particle container 113) and one bit contact 901 are formed over those drain regions 903 and 903. That is, the memory function body 904 is formed integrally continuously in the transverse direction so as to be in contact with the two drain regions 903 and 903. Moreover, the bit contact 901 is shared by the memory cells M2 and M3. A corresponding bit line 926 is connected to the bit contact 901.

Figure 9B:
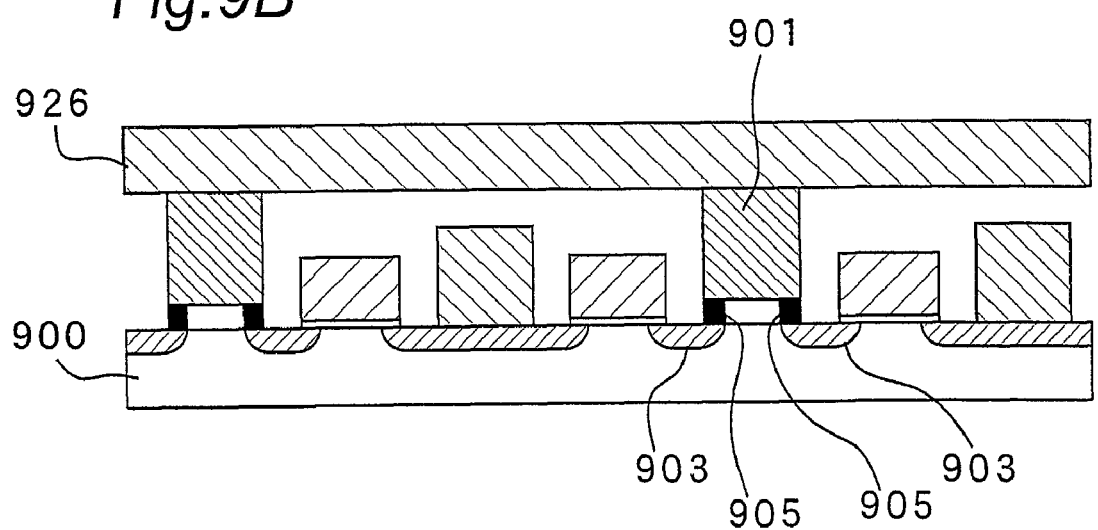
FIG. 9B is a view showing the portion that substantially performs memory operation in the resistance-changing function body of FIG. 9A.

In this construction, the regions that perform the memory operation in the memory function body 904 are limited to regions 905 and 905 which are interposed between the bit contact 901 and the drain regions 903 and 903 and to which a voltage is applied as shown in FIG. 9B. The memory function body 904 is basically an insulator although it contains conductive particles. Therefore, the remaining region (corresponding to the portion located between the regions 905 and 905) to which no effective voltage is applied in the memory function body 904 performs no memory operation.

Therefore, in this memory, the memory function body 904 operates as a 2-bit memory function body. Therefore, the occupation area of the memory function body 904 becomes about half in comparison with the case where one memory function body is formed on each of the drain regions 903. Moreover, the number of bit contacts 901 and source contacts 902 can be reduced to about half. Therefore, the occupation area per cell is reduced, and the integration density is improved.

Figure 10A:
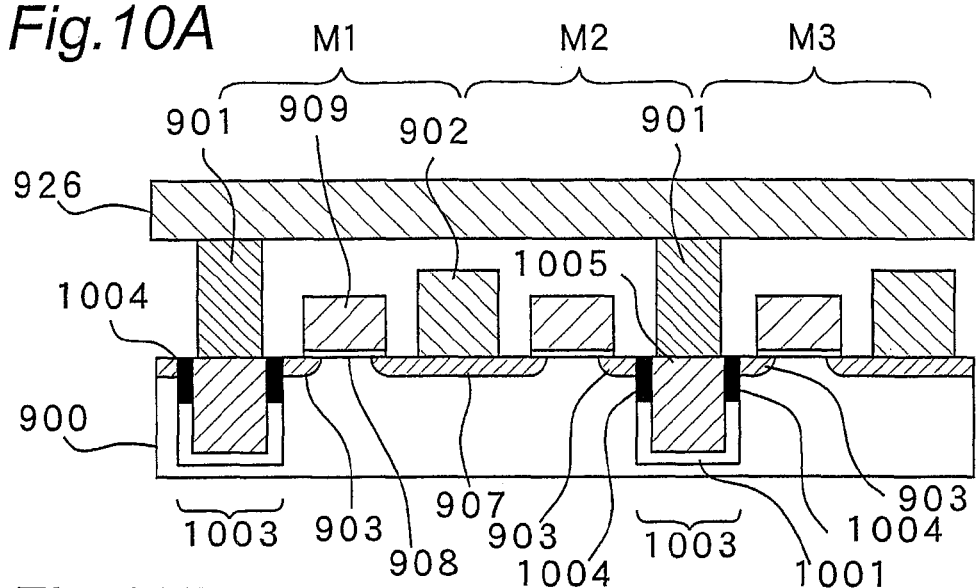
FIGS. 10A and 10B are views showing cross-sectional structures of a memory cell that includes the resistance-changing function body and a select transistor, respectively.
Figure 10B:
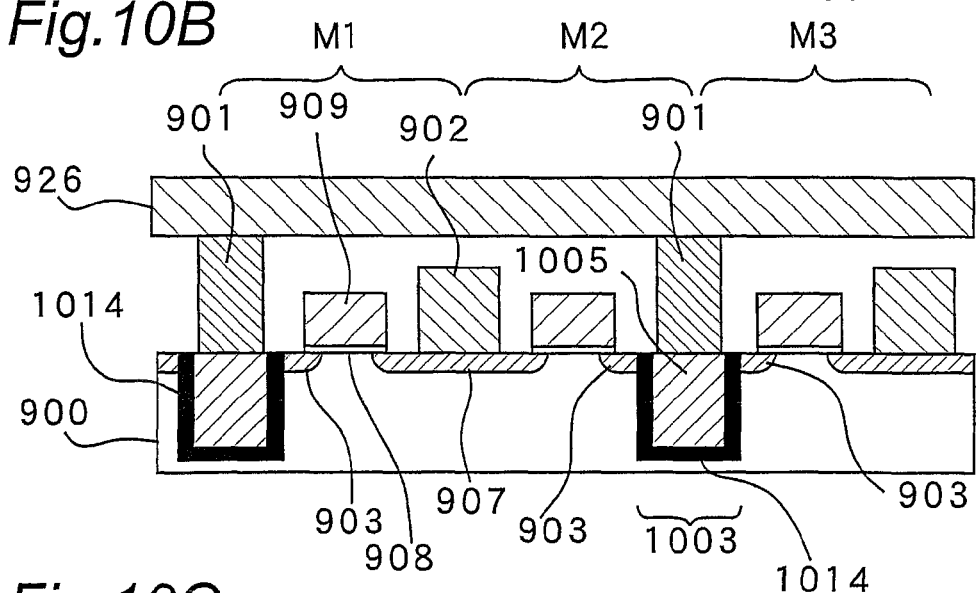

FIGS. 10A and 10B show modification examples of the memory shown in FIG. 9. It is to be noted that the same components as those already shown in the figures are denoted by same reference numerals, and no description is provided for them (also applicable hereinafter).

In these modification examples, the drain regions 903 and 903 of the mutually adjacent memory cells M2 and M3 are transversely isolated apart by a trench (groove) 1003 of a sectionally rectangular shape formed on the surface of the substrate 900. An insulation film 1001 is formed in a sectionally bracket-like shape along the substrate wall surfaces (inner walls of the trench) that define the trench 1003, and the inside of the insulation film 1001 is stuffed with a conductive substance (trench electrode) 1005 of, for example, polysilicon or metal. The trench electrode 1005 is electrically connected to a bit contact 1006.

In the memory of FIG. 10A, the conductive particles are contained only in the region near the substrate surface of the insulation film 1001, constituting a memory function body 1004. In this example, the memory function body 1004 reaches a depth deeper than that of the drain region 903 from the substrate surface. On the other hand, in the memory of FIG. 10B, conductive particles are contained in the whole region of the insulation film 1001, constituting a memory function body 1014.

Figure 10C:
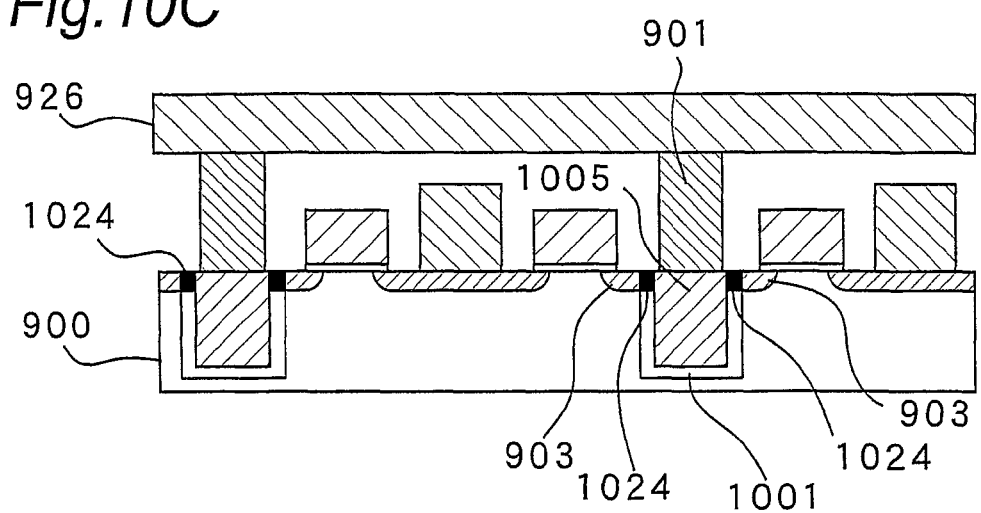
FIG. 10C is a view showing the portion that substantially performs memory operation in the resistance-changing function body of FIG. 10A.

Anyway, as shown in FIG. 10C, the regions that perform the memory operation in the memory function body 1004 are limited to regions 1024 and 1024, which are interposed between the trench electrode 1005 and the drain region 903 and to which a voltage is applied. The memory function body 1004 is basically an insulator although it contains the conductive particles. Therefore, the remaining region to which no effective voltage is applied in the memory function body 1004 performs no memory operation.

In these memories of FIGS. 10A and 10B, the occupation area of the memory function bodies 1004 and 1014 becomes about half like the memory of FIG. 9 in comparison with the case where one memory function body is formed on each of the drain regions 903. Moreover, the number of bit contacts 901 and source contacts 902 can be reduced to about half. Therefore, the occupation area per cell is reduced, and the integration density is improved.

Figure 11:
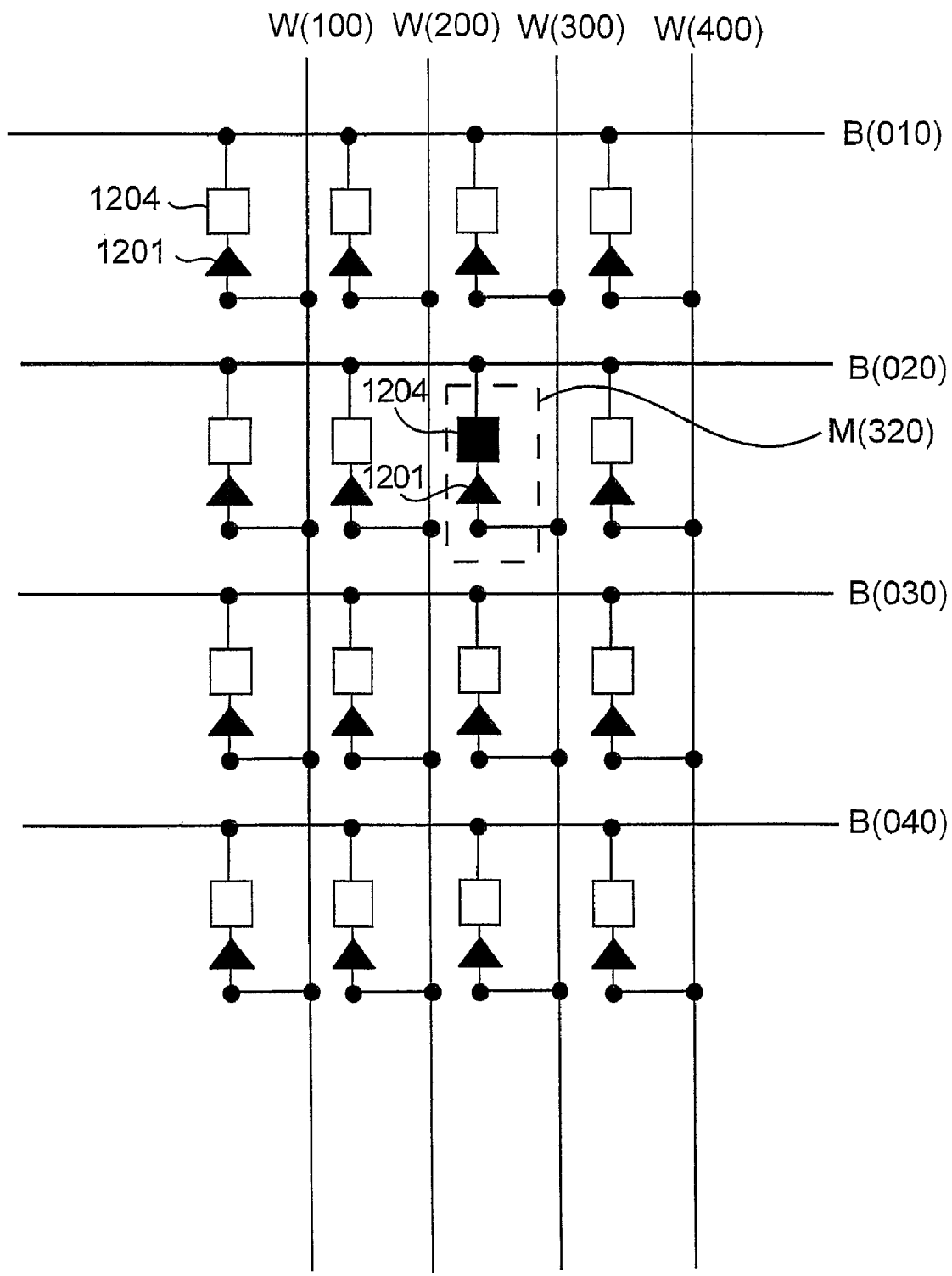
FIG. 11 is a diagram illustrating by way of example the circuit construction of a memory provided with memory cells that include the resistance-changing function body and a rectifying function body, which are arranged in a matrix form.

FIG. 11 shows the circuit construction of a memory provided with memory cells M each of which includes the aforementioned memory function body and a rectifying function body, the memory cells arranged in a matrix form. Word lines W and bit lines B are extended in the direction of row and in the direction of column, respectively. A memory function body 1204 (same as the foregoing particle container 113) and a rectifying function body 1201 of each of the memory cells M are connected in series between the corresponding bit line B and word line W. Each rectifying function body 1201 permits the flow of a current from the word line W to the bit line B through the memory function body 1204 and obstructs the flow of a current from the bit line B to the word line W through the memory function body 1204.

For example, in selecting the memory cell M(320), a positive voltage VH is applied to the word line W(300) connected to the memory cell, and a negative voltage VL, which provides a potential difference necessary for the desired operation of the write, read and erase in the memory function body 1204, is applied to the bit line B(020). Further, a voltage, which provides a potential difference that causes neither write nor erase in the memory function body 1204 even if the positive voltage VH is applied to the word line W, is applied to the other bit lines B(010), B(030) and B(010). For example, in order to render the potential difference zero, the voltage VH is applied. Likewise, the potential difference applied to the nonselected memory function body 1204 is rendered zero by applying the voltage VL to the other word lines W(100), W(200) and W(400).

By the above operation, a potential difference of about (VH−VL) is applied to the memory function body 1204 of the memory cell M(320), by which the memory operation is performed. The potential difference is zero or a voltage inverted with respect to the rectifying function body 1201 even if there is a potential difference in the other memory cells M. Therefore, the current is limited, and the memory function body 1204 performs no memory operation.

Otherwise, it is acceptable to employ a rectifying function body 1201 through which no current flows or only a current that is too small to cause the memory operation with a potential difference smaller than Vt even if a threshold value exists in the forward direction. It is to be noted that if the potential difference necessary for the memory operation of the memory function body 1204 is assumed to be Vm, then there holds an expression: Vt>(Vm/2). For example, in order to select the memory cell M(320), a positive voltage (Vm/2) is applied to the word line W(300) and a negative voltage −(Vm/2) is applied to the bit line B(020), giving a potential difference Vm necessary for the memory operation to the memory function body 1204. A voltage of 0 V is applied to the other word lines W and bit lines B. In this case, a maximum potential difference of (Vm/2) is applied to the nonselected memory cells M. However, since the current is limited by the rectifying function body 1201, no memory operation is performed.

FIGS. 12A to 12E shows various possible structures of the memory cells that include the aforementioned memory function body and the rectifying function body constructed of a pn junction.

Figure 12A:
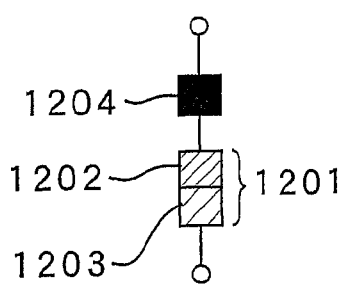
FIG. 12A is a view schematically showing a memory cell that includes the resistance-changing function body and a rectifying function body constructed of a pn junction.

FIG. 12A schematically shows a mode in which the memory function body 1204 (same as the foregoing particle container 113) and the rectifying function body 1201 are electrically connected in series. The rectifying function body 1201 includes a pn junction constructed of an n-type semiconductor 1202 and a p-type semiconductor 1203.

Figure 12B:
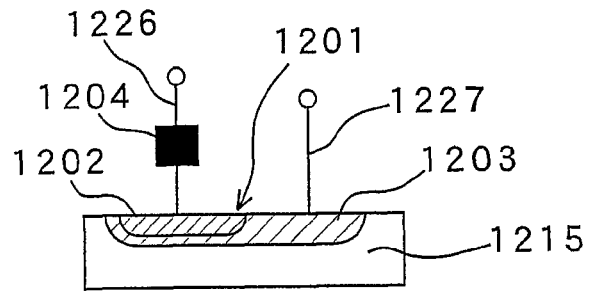
FIGS. 12B to 12E are views showing its concrete constructions, respectively.

FIG. 12B schematically shows a mode in which the rectifying function body 1201 in FIG. 12A is formed on a semiconductor substrate (e.g., silicon substrate) 1215. In this example, the p-type semiconductor region 1203 and the n-type semiconductor region 1202 of the rectifying function body 1201 are formed through successive implantation, diffusion and so on of impurities into the surface of the semiconductor substrate 1215 by a well-known method.

Figure 12C:
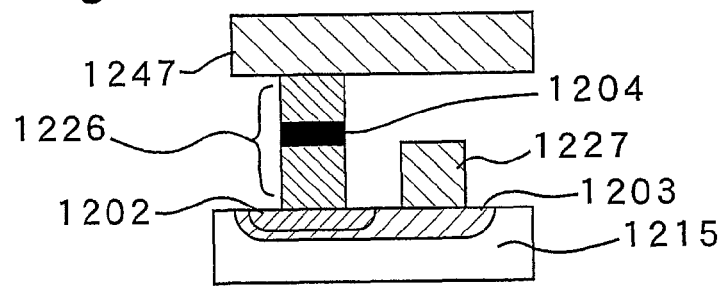
Figure 12D:
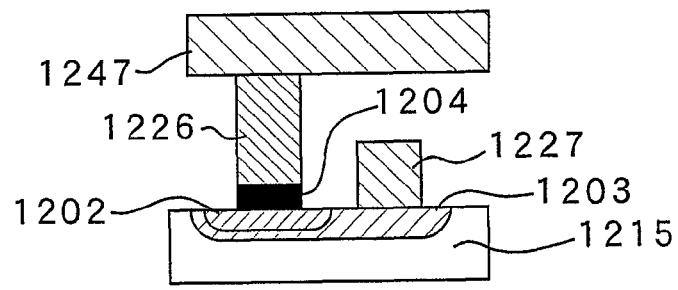
Figure 12E:
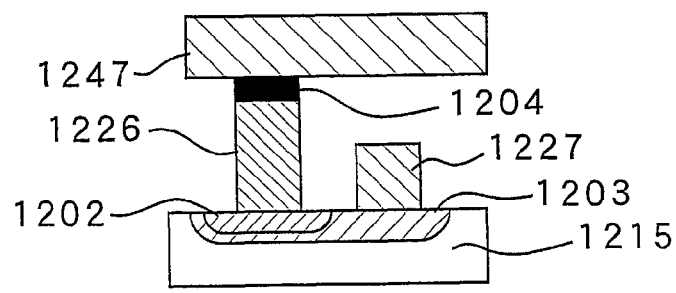

FIGS. 12C to 12E concretely show the arrangements of the memory function body 1204 in FIG. 12B. FIG. 12C is an example in which the memory function body 1204 is provided partway in a contact 1226. FIG. 12D is an example in which the memory function body 1204 is provided in contact with the n-type semiconductor region 1202. Moreover, FIG. 12E is an example in which the memory function body 1204 is provided in contact with a bit line 1247. The memory function body 1204 is formed by the aforementioned method, and the contacts 1226 and 1227 are formed by a well-known method.

FIGS. 13A to 13D shows various structures in the case where a memory function body and a rectifying function body constructed of a pn junction are included in each memory cell and the constituent elements are shared by mutually adjacent two memory cells. It is to be noted that contacts, which are expressed in a simplified style in FIGS. 13A to 13D, are formed by a well-known method.

Figure 13A:
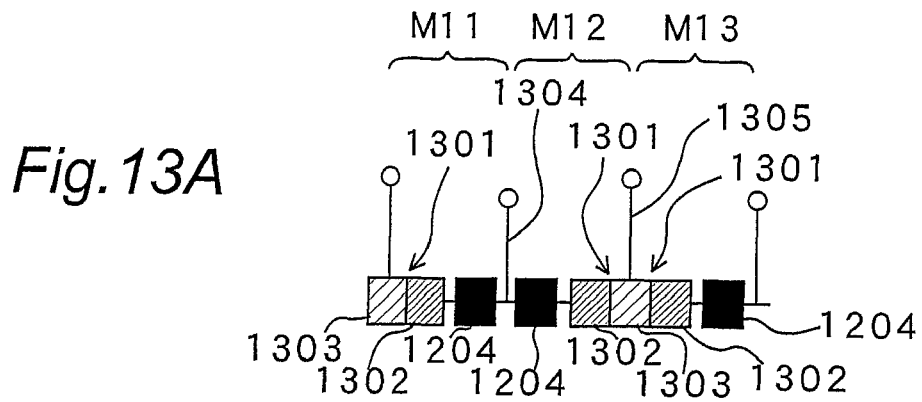
FIG. 13A is a view schematically showing a structure whose constituent elements are shared by mutually adjacent two memory cells that includes a resistance-changing function body and a rectifying function body constructed of a pn junction in each of the memory cells.

FIG. 13A schematically shows a mode in which memory cells M11, M12, M13, . . . including memory function bodies 1204 and rectifying function bodies 1301 are electrically connected in series. Mutually adjacent memory cells are symmetrically constructed. Each of the rectifying function bodies 1301 includes a pn junction constructed of an n-type semiconductor region 1302 and a p-type semiconductor region 1303. A word contact 1305 and a bit contact 1304 are electrically connected to the p-type semiconductor region 1303 and the memory function body 1204, respectively.

Figure 13B:
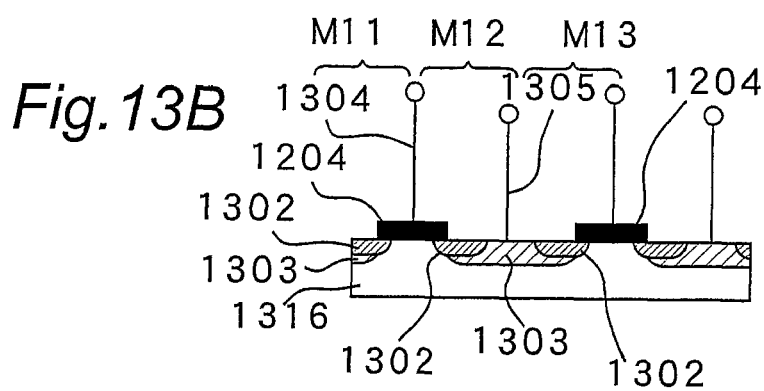
FIGS. 13B through 13D are views showing its concrete constructions, respectively.

FIG. 13B shows the cross-sectional structure of a memory in which the aforementioned plurality of memory cells M11, M12, M13, . . . are integrated on a silicon substrate 1316. The n-type semiconductor regions 1302 and 1302 are formed mutually apart in a direction (transverse direction in FIG. 13) parallel to the substrate 1316 between mutually adjacent memory cells M11 and M12, and one memory function body 1204 and one bit contact 1304 are formed over those n-type semiconductor regions 1302 and 1302. That is, the memory function body 1204 is formed integrally continuously in the transverse direction so as to be in contact with the two n-type semiconductor regions 1302 and 1302. The p-type semiconductor region 1303 is integrally continuously formed between mutually adjacent memory cells M12 and M13, and one word contact 1305 is formed on the region. If this arrangement is adopted, the occupation area per cell is reduced, and the integration density is improved.

In order to fabricate this memory, an oxide film (not shown) is first formed on the surface of the silicon substrate 1316, and the memory function body 1204 is formed by the aforementioned method. Next, the p-type semiconductor region 1303 and the n-type semiconductor region 1302 are formed through successive implantation, diffusion and so on of impurities into the surface of the silicon substrate 1316. At this time, no impurity is implanted into the region covered with the memory function body 1204. Subsequently, contacts 1304 and 1305 are formed by a well-known method.

Figure 13C:
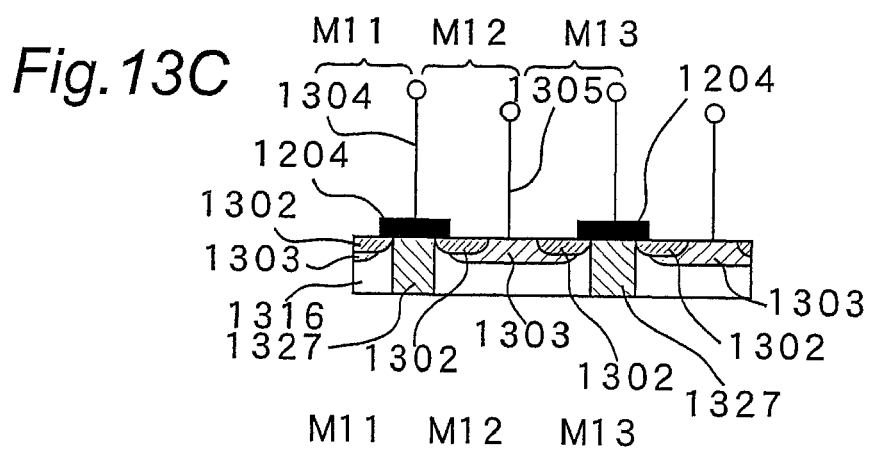

FIG. 13C shows a modification example of the memory shown in FIG. 13B. In this modification example, an element isolation region 1327 is provided between the n-type semiconductor regions 1302 and 1302 of the mutually adjacent memory cells M11 and M12 by a well-known method. If this arrangement is adopted, the mutually adjacent memory cells M11 and M12 can reliably be electrically isolated from each other.

Figure 13D:
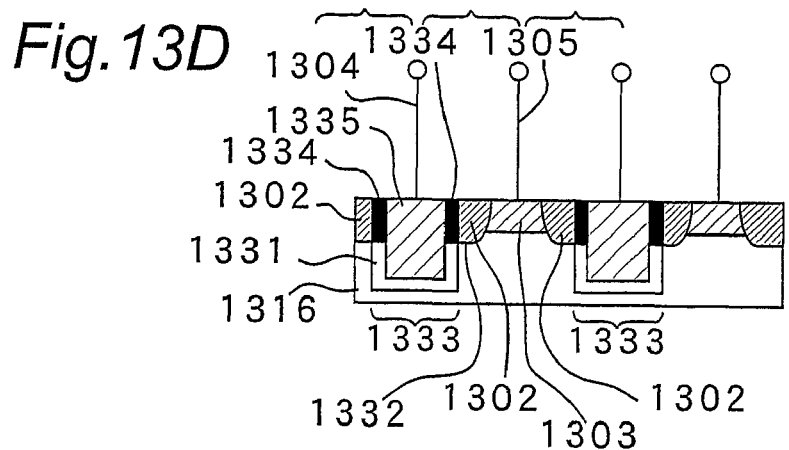

FIG. 13D shows a further modification example. In this modification example, a trench (groove) 1333 of a sectionally rectangular shape is provided between the n-type semiconductor regions 1302 and 1302 of the mutually adjacent memory cells M11 and M12 by a well-known method. An insulation film 1331 is formed in a sectionally bracket-like shape along the substrate wall surfaces (inner walls of the trench) that define the trench 1333, and the inside of the insulation film 1331 is stuffed with a conductive substance (trench electrode) 1335 of, for example, polysilicon or metal. The trench electrode 1335 is electrically connected to the bit contact 1304. Then, conductive particles are contained only in the region near the substrate surface of the insulation film 1331, constituting a memory function body 1334. In this example, the memory function body 1334 reaches a depth approximately equal to the depth of the n-type semiconductor region 1302 from the substrate surface. If this arrangement is adopted, the mutually adjacent two memory cells M11 and M12 can reliably be electrically isolated from each other.

Figure 14:
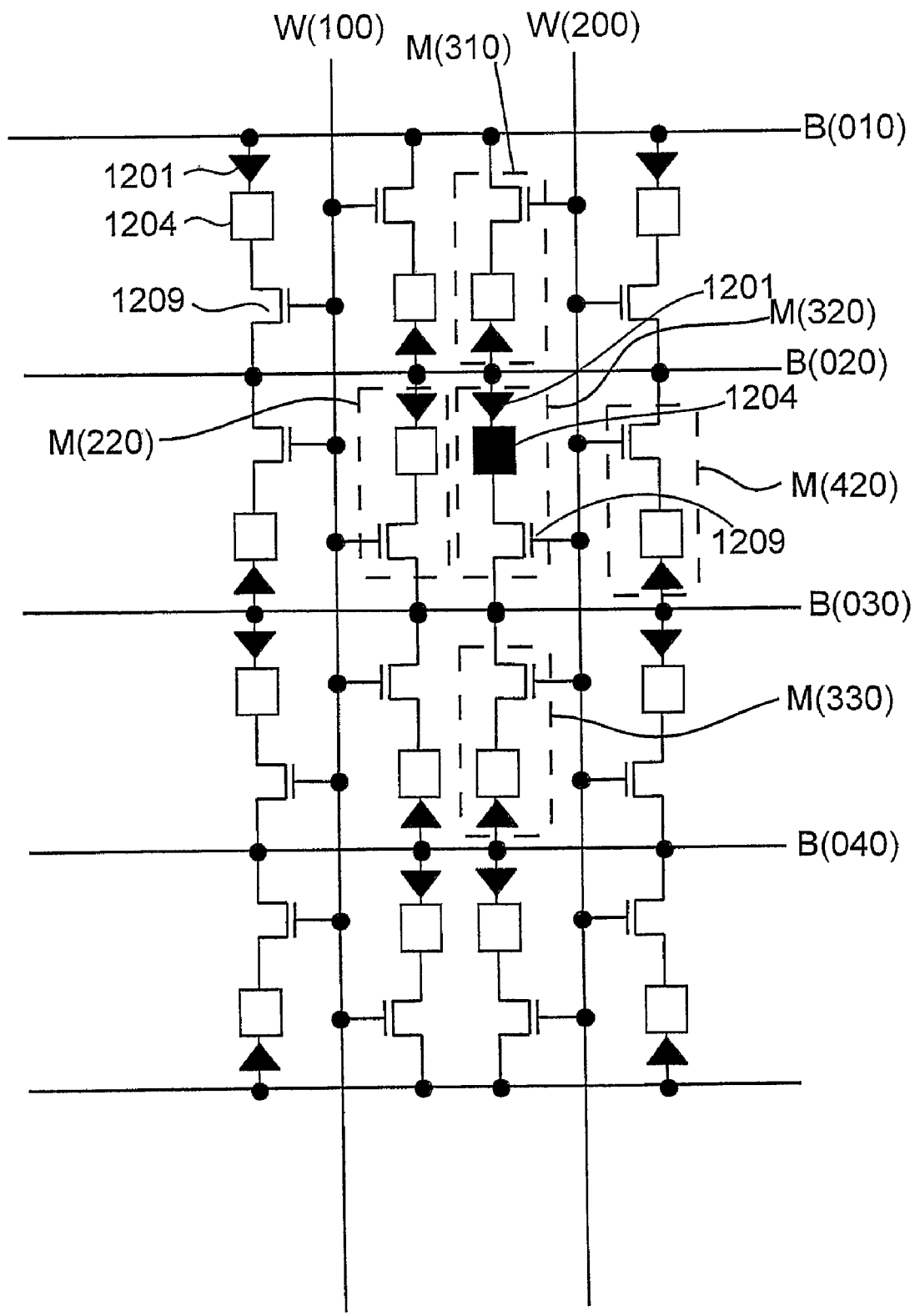
FIG. 14 is a diagram illustrating by way of example the circuit construction of a memory provided with memory cells that include the resistance-changing function body, the rectifying function body and a select transistor, which are arranged in a matrix form.

FIG. 14 shows the circuit construction of a memory provided with memory cells M each of which includes the aforementioned memory function body, a rectifying function body and a select transistor, the memory cells being arranged in a matrix form. Word lines W and bit lines B are extended in the direction of row and in the direction of column, respectively. In this example, the arrangement of the memory function body 1204, the rectifying function body 1201 and the select transistor 1209 (same as the foregoing select transistor 601) is symmetrical (inverted) between the memory cells M that are mutually adjacent in the direction of row. Moreover, the arrangement of the memory function body 1204, the rectifying function body 1201 and the select transistor 1209 is symmetrical (inverted) between the memory cells M that are mutually adjacent via a word line W in the direction of column. The memory function body 1204, the rectifying function body 1201 and the select transistor 1209 of each memory cell M are connected in series between the corresponding bit line B and bit line B. It is to be noted that each bit line B is switched over to operate also as a source line.

The memory cell M(320) is assumed as a first cell. With regard to it, memory cells M(310) and M(330), which are mutually adjacent in the direction of row, are assumed as a second cell and a fourth cell, respectively, and the memory cells M(220) and M(420), which are mutually adjacent in the direction of column, are assumed as a third cell and a fifth cell, respectively. The first cell M(320) and the second cell M(310) have the bit line B(020) shared, the word line W(200) and the source lines B(010) and B(030) unshared. The first cell M(320) and the third cell M(220) have the bit line B(020) shared, the source line B(030) shared and the word lines W(200) and W(100) unshared. The first cell M(320) and the fourth cell M(330) have the source line B(030) shared, the word line W(200) shared and the bit lines B(020) and B(040) unshared. The first cell M(320) and the fifth cell M(420) have the word line W(200) shared. The source line B(030) of the first cell M(320) and the bit line B(030) of the fifth cell M(420) are shared, and the bit line B(020) of the first cell M(320) and the source line B(020) of the fifth cell M(420) are shared.

For example, in selecting the first cell M(320), a voltage Vo that turns on the select transistor 1209 is applied to the word line W(200), and a voltage Vu that turns off the select transistor 1209 is applied to the other word line W(100). In addition, a high voltage VH is applied to the bit lines B(010) and B(020), and a low voltage VL is applied to the other bit lines B(030) and B(040). It is to be noted that a potential difference (VH−VL) is assumed to be a potential difference with which a forward current sufficient for the memory operation of the memory cell M flows.

With the above arrangement, the potential difference and the forward current necessary for the memory operation occur in the first cell M(320).

The cells, which are mutually adjacent in the direction of row with respect to the first cell M(320) sharing the bit lines B(020) and B(030) with the first cell M(320), i.e., the second cell M(310) and the fourth cell M(330) have no potential difference (no voltage is applied) regardless of whether the select transistor 1209 is turned on or off and no current flows, so that no memory operation is performed.

The cell, which is adjacent to the first cell M(320) in the direction of column and which does not share the word line W(200) but shares both the bit lines B(020) and B(030) with the first cell M(320), i.e., the third cell M(220) has no current flow necessary for the memory operation since the select transistor 1209 is off, so that no memory operation is performed.

The cell, which is adjacent to the first cell M(320) in the direction of column and which shares all of the first cell M(320), the bit lines B(020) and B(030) and the word line W(200), i.e., the fifth cell M(420) has no current flow necessary for the memory operation since only a reverse current flows due to the rectifying function body 1201, so that no memory operation is performed.

This memory is able to share the bit line and the word line and therefore makes it possible to reduce the number of interconnections and largely suppress increases in the occupation area attributed to the interconnections.

FIGS. 15A to 15E shows various possible structures of the memory cell that includes the aforementioned memory function body and the rectifying function body constructed of a Schottky junction.

Figure 15A:
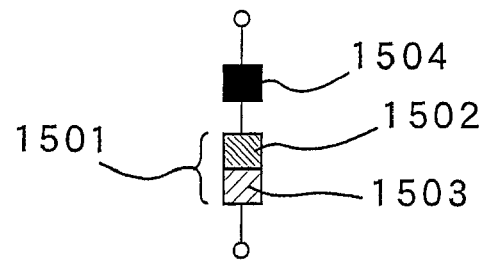
FIG. 15A is a view schematically showing a memory cell that includes the resistance-changing function body and a rectifying function body constructed of a Schottky junction.

FIG. 15A schematically shows a mode in which a memory function body 1504 (same as the foregoing particle container 113) and a rectifying function body 1501 are electrically connected in series. The rectifying function body 1501 includes a Schottky junction constructed of a metal 1502 and an n-type semiconductor 1503.

Figure 15B:
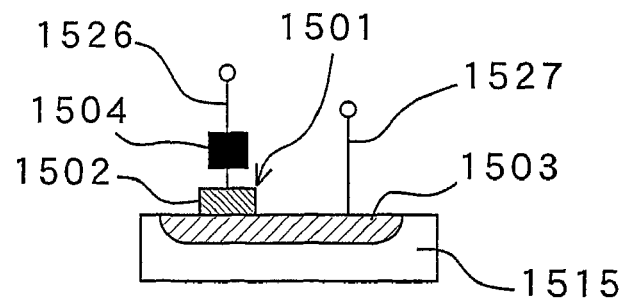
FIGS. 15B through 15E are views showing its concrete constructions, respectively.

FIG. 15B schematically shows a mode in which the rectifying function body 1501 in FIG. 15A is formed on a semiconductor substrate (e.g., silicon substrate) 1515. In this example, the n-type semiconductor region 1503 of the rectifying function body 1501 is formed by the implantation, diffusion and so on of impurities into the surface of the semiconductor substrate 1515 by a well-known method. A metal 1512 is formed on the region, forming a Schottky junction between the metal 1502 and the n-type semiconductor 1503. A memory function body 1504 is provided on the metal 1502 via a contact 1526. The metal 1502 and the contact 1526 may be formed of the same material, and the number of processes can be reduced because of the needlessness of process division, achieving excellent productivity.

Figure 15C:
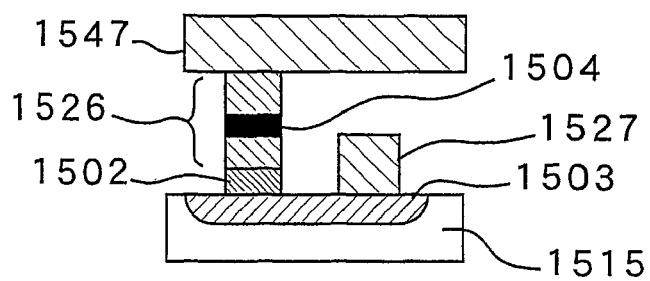
Figure 15D:
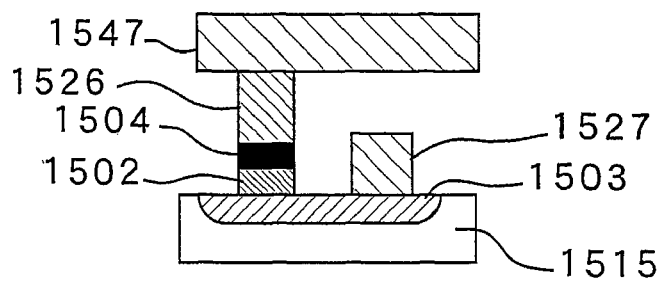

FIGS. 15C and 15D concretely show the arrangement of the memory function body 1504 in FIG. 15B. FIG. 15C shows an example in which the memory function body 1504 is provided partway in the contact 1526. FIG. 15D shows an example in which the memory function body 1504 is provided in contact with the metal 1502.

In this case, in order to form the Schottky junction between the metal and the semiconductor, the impurity concentration of the semiconductor (regardless of whether n-type or p-type) should preferably have a low concentration of, for example, less than $10^{18}$/cm$^3$. This is because an ohmic junction is disadvantageously formed when the impurity concentration of the semiconductor is extremely high. Whether the semiconductor is made to have an n-type or p-type doping depends on which way the rectification direction is directed. For example, if the semiconductor is made to have an n-type doping, then the forward direction of the metal-to-n-type semiconductor Schottky junction is the direction directed from the metal to the n-type semiconductor. That is, electrons move from the n-type semiconductor toward the metal.

Figure 15E:
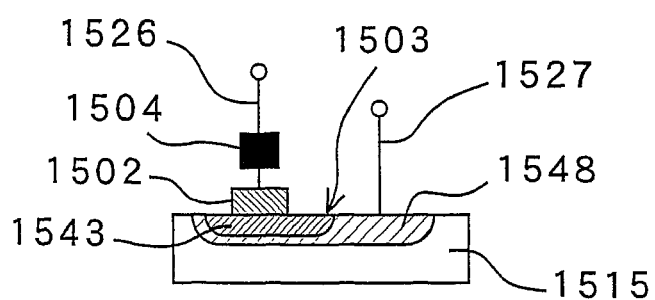

FIG. 15E shows a mode in which the aforementioned n-type semiconductor region 1503 is constructed of a lightly doped n-type semiconductor layer 1543 put in contact with the metal 1502 and a heavily doped n-type semiconductor layer 1548 that surrounds the layer and is in contact with a contact 1527. For example, the impurity concentration of the heavily doped n-type semiconductor layer 1548 is assumed to exceed about $10^{20}$/cm$^3$. This is an example provided with a resistive semiconductor layer 1548. With this arrangement, a Schottky junction can be formed between the layer and the metal 1502, and an ohmic junction can be formed between the layer and the contact 1527. Moreover, the resistance of the n-type semiconductor region 1503 (heavily doped n-type semiconductor layer 1548) can be reduced, making it possible to improve the operation speed and reduce power consumption.

In order to make an ohmic junction at the junction between the contact and the semiconductor layer, it is possible to use a method for increasing the impurity concentration of the semiconductor layer, a method for forming metallic silicide at the junction portion or the like.

FIGS. 16A to 16D show various structures in the case where a memory function body and a rectifying function body constructed of a Schottky junction are included in each memory cell and the constituent elements are shared by two mutually adjacent memory cells. It is to be noted that contacts, which are expressed in a simplified style in FIGS. 16A to 16D, are formed by a well-known method.

FIG. 16A schematically shows a mode in which memory cells M21, M22, M23, . . . including memory function 100 bodies 1504 and rectifying function bodies 1601 are electrically connected in series. Mutually adjacent memory cells are symmetrically constructed. Each of the rectifying function bodies 1601 includes a Schottky junction constructed of an n-type semiconductor region 1602 and a metal layer 1603. A bit contact 1605 and a word contact 1604 are electrically connected to the metal layer 1603 and the memory function body 1504, respectively.

FIG. 16B shows the cross-sectional structure of a memory in which the aforementioned plurality of memory cells M21, M22, M23, . . . are integrated on a silicon substrate 1616. The n-type semiconductor regions 1602 and 1602 are formed mutually apart in a direction (transverse direction in FIG. 16) parallel to the substrate 1616 between mutually adjacent memory cells M21 and M22, and one memory function body 1504 and one word contact 1604 are formed over those n-type semiconductor regions 1602 and 1602. That is, the memory function body 1504 is formed integrally continuously in the transverse direction so as to be in contact with the two n-type semiconductor regions 1602 and 1602. The metal layer 1603 is integrally continuously formed between mutually adjacent memory cells M22 and M23, and one bit contact 1605 is formed on the layer. If this arrangement is adopted, the occupation area per cell is reduced, and the degree of integration is improved.

In order to fabricate this memory, an oxide film (not shown) is first formed on the surface of the silicon substrate 1616, and the memory function body 1504 is formed by the aforementioned method. Next, an n-type semiconductor region 1602 is formed by the implantation, diffusion and so on of impurities successively into the surface of the silicon substrate 1616. At this time, no impurity is implanted into the region covered with the memory function body 1504. Next, a metal layer 1603 is formed so as to form a Schottky junction with the n-type semiconductor region 1602. Subsequently, contacts 1604 and 1605 are formed by a well-known method.

FIG. 16C shows a modification example of the memory shown in FIG. 16B. In this modification example, an element isolation region 1627 is provided between the n-type semiconductor regions 1602 and 1602 of the mutually adjacent memory cells M21 and M22 by a well-known method. If this arrangement is adopted, the mutually adjacent memory cells M21 and M22 can reliably be electrically isolated from each other. Moreover, the n-type semiconductor region 1602 is constructed of a lightly doped n-type semiconductor layer 1643 put in contact with the metal layer 1603 and a heavily doped n-type semiconductor layer 1648 that surrounds the layer and is put in contact with the memory function body 1504. With this arrangement, the resistance of the n-type semiconductor region 1602 (heavily doped n-type semiconductor layer 1648) can be reduced, making it possible to improve the operation speed and reduce power consumption.

FIG. 16D shows a further modification example. In this modification example, a trench (groove) 1633 of a sectionally rectangular shape is provided between the n-type semiconductor regions 1602 and 1602 of the mutually adjacent memory cells M21 and M22 by a well-known method. An insulation film 1631 is formed into a sectionally bracket-like shape along the substrate wall surfaces (inner walls of the trench) that define the trench 1633, and the inside of the insulation film 1631 is stuffed with a conductive substance (trench electrode) 1635 of, for example, polysilicon or metal. The trench electrode 1635 is electrically connected to the word contact 1604. Then, conductive particles are contained only in the region near the substrate surface of the insulation film 1631, constituting a memory function body 1634. In this example, the memory function body 1634 reaches a depth approximately equal to the depth of the n-type semiconductor region 1602 from the substrate surface. If this arrangement is adopted, the mutually adjacent two memory cells M21 and M22 can reliably be electrically isolated from each other.

Moreover, as in FIG. 16C, the n-type semiconductor region 1602 is constructed of the lightly doped n-type semiconductor layer 1643 put in contact with the metal layer 1603 and the heavily doped n-type semiconductor layer 1648 that surrounds the layer and is put in contact with the memory function body 1504. With this arrangement, the resistance of the n-type semiconductor region 1602 (heavily doped n-type semiconductor layer 1648) can be reduced, making it possible to improve the operation speed and reduce power consumption.

Figure 17A:
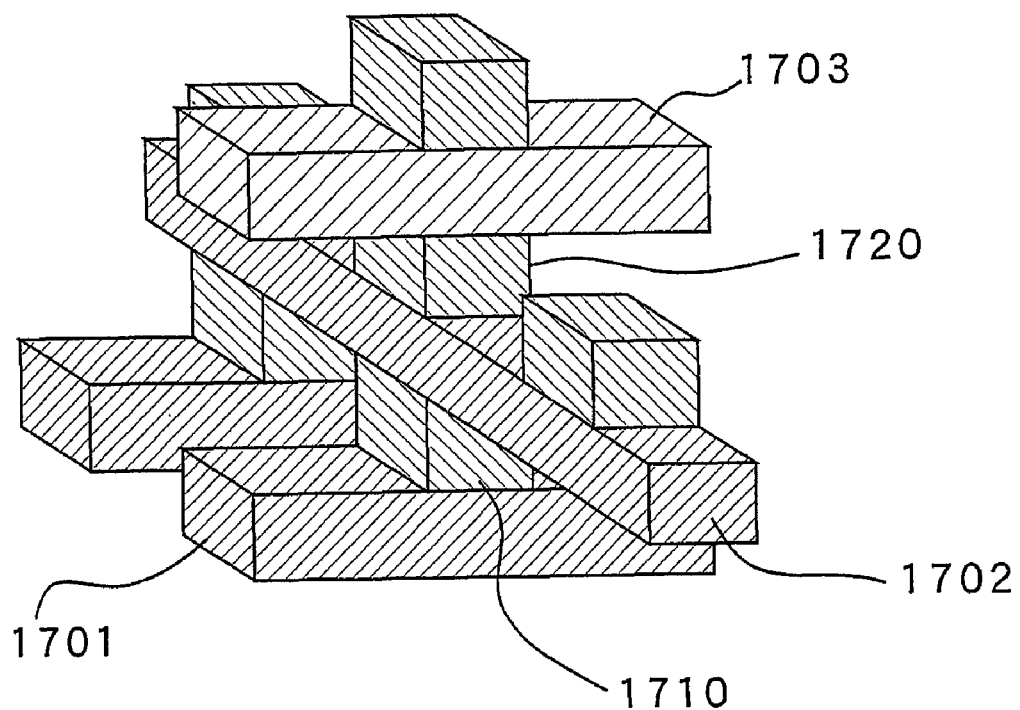
FIG. 17A is a view showing the three-dimensional spatial structure of a memory in which a plurality of aforementioned resistance-changing function bodies are arranged in a direction perpendicular to a substrate.
Figure 17B:
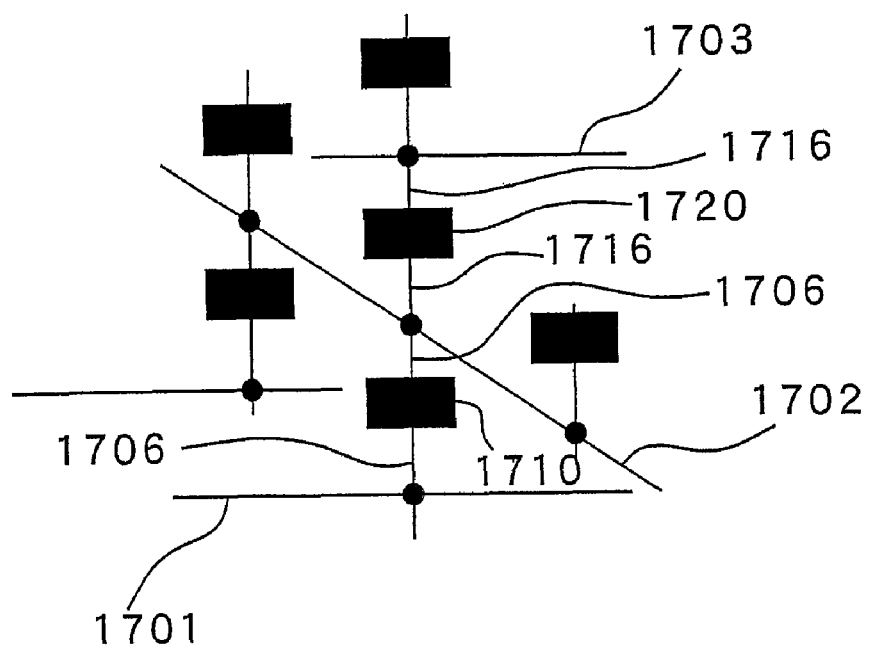
FIG. 17B is a view showing electrical connection of the constituent elements in FIG. 17A.

FIG. 17A shows the three-dimensional spatial structure of a memory in which a plurality of aforementioned memory function bodies are arranged in a direction perpendicular to a substrate, and FIG. 17B shows electrical connection of the constituent elements in FIG. 17A. It is to be noted that no interlayer insulator is shown in FIG. 17A.

This memory is provided with a plurality of interconnections 1701, 1702, 1703, . . . extended parallel to the substrate (not shown) at mutually different heights. An upper layer interconnection 1701 and a lower layer interconnection 1703 are parallel to each other, while an intermediate layer interconnection 1702 intersect these interconnections. A memory function body 1710 (same as the foregoing particle container 113) is provided so as to be interposed between those interconnections 1701 and 1702 via a contact 1706 in a portion in which the interconnection 1701 and the interconnection 1702 intersect each other. With this arrangement, a memory cell is constructed in the portion in which the metal interconnection 1701 and the metal interconnection 1702 intersect each other. Likewise, a memory function body 1720 (same as the foregoing particle container 113) is provided so as to be interposed between those interconnections 1702 and 1703 via a contact 1716 in a portion in which the interconnection 1702 and the interconnection 1703 intersect each other, constituting a memory cell. In other words, the memory function bodies 1710 and 1720 are provided so as to separate the contacts 1706 and 1716 from each other.

In this structure of FIG. 17A, the memory function bodies 1710 and 1720 are three-dimensionally integrated, and therefore, it is possible to largely reduce the effective occupation area and increase the memory capacity.

Figure 18A:
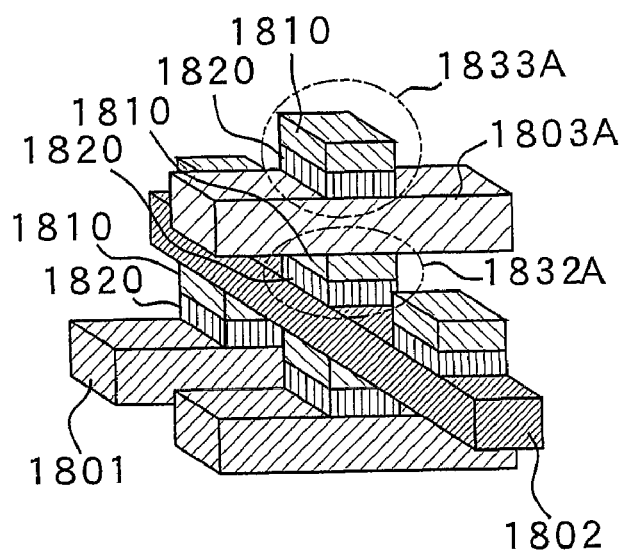
FIG. 18A is a view showing the three-dimensional spatial structure of a memory in which a plurality of aforementioned resistance-changing function bodies and rectifying function bodies are arranged in a direction perpendicular to the substrate.

FIG. 18A shows a memory, which has a three-dimensional spatial structure of the aforementioned type and in which each memory cell includes a memory function body and a rectifying function body. FIG. 18C shows the electrical connection of the constituent elements in FIG. 18A.

This memory is provided with a plurality of metal interconnections 1801, 1802, 1803A, . . . extended at different heights with respect to an unshown substrate. The lower layer metal interconnection 1801 and the upper layer metal interconnection 1803A are parallel to each other, and an intermediate layer metal interconnection 1802 intersect these interconnections. A semiconductor 1820 is provided in a portion in which the metal interconnection 1801 and the metal interconnection 1802 intersect each other so as to form a Schottky junction in contact with the metal interconnection 1801. The metal interconnection 1801 and the semiconductor 1820 constitute a rectifying function body. A memory function body 1810 (same as the foregoing particle container 113) is provided so as to be interposed between the semiconductor 1820 and the metal interconnection 1802 that constitute the rectifying function body (the semiconductor 1820 and the metal interconnection 1802 are electrically isolated from each other by the memory function body 1810). With this arrangement, a memory cell is constructed in a portion in which the metal interconnection 1801 and the metal interconnection 1802 intersect each other. Likewise, the semiconductor 1820 and the memory function body 1810 are provided in quite the same style in a portion in which the metal interconnection 1802 and the metal interconnection 1803A intersect each other, constituting a memory cell 1832A. Further, the semiconductor 1820 and the memory function body 1810 are provided in quite the same style in a portion in which the metal interconnection 1803 and a metal interconnection of its upper layer (not shown) intersect each other, constituting a memory cell 1833A.

Figure 18B:
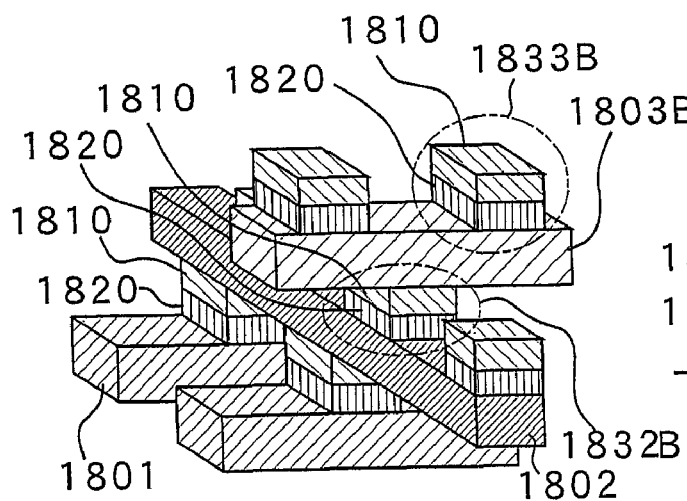
FIG. 18B is a view showing a modification example of the structure of FIG. 18A.
Figure 18C:
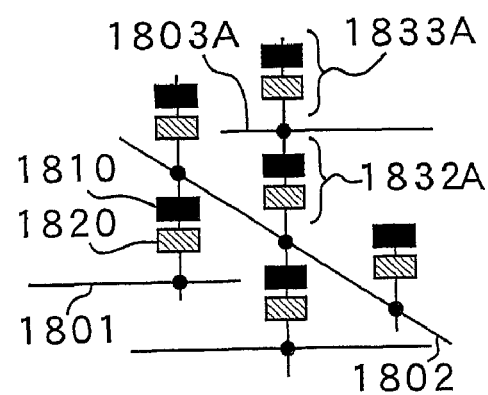
FIG. 18C is a view showing electrical connection of the constituent elements in FIG. 18A.
Figure 18D:
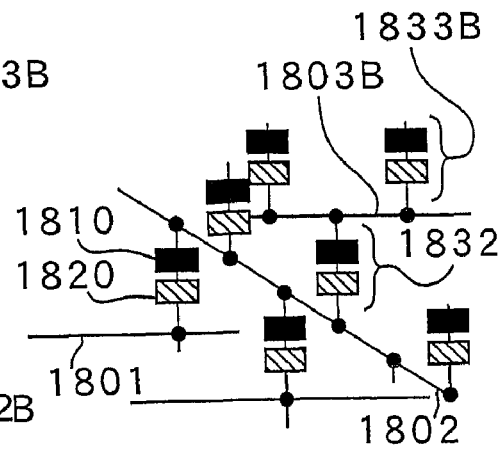
FIG. 18D is a view showing electrical connection of the constituent elements in FIG. 18B.

FIG. 18B show a modification example of the memory shown in FIG. 18A. In the structure of FIG. 18A, for example, the memory cells 1833A and 1832A arranged above and below the metal interconnection 1803A are arranged in a line in the vertical direction. In contrast to this, in the structure of this FIG. 18B, an upper layer metal interconnection 1803B is arranged displaced in the transverse direction (direction perpendicular to the lengthwise direction of this interconnection 1803B) with respect to the lower layer metal interconnection 1801. In addition, for example, a memory cell 1833B arranged upward with respect to the memory cell 1832B arranged below the metal interconnection 1803B, is arranged displaced in the lengthwise direction of this interconnection 1803B. As a result, in this structure of FIG. 18B, a spatial average distance between memory cells is greater than that of the structure of FIG. 18A. Therefore, mutual influence on the memory cells becomes less exerted, and the reliability of the memory is improved.

Next, a method for fabricating a memory that has a three-dimensional spatial structure of the type shown in FIG. 18A will be described with reference to FIG. 19. FIGS. 19A, 19B, 19C, 19D and 19E show the states of an object in fabrication stages viewed from the same direction. FIGS. 19F, 19G, 19H, 19I and 19J show the states of the object of FIGS. 19A, 19B, 19C, 19D and 19E viewed from the right-hand side.

Figure 19A:
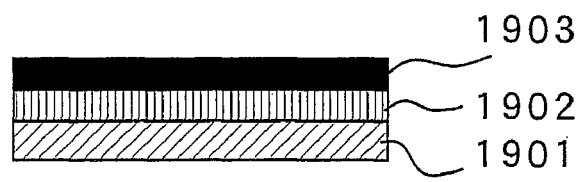
FIGS. 19A through 19E and FIGS. 19F through 19J are views for explaining the fabrication method of the memory that has the three-dimensional spatial structure of the type shown in FIG. 18A.
Figure 19B:
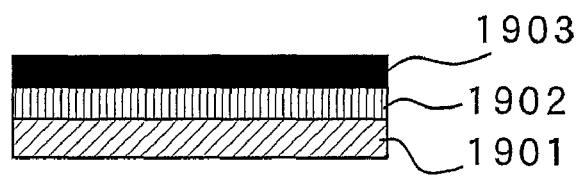
Figure 19C:
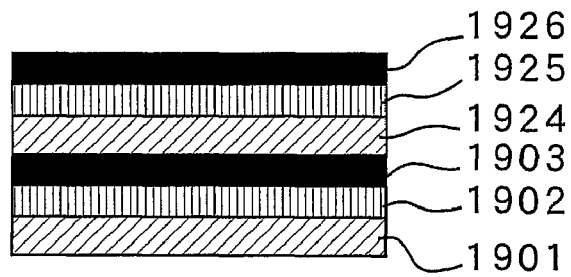
Figure 19D:
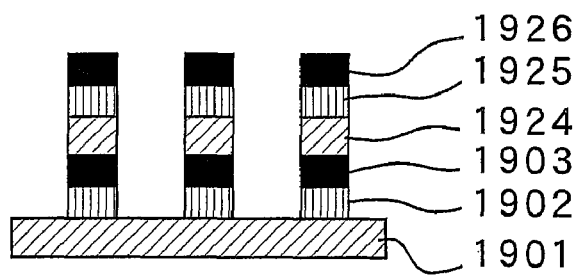
Figure 19E:
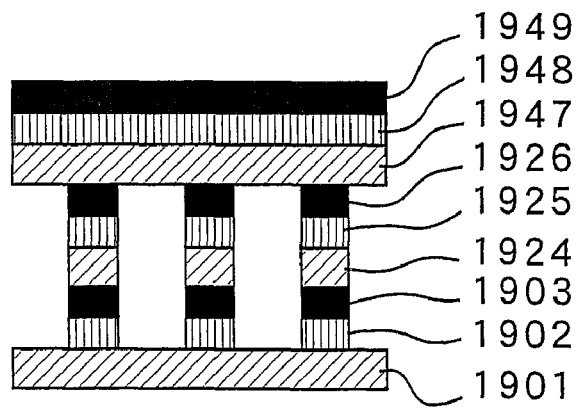
Figure 19F:
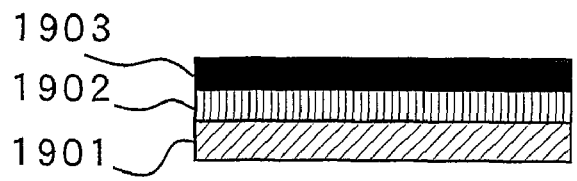

First of all, as shown in FIGS. 19A and 19F, a metal interconnection layer 1901, a semiconductor layer (e.g., polysilicon layer) 1902 for forming a Schottky junction with this metal interconnection layer and a memory function body layer 1903 are successively laminated in the whole area on a substrate (not shown). The memory function body layer 1903 is formed by forming, for example, a silicon oxide film and thereafter implanting ions of conductive particles in the silicon oxide film so as to provide the same structure as that of the aforementioned particle container 113.

Figure 19G:
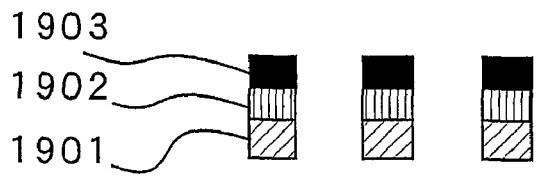

Next, as shown in FIGS. 19B and 19G, the layers 1903, 1902 and 1901 are collectively etched and processed into a linear pattern extended in one direction. If the etching is collectively effected as described above, then the process can be simplified than when the etching is repeated for each of the layers 1903, 1902 and 1901. It is to be noted that an unshown interlayer insulation film of, for example, silicon oxide is deposited in the whole area after this etching, and the surface is flattened by a CMP (Chemical-Mechanical Polishing) method.

Figure 19H:
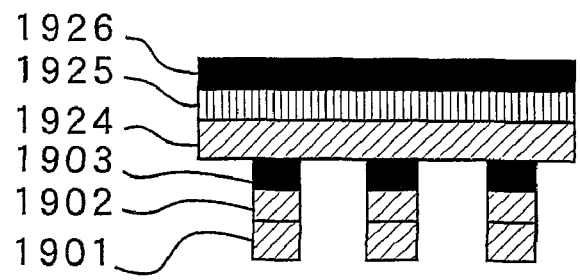

Next, as shown in FIGS. 19C and 19H, a metal interconnection layer 1924, a semiconductor layer 1925 for forming a Schottky junction with this metal interconnection layer and a memory function body layer 1926 are successively repetitively laminated in the whole area on this film.

Figure 19I:
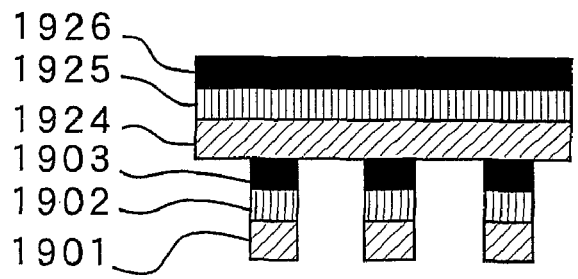

Next, as shown in FIGS. 19D and 19I, the layers 1924, 1925 and 1926 are collectively etched to carry out pattern processing in a linear form extended crosswise roughly perpendicularly to the direction in which the layers 1903, 1902 and 1901 are extended. If the etching is collectively effected as described above, then the process can be simplified than when the etching is repeated for each of the layers 1924, 1925 and 1926. In this stage, a first layer memory cell, which includes the semiconductor layer 1902 and the memory function body 1903 that have undergone the pattern processing, is formed in a portion in which the lower layer metal interconnection 1901 and the metal interconnection 1924 on it intersect each other. After this etching, an interlayer insulation film (not shown) of, for example, silicon oxide is deposited again in the whole area, and the surface is flattened by the CMP method.

Figure 19J:
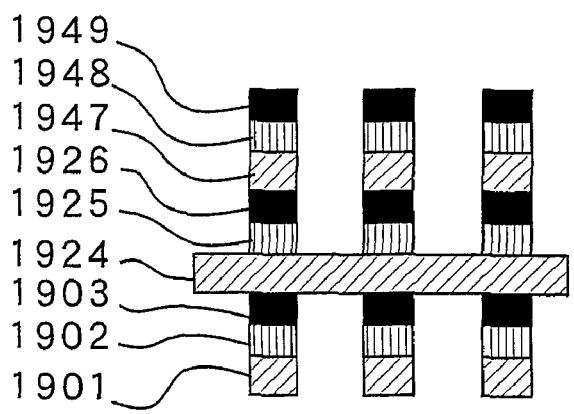

Subsequently, as shown in FIGS. 19E and 19J, the deposition and collective etching of a metal layer 1947 to be a metal interconnection, a semiconductor layer 1948 and a memory function body layer 1949 are repeated in a similar manner. In this stage, a second layer memory cell, which includes the semiconductor layer 1925 and the memory function body 1926 that have undergone the pattern processing, is formed in a portion in which the metal interconnection 1924 and the metal interconnection 1947 on it intersect each other.

By thus repeating the deposition and collective etching of the metal layer, the semiconductor layer and the memory function body layer, a memory that has a three-dimensional spatial structure can be fabricated.

It is to be noted that a third layer memory cell, which includes the semiconductor layer 1948 and the memory function body layer 1949 that have undergone the pattern processing, is formed by the next collective etching.

As already described hereinabove, the memory function body is basically an insulator although it contains conductive particles. Therefore, the remaining portion to which no effective voltage is applied in the memory function body performs no memory operation.

Figure 20A:
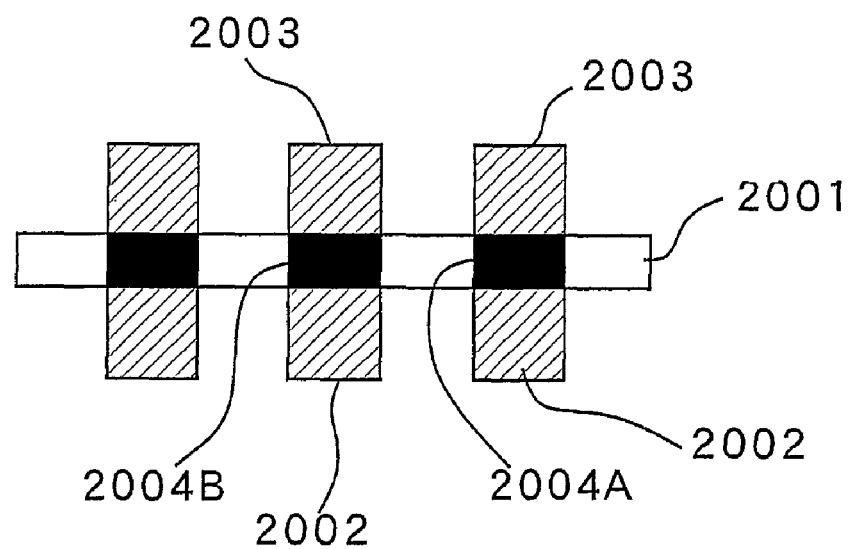
FIGS. 20A and 20B are views for explaining the regions that perform memory operation in a resistance-changing function body layer.
Figure 20B:
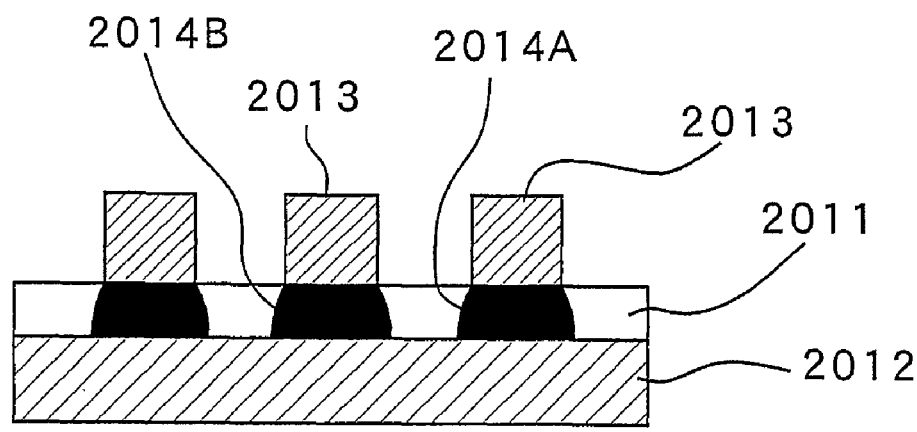

For example, as shown in FIG. 20A, it is assumed that a pair of upper and lower electrodes 2003, 2002; 2003, 2002; . . . arranged with interposition of a memory function body layer 2001 are arranged mutually apart in the layer direction (transverse direction in FIGS. 20A and 20B). In this case, if a voltage is applied across, for example, the pair of electrode 2003 and 2002 located at the right-hand end, the region that performs the memory operation in the memory function body layer 2001 is limited to the neighborhood of a region 2004A interposed between the pair of electrodes 2003 and 2002 located at the right-hand end. Therefore, a region 2004B interposed between the pair of the central electrodes 2003 and 2002 across which no voltage is applied causes no malfunction.

Moreover, as shown in FIG. 20B, it is assumed that an interconnection layer 2012 is formed extended in the transverse direction under a memory function body layer 2011, and interconnection layers 2013, 2013, . . . extended in the depthwise direction (direction perpendicular to the sheet plane of FIG. 20) are arranged mutually apart on the memory function body layer 2011. Also, in this case, when a voltage is applied across, for example, the interconnection layer 2012 and the interconnection layer 2013 located at the right-hand end, the region that performs the memory operation in the memory function body layer 2011 is limited to the neighborhood of a region 2014A in which those interconnection layers 2012 and 2013 intersect each other. Therefore, a region 2004B interposed between the interconnection layer 2012 and the central interconnection layer 2013 causes no malfunction.

As described above, the remaining portion to which no effective voltage is applied in the memory function body layer performs no memory operation. Therefore, it is possible to put the memory function body layer into an integrated continuous state without being divided into memory cells. If the above arrangement is adopted, it is possible to prevent damage due to etching from being given to the region that performs the memory operation and improve the reliability of the memory.

A method for fabricating the memory function body layer integrally continuously in the layer direction in fabricating a memory that has a three-dimensional spatial structure will be described next by using FIG. 21. FIGS. 21A, 21B, 21C, 21D and 21E show the states of an object in fabrication stages viewed from the same direction. FIGS. 21F, 21G, 21H, 21I and 21J show the states of the object of FIGS. 21A, 21B, 21C, 21D and 21E viewed from the right-hand side.

Figure 21A:
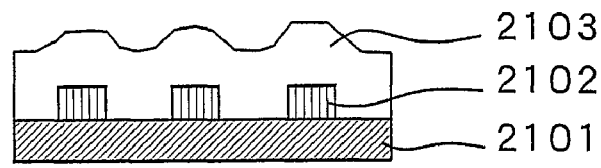
FIGS. 21A through 21E and FIGS. 21F through 21J are views for explaining a fabrication method for forming a resistance-changing function body layer of the memory that has a three-dimensional spatial structure into a state in which they are integrally continuous in the layer direction.
Figure 21B:
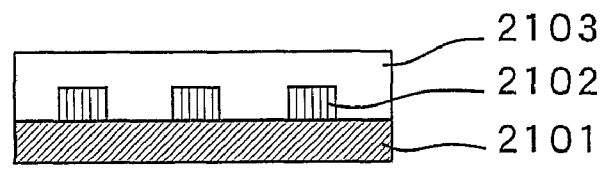
Figure 21C:
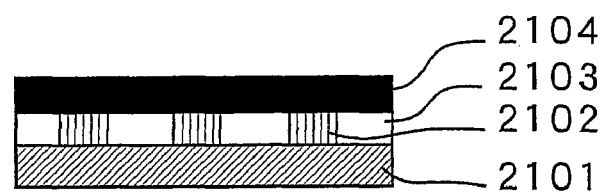
Figure 21D:
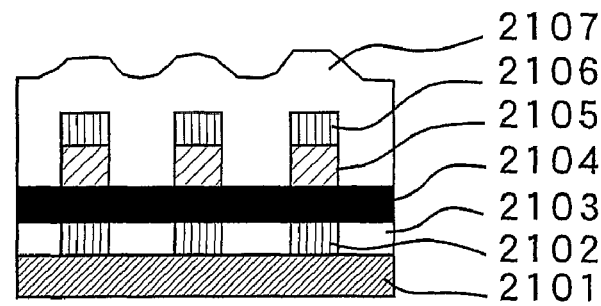
Figure 21E:
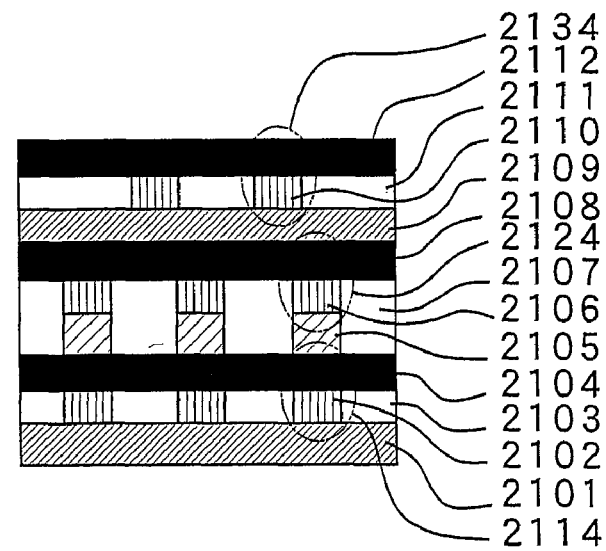
Figure 21F:
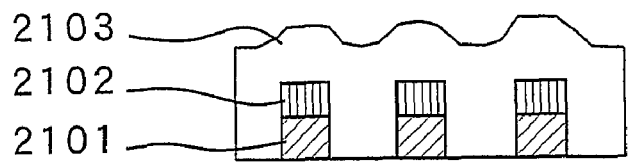
Figure 21G:
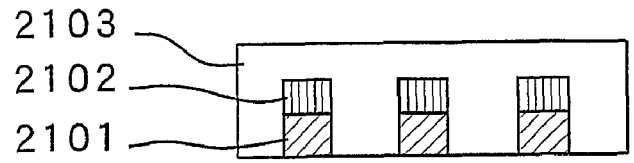

First of all, as shown in FIGS. 21A and 21F, a metal interconnection layer 2101 and a semiconductor layer (e.g., polysilicon layer) 2102 for forming a Schottky junction with this metal interconnection layer are successively laminated in the whole area on an unshown substrate. These layers 2102 and 2101 are collectively etched and patterned into a linear form extended in one direction. Further, the semiconductor layer 2102 is etched and separated every memory cell. After this etching, an insulator layer 2103, which should become an interlayer insulation film of, for example, silicon oxide, is deposited to a sufficient thickness in the whole area, and the surface is flattened by the CMP method as shown in FIGS. 21B and 21G. This flattening is effected not until the upper surface of the semiconductor layer 2102 is exposed but until the thickness of the insulator layer 2103 on the semiconductor layer 2102 becomes equivalent to the thickness of the memory function body layer to be formed in the next process.

Figure 21H:
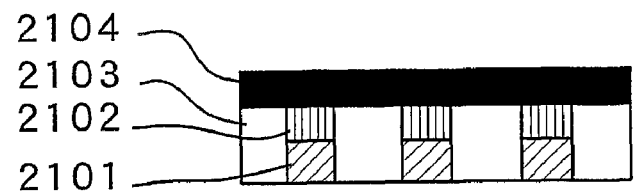

Next, as shown in FIGS. 21C and 21H, ions of conductive particles are implanted in the region above the upper surface of the semiconductor layer 2102 in the insulator layer 2103, forming a memory function body layer 2104. The memory function body layer 2104 has the same structure as that of the aforementioned particle container 113 and is formed into a state in which it is put in contact with the semiconductor layer 2102 and extended integrally continuously in the layer direction in the whole area on the substrate.

Figure 21I:
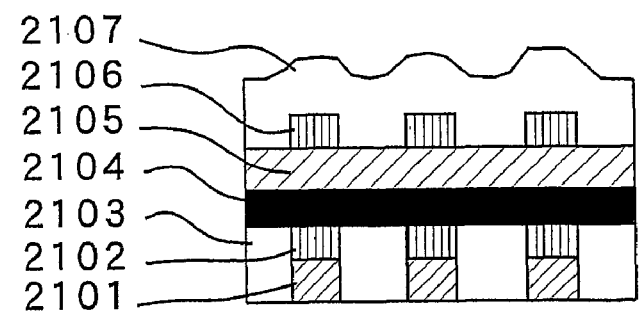
Figure 21J:
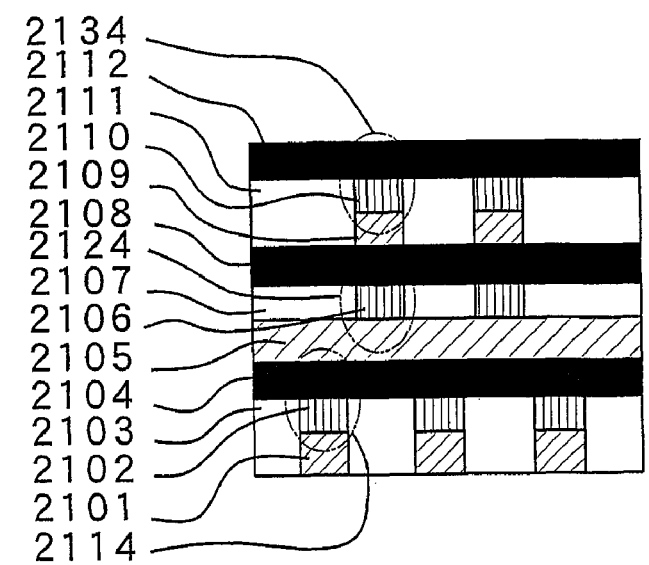

Next, as shown in FIGS. 21D and 21I, a metal interconnection layer 2105 and a semiconductor layer 2106 for forming a Schottky junction with this metal interconnection layer are successively laminated again in the whole area. These layers 2106 and 2105 are collectively etched and patterned into a liner form extended crosswise roughly perpendicularly to the direction in which the metal layer 2101 is extended. Further, the semiconductor layer 2106 is etched and separated every memory cell. After this etching, an insulator layer 2107, which should become an interlayer insulation film of, for example, silicon oxide, is deposited to a sufficient thickness in the whole area, and the surface is flattened by the CMP method as shown in FIGS. 21E and 21J. This flattening is effected not until the upper surface of the semiconductor layer 2106 is exposed but until the thickness of the insulator layer 2107 on the semiconductor layer 2106 becomes equivalent to the thickness of the memory function body layer to be formed in the next process.

Subsequently, by repeating similar processes, a three-dimension spatial structure as shown in FIGS. 21E and 21J is obtained. FIGS. 21E and 21J show a state in which the three sets of the metal interconnection layer, the semiconductor layer and the memory function body layer are laminated. In the figures, there are shown a memory function body layer 2108, a metal interconnection layer 2109, a semiconductor layer 2110, an interlayer insulation film (insulator layer) 2111 and a memory function body layer 2112.

In this structure, as is apparent from FIG. 21E, the memory cell 2134, which is arranged upward with respect to, for example, the memory cell 2124 arranged below the metal interconnection 2109, is displaced in the lengthwise direction of this interconnection 2109. Moreover, as is apparent from FIG. 21J, the memory cell 2124, which is arranged upward with respect to, for example, the metal interconnection 2105, is displaced in the lengthwise direction of this interconnection 2105 against the memory cell arranged downward. As a result, in this structure, a spatial average distance between the memory cells is made greater than in the case where the memory cells are arranged in a line in the vertical direction. Therefore, mutual influence on the memory cells becomes less exerted, and the reliability of the memory is improved.

Figure 22A:
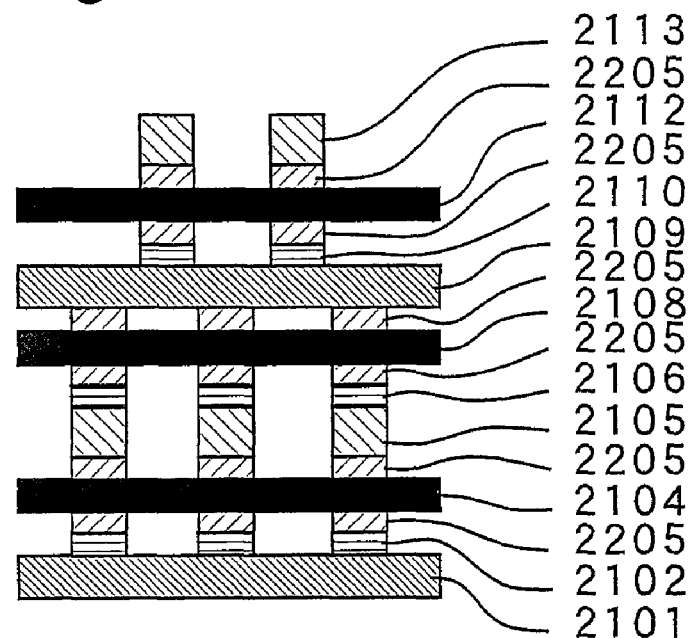
FIGS. 22A and 22B are views showing modification examples of the structure shown in FIGS. 21E and 21J.
Figure 22B:
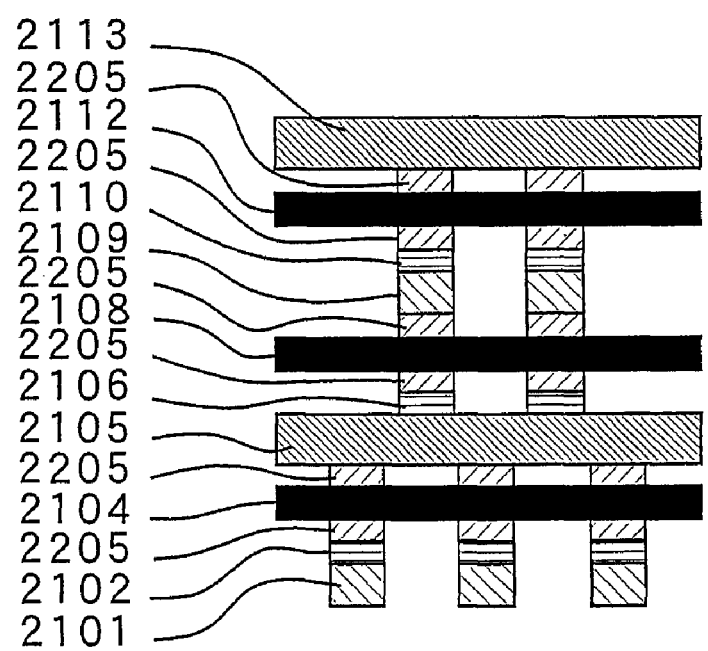

FIGS. 22A and 22B show a modification example of the structure shown in FIGS. 21E and 21J. FIG. 22B shows a state in which the object of FIG. 22A is viewed from the right-hand side.

In this modification example, a contact 2205 is provided between the memory function body layer 2104 and the metal interconnection layer 2105 and the semiconductor layer 2102 located above and below the layer, between the memory function body layer 2108 and the metal interconnection layer 2109 and the semiconductor layer 2106 located above and below the layer and between the memory function body layer 2112 and the metal interconnection layer 2113 and the semiconductor layer 2110 located above and below the layer.

It is a matter of course that a structure in which the memory function body is separated every memory cell can be employed in FIGS. 21 and 22.

Figure 23A:
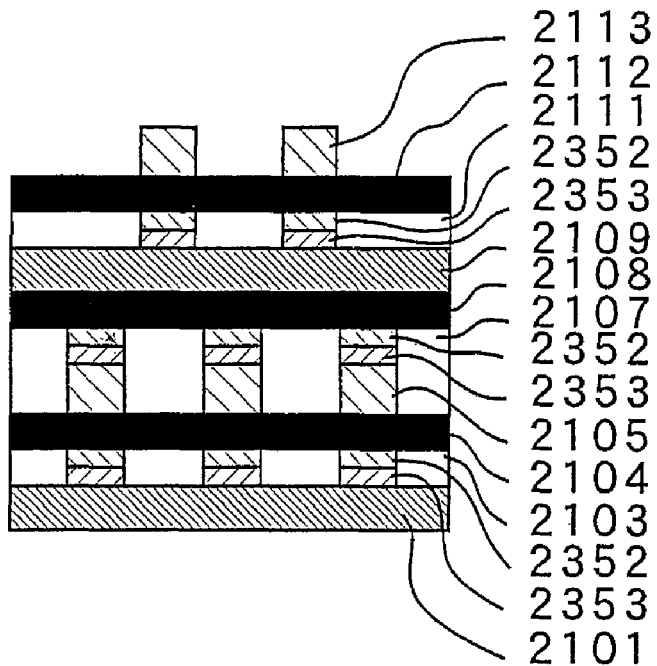
FIGS. 23A and 23B are views showing other modification examples of the structure shown in FIGS. 21E and 21J.
Figure 23B:
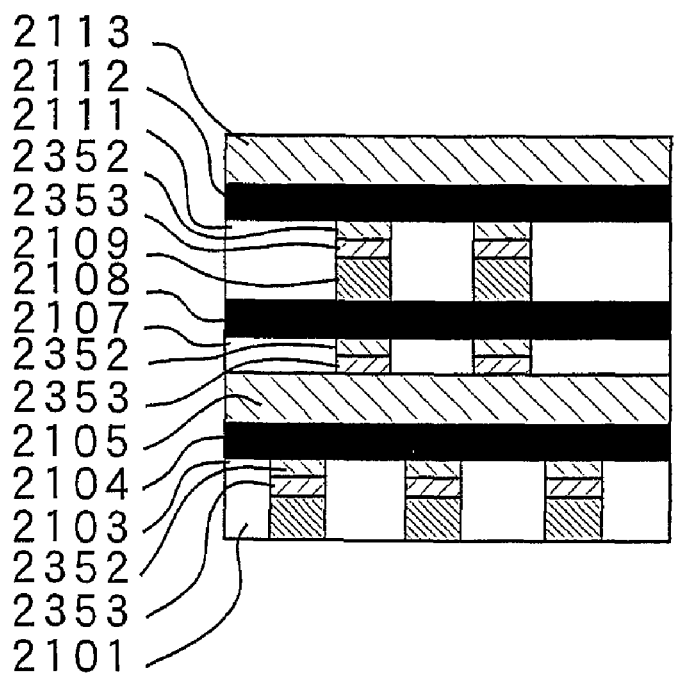

FIGS. 23A and 23B show another modification example of the structure shown in FIGS. 21E and 21J. FIG. 23B shows a state in which the object of FIG. 23A is viewed from the right-hand side.

In this modification example, a rectifying function body constructed of a pn junction is provided in place of the rectifying function body constructed of the Schottky junction. That is, a pair of p-type semiconductor layer 2353 and n-type semiconductor layer 2352, which constitute a pn junction, is provided between the metal interconnection layer 2101 and the memory function body layer 2104, between the metal interconnection layer 2105 and the memory function body layer 2108 and between the metal interconnection layer 2109 and the memory function body layer 2112.

It is acceptable to interchange the places of the p-type semiconductor layer and the n-type semiconductor layer. By interchanging the places of the p-type with the n-type, the direction of rectification can be reversed.

The structure of FIG. 23 can be fabricated through processes similar to those of the example of FIG. 21 except for the process for constructing the semiconductor layer of two layers of the p-type semiconductor layer and the n-type semiconductor layer.

In general, the barrier height of the pn junction diode can be adjusted by impurity concentration more easily than that of the Schottky junction diode. Therefore, when the rectifying function body constructed of the pn junction is employed in place of the rectifying function body constructed of the Schottky junction, the rectifying function body can easily be adjusted in characteristics, being excellent in versatility. For example, if the barrier height is adjusted, then the amount of current that flows at a constant voltage or the capacitance can be changed, and the memory operation voltage can easily be adjusted.

Figure 24A:
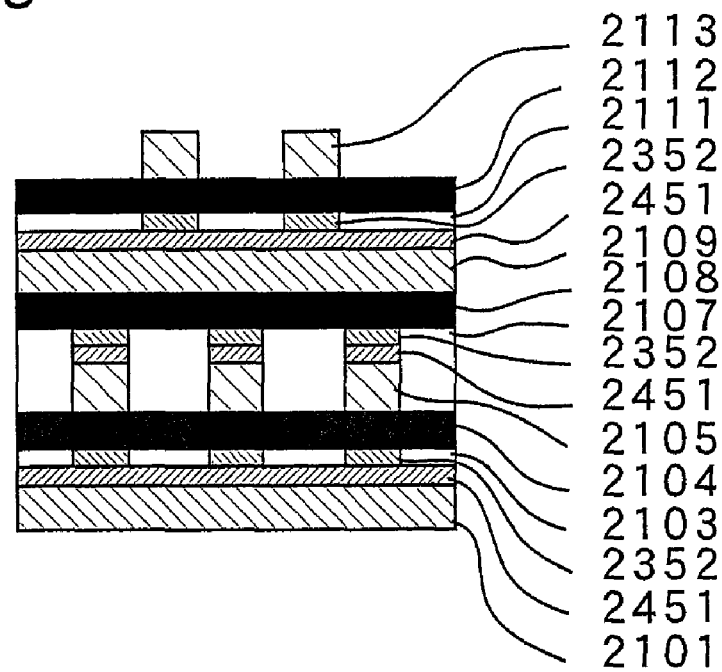
FIGS. 24A and 24B are views showing modification examples of the structure shown in FIGS. 23A and 23B.
Figure 24B:
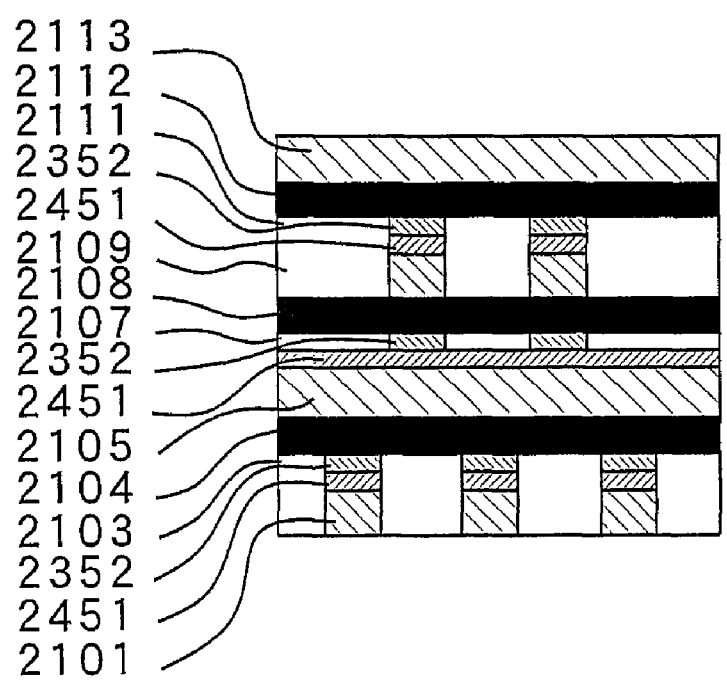

FIGS. 24A and 24B show a modification example of the structure shown in FIGS. 23A and 23B. FIG. 24B shows a state in which the object of FIG. 24A is viewed from the right-hand side.

In this modification example, a semiconductor layer 2451, which is put in contact with a metal interconnection layer out of the two semiconductor layers that constitute a pn junction as a rectifying function body, is extended in a linear form along the metal interconnection layer. That is, the semiconductor layers 2451, 2451 and 2451, which are put in contact with the metal interconnection layers 2101, 2105 and 2109, respectively, are not separated every memory cell but processed into the same patterns as those of the metal interconnection layers 2101, 2105 and 2109, respectively. Since the semiconductor layer has a resistance higher than that of metal, it is more preferable that the semiconductor layer is extended in a linear form along, for example, the metal interconnection layer that constitutes the bit line like the structure of FIGS. 24A and 24B than when separated every memory cell. With this arrangement, it is possible to effectively reduce the resistance by making the semiconductor layer 2451 shared by at least two memory cells.

Figure 25A:
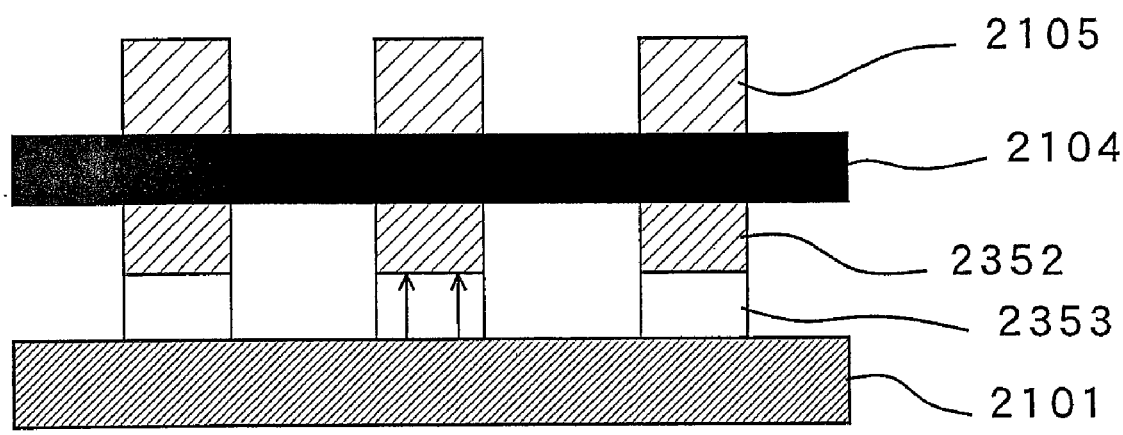
FIG. 25A is a view showing the current path of the structure shown in FIGS. 23A and 23B.
Figure 25B:
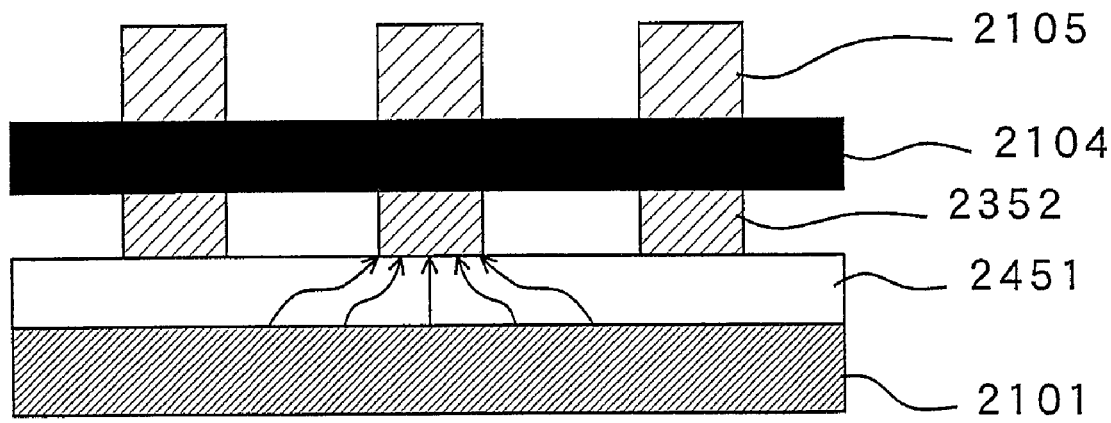
FIG. 25B is a view showing the current path of the structure shown in FIGS. 24A and 24B.

In detail, the semiconductor layer 2353 is separated every memory cell in the structure shown in FIGS. 23A and 23B. Therefore, the path of the current flowing from the metal interconnection 2101 to the memory function body 2104 is limited to the inside of the pattern of each individual semiconductor layer 2353 as indicated by arrow in FIG. 25A. In contrast to this, in the structure shown in FIGS. 24A and 24B, the path of the current flowing from the metal interconnection 2101 to the memory function body 2104 expands in a direction along the metal interconnection 2101 as indicated by arrow in FIG. 25B. Therefore, the interconnection effective cross-section area increases to reduce the resistance. This consequently enables the high-speed operation of the memory.

It is a matter of course that the effect of the semiconductor layer 2451 extended in a linear form along the metal interconnection layer is similar not only in the case where the memory function body 2504 is extended integrally continuously in the layer direction but also in the case where the memory function body 2504 is separated every memory cell.

Figure 26A:
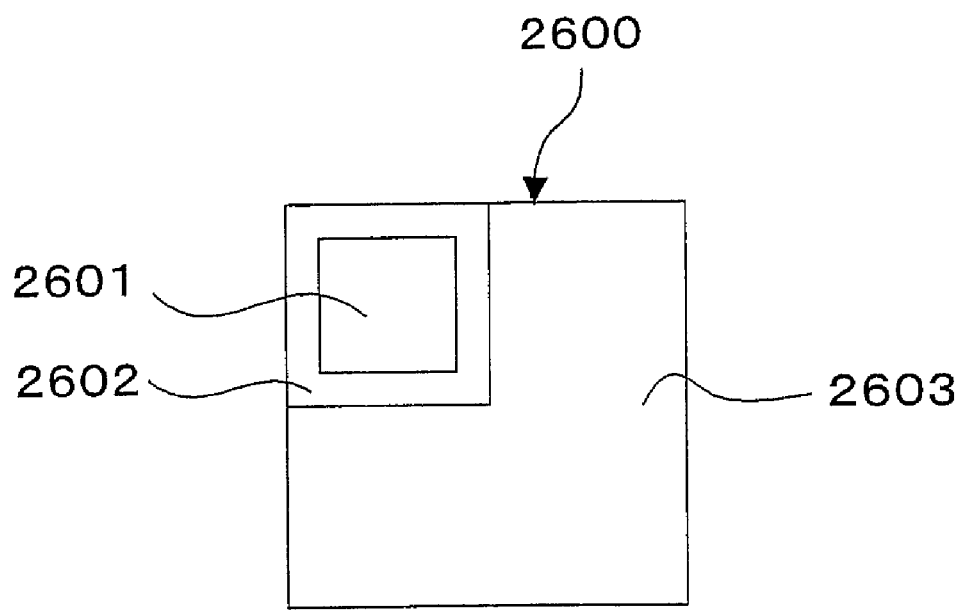
FIG. 26A is a view showing the plan layout of a semiconductor device of one embodiment of the present invention.

FIG. 26A shows a schematic plan layout of a semiconductor device 2600 of one embodiment.

This semiconductor device 2600 is provided with a memory circuit 2601 that has the aforementioned memory (memory cells), a peripheral circuit 2602 that has a logic circuit, and a function circuit 2603 that has a function other than those of the memory circuit and the peripheral circuit in a state in which the components are integrated on an identical semiconductor substrate.

Figure 26B:
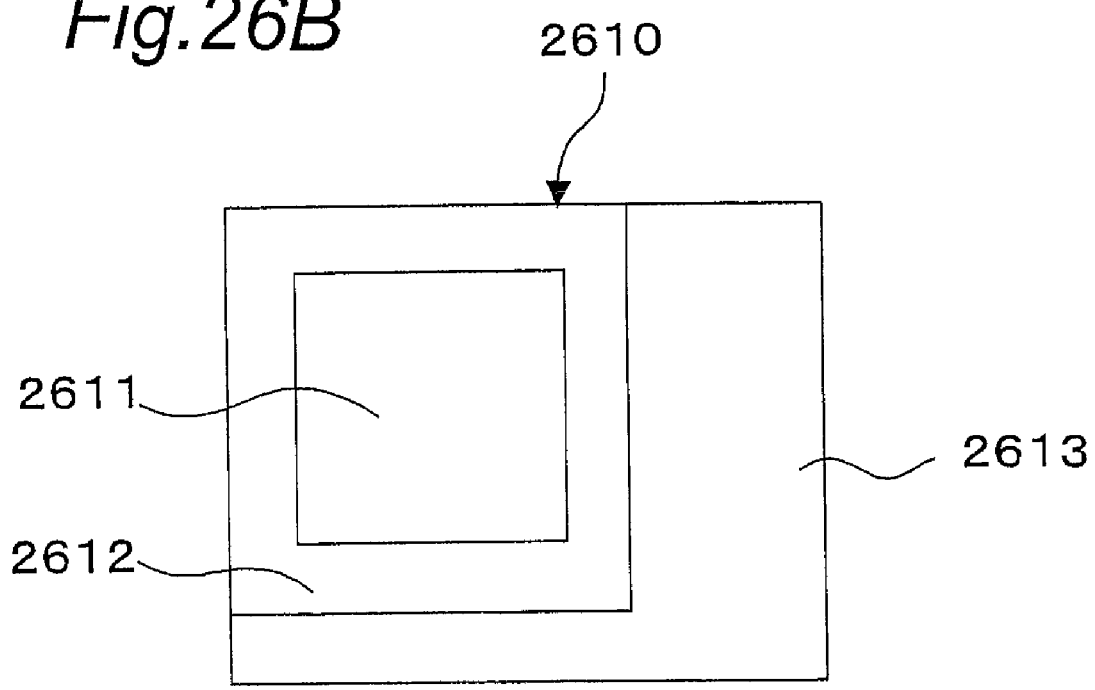
FIG. 26B is a view showing the plan layout of a conventional semiconductor device.

FIG. 26B shows a schematic plan layout of a conventional semiconductor device 2610 for comparison' sake. The memory circuit 2611 is integrated with a flash memory that has a conventional floating gate. This conventional semiconductor device 2610 needs a booster circuit and a control circuit for the peripheral circuit 2612 since the driving voltage of the flash memory is higher than the driving voltage of the logic circuit. Moreover, it is required to increase the gate oxide film thickness of the transistor of the peripheral circuit to endure a high driving voltage of the memory circuit, and therefore, the occupation area of the peripheral circuit 2612 has conventionally been enlarged. Therefore, it has been difficult to miniaturize the semiconductor device. Moreover, since the occupation areas of the memory circuit 2611 and the peripheral circuit 2612 have been large, the occupation area ratio of the function circuit 2513 for another function has been limited to a small value.

In contrast to this, the memory circuit 2601 that has the memory cells of the present invention can operate with a low voltage, and therefore, this semiconductor device 2600 can operate with the same power voltage as that of the peripheral circuit 2602. Therefore, it is possible to share the power source by the memory circuit 2601 and the peripheral circuit 2602 and remove the conventional booster circuit and the control circuit. As a result, the occupation area of the peripheral circuit 2602 can be reduced. Moreover, since the driving voltage of the memory circuit 2601 is low, the gate oxide film of the transistor included in the peripheral circuit 2602 can be reduced in thickness, and the occupation area of the peripheral circuit 2602 can be reduced. Furthermore, since the memory circuit 2601 can be highly integrated, the occupation area of the memory circuit 2601 can be reduced. With these factors, this semiconductor device 2601 can consequently be made smaller than the conventional semiconductor device 2610. Moreover, since the occupation area of the function circuit 2603 other than the memory circuit and the peripheral circuit can be expanded, a semiconductor device of a performance higher than that of the conventional one can be constructed.

Otherwise, if the same occupation area as that of the conventional semiconductor device 2610 is permitted for this semiconductor device 2600, it is possible to increase the storage capacity of the semiconductor device by integrating more memory cells than in the conventional case. With this arrangement, it becomes possible to temporarily read a large-scale program, retain the program even after the power is turned off and execute the program after the power is turned on again, and it also becomes possible to replace the program with another program.

Figure 27:
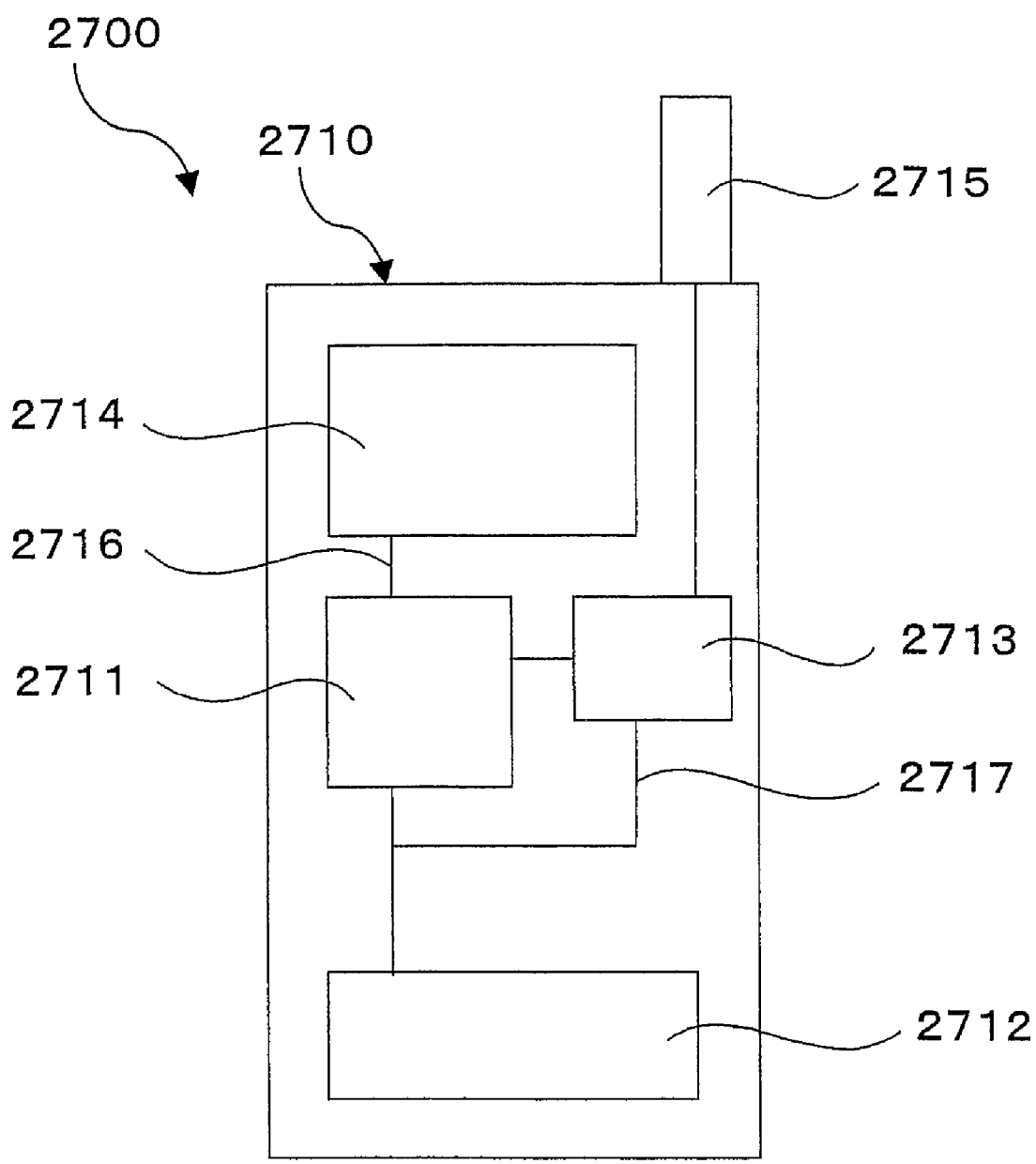
FIG. 27 is a view showing a portable telephone as one example of the electronic equipment of the invention.

FIG. 27 schematically shows the construction of a portable telephone 2700 provided with the aforementioned semiconductor device as one example of the electronic equipment of the present invention.

In this portable telephone 2700, a main body 2710 is equipped with an antenna section 2715, an RF circuit section 2713, a display section 2714, a control circuit 2711 as a semiconductor device and a battery 2712 for supplying electric power to these constituent elements. The reference numerals 2716 and 2717 denote a signal line and a power line, respectively.

The control circuit 2711 is an LSI (Large Scale Integrated circuit) in which a memory circuit having the memory of the present invention and a logic circuit are consolidated and controls the RF circuit section 2713 and the display section 2714. The control circuit 2711 has the semiconductor device of the present invention built-in. Therefore, this portable telephone is able to have high functions and reduced power consumption, allowing the battery life to be remarkably prolonged.

Although the portable telephone is constructed as one example of the electronic equipment in the present embodiment, similar effects can be produced even if another electronic equipment such as a portable information terminal or a game machine is constructed.

Although silicon oxide is employed as the material of the insulator 101 in the aforementioned embodiments, it is acceptable to employ such insulators as silicon nitride, aluminum oxide and titanium oxide. However, as it depends also on the size of the particles, excessively high dielectric materials, if employed for the insulator 101, would cause the capacity to increase, affecting the operating speed. Therefore, the material of the insulator 101 is preferably one having a low relative dielectric constant of not more than 10, preferably not more than 4.

Moreover, although silver is employed above as the material that constitutes the particles 102, it is also acceptable to employ a metal selected from among gold, silver, copper, aluminum, tin, nickel, platinum, zinc, hafnium, manganese, tantalum, titanium, tungsten, indium or gallium as a material for constituting the particles 102. Moreover, it is also possible to employ a semiconductor or a compound semiconductor of silicon, germanium or the like or employ an alloy or another compound. Moreover, even a magnetic material can be employed. However, a single element is preferable since the implantation thereof is easy.

Moreover, although a silicon substrate has been employed as the second (fourth) electrode 112, it is acceptable to employ a substrate constructed of a semiconductor other than silicon or a metal material. Moreover, it is acceptable to form a conductive layer on a substrate constructed of an insulator material such as a glass substrate by CVD (Chemical Vapor Deposition) method, evaporation, MBE (Molecular Beam Epitaxy) method or the like and use the conductive layer as the second (fourth) electrode.

The silicon film can be formed through epitaxial growth and polysilicon deposition, and CGS (Continuous Grain Silicon) or the like can be employed. However, it is preferable to employ polysilicon or CGS, which can be formed at a comparatively low temperature. It is more preferable to employ CGS of good crystallinity in terms of improving the rectification capability and excellence in reliability. The CGS is a silicon that can be fabricated at a low temperature by the fabrication method described in JP H08-78329 A and so on and has the advantages that it has better crystallinity than those of amorphous silicon, low-temperature polysilicon other than CGS and so on and is able to obtain higher mobility.

As apparent the above description, according to the memory of the present invention, the magnitude of the current that flows through the memory function body can be changed by electrical control with a comparatively low voltage at normal temperature. Thus, there can be provided a memory having practicability.

Also, according to the manufacturing method of the memory of the present invention, such memories can be fabricated with good productivity.

Moreover, the semiconductor device including the memory of the present invention can be made higher in integration and lower in power consumption.

Further, electronic equipment having such a semiconductor device can be made smaller in size and lower in power consumption, thus suitable for portable use.

Figure 28A:
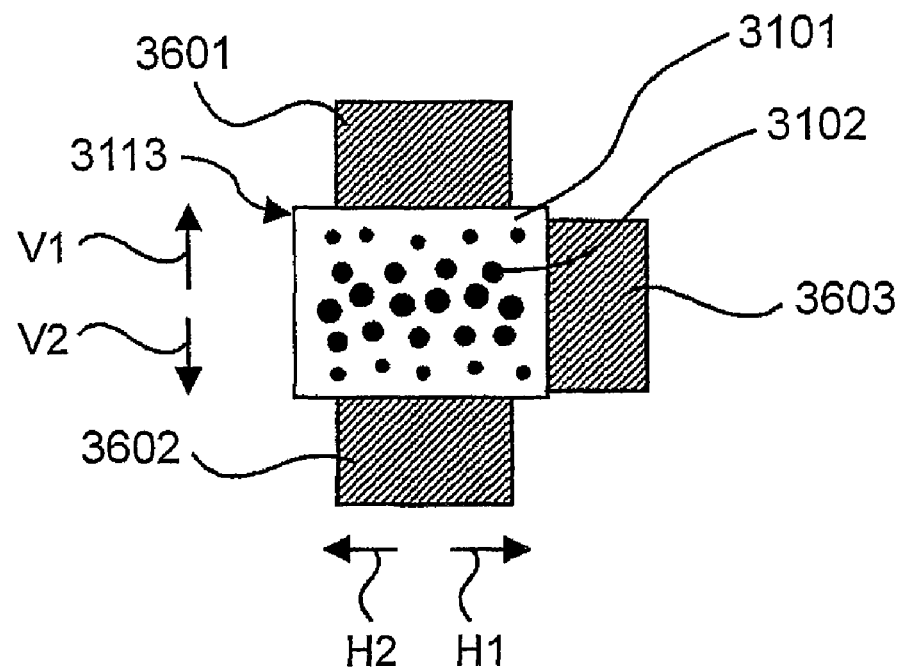
FIG. 28A is a view showing a schematic cross section of a memory of one embodiment of the invention.

FIG. 28A shows an example in which a third electrode 3603 is adjacent to the particle container 3113 (same as the foregoing particle container 113) provided between the first electrode 3601 and the second electrode 3602 from a direction H1 (this is called the "layer direction") perpendicular to directions V1 and V2 in which the first electrode 3601 and the second electrode 3602 are opposed to each other. The particle container 3113 is interposed between the first electrode 3601 and the second electrode 3602 in the thickness directions V1 and V2. In contrast to this, in the example of FIG. 28B, the electrode arrangement with respect to the particle container 3113 is different, so that the particle container 3113 is interposed between a first electrode 3611 and a second electrode 3612 in the layer directions H1 and H2, and a third electrode 3613 is adjacent to the particle container 3113 in the thickness direction V1.

In the example of FIG. 28A, by grounding the second electrode 3602 and applying a voltage to the first electrode 3601, there was observed a current that flowed between those electrodes 3601 and 3602. Moreover, in the example of FIG. 28B, by grounding the second electrode 3612 and applying a voltage to the first electrode 3611, there was observed a current that flowed between those electrodes 3611 and 3612. In either of the above cases, the observation was carried out when the third electrode 3603 was grounded and when a voltage was applied to the third electrode 3603.

Figure 28B:
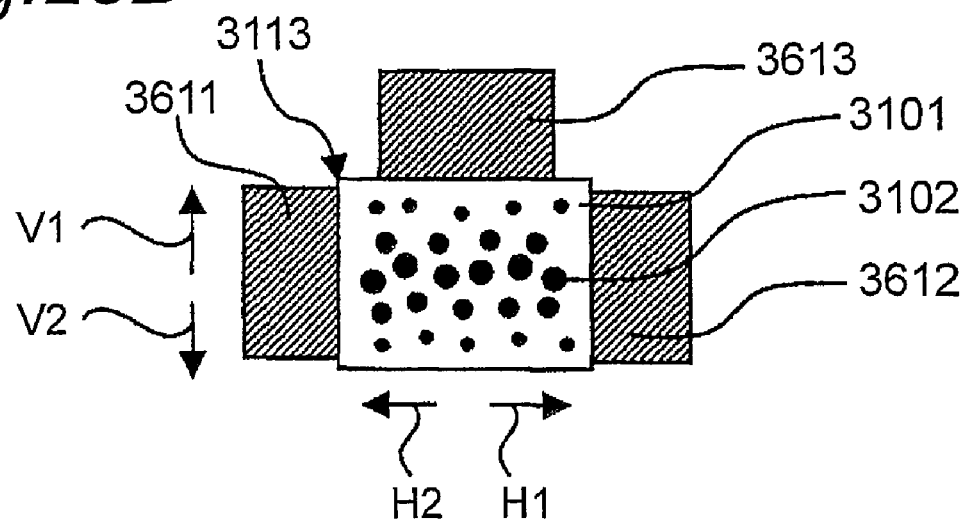
FIG. 28B is a view schematically showing an example in which the electrode arrangement is different from that of FIG. 28A.

Under the condition that the third electrodes 3603 and 3613 were grounded, there was observed a difference in the current-voltage (I-V) characteristic between the example of FIG. 28A and the example of FIG. 28B, whereas a hysteresis characteristic appeared in either of the above cases. Under the condition that the voltage was applied to the third electrodes 3603 and 3613, it was discovered that the width of the memory window (hysteresis) increased in either of the above cases in comparison with the case where the third electrodes 3603 and 3613 were grounded. This means that the memory function is improved when the voltage is applied to the third electrodes 3603 and 3613. With this arrangement, read errors in reading the storage state are reduced, and the reliability of the memory is improved.

FIG. 29 shows a method for fabricating a memory that has an electrode arrangement of the type shown in FIG. 28B on the surface of a semiconductor substrate.

Figure 29A:
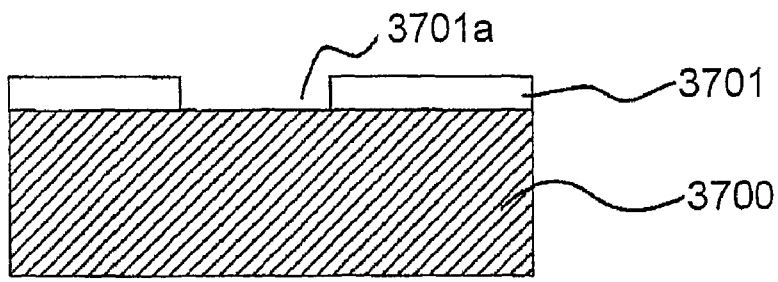
FIGS. 29A through 29E are views for explaining a fabrication method of a memory that has the electrode arrangement of the type of FIG. 28B.
Figure 29B:
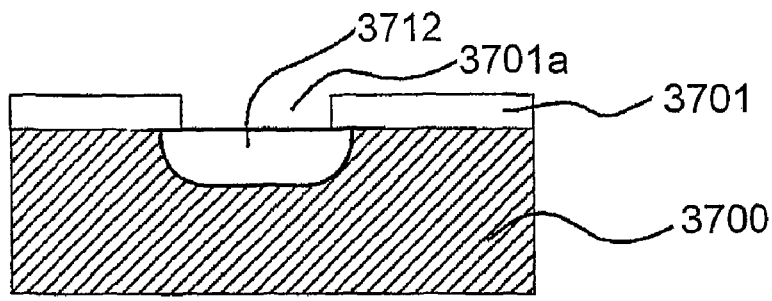

First of all, as shown in FIG. 29A, a silicon nitride film 3701 is deposited as a mask for oxidation on a semiconductor substrate of, for example, a silicon substrate 3700, and an opening 3701a is formed in a specified region of this silicon nitride film. Then, as shown in FIG. 29B, a silicon oxide film 3712 as an insulator is formed in a superficial region (region in which the memory function body should be formed) of the silicon substrate 3700 by oxidizing the silicon substrate 3700 from its surface through the opening 3701a as in the ordinary element isolation process.

Figure 29C:
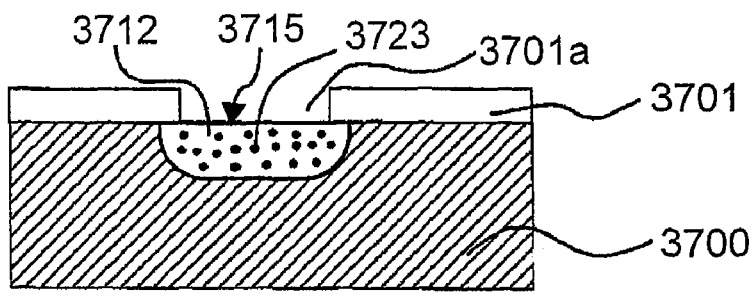

Next, as shown in FIG. 29C, ion implantation of a semiconductor or a metal is effected in the silicon oxide film 3712, forming conductive particles 3723 in the silicon oxide film 3712. In this example, silver was introduced into the silicon oxide film 3712 by the negative ion implantation method like the aforementioned method. In this example, heat treatment was further carried out. This heat treatment, which can also be eliminated, should preferably be carried out. This is because the particle size and the distribution of the conductive particles 3723 can be adjusted, and the recovery of implantation defects and so on can be achieved if heat treatment is carried out. As described above, a memory function body 3715, which has the same structure as that of the aforementioned particle container 113, is formed.

Figure 29D:
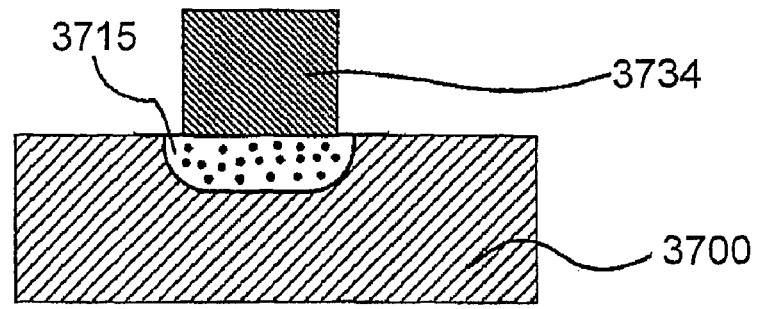

Next, as shown in FIG. 29D, a gate electrode 3734 is formed as a third electrode on the memory function body 3715 by a method similar to that of the formation of the gate electrode of the well-known MOS transistor. In this case, it is preferable to form the gate electrode 3734 with the silicon nitride film 3701 left. This is because manufacturing variations are consequently reduced since the positional relation between the gate electrode 3734 and the memory function body 3715 is determined in a self-aligning manner.

Figure 29E:
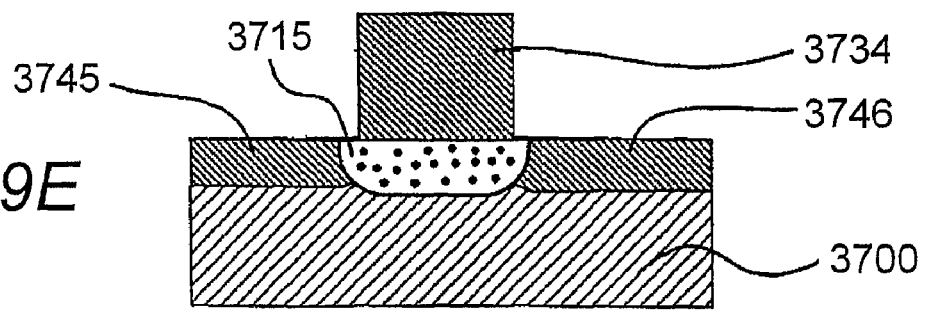

After removing the silicon nitride film 3701, a source region 3745 and a drain region 3746 as first and second electrodes are formed so as to place the memory function body 3715 therebetween from opposite sides in the layer direction (transverse direction in FIG. 29) by implanting impurity ions into the surface of the semiconductor substrate 3700 with the gate electrode 3734 serving as a mask as shown in FIG. 29E.

The memory, which has the electrode arrangement of the type shown in FIG. 28B, can be thus fabricated on the surface of the semiconductor substrate 3700. In the fabricated memory, the magnitude of the current that flows through the memory function body 3715 is changed before and after a specified voltage is applied across the source region 3745 and the drain region 3746, and the storage state (written state or erased state) is discriminated according to the magnitude of the current.

FIG. 30 shows another method for fabricating a memory that has the electrode arrangement of the type shown in FIG. 28B on the surface of a semiconductor substrate.

Figure 30A:
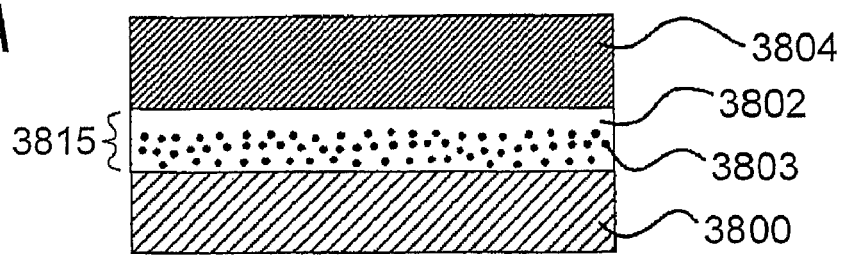
FIGS. 30A through 30E are views showing another fabrication method of a memory that has the electrode arrangement of the type of FIG. 28B.

First of all, as shown in FIG. 30A, a silicon oxide film 3802 is formed on a silicon substrate 3800 by thermal oxidation. Subsequently, as in the aforementioned method, silver ions are introduced into the silicon oxide film 3802 by the negative ion implantation method, forming a memory function body 3815 in a layer form including conductive particles 3803 in the silicon oxide film 3802. Subsequently, a substance for forming a third electrode of, for example, polysilicon 3804 is deposited in the whole area on the memory function body 3815.

Figure 30B:
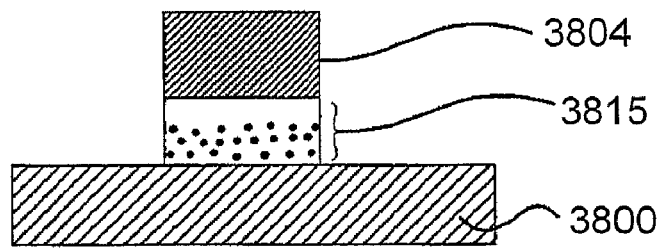

Next, as shown in FIG. 30B, a gate electrode 3804 (denoted by the same reference numerals as those of the polysilicon for the sake of easy understanding) as a third electrode is formed on the memory function body 3815 by a method similar to that of the pattern formation of the gate electrode of the well-known MOS transistor.

Figure 30C:
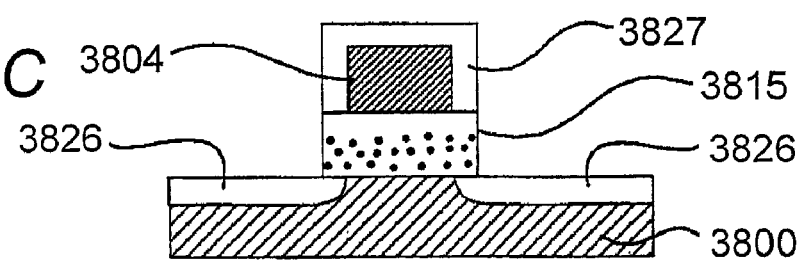

Next, as shown in FIG. 30C, oxidation is carried out to form a silicon oxide film 3826 on the surface of the silicon substrate 3800, and a silicon oxide film 3827 is formed on the surface of the gate electrode 3804.

Figure 30D:
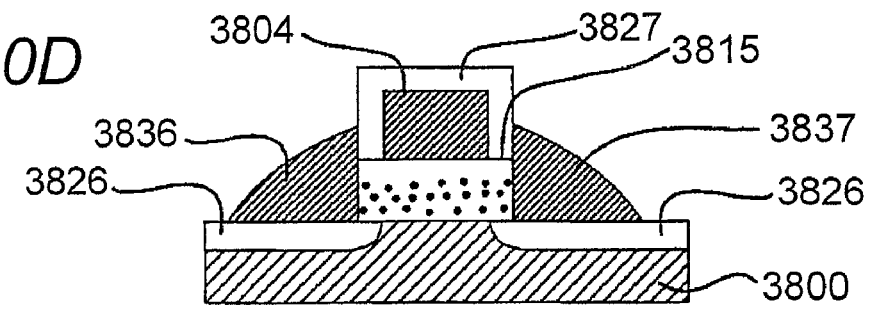

Next, as shown in FIG. 30D, polysilicon sidewalls 3836 and 3837 as the first and second electrodes are formed so as to place the memory function body 3815 therebetween from opposite sides in the layer direction (transverse direction in FIG. 30) by using a well-known method. The polysilicon sidewalls 3836 and 3837 are electrically insulated with respect to the silicon substrate 3800 and the gate electrode 3804 by the silicon oxide films 3826 and 3827.

Figure 30E:
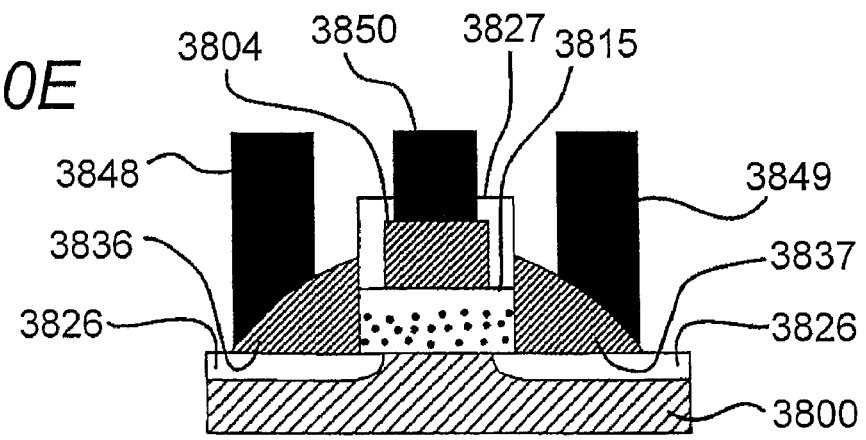

Next, after an unshown interlayer insulation film is formed on this, the well-known contact process is carried out as shown in FIG. 30E, forming contact interconnections 3848, 3849 and 3850 on the polysilicon sidewalls 3836 and 3837 and the gate electrode 3804, respectively.

It is desirable to distribute the conductive particles 3803 on the side near the silicon substrate 3800 with regard to the thickness direction of the silicon oxide film 3802 inside the memory function body 3815 (see FIG. 30A). The reason for the above is to form the conductive particles 3803 so that the particles are apart from the third electrode (gate electrode) 3804, thereby preventing useless memory operation from being performed between the first and second electrodes (polysilicon sidewalls) 3836 and 3837 and the third electrode (gate electrode) 3804. In concrete, there can be used a method for carrying out ion implantation for forming the conductive particles so that the implantation depth becomes sufficiently deeper than the surface of the silicon oxide film, a method for forming an insulator film between the memory function body 3815 and the gate electrode 3804 and so on.

Figure 31A:
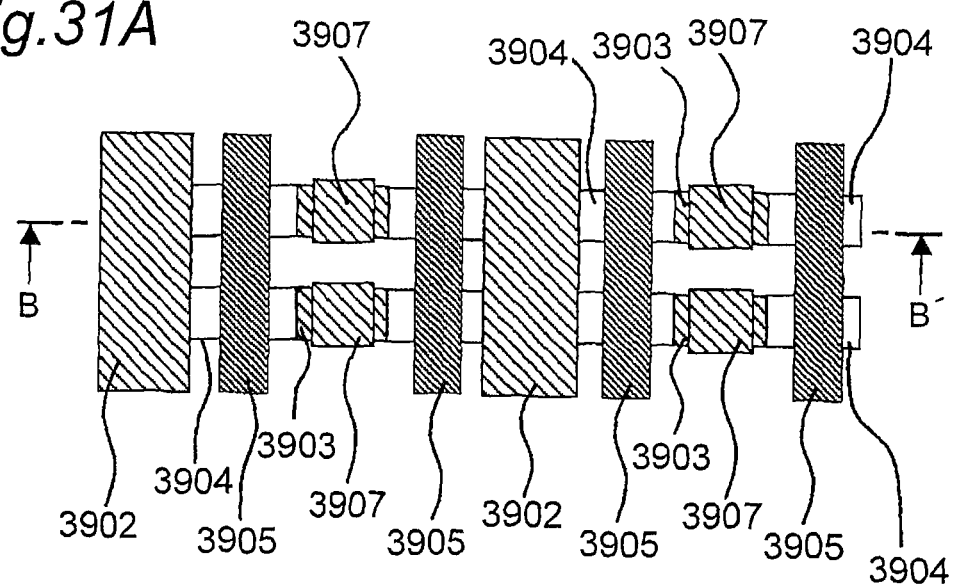
FIG. 31A is a view showing a plan layout of a memory integrated three-dimensionally.
Figure 31B:
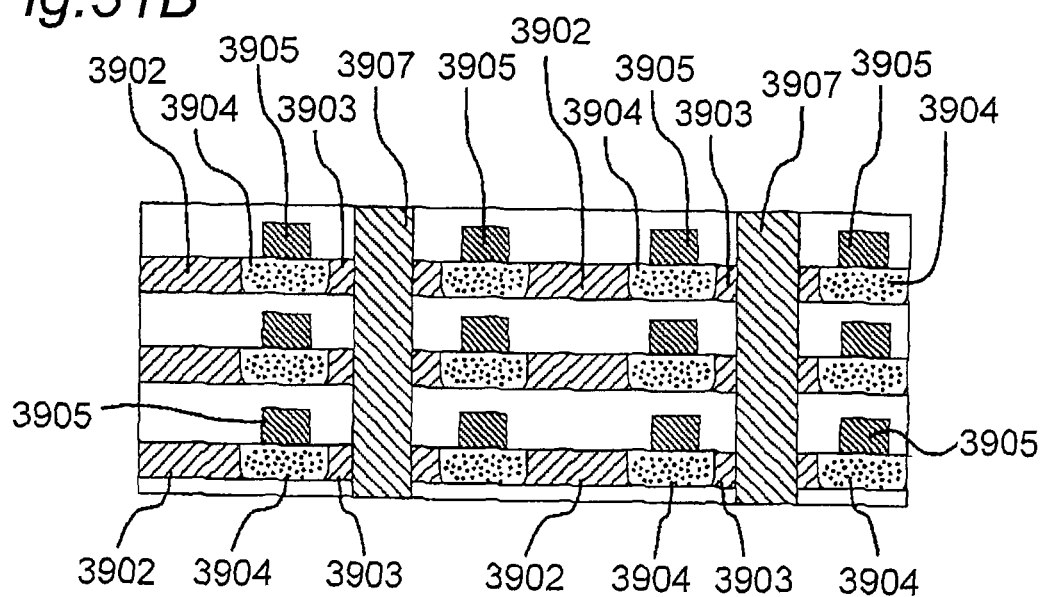
FIG. 31B is a view taken along the line of B-B' indicated by arrows in FIG. 31A.

FIG. 31 shows the structure of a memory in which a plurality of the aforementioned memory function bodies are arranged in the direction perpendicular to the substrate and three-dimensionally integrated. FIG. 31A shows a plan layout when the memory is viewed from the upper side with the interlayer insulation film removed, while FIG. 31B shows a cross section taken along the arrow line B-B' in FIG. 31A. In the figures, there are shown a memory function body 3904, a first electrode 3902, a second electrode 3903 and a third electrode 3905. The contact interconnection 3907 electrically connects a plurality of second electrodes 3903, 3903, . . . arranged in the direction perpendicular to the substrate.

Since this memory is three-dimensionally integrated, it is possible to largely shrink the effective occupation area and increase the memory capacity.

Although not shown in FIG. 31, the substrate can be provided by, for example, a glass substrate, a silicon substrate whose upper layer is oxidized or the like. The conventional floating gate type memory, based on the normal MOS transistor, is therefore generally fabricated on a silicon substrate. However, the memory of the present invention does not necessarily need to be fabricated on a silicon substrate.

A method for fabricating a memory that has a three-dimensional spatial structure of the type shown in FIG. 31 will be described next by using FIGS. 32 and 33.

FIGS. 32A to 32E show the sectional views of the memory in the processing stages.

First of all, as shown in FIG. 32A, an insulator film 4001 of a silicon oxide film or the like and a silicon film 4002 are successively stacked on a groundwork or a substrate 4000. Subsequently, a silicon nitride film 4003 is deposited as a mask for oxidation on the silicon film 4002, and openings 4003a are formed in specified regions of this silicon nitride film. Then, as shown in FIG. 32B, the silicon film 4002 is oxidized from its surface through the openings 4003a, forming a silicon oxide film 4018 as an insulator in the specified regions (regions in which memory function bodies should be formed) of the silicon film 4002.

Subsequently, silver is introduced into the silicon oxide film 4018 by the negative ion implantation method by using an unshown mask as in the aforementioned method, and heat treatment is further carried out, forming a memory function body 3904. It is to be noted that the region left unoxidized in the silicon film 4002 is used as a first electrode 3902 and a second electrode 3903.

Next, as shown in FIG. 32C, a material for forming a third electrode of, for example, polysilicon is deposited in the whole area on this, forming a gate electrode 3905 as the third electrode on the memory function body 3904 by a method similar to that of the pattern formation of the gate electrode of the well-known MOS transistor. Subsequently, an interlayer insulation film 4026 is formed in the whole area on this. Then, the surface of this interlayer insulation film 4026 is flattened by the CMP (Chemical-Mechanical Polishing) method or the like.

Subsequently, a silicon film 4032 is stacked again in the whole area on the interlayer insulation film 4026. Then, by repeating the processes similar to the aforementioned processes, a second layer memory function body 3904, a first electrode 3902, a second electrode 3903 and a third electrode 3905 are formed as shown in FIG. 32D. Subsequently, an interlayer insulation film 4056 is formed in the whole area on this. Then, the surface of this interlayer insulation film 4056 is flattened by CMP or the like.

The layers are thus increased to the desired number of layers, and thereafter, a contact interconnection 3907 is formed so as to connect the second electrodes 3903, 3903, . . . in the direction perpendicular to the substrate 4000, as shown in FIG. 32E.

FIGS. 33A to 33F show plan layouts when the memory in the fabrication processes is viewed from the upper side.

Figure 33A:
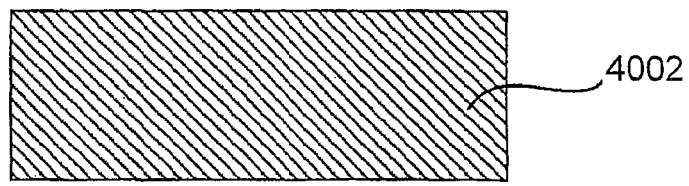
FIGS. 33A through 33F are views showing the plan layout in the fabrication processes of the memory shown in FIGS. 31A and 31B.

As shown in FIG. 33A, the silicon film 4002 is formed in the whole area on the substrate.

Figure 33B:
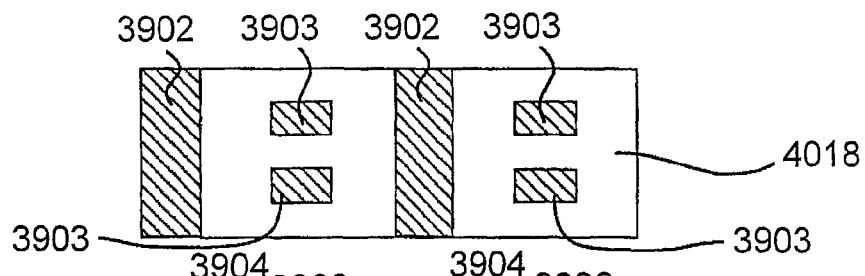

Next, as shown in FIG. 33B, the silicon film 4102 is partially oxidized leaving the portions that become the first electrodes 3902 and the second electrodes 3903, forming a silicon oxide film 4018. The first electrodes 3902 are each extended in a linear form in the vertical direction in FIG. 33B. On the other hand, the second electrodes 3903 have a rectangular pattern and are individually isolated in the silicon oxide film 4018. The silicon oxide film 4018 also plays the role of element isolation. A plurality of second electrodes 3903 are arranged along the vertical direction at the center between mutually adjacent first electrodes 3902 and 3902.

Figure 33C:
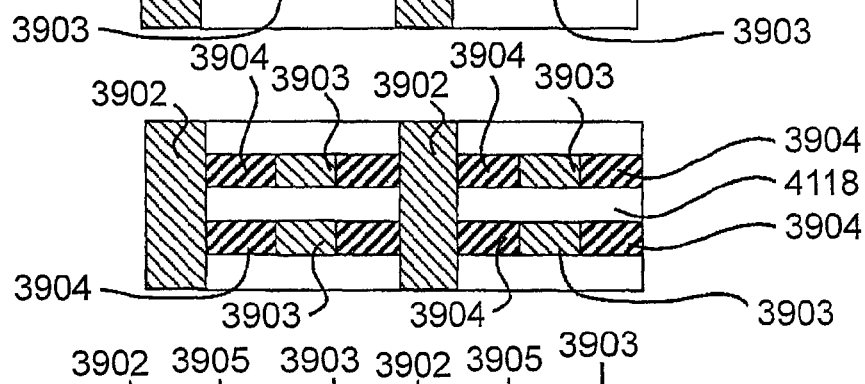

Next, as shown in FIG. 33C, a memory function body 3904 is formed in each rectangular region interposed between the first electrode 3902 and the second electrode 3903 inside the silicon oxide film 4018. A sectional view at this time corresponds to FIG. 32B.

Figure 33D:
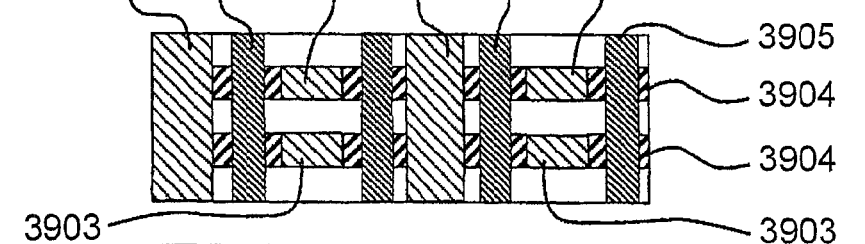

Next, as shown in FIG. 33D, a gate electrode 3905 as the third electrode is formed in a linear form extended in the vertical direction so as to extend over a plurality of memory function bodies 3904 arranged parallel in the vertical direction.

Figure 33E:

Next, as shown in FIG. 33E, an interlayer insulation film 4026 is formed in the whole area on this. A sectional view at this time corresponds to FIGS. 32C and 32D.

Figure 33F:

Subsequently, as shown in FIG. 33F, a contact interconnection 3907 is formed in a position in which the contact interconnection 3907 runs through the second electrode 3903. A sectional view at this time corresponds to FIG. 32E.

Moreover, although the first electrode 3902 and the third electrode 3905 are extended as interconnections parallel in the vertical direction in this example, the present invention is not limited to this. If multi-layer interconnections are provided as in the fabrication of ordinary integrated circuits, then the interconnection for the first electrode 3902, the interconnection 3907 for the second electrode 3903 and the interconnection for the third electrode 3905 can be formed so as to intersect one another.

Figure 34A:
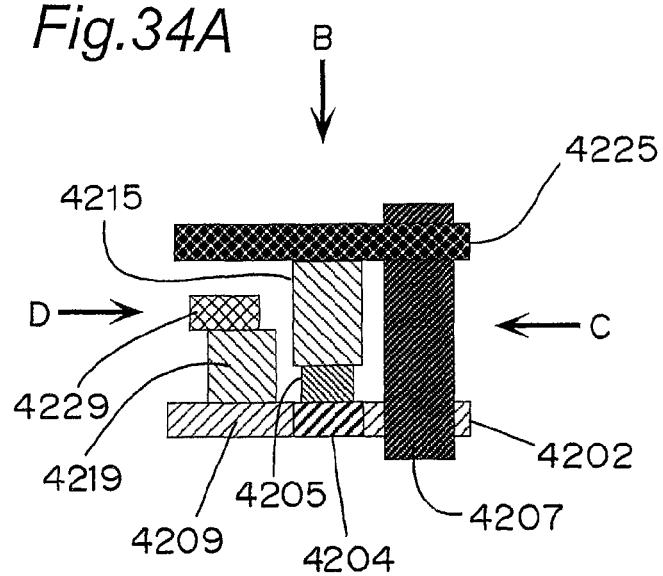
FIG. 34A is a view showing a memory structure in which the interconnections connected to the first, second and third electrodes are substantially perpendicular to one another.
Figure 34B:
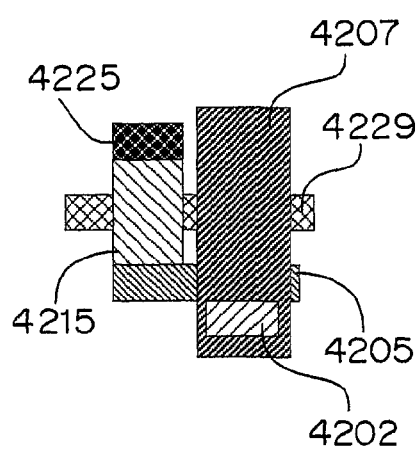
FIGS. 34B, 34C and 34D are views showing the memory of FIG. 34A viewed from the direction of B, the direction of C and the direction of D, respectively.
Figure 34C:
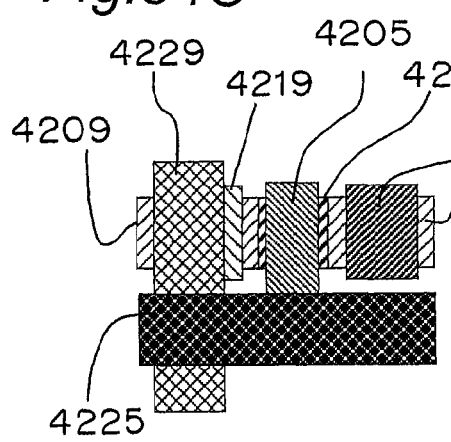
Figure 34D:
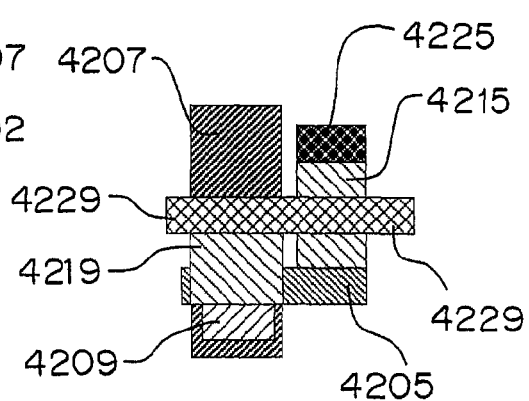

For example, FIG. 34A shows the structure of a memory in which the interconnections connected to the first, second and third electrodes are substantially perpendicular to one another. FIGS. 34B, 34C and 34D show the memory of FIG. 34A viewed from the direction B, the direction C and the direction D, respectively.

In this memory, the first electrode 4209, the second electrode 4202 and the third electrode 4205 are put in contact with the memory function body 4204 from the left-hand side, from the right-hand side and from the upper side, respectively, in FIG. 34A. A first interconnection 4229 extended forwardly depthwise in FIG. 34A is electrically connected to the first electrode 4209 via a contact 4219. A second interconnection 4207 extended in the vertical direction in FIG. 34A is electrically connected to the second electrode 4202. A third interconnection 4225 extended in the transverse direction in FIG. 34A is electrically connected to the third electrode 4205 via a contact 4215.

As described above, if the interconnections connected to the first, second and third electrodes are arranged substantially perpendicularly to one another, it is possible to further largely shrink the effective occupation area and increase the memory capacity.

Although silicon oxide is employed as the material of the insulator forming the particle container in the aforementioned embodiments, it is acceptable to employ such insulators as silicon nitride, aluminum oxide and titanium oxide. However, as it depends also on the size of the particles, excessively high dielectric materials, if employed for the insulator, would cause the capacity to increase, affecting the operating speed. Therefore, the material of the insulator is preferably one having a low relative dielectric constant of not more than 10, preferably not more than 4.

Moreover, although silver is employed above as the material that constitutes the particles, it is also acceptable to employ a metal selected from among gold, silver, copper, aluminum, tin, nickel, platinum, zinc, hafnium, manganese, tantalum, titanium, tungsten, indium or gallium as a material for constituting the particles. Moreover, it is also possible to employ a semiconductor or a compound semiconductor of silicon, germanium or the like or employ an alloy or another compound. Moreover, even a magnetic material can be employed. However, a single element is preferable since the implantation thereof is easy.

Moreover, although a silicon substrate has been employed as the substrate, it is acceptable to employ a substrate constructed of a semiconductor other than silicon or a metal material. Moreover, it is acceptable to form a conductive layer on a substrate constructed of an insulator material such as a glass substrate by CVD (Chemical Vapor Deposition) method, evaporation, MBE (Molecular Beam Epitaxy) method or the like and use the conductive layer as the second electrode.

The silicon film can be formed through epitaxial growth and polysilicon deposition, and CGS (Continuous Grain Silicon) or the like can be employed. However, it is preferable to employ polysilicon or CGS, which can be formed at a comparatively low temperature. It is more preferable to employ CGS of good crystallinity in terms of improving the rectification capability and excellence in reliability. The CGS is a silicon that can be fabricated at a low temperature by the fabrication method described in JP H08-78329 A and so on and has the advantages that it has better crystallinity than those of amorphous silicon, low-temperature polysilicon other than CGS and so on and is able to obtain higher mobility.

As apparent the above description, according to the memory of the present invention, the magnitude of the current that flows through the memory function body can be changed by electrical control with a comparatively low voltage at normal temperature. Thus, there can be provided a memory having practicability.

Also, according to the manufacturing method of the memory of the present invention, such memories can be fabricated with good productivity.

Moreover, the semiconductor device including the memory of the present invention can be made higher integration and lower in power consumption.

Further, electronic equipment having such a semiconductor device can be made smaller in size and lower in power consumption, thus suitable for portable use.

Figure 35:
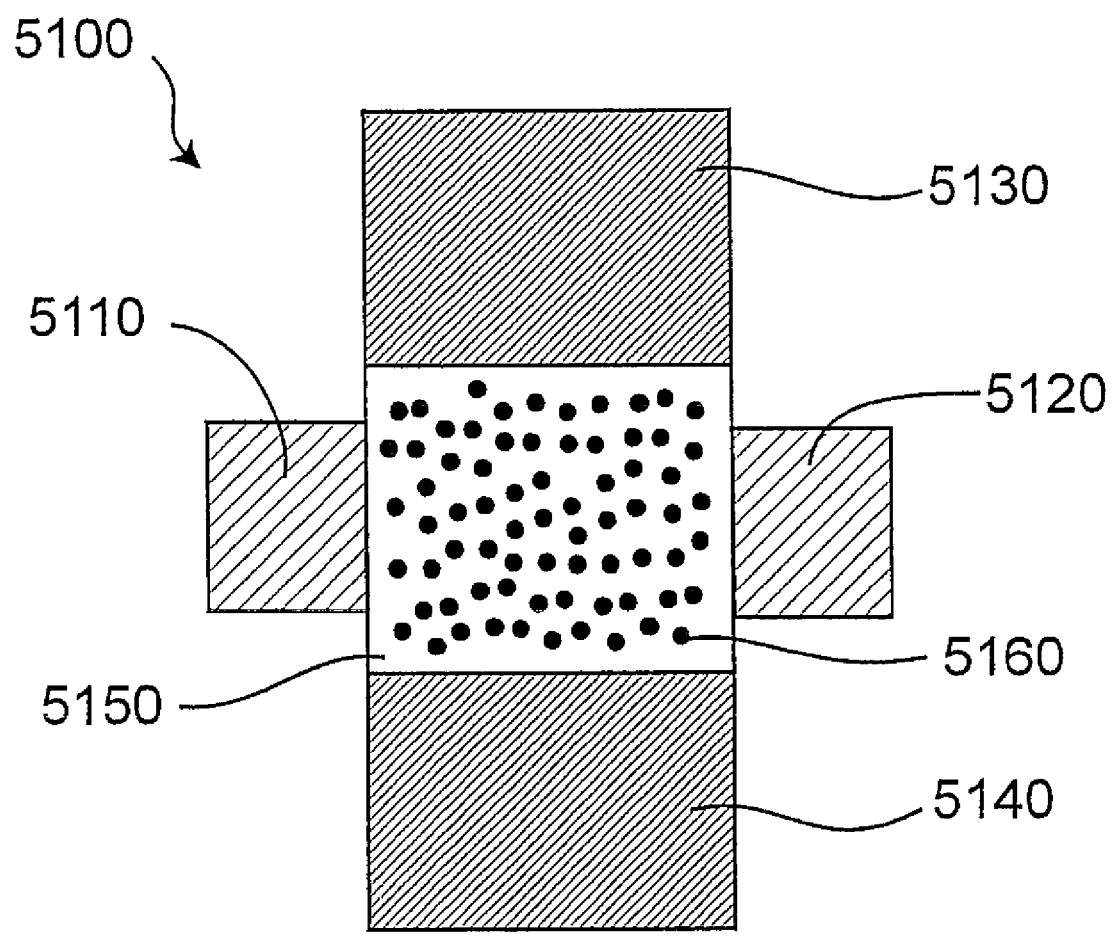
FIG. 35 is a view showing a schematic cross-sectional structure of the resistance-changing function body of one embodiment of the invention.

FIG. 35 shows a schematic cross-sectional structure of the resistance-changing function body (the whole body is denoted by reference numeral 5100) of one embodiment. This resistance-changing function body 100 is provided with an insulator 5150, which is placed between a third electrode 5130 and a fourth electrode 5140 and placed between a first electrode 5110 and a second electrode 5120 provided separately from these third and fourth electrodes 5130 and 5140. In concrete, the third electrode 5130 and the fourth electrode 5140 are put in contact with the insulator 5150 in the vertical direction in the figure, while the first electrode 5110 and the second electrode 5120 are put in contact with the insulator 5150 in the sidewise direction in the figure. The insulator 5150 contains a plurality of conductive particles 5160 arranged so that electrical resistance between the first electrode 5110 and the second electrode 5120 changes on the basis of a size effect before and after the application of a specified voltage across the third electrode 5130 and the fourth electrode 5140. In this example, it is assumed that silicon oxide is employed as the material of the insulator 5150, while silver particles having a particle size smaller than 1 μm are employed as the conductive particles. The particles 5160 have roughly uniform particle sizes and are distributed roughly uniformly throughout the whole region of the insulator 5150.

In this resistance-changing function body 5100, the electrical resistance between the first electrode 5110 and the second electrode 5120 changes on the basis of the size effect of the conductive particles 5160 before and after the application of the specified voltage across the third electrode 5130 and the fourth electrode 5140 due to the arrangement of the plurality of conductive particles 5160 in the insulator 5150.

That is, by making a current flow between the third electrode 5130 and the fourth electrode 5140, one to several electric charges are accumulated in a certain conductive particle in the vicinity of a current path or in the current path, and the accumulated electric charges exert Coulomb interactions on the electrons in the current path. Therefore, the electrical resistance between the first and second electrodes 5110 and 5120 changes in accordance with the presence or absence or the amount of electric charges accumulated in the conductive particles 5160.

Figure 36:
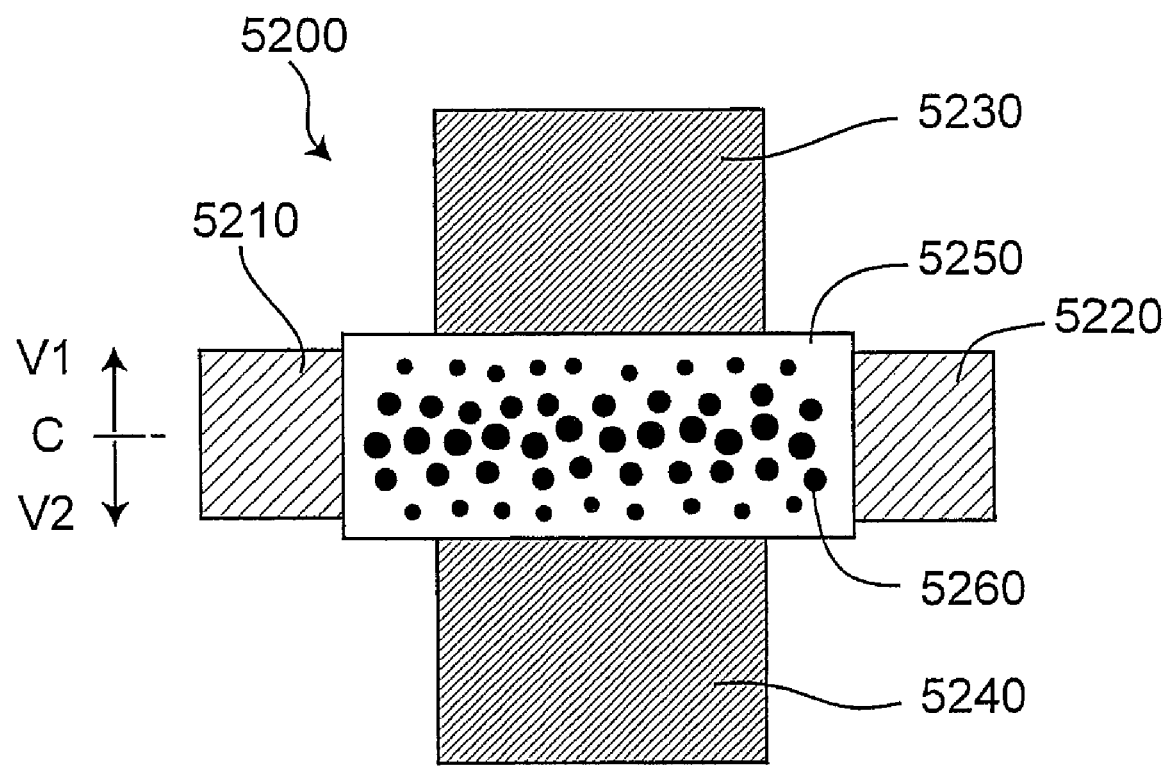
FIG. 36 is a view showing a schematic cross-sectional structure of a resistance-changing function body of another embodiment of the invention.

FIG. 36 shows the schematic cross-sectional structure of the resistance-changing function body (the whole body is denoted by reference numeral 200) of a more preferable embodiment. As in the resistance-changing function body 5100 of FIG. 35, this resistance-changing function body 5200 is provided with an insulator 5250, which is placed between a third electrode 5230 and a fourth electrode 5240 and placed between a first electrode 5210 and a second electrode 5220 provided separately from the third and fourth electrodes 5230 and 5240. In this example, the insulator 5250 is formed in a layer form.

The third electrode 5230 and the fourth electrode 5240 are provided on opposite sides V1 and V2 in the thickness direction (vertical direction in the figure) of the insulator 5250. The first electrode 5210 and the second electrode 5220 are provided on opposite sides in the layer direction (sidewise direction in the figure) of the insulator 5250 perpendicularly to the thickness directions V1 and V2.

The insulator 5250 contains a plurality of conductive particles 5260 arranged so that electrical resistance between the first electrode 5210 and the second electrode 5220 changes on the basis of the size effect before and after the application of a specified voltage across the third electrode 5230 and the fourth electrode 5240. In this example, as in the foregoing example, it is assumed that silicon oxide is employed as the material of the insulator 5250, while silver particles having a particle size smaller than 1 μm are employed as conductive particles.

The conductive particles 5260 are uniformly distributed in the layer direction of the insulator 5250 and distributed within a certain range in the thickness direction of the insulator 5250. This arrangement restrains a current from becoming excessively hard to flow or excessively easy to flow in the thickness direction of the insulator 5250 between the third electrode 5230 and the fourth electrode 5240. Therefore, a change in the electrical resistance between the first electrode 5210 and the second electrode 5220 provided on opposite sides in the layer direction of the insulator 5250 is stabilized. As a result, stable characteristics are obtained.

Moreover, as shown in FIG. 36, it is preferable to provide a structure in which the particles contained in the insulation film 5250 have at least two kinds of particle sizes, so that electric charge moving between the first electrode 5210 and the second electrode 5220 can move along comparatively large particles, whereas the electric charge trying to move between the third electrode 5230 and the fourth electrode 5240 have to move along comparatively small particles.

In concrete, it is preferable that the concentration of the silver element that constitutes the conductive particles 5260 is maximized in a certain position C in the insulator 5250 and reduced away from the position C in the thickness directions V1 and V2. In the above case, the current is further restrained from becoming excessively hard to flow or excessively easy to flow in the thickness directions V1 and V2 of the insulator 5250 between the third electrode 5230 and the fourth electrode 5240. As a result, further stabilized characteristics are obtained.

Moreover, it is preferable that the density of the conductive particles 5260 is maximized in a certain position C in the insulator 5250 and reduced away from the position C in the thickness directions V1 and V2. Also, in the above case, the current is further restrained from becoming excessively hard to flow or excessively easy to flow in the thickness directions V1 and V2 of the insulator 5250 between the third electrode 5230 and the fourth electrode 5240. As a result, further stabilized characteristics are obtained.

Moreover, it is preferable that the particle size of the conductive particles 5260 is maximized in a certain position C in the insulator 5250 and reduced away from the position C in the thickness directions V1 and V2. Also, in the above case, the current is further restrained from becoming excessively hard to flow or excessively easy to flow in the thickness directions V1 and V2 of the insulator 5250 between the third electrode 5230 and the fourth electrode 5240. As a result, further stabilized characteristics are obtained. As described above, if particles of a plurality of sizes are employed as the conductive particles 5260, it becomes possible to distribute device roles to the particles that mainly bear the role of electrical conduction and the particles that bear the role of retaining electric charge and changing the electrical resistance, and excellent operational stability can be obtained.

This resistance-changing function body 5200 is formed as follows.

Figure 37A:
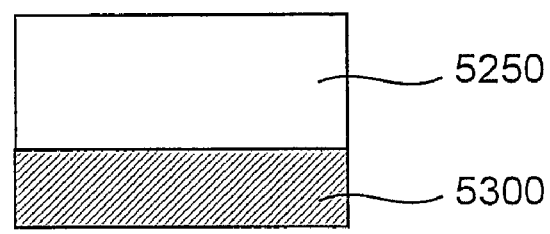
FIGS. 37A to 37E are process diagrams showing fabrication processes of the resistance-changing function body of FIG. 36.

First of all, as shown in FIG. 37A, a silicon oxide film 5250 is formed as an insulator on the surface of a silicon substrate 5300 through a thermal oxidation process. In this case, the film thickness of the formed silicon oxide film 5250 is about 25 nm. It is to be noted that the silicon substrate 5300 is employed as the fourth electrode 5240 of the resistance-changing function body 5200.

Figure 37B:
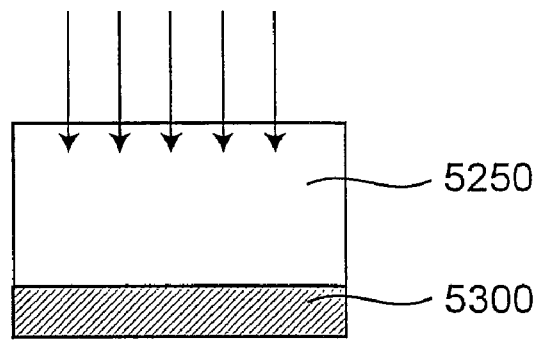

Next, as shown in FIG. 37B, silver is introduced as the element that constitutes the conductive particles into the silicon oxide film 5250 by the negative ion implantation method. In this case, if the implantation energy is extremely high, then the distribution of the implanted silver extremely spreads. This is not suitable for the implantation into the thin film of the silicon oxide film 5250, and the silicon oxide film 5250 is damaged, disadvantageously causing a defect. Therefore, the implantation energy should preferably be set smaller than 100 keV and more preferably be set smaller than 50 keV. By carrying out the implantation with energy of 15 keV, silver can be implanted to an intermediate depth of the silicon oxide film 5250.

Moreover, if the implantation dose is extremely large, then the particle size of the particles becomes extremely increased, and the damage of the silicon oxide film 5250 is increased. If the implantation dose is extremely small, then the particle density becomes extremely reduced. Therefore, the implantation dose should preferably be set greater than $1 \times 10^{12}/cm^2$ and smaller than $1 \times 10^{20}/cm^2$ and more preferably be set greater than $1 \times 10^{13}/cm^2$ and smaller than $1 \times 10^{17}/cm^2$. In the present embodiment, the implantation energy is set to about 15 keV, and the dose is set to about $1 \times 10^{15}/cm^2$.

Moreover, as described above, the negative ion implantation method is adopted as an ion implantation method in the present embodiment. As described above, when the implantation is carried out by using negative ions, the surface potential of the material (silicon oxide film 5250 in this example) that undergoes the implantation does not increase up to the acceleration voltage of positive ions as in the case of positive ions, and the voltage settles to a very low value of about several volts. That is, in the case of positive ion implantation, ions of positive charge are made incident on the material surface, and the secondary electrons of negative charge are discharged. Consequently, the material surface keeps being positively charged. Therefore, the voltage eventually rises up to the acceleration voltage of positive ions.

In contrast to this, in the case of negative ion implantation, ions of negative charge are made incident on the material surface, and the secondary electrons of negative charge are discharged. Consequently, positive charge is generated on the material surface, and the surface voltage settles within a range of about positive several volts to negative several volts. Therefore, effective changes in the acceleration voltage are reduced in comparison with the positive ion implantation, and this makes it possible to suppress variations in the implantation depth. Moreover, the silicon oxide film 5250 that undergoes the implantation and the silicon substrate 5300 that supports it are scarcely charged, and this therefore makes it possible to suppress the occurrence of defects due to dielectric breakdown and so on.

Figure 37C:
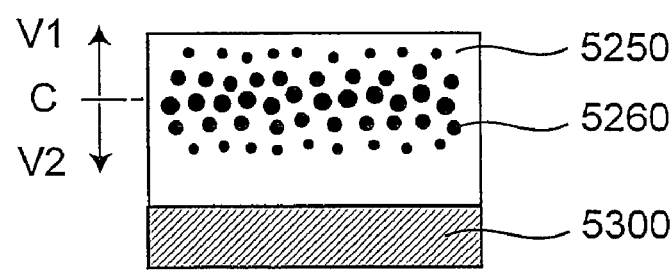

Next, as shown in FIG. 37C, heat treatment is carried out to condense or diffuse the implanted element ("silver" in the present embodiment). By once effecting sufficient diffusion or making the implantation distribution concentration gradient gradual in the foregoing implantation process, it is possible to roughly uniformly distribute the particles 5160 throughout the whole region of the insulator 5150 with a uniform particle size as in the example shown in FIG. 35. However, in order to provide a more preferable state as in the example shown in FIG. 36, the heat treatment is carried out moderately so that the implantation concentration distribution does not excessively spread. This arrangement enables the formation of the silver particles 5260 in the silicon oxide film 5250 at such a density that either one or both of particle size and Coulomb force by which a remarkable size effect become effective, and allows the silver particles 5260 to be distributed within a certain range in the thickness directions V1 and V2 centered about a certain depth C in the silicon oxide film 5250. Moreover, defects that have occurred during the ion implantation can be corrected.

The heat treatment is ineffective when its temperature is extremely low, while the implanted element is diffused and melted when the temperature is extremely high, so that particles could not be formed. Accordingly, the temperature of the heat treatment should preferably be set higher than 200° C. and lower than the melting point of the implanted element. Moreover, it is true that the effect of the heat treatment can be increased by prolonging the time of the heat treatment even at a certain temperature, but if the time is excessively long, there may arise cases where the particle size becomes excessively large or where the implanted element diffuses to a region outside the region in which the particles should be formed. Therefore, the heat treatment time should preferably be set shorter than 24 hours.

For example, when an ordinary heat treatment furnace is used, it is preferable to set the heat treatment temperature within a range of 300° C. to 1000° C. in an inert atmosphere of argon, nitrogen or the like. However, when silver is employed as the material of the particles, silver is disadvantageously diffused roughly uniformly if heat treatment is carried out at an elevated temperature for a long time. Therefore, in this example, a ceramics electric tube furnace produced by ASAHI Rika Seisakusho was used, and heat treatment was carried out at a temperature of about 600° C. for about one hour in an argon atmosphere.

In the case where a material that has a higher melting point other than the aforementioned "silver", or for example, a conductive material of "gold" or the like is employed as the particles 5260, the particles 5260 can be formed without being extremely diffused even through annealing at a high temperature of about 900° C. as shown in FIG. 37 in the case of "gold". However, in the case where similar particles are formed by using, for example, "silver", silver is disadvantageously diffused roughly uniformly if annealing is carried out at a temperature of about 900° C. Since the oxidation temperature of typical silicon is about 900° C. in the semiconductor industry, it is advantageous to use a high melting-point material as the particles 5260 in terms of compatibility with the existing semiconductor processes.

Figure 37D:
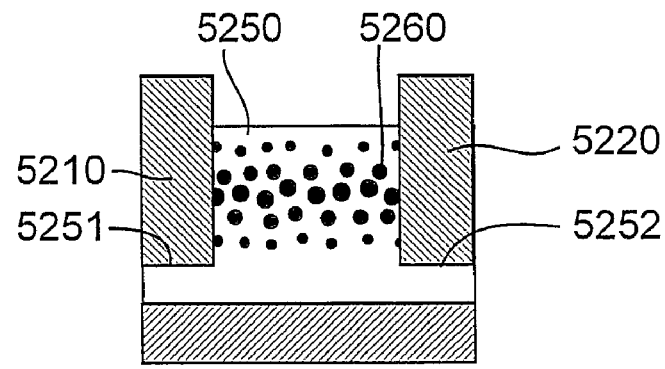

After the silver particles 5260 are formed moderately distributed in the silicon oxide film 5250 as described above, grooves 5251 and 5252 that have a depth exceeding the distribution of the silver particles 5260 are provided by etching on opposite sides in the layer direction (sidewise direction in the figure) of the silicon oxide film 5250 as shown in FIG. 37D. Further, the first electrode 5210 and the second electrode 5220 are formed by burying the grooves 5251 and 5252 with a conductive material by evaporation or the like.

Figure 37E:
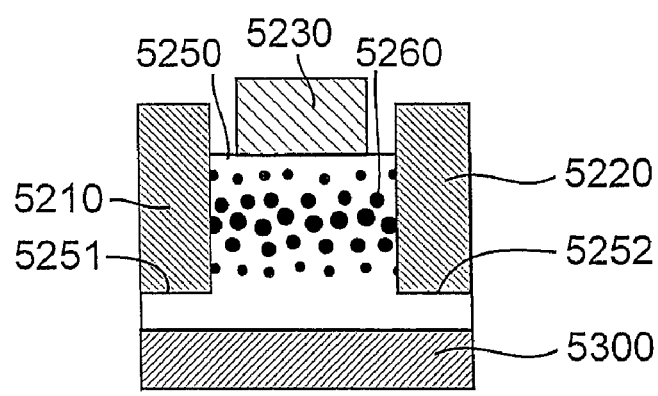

Moreover, as shown in FIG. 37E, the third electrode 5230 is formed on the surface of the silicon oxide film 5250 by evaporation or the like.

As a result, the silicon oxide film 5250 is placed between the third electrode 5230 and the silicon substrate 5300 (i.e., fourth electrode 5240) from opposite sides in the thickness direction, while the silicon oxide film 5250 is placed between the first electrode 5210 and the second electrode 5220 from opposite sides in the layer direction.

The materials of the first electrode 5210, the second electrode 5220 and the third electrode 5230 may also be made of a metal, a semiconductor or an organic substance so long as the material has conductivity. Gold was employed in the present embodiment. Moreover, as a method for forming these electrodes, there can be adopted CVD (Chemical Vapor Deposition), evaporation, MBE (Molecular Beam Epitaxy) and so on.

Furthermore, it is preferable to carry out hydrogen sintering. By so doing, charge trapping factors of interface state and so on other than the particles 5260 can be restrained, and the operation characteristics are stabilized, allowing the reliability to be improved. It is to be noted that, if the hydrogen sintering is carried out at a temperature of not lower than 600° C., it becomes possible to concurrently carry out heat treatment to correct the aforementioned defects and hydrogen sintering, and this is rather preferable for the reason that the processes can be simplified.

Figure 38:
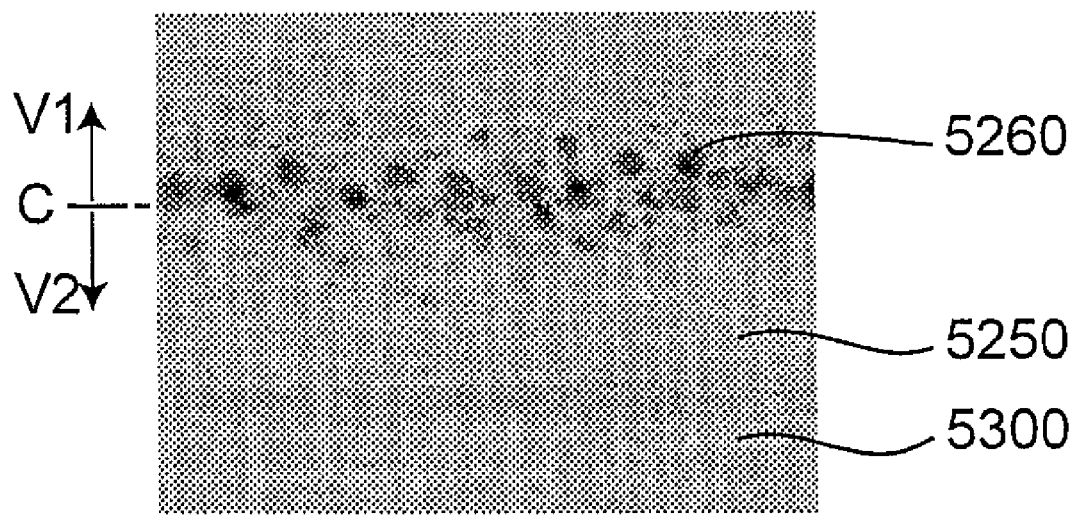
FIG. 38A is a view showing a photograph resulting from observing a cross section of a layered silicon oxide film containing particles in the resistance-changing function body of FIG. 36 by TEM (Transmission Electron Microscope)

The cross section of the layered silicon oxide film 5250 containing the particles 5260 of the resistance-changing function body 5200 produced as described above was observed by TEM (Transmission Electron Microscope). As a result, it was discovered that the implanted silver ions were condensed as shown in FIG. 38 and became nanometer-size particles 5260 having a particle size of not greater than about 3 nm. Moreover, the particles 5260 were able to be distributed within a certain range in the thickness directions V1 and V2 centered about the depth C expected from the set implantation energy (acceleration energy of silver ions) in the silicon oxide film 5250. That is, the concentration of the silver element constituting the conductive particles 5260 was maximized in a certain position C in the insulator 5250 and reduced away from the position C in the thickness directions V1 and V2. Moreover, the density of the conductive particles 5260 was maximized in a certain position C in the insulator 5250 and reduced away from the position C in the thickness directions V1 and V2. Furthermore, the particle size of the conductive particles 5260 was maximized in a certain position C in the insulator 5250 and reduced away from the position C in the thickness directions V1 and V2.

As described above, according to the ion implantation, the conductive particles 5260 can be formed at high density in the insulator 5250 within a short time through one-time processing, and the conductive particles 5260 can be desirably distributed in the thickness directions V1 and V2 of the insulator 5250. Moreover, according to the ion implantation, there is required no fine processing technique such as photolithography and etching in order to form the conductive particles 5260. Therefore, the ion implantation is excellent in productivity.

Moreover, the substance for forming the conductive particles 5260 in the insulator 5250 is implanted by the negative ion implantation method in the present embodiment, and therefore, the insulator 5250 and the silicon substrate 5300 that supports it can be prevented from being electrically charged during implantation. Therefore, the implantation energy can be accurately controlled, and variations in the implantation can be suppressed. Moreover, since the electrical charging is suppressed as described above, it is possible to prevent the destruction of the insulator 5250 due to electrical charging and the consequent occurrence of defects. As the result of the above, the reliability of the resistance-changing function body 5200 can be improved.

Figure 39:
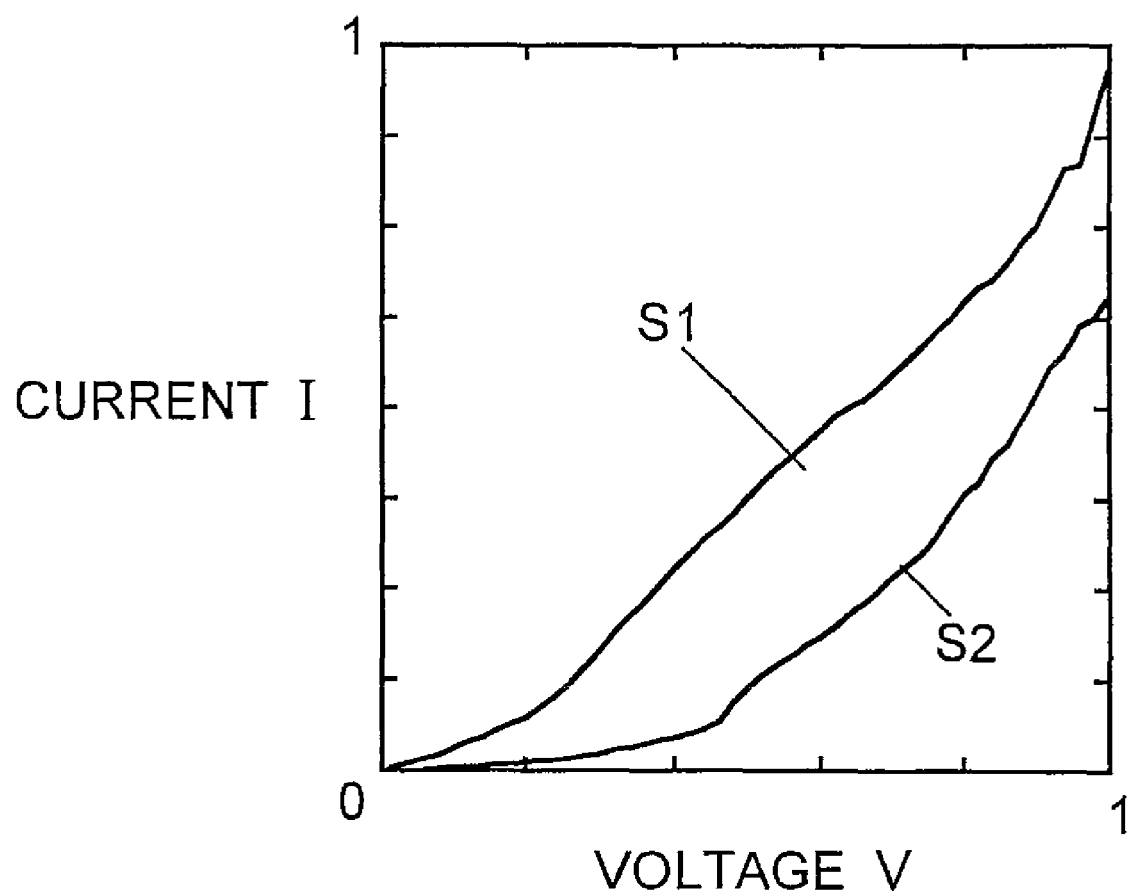
FIG. 39 is a chart showing current-voltage (I-V) characteristics at normal temperature (25° C.) of the resistance-changing function body of FIG. 36.

FIG. 39 shows a graph of the current-voltage (I-V) characteristic at normal temperature (25° C.) of the resistance-changing function body 5200 produced by the aforementioned method.

This characteristic was obtained by grounding the second electrode 5220, applying a voltage to the first electrode 5210 and observing the current flowing through the first electrode 5210. First of all, when the voltage was continuously changed from lower to higher side, the current was increased as indicated by the characteristic data S1 in FIG. 39. Subsequently, a voltage of about 5 V was applied across the third electrode 5230 and the fourth electrode 5240, and thereafter, a voltage was applied again across the first electrode 5210 and the second electrode 5220 to similarly observe the current. Consequently, the current was increased as indicated by the characteristic data S2 in FIG. 39. As is understood from FIG. 39, according to this current-voltage (I-V) characteristic, the current flowing between the first electrode 5210 and the second electrode 5220 after the application of the voltage across the third electrode 5230 and the fourth electrode 5240 is reduced with respect to any voltage within the measured voltage range. That is, the resistance is increased. This reason will be considered next.

According to the characteristic data S1 of FIG. 39, when the voltage is applied across the first electrode 5210 and the second electrode 5220, it is surmised that electric charges move, or a current flows mainly in the layer direction along the comparatively large particles existing in the vicinity of the distribution center C regarding the thickness direction of silicon oxide film 5250. Comparatively small particles are existing scattered in the regions remote from the comparatively large particles located in the vicinity of the center C in the thickness directions V1 and V2. In the regions, the particles have small particle sizes, and it is highly probable that the adjoining particles are separated farther apart from one another than in the vicinity of the center C in terms of intervals. Therefore, it can be considered that there is a small amount of electric charges transferred along small particles.

A behavior when a voltage is applied across the third electrode 5230 and the fourth electrode 5240 will be considered next. In this case, considering the direction in which the voltage is applied, it can easily be surmised that if a voltage of not smaller than a certain voltage is applied, electric charges are injected also into the comparatively small particles existing in the regions apart from the comparatively large particles located in the vicinity of the center C in the thickness directions V1 and V2 as a consequence of tunneling through the surrounding oxide. It can be considered that when electric charges are injected into these small particles, the electric charges are retained in the small particles even if the voltage application across the third electrode 5230 and the fourth electrode 5240 is stopped since the particles are surrounded by the insulator.

Here is considered a case where a voltage is applied again across the first electrode 5210 and the second electrode 5220 on this condition. In this case, electric charges are retained in the small particles existing in the regions remote from the comparatively large particles located in the vicinity of the center C in the thickness directions V1 and V2. It is a matter of course that those electric charges are expected to exert Coulomb interactions on the electric charges that try to move between the first electrode 5210 and the second electrode 5220 while being transferred along the large particles located in the vicinity of the center C and obstruct the movement of the electric charges. That is, it can be considered that the current flowing between the first electrode 5210 and the second electrode 5220 is restrained and the current is reduced in comparison with the state of the characteristic data S1. That is, it can be considered that the electrical resistance between the first electrode and the second electrode is increased.

Moreover, the cause of the electrical resistance-changing can also be considered to be ascribed to a change in the Coulomb energy as a consequence of the diffusion and disappearance or the condensation and enlargement of the particles due to the influence of the current. It can otherwise be considered that the Coulomb energy has been changed as a consequence of the discharge of electrons from the particles due to a thermal energy ascribed to Joule heat.

This resistance-changing function body 5200 can be used as a memory through discrimination of binary data by reading the magnitude of the current taking advantage of the resistance change. Moreover, the resistance-changing function body of the present invention can also be referred to as a local charge retaining function body because of partial capturing of electric charges.

When an excessive voltage was applied across the first and second electrodes 5210 and 5220 and across the third and fourth electrodes 5230 and 5240 of the present resistance-changing function body 5200, the current value was remarkably increased. This is presumably ascribed to the change of the particles contained in the insulator or the occurrence of dielectric breakdown of the insulator between particles. It is presumably highly possible that the particles have been diffused or condensed by Joule heat or the state of the particles has been changed by migration due to the current since the insulator between the particles is a tunneling barrier that scarcely causes dielectric breakdown.

Moreover, a normal fuse memory, which utilizes the dielectric breakdown of an insulation film or the like, needs a high voltage to cause the dielectric breakdown of the insulation film or the like. In contrast to this, the present memory, which utilizes the resistance-changing function body and in which the substantial insulation film thickness between particles is thin and a majority of insulation film thickness is capable of tunneling between the particles, therefore becomes capable of write operation executed with a voltage lower than that of the conventional fuse memory. Therefore, the present memory can also be used as a fuse memory usable with a low voltage.

In a case where small particles are made to efficiently retain electric charge taking advantage of the Coulomb blockade effect as a sort of size effect, the energy necessary for making the electric charge separate must be sufficiently larger than the thermal energy due to the ambient temperature so that the Coulomb blockade effect becomes remarkable in consideration of the capacity of the particles. For the above-mentioned purpose, it is estimated that the required radius of the particle might be about 0.5 nm to 1 nm when the particle is assumed to be a perfect conductor sphere. The Coulomb blockade effect itself becomes remarkable as the particle size of the particles is reduced. However, the implantation of electric charge becomes difficult when the particle size of the particles is excessively small, and a high voltage and a reduction in the operation speed occur. Therefore, this arrangement is undesirable from the viewpoint of device application.

Moreover, negative ion implantation is carried out to form the conductive particles in the silicon oxide. Therefore, the silicon oxide after being produced had the same quality as that of a single thermal oxide film and came to have very high reliability. Moreover, the processing time is shortened in comparison with CVD and the like, assuring excellent productivity.

Moreover, according to the negative ion implantation, variations in the particles due to the electrical charging can be suppressed as already described. Therefore, the distribution of the particles can be restrained from varying in the thickness directions V1 and V2 of the silicon oxide film 5250. Therefore, the resistance-changing function body 5200 can be formed into a thin film and allowed to be scaled down in size. When the resistance-changing function body is thus formed into a thin film, the effective electric field applied to the resistance-changing function body is strengthened even if the same voltage is applied across the third and fourth electrodes 5230 and 5240. Therefore, it becomes possible to lower the voltage for operating the resistance-changing function body, assuring excellent productivity and low power consumption.

As schematically shown in FIG. 36, the concentration of the silver element that constitutes the particles 5260 in the silicon oxide film 5250 is not uniform, and a region where the concentration of the silver element that constitutes the particles 5260 is low exists continuously to the region where the concentration of the silver element is high in the thickness directions V1 and V2 of the silicon oxide film 5250. Likewise, the density of the particles 5260 in the silicon oxide film 5250 is not uniform, and a region where the density of the particles 5260 is low exists continuously to the region where the concentration of the conductive particles 5260 is high in the thickness directions V1 and V2 of the silicon oxide film 5250. Likewise, the size of the conductive particles 5260 in the silicon oxide film 5250 is not uniform, and a region where the size of the particles 5260 is small exists continuously to the region where the size of the conductive particles 5260 is large in the thickness directions V1 and V2 of the silicon oxide film 5250. In these cases, the current can be restrained from becoming extremely hard to flow or extremely easy to flow in the thickness directions V1 and V2 of the silicon oxide film 5250, i.e., in the direction in which the third and fourth electrodes 5230 and 5240 are opposed to each other. Therefore, the characteristics of the resistance-changing function body are stabilized.

Moreover, if angled implantation is carried out during the negative ion implantation, the distribution of the particles 5260 can be restrained from spreading in the thickness direction of the silicon oxide film 5250. Therefore, the resistance-changing function body can be formed into a thin film suitably for scale-down in size.

Figure 40:
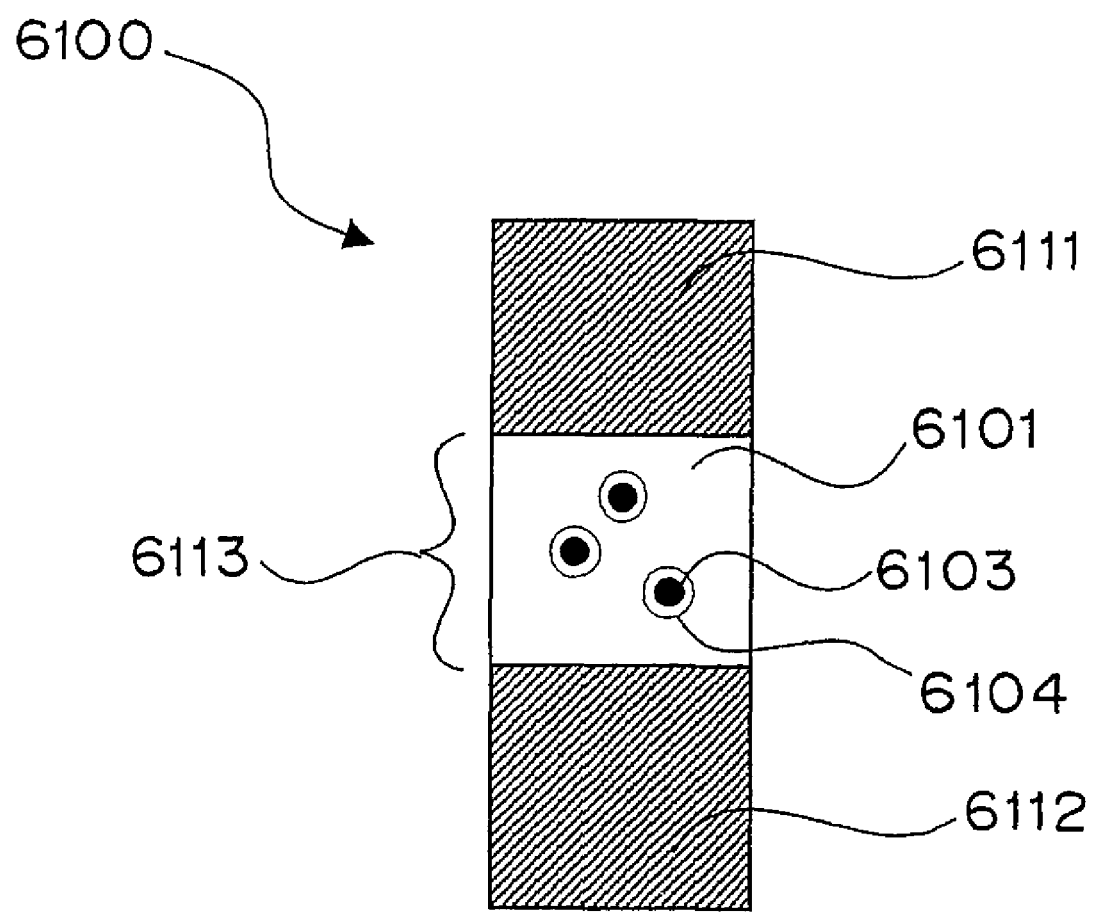
FIG. 40 is a view schematically showing a cross section of a resistance-changing function body of one embodiment of the invention.

FIG. 40 is a schematic sectional view showing the resistance-changing function body of one embodiment of the present invention. This resistance-changing function body 6100 includes a first electrode 6111, a second electrode 6112 and an insulator 6101 that serves as a medium interposed between this first electrode 6111 and the second electrode 6112. One or more conductive particles 6103, each of which has a nanometer size and a surface covered with an insulator 6104, are contained in the insulator 6101.

The resistance-changing function body 6100 is fabricated in a manner as shown in the process charts of FIGS. 41A through 41D.

This embodiment employs silicon oxide as a first material for the material of the insulator 6101, uses silver as a third material for the material of the particles 6103 and uses silver oxide as a second material for the material of the insulator 6104 so as to be manufacturable by using the existing apparatuses used in the semiconductor industry.

Figure 41A:
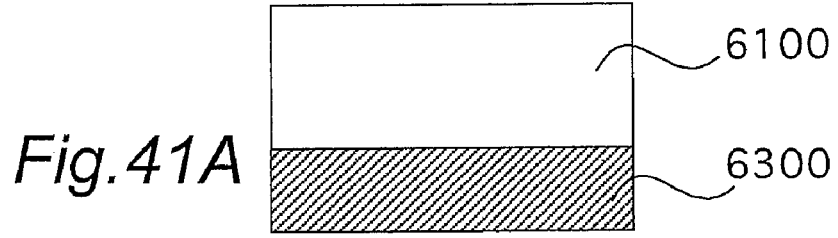
FIGS. 41A to 41D are views for explaining the fabrication processes of the resistance-changing function body of FIG. 40.

First of all, as shown in FIG. 41A, a silicon oxide film 6101 is formed on the surface of a silicon substrate 6300 by a thermal oxidation process. In this example, the silicon oxide film 6101 is formed to a film thickness of about 35 nm. It is to be noted that the portion other than the silicon oxide film 6101 of the silicon substrate is used as a second electrode.

Figure 41B:
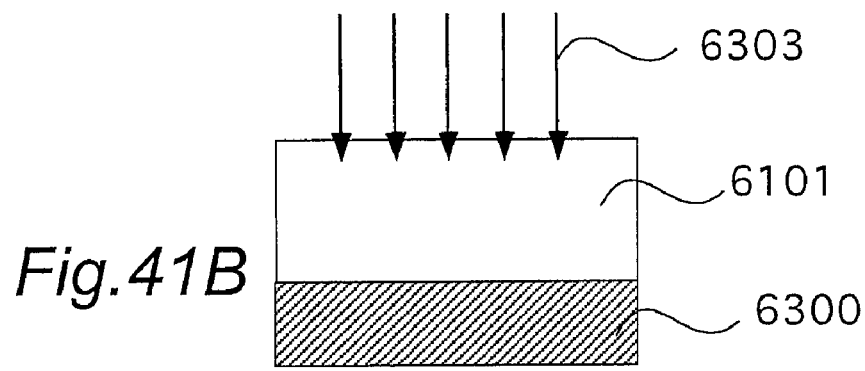

Next, as shown in FIG. 41B, silver 6303 is introduced into the silicon oxide film 6101 by the negative ion implantation method.

In this case, if implantation energy is excessive, then a range of distribution of the implanted silver 6303 in the silicon oxide film 6101 becomes broad, and this is improper to the resistance change function and exerts excessive damage to the silicon oxide film 6101, disadvantageously causing defects. Therefore, the implantation energy should preferably be smaller than 100 keV and more preferably be especially set smaller than 50 keV.

Moreover, if the dosage of silver (dosage per unit area) is extremely large, then the particle size of the conductive particle becomes extremely large, and the damage to the silicon oxide film 6101 is increased. If the dosage is extremely small, the distribution density of the conductive particles becomes extremely small. Therefore, the dosage of silver should preferably be greater than $1 \times 10^{12}/cm^2$ and smaller than $1 \times 10^{20}/cm^2$ and set, for example, greater than $1 \times 10^{14}/cm^2$ and smaller than $1 \times 10^{17}/cm^2$.

In the present embodiment, the implantation energy was set to about 15 keV, and the dosage was set to about $1 \times 10^{15}/cm^2$. It is a matter of course that the implantation energy and the dosage to be selected differ depending on the kind of ions to be implanted.

Moreover, the present embodiment adopts the negative ion implantation method as an ion implantation method. According to this implantation using negative ions, there is no possibility of the rise of the surface potential of the material (silicon oxide film 6101 in the present embodiment) that undergoes the implantation to a potential close to the acceleration voltage of positive ions unlike the case where positive ions are used, so that the surface potential of the silicon oxide film 6101 can be suppressed to a very low value of about several volts. In more detail, when the positive ion implantation is used, secondary electrons of negative charges are discharged when the ions of the positive charges are injected into the surface of the silicon oxide film 6101. Therefore, the surface of the silicon oxide film 6101 keeps being positively charged in accordance with continuing the implantation of the positive ions, and the surface potential eventually rises to the acceleration voltage of the positive ions. In contrast to this, according to the negative ion implantation method, secondary electrons of negative charges are discharged when the ions of negative charges are injected into the surface of the silicon oxide film 6101. Therefore, the surface potential of the silicon oxide film 6101 settles within about positive and negative several volts. As a result, the fluctuation of the effective acceleration voltage is reduced in comparison with the positive ion implantation, and therefore, it becomes possible to restrain the variation in the implantation depth of silver. Moreover, since the silicon oxide film 6101 that undergoes the implantation and the silicon substrate 6300 located below the film are scarcely electrically charged, it becomes possible to restrain the occurrence of defects due to dielectric breakdown and the like. In the present embodiment, a negative ion implantation apparatus produced by Nissin Electric CO., Ltd. was used.

Figure 41C:
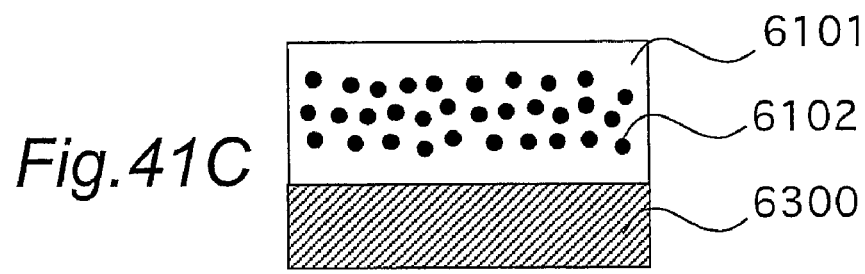

Next, the silicon oxide film 6101 is subjected to heat treatment, so that the silver implanted in this silicon oxide film 6101 is condensed or diffused. Through this process, silver particles 6102 are formed as conductive particles in the silicon oxide film 6101 as shown in FIG. 41C. Moreover, the defects that have occurred in the silicon oxide film 6101 during the ion implantation are corrected by the heat treatment.

The heat treatment is ineffective when its temperature is extremely low, while the implanted element (silver) is diffused and melted when the temperature is extremely high, so that particles could not be formed. Accordingly, the temperature of the heat treatment should preferably be set higher than 200° C. and lower than the melting point of the implanted element (silver). Moreover, it is true that the effect of the heat treatment can be increased by prolonging the time of the heat treatment even at a relatively low temperature, but if the time is excessively long, there may arise cases where the particle size becomes excessively large or where the implanted element diffuses to a region outside the region in which the particles should be formed. Therefore, the heat treatment time should preferably be set shorter than 24 hours.

In general, heat treatment is carried out in an inert atmosphere of argon or the like, whereas the heat treatment of the present embodiment is carried out in an atmosphere for forming an insulator that covers the surfaces of the silver particles 6102. That is, the heat treatment is carried out in a vapor phase including oxygen, forming the silver particles 6102 in the silicon oxide film 6101 and diffusing oxygen in the silicon oxide film 6101. Through this process, silver oxide 6104, which serves as an insulative substance and the second material, is formed in the surface portions of the silver particles 6102. That is, the silver oxide as the second material is an insulative substance formed by using silver as the third material.

It is to be noted that the conditions of the temperature, time and the flow rate of vapor phase of the heat treatment differ depending on the material to be employed, the particle size of the particles to be formed and the thickness of the insulator to be formed on the surface.

Figure 41D:
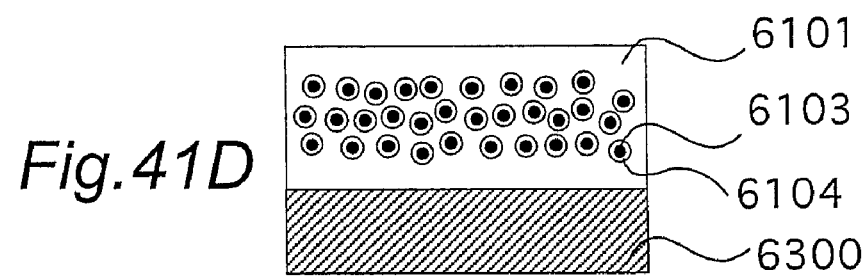

In the present embodiment, by carrying out the heat treatment in an oxidizing atmosphere for about several hours at a temperature slightly lower than that of the silicon thermal oxidation condition, there are formed silver particles 6103 covered with the silver oxide 6104 as shown in FIG. 41D.

It is acceptable to form an insulation film constructed of a nitride as the second material around the silver particles 6103 besides the insulation film constructed of an oxide. For example, when the conductive particles are formed of silicon, there is a practice to inject silicon as a conductor and thereafter carry out heat treatment in, for example, an ammonia atmosphere. Through this process, the silicon particles are formed, and a silicon nitride as an insulator is formed around the silicon particles.

Moreover, it is acceptable to first carry out the heat treatment in an inert atmospheres of argon, nitrogen or the like and thereafter change it to a heat treatment in an atmosphere in which the conductive particles are made insulative after the conductive particles are formed to a certain extent. According to this method, the conductive particles can be made insulative after the size of the conductive particles is adjusted to the desired size, and therefore, the particle size of the conductive particles can be formed accurately to the desired size. For example, when the normal thermal processing furnace is used, a treatment temperature of about 300° C. to 900° C. is preferable in the inert atmosphere of argon, nitrogen or the like. For example, the heat treatment is effected for about one hour at a temperature of about 700° C. in the argon atmosphere by means of a ceramics electric tube furnace made by ASAHI Rika Seisakusho. This condition of heat treatment is in the case of the silver particles, and the optimum heat treatment condition differs depending on the material to be formed into the conductive particles.

Further, when the heat treatment for forming the conductive particles is carried out at a comparatively low temperature, it is preferable to subject the insulation film as the medium to heat treatment at a temperature of about 500 to 1000° C. in order to correct the defects caused by the implantation. In this case, since an inconvenience of the fusion or diffusion of the conductive particles occurs when the heat treatment is effected for a long time, it is preferable to carry out RTA (Rapid Thermal Annealing), i.e., heat treatment for a short time.

As a method for forming an insulator on the surface of the conductive particles, there is a method for carrying out ion implantation of oxygen, nitrogen or the like and thereafter carrying out oxidation, nitridation or the like by an annealing process besides the aforementioned thermal oxidation in the oxidizing atmosphere and thermal nitridation in the nitriding atmosphere. According to this method, oxygen or nitrogen can be supplied to the desired depth in comparison with the method by thermal diffusion from the surface in the thermal processing furnace. Therefore, this method is especially effective when, for example, it is desired to avoid oxidation, nitridation and so on in the vicinity of the surface of the medium constructed of the first material including conductive particles.

Figure 41E:
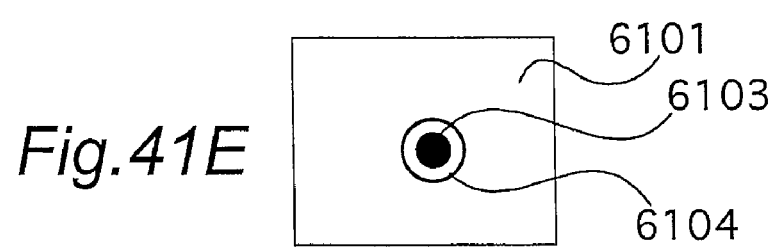
FIG. 41E is an enlarged view of part of FIG. 41D.

The states of the conductive particles and the insulator produced by the manufacturing method of the present embodiment were examined by cross-sectional TEM (Transmission Electron Microscope) observation. As a result, as shown in FIG. 41D, it was able to be confirmed that the silver particles 6103 of a nanometer size of about 2 to 3 nm and the silver oxide 6104 that covered the periphery of the particles were formed at the specified depth corresponding to the acceleration energy of silver ions. FIG. 41E is an enlarged view of part of FIG. 41D.

As described above, according to the present embodiment, the negative ion implantation method is used in forming the silver particles 6102 in the silicon oxide film 6101. Therefore, silver can easily be implanted to the desired depth in the silicon oxide film 6101 while controlling the electrification of the silicon oxide film 6101. Moreover, the ion implantation method is used for the formation of the silver particles 6102. Accordingly, there are fewer processes than when the conductive film is etched, and no nanoscale fine processing technique is used, unlike the conventional case. Therefore, the nanometer-size particles can be formed with satisfactory productivity.

After the silver particles 6103 covered with the silver oxide 6104 are formed in the silicon oxide film 6101, a first electrode 6111 is formed on the silicon oxide film 6101. The material of this first electrode 6111 may be either a metal or a semiconductor or an organic substance so long as it has conductivity. As a method for forming the first electrode 6111, there can be adopted CVD (Chemical Vapor Deposition) method, evaporation method, MBE (Molecular Beam Epitaxy) method and so on. In the present embodiment, the first electrode 6111 is formed through Al film formation by the normal vacuum evaporation method, completing a resistance-changing function body.

According to the resistance-changing function body of the present embodiment, the silver particles 6102 can be formed with a high density through fewer processes within a short time by ion implantation and heat treatment. According to the ion implantation method, no fine processing technique is required for the formation of the silver particles 6102, and therefore, the resistance-changing function body can be manufactured with satisfactory productivity.

Although the silver particles 6102 are employed as the conductive particles in the present embodiment, it is acceptable to form conductive particles by using a conductor of a metal such as gold or copper other than silver or a semiconductor such as silicon or germanium. It is to be noted that gold is not easily oxidized, and it is difficult to form an insulator around the particles after the formation of the particles. In contrast to this, it is preferable to employ a material of, for example, aluminum, which forms a strong oxide film on its surface through oxidation, and it is acceptable to form the conductive particles by using tungsten, niobium, zirconium, titanium, chromium, tin, cobalt, nickel, iron, antimony, lead and so on besides aluminum.

Moreover, the silver particles 6102 were formed as the conductive particles in the silicon oxide film 6101 formed by subjecting the silicon substrate to thermal oxidation. However, the silver particles may be formed in another insulator of a glass substrate or the like, a semiconductor substrate and so on.

Moreover, the silicon oxide film is not limited to the thermal oxidation film but allowed to be a silicon oxide film formed by CVD method or the like or one obtained by oxidizing polysilicon or amorphous silicon. It is to be noted that a silicon oxide film obtained by oxidizing single-crystal silicon is more preferable since it has a better film quality. Furthermore, it is possible to employ another insulator besides the silicon system insulators of silicon nitride and so on.

Moreover, in the present embodiment, the material of conductive particles is implanted in the medium constructed of the insulative substance by the negative ion implantation method. Therefore, it is possible to effectively suppress the electrification of the insulative medium and the substrate that supports it during the implantation. Therefore, the implantation depth of the material of the conductive particles can be accurately controlled, and the variation in distribution can be suppressed. That is, the formation depth and region of the conductive particles can be accurately controlled. Moreover, since the electrification during the implantation is suppressed, it is possible to suppress the occurrence of defects as a consequence of the destruction of the insulative medium due to the electrification. Consequently, the reliability of the resistance-changing function body can be effectively improved.

Figure 42:
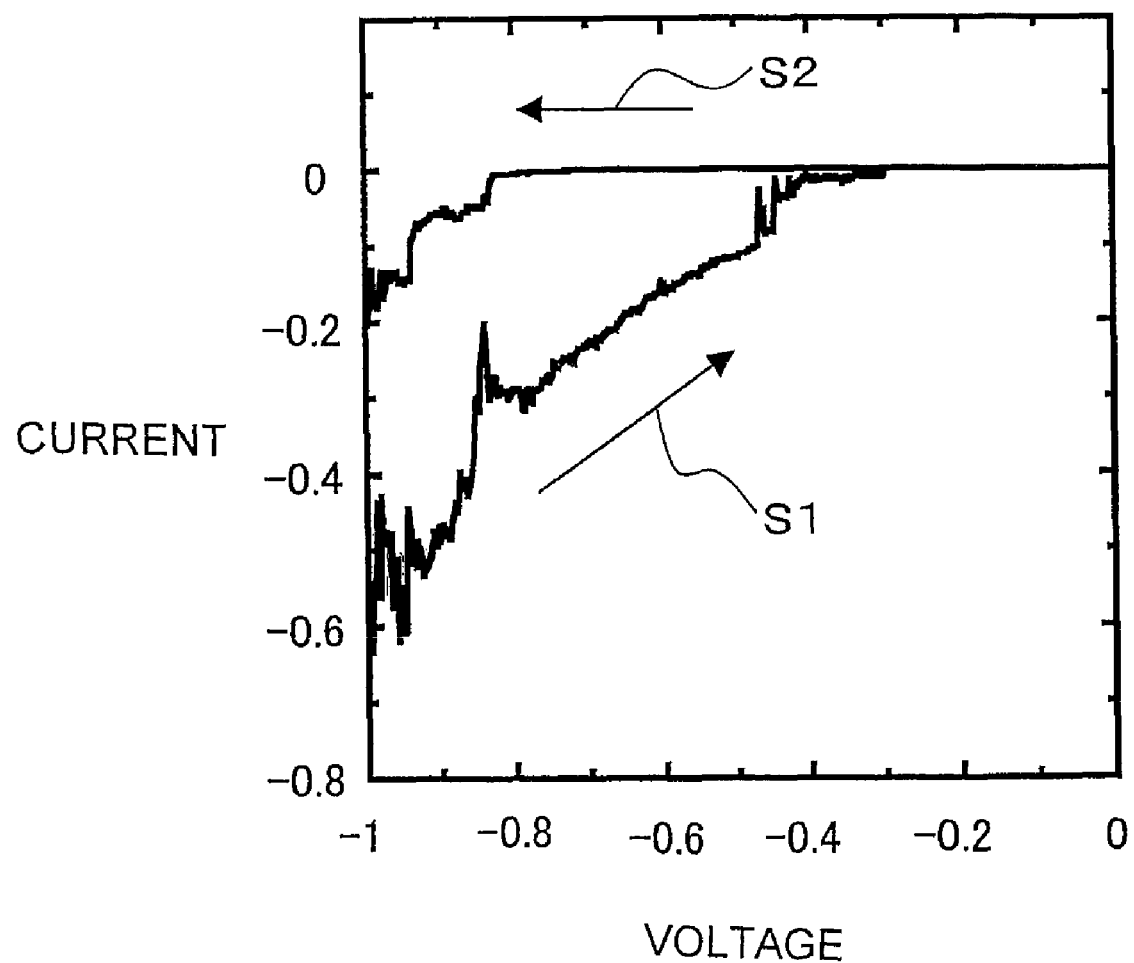
FIG. 42 is a chart showing results of measuring current-voltage (I-V) characteristics of the resistance-changing function body of FIG. 40.

FIG. 42 is a graph showing a current-voltage (I-V) characteristic at normal temperature (25° C.) of the resistance-changing function body 6100 fabricated by the aforementioned method.

This current-voltage characteristic exhibits a change in the current that flows through this first electrode 6111 when the second electrode 6112 is grounded and the voltage applied to the first electrode 6111 is changed. First of all, if the application voltage of the first electrode 6111 is continuously raised from about −1 V, then the absolute value of the current reduces as indicated by the arrow S1. Subsequently, if the voltage is continuously lowered from about 0 V, then the absolute value of the current value increases as indicated by the arrow S2 through a route different from the arrow S1. When the application voltage reaches −1 V, the absolute value of the current value lowered as indicated by the arrow S2 becomes smaller than that of the initial current value when the application voltage has started rising from −1 V. The fact that the absolute value of the current has reduced with respect to the same application voltage means that the resistance has increased. As described above, hysteresis appears in the current-voltage (I-V) characteristic shown in FIG. 42. It can be said that this is because a satisfactory Coulomb blockade is achieved by the mutual isolation of the conductive particles 6103 due to a satisfactory barrier effect given from the insulator 6104 that covers the particles.

Moreover, it can also be considered that the cause of the occurrence of hysteresis is ascribed to the change of coulombic energy as a consequence of the diffusion, disappearance or the enlargement through cohesion of extremely minute particles of the plurality of conductor particles due to the influence of the current. It can otherwise be considered that the coulombic energy has changed as a consequence of the discharge of electrons from the conductor particles due to thermal energy caused by Joule heat.

Moreover, the following can be considered as another cause of the occurrence of hysteresis. That is, one or several electric charges are accumulated in a specified silver particle 6103 among the plurality of silver particles 6103 in the silicon oxide film 6101, and a Coulomb interaction is exerted on the electrons of the other silver particles 6103 that form a current path in the vicinity of this silver particle 6103 due to the accumulated electric charges. As a result, it can be considered that the easiness of flow of the current in the current path, i.e., the electrical resistance changes. It can be considered that the aforementioned hysteresis appears due to any one or a combination of a plurality of these effects.

However, there is also a possibility that the hysteresis appears due to a factor other than these. Anyway, it is clear that a sufficiently large hysteresis can be obtained in practice according to the resistance function body of the present invention irrespective of the factor.

In the case where an excessive voltage is applied across the first and second electrodes 6111 and 6112 of the resistance-changing function body 6100, the current value has remarkably increased. It can be considered that this is ascribed to the change of the silver particle 6103 contained in the silicon oxide film 6101. Otherwise, it can be considered that the above is ascribed to the dielectric breakdown of either one or both of the portion of the silicon oxide film 6101 located between the silver particles 6103 and 6103 and the silver oxide 6104. It is to be noted that the portion of the silicon oxide film 6101 located between the silver particles 6103 and 6103 or the silver oxide 6104, which are tunnel barriers, therefore scarcely causes dielectric breakdown. Accordingly, it can be considered that the above is ascribed to the diffusion or cohesion of the silver particles 6103 or the change of the silver oxide 6104 due to Joule heat or the change in the state of the silver particles 6103 due to migration caused by the current.

If this property is utilized, there occurs a large difference in the change of the current value between when it is operated with a proper voltage and when an excessive voltage is applied to it. Therefore, one element can be operated in more than two modes.

The resistance-changing function body 6100 of the present embodiment is able to discriminate binary data by reading the magnitude of the current value utilizing the aforementioned hysteresis effect and be used as a memory. That is, the silicon oxide film 6101 including the silver particles 6103 and the silver oxide 6104 functions as a memory function body 6113 having memory effects. The resistance-changing function body of the present invention, which can be considered to have a capability of capturing electrons, can also be called a charge retention function body.

Conventionally, a fuse memory that has utilized the dielectric breakdown of the insulation film or the like has needed a high voltage for causing the dielectric breakdown of the insulation film or the like. In contrast to this, the resistance-changing function body 6100 of the present embodiment has a comparatively small thickness of the portion of the silicon oxide film 6101 and the silver oxide 6104 between the silver particles 6103 and 6103 corresponding to the substantial insulation film thickness when used as a fuse memory, and these insulation films are capable of producing the tunnel effect. Therefore, it becomes possible to execute write operation at a voltage lower than in the conventional fuse memory. Therefore, this resistance-changing function body 6100 can also be used as a fuse memory of low-voltage operation.

In the present embodiment, the particle size of the silver particle 6103 was approximately not greater than 3 nm within the range of TEM observation. Resistance-changing function bodies that had conductive particles of particle sizes of not greater than approximately 6 nm and conductive particles of particle sizes of not greater than approximately 10 nm were fabricated by a manufacturing method similar to that of the present embodiment, and these resistance change function bodies were subjected to an experiment for measuring the I-V characteristic. As a result, it was discovered that the hysteresis of the I-V characteristic became smaller as the particle size of the conductive particles increased and the hysteresis had the tendency of becoming indistinct even at a temperature lower than the room temperature. As a result of conducting the experiment of the conductive particles of other particle sizes, it was clarified that the particle size of the conductive particle was required to be not greater than 11 nm or preferably not greater than 7 nm and more preferably not greater than 4 nm in order to obtain hysteresis.

In the present specification, the term of "particle size" means the size of the particle, which corresponds to the "diameter" thereof when the shape of the particle is approximately spherical or is able to be approximated to a sphere. In the present invention, the particle shape should preferably be close to a spherical shape. However, if a conductor of a particle of a deformed or imperfect shape is employed, it is possible to regard any one of the diameter of a spherical conductor that has the same volume as that of the above-mentioned conductor, the diameter of a sphere that has a surface area equivalent to the surface area of the above-mentioned conductor, the diameter of a sphere that has a volume equivalent to the volume of the above-mentioned conductor, and a distance between two points of the particle, the points being mutually most apart from each other, as the particle size. For example, it is possible to regard the "semimajor axis" in the case where the shape of the particle can be approximated to an elliptical sphere, the cubic root of semimajor axis×semiminor axis×semiminor axis or the like as the particle size.

When the Coulomb blockade effect is utilized to retain electric charges, the energy necessary for making the electric charges break away from the conductive particle should be sufficiently greater than the thermal energy due to the ambient temperature in consideration of the capacity of the conductive particle so that the Coulomb blockade effect becomes remarkable. For the above purpose, the radius that the conductive particle should have when the conductive particle is assumed to be a perfect conductive sphere becomes about 0.5 nm to 1 nm. The Coulomb blockade effect itself becomes more remarkable as the particle size of the conductive particle becomes smaller. However, a high voltage is needed across the first and second electrodes when the particle size of the conductive particle is extremely small, and therefore, the extremely small particle size is not preferable from the viewpoint of device applications.

Moreover, the resistance-changing function body 6100 of the present embodiment undergoes negative ion implantation in order to form the silver particles 6102 in the silicon oxide film 6101. Therefore, the silicon oxide film 6101 has kept a quality equivalent to that of the silicon oxide film before implantation and has become of very high reliability. Moreover, the processing time of the formation of the particle is reduced in comparison with the case where the conductive particle is formed by CVD or the like, and therefore, satisfactory productivity is possessed.

Moreover, according to the negative ion implantation, variations in the distribution of conductive particles due to electrification can be suppressed as described above. Therefore, variations in the distribution of the particles 6102 in the thickness direction of the silicon oxide film 6101 can be suppressed. Therefore, the silicon oxide film 6101 that includes the silver particles 6103 and the silver oxide 6104, i.e., the memory function body 6113 can be formed into a thin film and is allowed to be scaled down. When the memory function body 6113 is formed into a thin film as shown above, the effective electric field applied to the memory function body 6113 becomes stronger than when the memory function body 6113 is thick even with the same voltage applied across the first and second electrodes 6111 and 6112. Therefore, if a memory is formed of the resistance-changing function body 6100, it becomes possible to reduce the operating voltage of this memory and improve both productivity and low power consumption.

Figure 43:
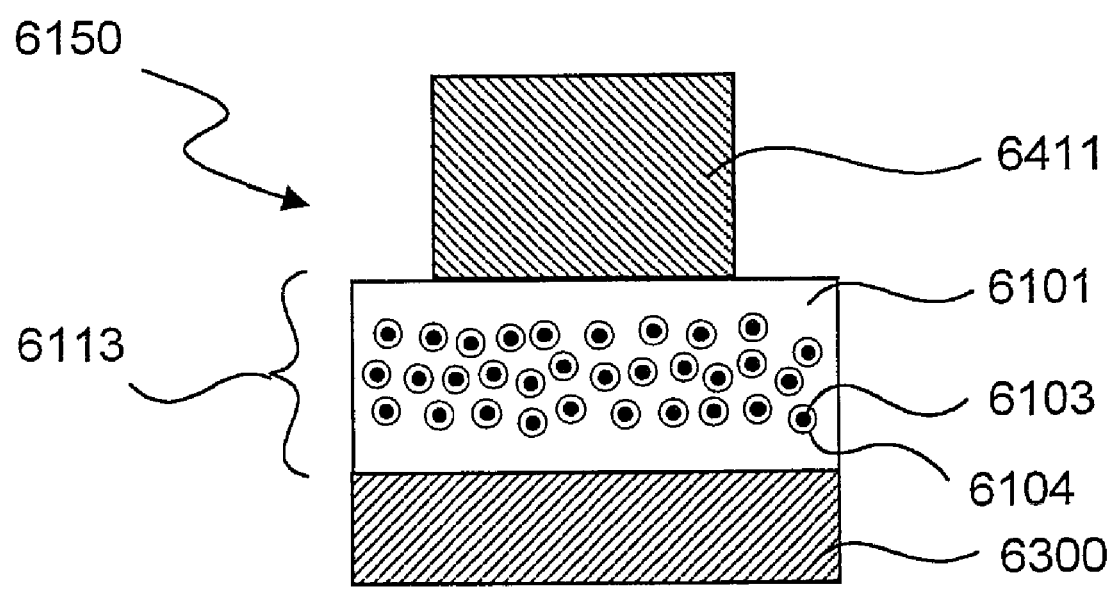
FIG. 43 is a view showing a memory formed by using the resistance-changing function body of FIG. 40.

FIG. 43 is a view showing a memory 6150 that has a structure similar to that of the above-described resistance-changing function body and is provided with an electrode 6411 as a first electrode obtained by evaporating and patterning an Al film. That is, the silicon oxide film 6101 is the first insulator, the silver particles 6103 are the conductor particles, and the silver oxide 6104 is the second insulator. A power source and a current sensor (not shown) are connected to the electrode 6411.

Figure 44:
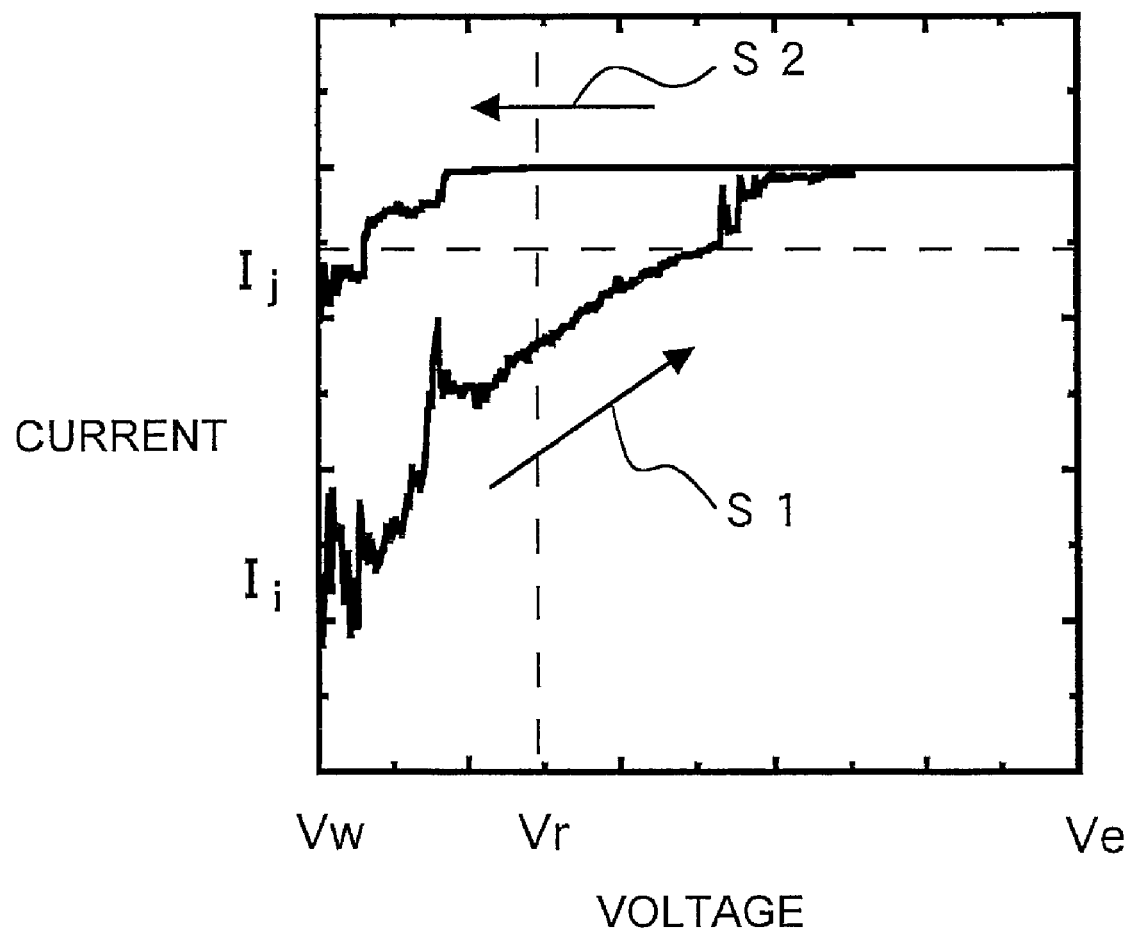
FIG. 44 is a view for explaining memory operation of the memory of FIG. 43.

FIG. 44 is a graph showing the current-voltage (I-V) characteristic at normal temperature (25° C.) of a memory 6150 provided with this electrode 6411. Operation for discriminating the storage state of the memory 6150 will be described by using this graph.

The characteristic of the memory 6150 shown in FIG. 44 is obtained by grounding a silicon substrate 6300, applying a voltage to the first electrode 6411 and observing the current that flows through the first electrode 6411 as in the case of FIG. 42 of the resistance-changing function body. First of all, if the application voltage of the first electrode 6411 is continuously raised from Vw, then the current value of the first electrode 6411 increases from its initial value $i_i$ as indicated by the arrow S1. Subsequently, if the application voltage of this first electrode 6411 is continuously lowered after the application voltage reaches Ve, then the current value reduces as indicated by arrow S2 through a route different from the arrow S1. When the application voltage is lowered to Vw, there is a resulting current value ij of which the absolute value is smaller than the initial current value $i_i$ when this application voltage is raised. As described above, the fact that the magnitude of the current has reduced with respect to the same voltage Vw means that the resistance has increased. As described above, hysteresis appears in the current-voltage (I-V) characteristic shown in FIG. 44.

In this case, as shown in, for example, FIG. 44, a write voltage Vw and an erase voltage Ve are set. Then, a read voltage Vr for discriminating the written state from the erased state is set that the voltage becomes the central voltage value of the memory window (range of the voltage value that causes hysteresis), and a reference current value Ij that serves as a criterion for discrimination is set. The storage state of this memory 6150 can be discriminated by reading the magnitude of the current when the read voltage Vr is applied according to the relation of the magnitude between the read value of the current and the reference current value Ij. For example, the state is the erased state (logic 0) when the read value of the current is greater than the reference current value Ij, and the state is the written state (logic 1) when the read value of the current is smaller than the reference current value Ij.

As described above, the memory 6150 that employs the memory function body can be used as a binary memory.

In another embodiment, a conductive particle can be formed of silicon in place of silver. That is, silicon was implanted by a dosage of $1\times10^{15}$ to $1\times10^{16}/cm^2$ with implantation energy of 10 to 15 KeV into a silicon thermal oxidation film. Then, heat treatment was carried out in a nitriding atmosphere, and a memory function body, in which SiN/Si particles obtained by covering the surfaces of the silicon particles with SiN discretely existed in $SiO_2$, was fabricated. The heat treatment was carried out for several hours at a temperature of about 900° C. in an ammonia atmosphere.

The memory function body fabricated in the present embodiment has a great hysteresis (i.e., the memory window is large) and a satisfactory charge retention characteristic in comparison with the conventional memory function body that has the particles formed by CVD and etching. This is because the insulation film, which includes the SiN/Si particles, is the silicon thermal oxidation film and therefore has a quality better than that of the conventional CVD film and polysilicon oxide film. Furthermore, there is an influence that the silicon particle surface is covered with SiN and this SiN has a good quality with an approximately uniformly formed thickness obtained through an annealing process.

Moreover, in another embodiment, a conductive particle is formed of aluminum in place of silver. The above-mentioned aluminum is implanted into a silicon thermal oxidation film by a dosage of $1\times10^{14}$ to $1\times10^{16}/cm^2$ with implantation energy of 5 to 15 KeV. Then, heat treatment is carried out at a temperature of not higher than 600° C. Through this process, there was fabricated a memory function body, in which $Al_2O_3/Al$ particles obtained by covering the surfaces of aluminum particles with alumina discretely existed in $SiO_2$.

The memory function body of the present embodiment has a greater hysteresis (i.e., the memory window is large) and a better charge retention characteristic than those of the conventional memory function body. This is because an excellent charge storage capability can be obtained by the use of aluminum that is a metal used as conductive particles and further because an excellent charge retention capability can be obtained by surrounding the conductive particles with alumina that is a satisfactory insulator. The above-mentioned alumina is in a so-called passive state, and the oxidation thereof scarcely progresses after being formed by the oxidation of the aluminum particle surface. Therefore, the above-mentioned alumina is formed approximately uniformly in thickness. With this arrangement, there can be provided a memory function body that has stable memory operation and high reliability.

In another embodiment, the particle contained in the memory function body is formed by another method. That is, a diffusion method is used as a method for adding a material for forming conductive particles into the first insulator instead of the ion implantation method. For example, when an aluminum particle is formed in a silicon thermal oxidation film as in the aforementioned embodiment, a silicon thermal oxidation film is formed as in the aforementioned embodiment, and thereafter an aluminum film is formed on this silicon thermal oxidation film by means of a vacuum evaporation system. It is acceptable to use a sputtering method instead of the evaporation method and use any method so long as the aluminum film can be formed.

Subsequently, heat treatment is carried out at a temperature of about 400° C. to 600° C., diffusing aluminum in the silicon thermal oxidation film. Subsequently, heat treatment is carried out at a temperature lower than the temperature of diffusion, and thereafter oxidation is carried out to form alumina as a second insulator.

Subsequently, an electrode is formed as in the aforementioned embodiment, forming a memory function body. It was confirmed that this memory function body had a satisfactory memory characteristic as in the embodiment in which the aluminum particles were formed by implantation.

Since the memory function body of the present embodiment uses the diffusion method, the memory function body of the present invention can be fabricated more simply.

It is preferable to employ a silicon film that contains Al in place of the aluminum film formed on the silicon thermal oxidation film because the aluminum concentration in the vicinity of the surface of the silicon thermal oxidation film can be prevented from increasing. Furthermore, it is more preferable to employ a material such that the oxide forms a passive state, as represented by aluminum because an insulator of good quality can be formed by oxidation around the conductive particles.

In this example, the memory can be fabricated by the existing semiconductor apparatuses without using any special fine processing technique. Moreover, it is, of course, possible to fabricate only one particle by using a fine processing technique of electron beam or the like as in the single-electron transistor proposed in recent years.

Moreover, it is preferable to carry out a hydrogen sintering process in forming the conductive particles because the unnecessary interface state and so on can be restrained to allow a resistance-changing function body and a memory function body of stable operation to be obtained.

Although the silicon oxide is employed as the material of the insulator 6101 that is the first insulator in the aforementioned embodiments, it is acceptable to employ silicon nitride, aluminum oxide, titanium oxide, zirconium oxide, hafnium oxide and so on. Furthermore, when the particle surface is covered with an insulator as in the one embodiment of the present invention, the insulator is not required to be formed of an insulative substance.

Moreover, although silver is employed as the material that constitutes the conductive particles, it is also acceptable to employ another metal such as copper, aluminum, tin, nickel, zinc, hafnium, zirconium, manganese, tantalum, titanium, tungsten, indium or gallium as a material for constituting the particles 6103. Moreover, it is also possible to employ a semiconductor or a compound semiconductor of silicon, germanium or the like or employ an alloy or another compound. Moreover, even a magnetic material can be employed. However, a single element is preferable since the implantation thereof is easy. Moreover, the insulator that covers the particle surface may be anything so long as the insulator has a good insulative property among the compounds of the oxides and nitrides of the substance that constitutes the particles.

FIGS. 45A through 45E are process diagrams showing the formation method of particles. In this example, silver particles serving as conductive particles are formed in a silicon oxide film serving as an insulator.

Figure 45A:
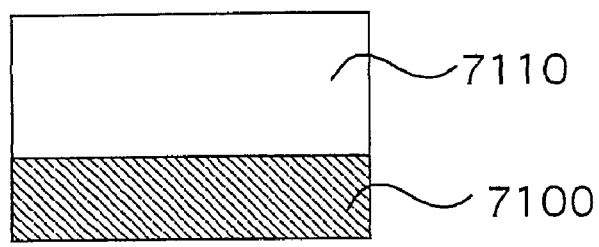
FIGS. 45A to 45D are process diagrams showing a formation method of particles.

First of all, as shown in FIG. 45A, a silicon oxide film 7110 that serves as the insulator is formed on the surface of a silicon substrate 7100 that serves as a semiconductor substrate through a thermal oxidation process. In this example, the film is formed to a film thickness of about 50 nm.

Figure 45B:
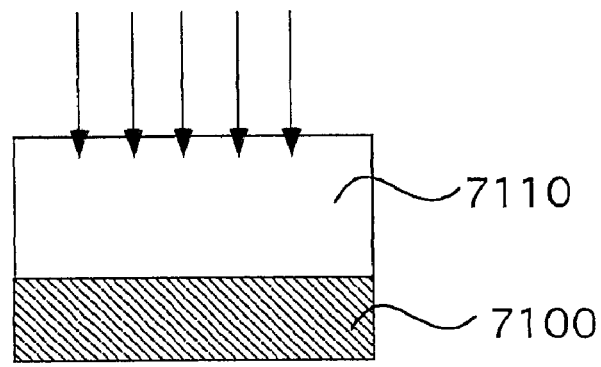

Next, as shown in FIG. 45B, silver as a substance for forming conductive particles is introduced into the silicon oxide film 7110 by the ion implantation method. In this case, the distribution of implantation extremely expands when implantation energy is extremely high, and this is therefore not suitable for the implantation into the comparatively thin silicon oxide film 7110 and causes damage to the silicon oxide film 7110, disadvantageously causing defects. Therefore, the implantation energy should preferably be smaller than 100 KeV and should more particularly be smaller than 50 KeV. In this example, the implantation was carried out with energy of about 30 KeV so as to form the particles in the vicinity of the center in the thickness direction of the silicon oxide film 7110.

Moreover, the particle size becomes extremely large and the damage to the silicon film 110 is increased when the dosage of implantation is extremely large. When the dosage of implantation is extremely small, the density of the particles becomes extremely small. Therefore, the dosage of implantation should preferably be greater than $1\times10^{12}/cm^2$ and smaller than $1\times10^{20}/cm^2$. For example, the dosage of implantation should more preferably be greater than $1\times10^{13}/cm^2$ and smaller than $1\times10^{17}/cm^2$. In this example, silver was introduced with energy of about 30 KeV and a dosage of about $1\times10^{15}/cm^2$.

Needless to say, the energy of implantation and the dosage of implantation differ depending on the ionic type.

Moreover, the ion implantation method for implanting silver should preferably be the negative ion implantation method. When the implantation is carried out by using negative ions, the surface potential of the insulator (silicon oxide film 7110 in this example) subjected to the implantation does not rise close to the acceleration voltage of positive ions when positive ions are employed, and is able to be suppressed to a very low value of about several volts. That is, according to the positive ion implantation method, secondary electrons of negative charges are discharged when the ions of the positive charges are injected into the surface of the insulator. Therefore, the surface of the insulator keeps being positively charged, and the surface potential eventually rises to the acceleration voltage of the positive ions. In the case of the negative ion implantation method, secondary electrons of negative charges are discharged as a consequence of the injection of ions of negative charges, and the surface potential settles within about positive and negative several volts. Accordingly, the fluctuation in the effective acceleration voltage becomes reduced in comparison with the positive ion implantation, and therefore, it becomes possible to suppress the variation in the implantation depth of the substance (silver) for forming the conductive particles. Moreover, since the insulator is scarcely electrically charged, it becomes possible to suppress the occurrence of defects due to dielectric breakdown and the like. In this example, a negative ion implantation apparatus produced by Nissin Electric CO., Ltd. was used.

Figure 45C:
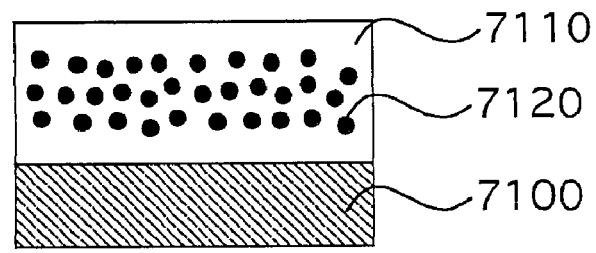

Subsequently, the silicon oxide film 7110, in which silver has been implanted, is subjected to heat treatment. By condensing or diffusing the implanted element (silver) by this heat treatment, silver particles 7120 of a specified particle size are formed as shown in FIG. 45C. It is also possible to correct the defects of the silicon oxide film 7110 generated during the ion implantation. The temperature of the heat treatment takes no effect when it is extremely low, while the particles cannot be formed as a consequence of the diffusion and melting of the implanted element when the temperature is extremely high. Therefore, the temperature of the heat treatment should preferably be higher than 200° C. and lower than the melting point of the implanted element (silver). The effect at a temperature is increased if the processing time is prolonged even at the same temperature. However, if the processing time is extremely long, there may occur the case where the particle size of the particles becomes extremely large or the case where the implanted element diffuses outwardly of the region where the particles should be formed, and therefore, the processing time should preferably be shorter than 24 hours.

The normal heat treatment, which is carried out in an inert atmosphere of argon or the like, is carried out in an atmosphere in which the surface portions of the conductive particles are made insulative according to the present invention. In this example, the heat treatment is carried out in a vapor phase including oxygen to form silver particles. Further, by diffusing oxygen in the silicon oxide film 7110 for the supply of oxygen to the surface portion of the silver particles, the surface portions of the silver particles are made insulative through oxidation.

The conditions of temperature, time, vapor phase and so on of the heat treatment differ depending on the material to be employed, the desired particle size and the thickness of the insulation layer formed on the surface.

Figure 45D:
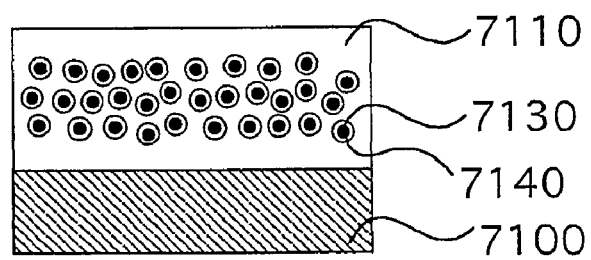

In this example, the heat treatment is carried out in an oxidizing atmosphere for about several hours at a temperature slightly lower than that of the silicon thermal oxidation condition. Through this process, the surface portion of the silver particle 7120 is made insulative as shown in FIG. 45D, forming silver oxide 7140.

During the above-mentioned heat treatment, it is also possible to achieve insulation by nitridation besides oxidation. For example, by implanting, for example, silicon as a metal for forming the conductive particles and thereafter carrying out heat treatment in, for example, an ammonia atmosphere, silicon nitride can be formed as an insulator on the surface of the particles.

Moreover, it is also acceptable to initially carry out heat treatment in an inert atmospheres of argon, nitrogen or the like and thereafter change it to heat treatment in an atmosphere in which the formed conductive particles are made insulative after the conductive particles are formed to a certain extent. According to this method, the conductive particles can be made insulative after the size of the particles is adjusted to the desired size, and therefore, conductive particles of further varied particle sizes can be accurately formed.

For example, when the normal heat treatment furnace is used, it is preferable to carry out initial heat treatment at a temperature of about 300° C. to 900° C. in the inert atmosphere of argon, nitrogen or the like. For example, the heat treatment can be effected for about one hour in the argon atmosphere by means of a ceramics electric tube furnace made by ASAHI Rika Seisakusho. This is, of course, in the case of silver particles, and the optimum heat treatment condition differs depending on the element for forming the conductive particles.

Further, when the heat treatment for forming the conductive particles is carried out at a comparatively low temperature, it is preferable to carry out the heat treatment at a temperature of about 500° C. to 1000° C. in order to correct the defects generated in the insulator by implantation. At this time, since the fusion, diffusion or the like of the conductive particles occurs when the heat treatment is effected for a long time, it is preferable to carry out RTA (Rapid Thermal Annealing), i.e., heat treatment for a short time.

Figure 45E:
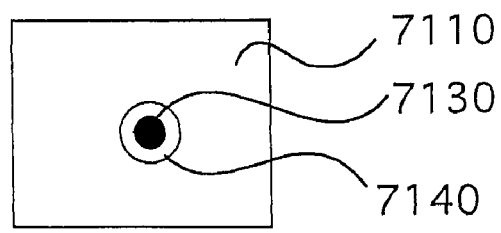
FIG. 45E is an enlarged view of part of FIG. 45D.

The states of the conductive particles formed by the particle forming method of the present embodiment were examined by cross-sectional TEM (Transmission Electron Microscope) observation. Consequently, as shown in FIG. 45D, the so-called nanometer-size silver particles 7130 having particle sizes (diameters) of about 2 nm to 3 nm were formed as a consequence of the cohesion of the implanted silver ions. Then, silver oxide 7140 was formed so as to cover the silver particles 7130. The silver particles 7130 were formed while being accurately distributed to a depth expected from the acceleration energy of silver ions. FIG. 45E is an enlarged view of part of FIG. 45D.

As described above, the negative ion implantation method, which can suppress the electric charging effect of the insulator subjected to the implantation, therefore has the advantage that it is easy to carry out implantation to the intended depth and concentration in the insulator. Moreover, the substance for forming the particles is introduced into the insulator by implantation, and therefore, the nanometer-size particles distributed in appropriate positions in the insulator can be formed through a one-time process. Accordingly, there is no need to repeat again and again the thin film formation process and the fine processing process of this thin film, unlike the conventional case. Moreover, there is no need to use the nanoscale fine processing technique, and therefore, productivity is good.

Although the silver is employed as the particles in this example, it is acceptable to employ a conductor of a metal such as gold or copper or a semiconductor such as silicon or germanium. It is to be noted that gold is hardly oxidized, and it is therefore more or less difficult to insulate the surface portions of the particles. In another aspect, it is preferable to employ a substance of, for example, aluminum, which forms a strong oxide film on its surface through oxidation in terms of the stable formation of the insulator that covers the particles. It is preferable to employ tungsten, niobium, zirconium, titanium, chromium, tin, cobalt, nickel, iron, antimony, lead and so on besides aluminum.

Moreover, the example of the thermal oxide film on the silicon substrate has been enumerated as the insulator for forming the particles therein, it is also possible to employ another insulator of a glass substrate or the like, a semiconductor substrate and so on.

FIG. 46A to 46D are process diagrams showing another formation method for particles. In this particle formation method, an etching process is provided between the particle formation process and the insulation process, and the region from the surface to a specified depth is removed from the insulator in which the conductive particles have been formed.

In this example, silver particles that serve as conductive particles are formed as in the example of FIG. 45.

Figure 46A:
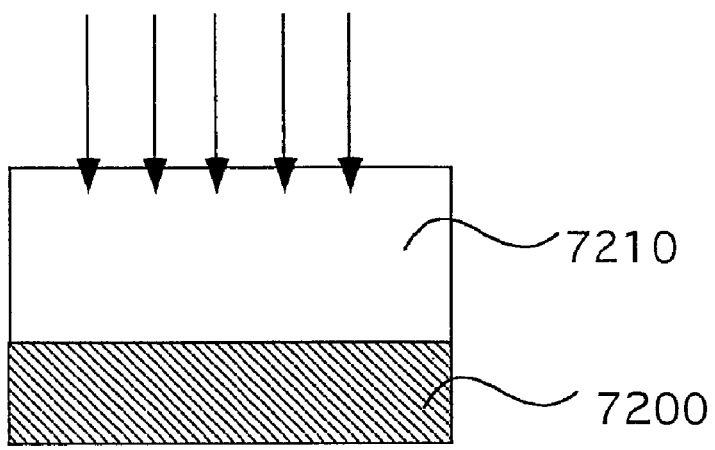
FIGS. 46A to 46D are process diagrams showing another formation method of particles.

First of all, as shown in FIG. 46A, a silicon oxide film 7210 that serves as the insulator is formed on the surface of a silicon substrate 7200 that serves as a semiconductor substrate through a thermal oxidation process. In this example, the film is formed to a film thickness of about 100 nm.

Figure 46B:
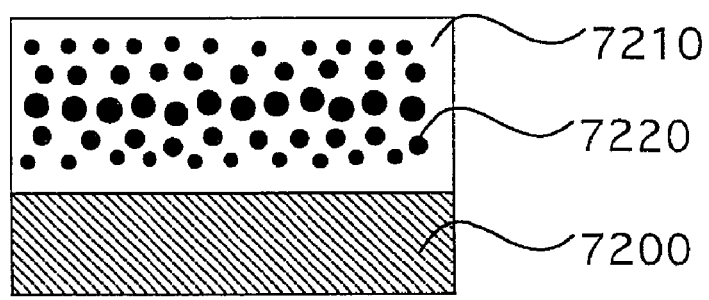

Next, as shown in FIG. 46B, silver is introduced into the silicon oxide film 7210 by the ion implantation method. In this case, the implantation energy is set so that the implantation depth becomes about 50 nm.

Normally, a distribution of implantation is caused by the ion implantation method, and the concentration of the implanted substance comes to have a concentration distribution similar to the Gaussian distribution in the depthwise direction with a specified depth assumed as a maximum concentration. In this example, the implanted silver comes to have the maximum concentration at the depth of about 50 nm from the surface. Therefore, when conductive particles are formed as in the example of FIG. 45, the conductive particles form a particle size distribution depending on the aforementioned ion concentration. That is, particles of comparatively large particle sizes are formed at the maximum depth of implantation concentration, and particles of comparatively small particle sizes are formed above and below the position in which the particles of the comparatively large particle sizes are formed.

Figure 46C:
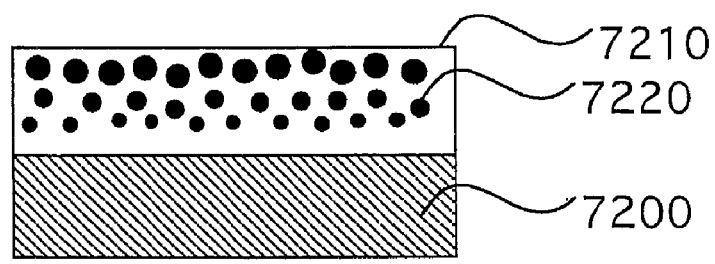

In this example here, there is effected removal from the surface of the insulator (silicon oxide film 7210) to a specified depth by etching. Through this process, as shown in FIG. 46C, the particles of comparatively large particle sizes are positioned near the surface of the insulator and the particles are reduced in particle size from the neighborhood of the insulator surface toward the substrate side. As the etching for removing the insulator, either wet etching or dry etching can be used. Since the insulator was silicon oxide in this example, the wet etching was carried out by using a hydrofluoric acid solution of a concentration of 0.5%.

The thickness of the insulator to be removed through the etching process is made equivalent to or greater than the implantation depth of the substance for forming the particles in this insulator. In this example, etching was effected to a depth of about 50 nm from the surface.

Figure 46D:
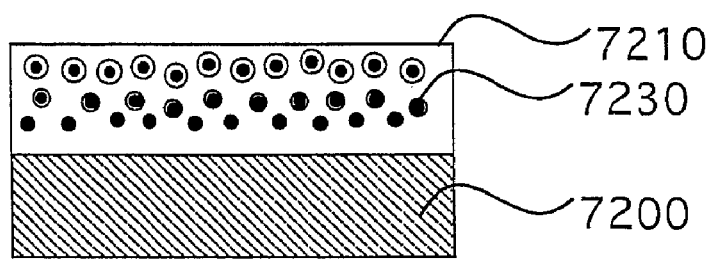

Subsequently, as in the example of FIG. 45, the surface portions of the conductive particles are made insulative by, for example, thermal oxidation. Through this process, silver oxide is formed on the surfaces of the silver particles 7230 as shown in FIG. 46D. In this insulation process, a load-lock type oxidation furnace produced by Kokusai Electric Inc. was used. The silver particles undergo a greater degree of oxidation as located closer to the surface of the silicon oxide film 7210, whereas the silver particles have greater particle sizes as located closer to the surface. Therefore, the silver particles 7230 after insulation come to have comparatively smaller variations in particle size than the particle sizes of the silver particles 7220 before insulation in the depthwise direction.

FIGS. 47A to 47D are process diagrams showing still another formation method for particles. In this example, an etching process is provided between the ion implantation process and the heat treatment process, and the region from the surface to a specified depth is removed from the insulator in which the substance for forming the conductive particles has been implanted.

In this example, silver particles that serve as conductive particles are formed in the silicon oxide film that serves as an insulator.

First of all, a silicon oxide film 7310 as the insulator is formed on the surface of the silicon substrate 7300 as the semiconductor substrate through a thermal oxidation process. In this example, the film is formed to a film thickness of about 100 nm.

Figure 47A:
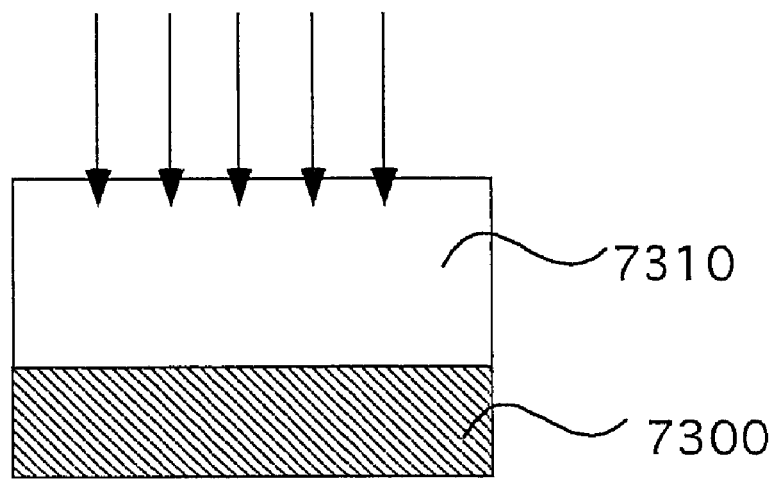
FIGS. 47A to 47D are process diagrams showing yet another formation method of particles.

Next, as shown in FIG. 47A, silver is introduced into the silicon oxide film 7310 by the ion implantation method. In this case, the implantation energy is set so that the implantation depth becomes about 50 nm.

In this case, with regard to the implantation concentration of silver, there is formed a concentration distribution similar to the Gaussian distribution in the depthwise direction with respect to a maximum concentration in the region at a depth of about 50 nm from the surface of the silicon oxide film 7310.

Figure 47B:
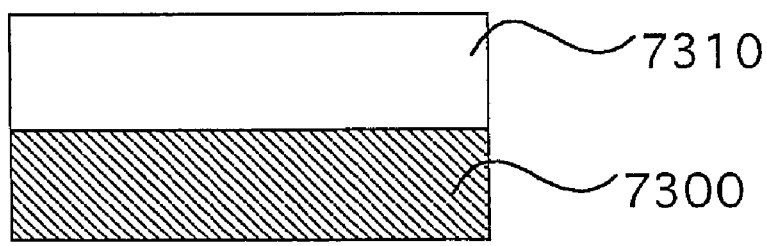

Subsequently, as shown in FIG. 47B, the surface portion of the silicon oxide film 7310 is removed by etching so that the portion of a high implantation concentration of silver becomes located near the surface. That is, the silicon oxide film 7210 is etched to a depth equivalent to or deeper than the above-mentioned implantation depth. In this example, the etching was effected to a depth of about 50 nm from the surface. The etching method may be either one of wet etching and dry etching as in the example of FIG. 46. In this example, the wet etching was carried out by using a hydrofluoric acid solution of a concentration of 0.5%.

Subsequently, heat treatment of the silicon oxide film 7310 and the insulation of silver particles are carried out as in the example of FIG. 46.

Figure 47C:
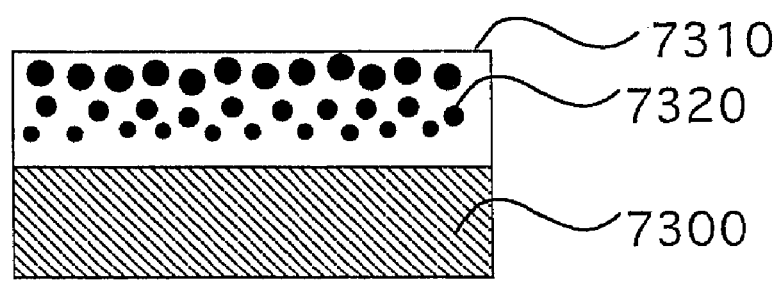

First of all, as shown in FIG. 47C, silver particles 7320 are distributed so that the particle size thereof reduces from the neighborhood of the surface of the silicon oxide film 7310 toward the substrate 7300 side by carrying out the heat treatment of the silicon oxide film 7310.

Figure 47D:
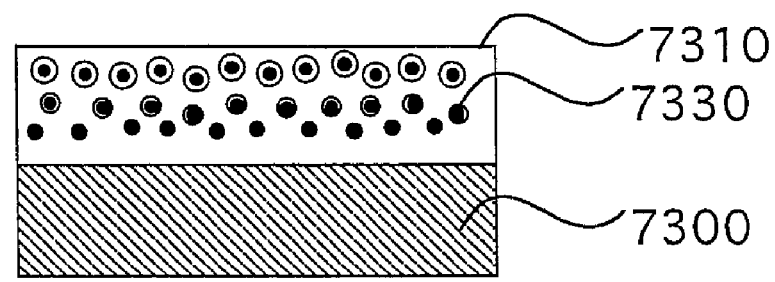

Then, the surface portions of the silver particles were made insulative through thermal oxidation. In this example, the load-lock type oxidation furnace produced by Kokusai Electric Inc. was used. As a result, as shown in FIG. 47D, a silver oxide film was formed on the surfaces of the silver particles 7330, so that a comparatively thick silver oxide film was formed on the particles located near the surface of the silicon oxide film 7310. Meanwhile, a comparatively thin silver oxide film was formed on the silver particles 7330 located on the silicon substrate 7300 side, i.e., remote from the surface of the silicon oxide film 7310. Consequently, the silver particles 7330 after insulation came to have an approximately equal particle size in the thickness direction of the silicon oxide film 7310. As a result, the silver particles 7330, which remained uninsulated in the center portion of the initially formed silver particles 7320, came to have a particle size distribution of less variations than that of the initially formed silver particles 7320.

In the example of FIGS. 45 to 47, the implantation process, the heat treatment process and the insulation process were independently carried out. However, even immediately after the ion implantation, the particles can be formed without carrying out the heat treatment process depending on the implantation condition. Moreover, the insulation process is a process that involves heat like, for example, thermal oxidation, and therefore, the process can also substantially concurrently serve as a heat treatment process.

However, the condition for obtaining the desired particles becomes severe, or the process becomes unstable. Therefore, it is preferable to separate the processes in carrying out mass-production.

FIGS. 48A to 48D are process diagrams showing yet another formation method of particles. In this example, a substance for forming conductive particles is implanted into a semiconductor substrate, and thereafter, an oxidation process of the semiconductor substrate is carried out. The process of oxidizing this semiconductor substrate is carried out so as to effect oxidation to the neighborhood of the region where the implantation concentration of the substance is high. Subsequent to this semiconductor substrate oxidizing process, etching is carried out by, for example, dilute hydrofluoric acid, removing the oxidized region. At this point of time, the portion where the implantation concentration of the substance is high appears in the surface. Then, the semiconductor substrate, in the surface of which the portion of a high implantation concentration has appeared, is heat-treated to diffuse or gather the metal of the implanted substance, forming the desired particles at this point of time. Subsequently, oxidation is carried out again to oxidize the surface portion of the semiconductor substrate, and the surface portions of the conductive particles are oxidized for the insulation.

FIGS. 48A through 48D are views for explaining the method for forming the silver particles in the silicon oxide film as in the aforementioned example.

Figure 48A:
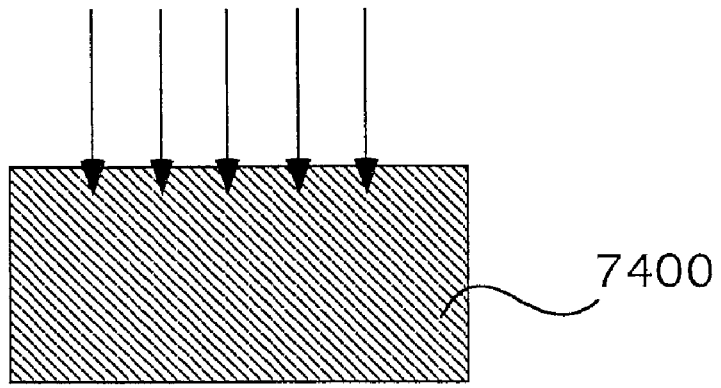
FIGS. 48A to 48D are process diagrams showing yet another formation method of particles.

In this example, the silver ion implantation is carried out in a state in which no silicon oxide film exists in the silicon substrate or through a thin pad film, unlike the example of FIGS. 45 to 47. That is, as shown in FIG. 48A, silver is introduced into a silicon substrate 7400 by the ion implantation method. In this case, the implantation energy was set so that the implantation depth of the silver ions became about 50 nm.

Even in this case, the implantation concentration of silver ions becomes a distribution similar to the Gaussian distribution such that the position at the depth of about 50 nm from the surface of the silicon substrate 7400 comes to have a maximum concentration in the depthwise direction as in the aforementioned examples.

Figure 48B:
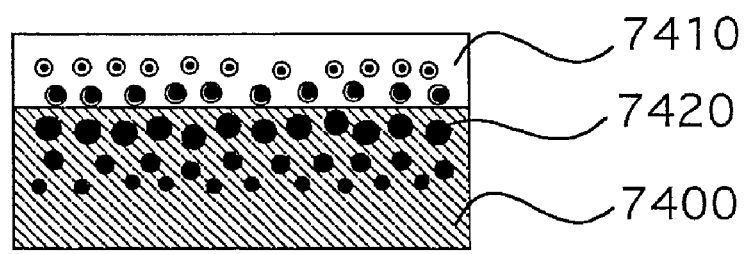

Subsequently, an oxidation process is carried out. That is, as shown in FIG. 48B, the silicon substrate 7400 is oxidized to form a silicon oxide film 7410. The oxidation is carried out so that a portion of a high implantation concentration of silver is positioned in the vicinity of the interface between this silicon oxide film 7410 and the silicon substrate 7400. That is, the oxidation depth of the silicon substrate 7400 is made roughly equivalent to or greater than the implantation depth of silver. In this example, the oxidation was effected from the surface of the silicon substrate before oxidation to a depth of about 50 nm. By heat when this oxidation is carried out, the silver particles 7420 are formed.

Figure 48C:
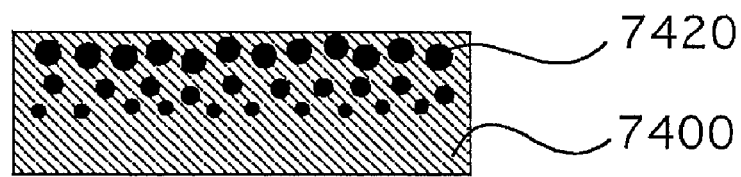

Next, the silicon oxide film 7410 is removed. In this example, the silicon oxide film 7410 is removed by dilute hydrofluoric acid. Consequently, as shown in FIG. 48C, there are formed silver particles 7420 distributed so that the particle size of the silver particles 7420 near the surface of the silicon substrate 7400 is maximized and the particle size becomes thinner in the depthwise direction from the surface of this silicon substrate 7400.

Figure 48D:
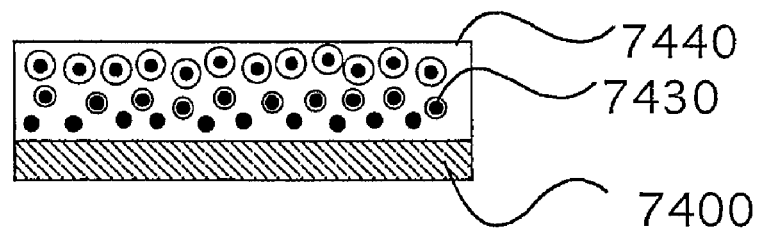

Subsequently, the silicon substrate 7400 is oxidized again. This oxidation was carried out by the thermal oxidation method, by which a silicon oxide film 7440 of a film thickness of about 50 nm was formed on the surface of the silicon substrate 7400. Consequently, as shown in FIG. 48D, the surface portions of the silver particles 7420 were also oxidized, so that silver particles 7430 of which the surfaces were covered with silver oxide were formed. The particle sizes of the silver particles 7430, of which the surfaces were covered with silver oxide, resulted in a distribution having comparatively smaller variations than the particle sizes of the silver particles 7420 before the formation of silver oxide, as in the example of FIG. 47.

FIGS. 49A to 49D are process diagrams showing still another formation method of particles. Generally, in this example, a pad oxide film is preliminarily formed on a semiconductor substrate to be subjected to the implantation of a substance for forming conductive particles before the implantation of this substance.

Next, the substance is implanted through the pad oxide film. At this time, the thickness and the implantation condition of the pad oxide film are preparatorily set so that an interface between the pad oxide film and the semiconductor substrate becomes located in the portion of a high implantation concentration of the substance.

Heat treatment is carried out after the implantation of the substance, by which conductive particles are formed. Subsequently, the pad oxide film is etched by, for example, dilute hydrofluoric acid.

Next, oxidation is carried out again for insulation by oxidizing the surface portion of the semiconductor substrate and also oxidizing the surface portions of the conductor particles. The conductive particles undergo a greater degree of oxidation as located closer to the surface of the semiconductor substrate. However, since the conductive particles have comparatively great particle sizes near the surface of the semiconductor substrate, the conductive particles after insulation come to have comparatively smaller variations in the diameter in the depthwise direction of the semiconductor substrate.

A concrete example of the method for forming the particles will be described with reference to FIGS. 49A to 49D.

First of all, a silicon oxide film 7510 is formed as a pad oxide film on the surface of a silicon substrate 7500 that serves as a semiconductor substrate through a thermal oxidation process. This silicon oxide film 7510 is formed to a thickness of about 25 nm.

Figure 49A:
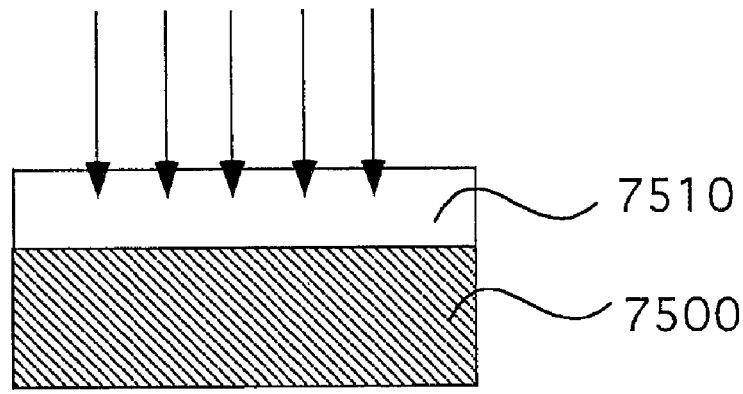
FIGS. 49A to 49D are process diagrams showing yet another formation method of particles.

Next, as shown in FIG. 49A, silver is introduced into the silicon oxide film 7510 and the silicon substrate 7500 by the ion implantation method. In this case, the implantation energy is set so that the implantation depth of silver becomes located in the vicinity of the interface between the silicon oxide film 7510 and the silicon substrate 7500. In this example, the implantation was carried out so that the implantation depth became about 50 nm.

Also in this example, the implantation concentration of silver comes to have a concentration distribution similar to the Gaussian distribution in the depthwise direction with a maximum concentration located at a depth of about 50 nm from the surface of the silicon oxide film 7510.

Figure 49B:
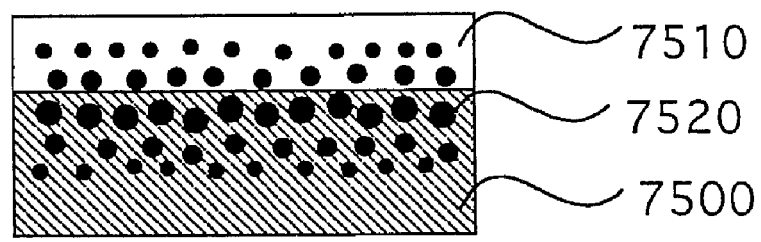

Next, a heat treatment process is carried out to form silver particles 7520. In the silicon oxide film 7510 and the silicon substrate 7500, the particle size distributions depending on the ion concentrations are provided in the respective base materials as shown in FIG. 49B although the state of formation differs between the silicon oxide film 7510 and the silver particles 7520 due to the difference between the base materials.

Figure 49C:
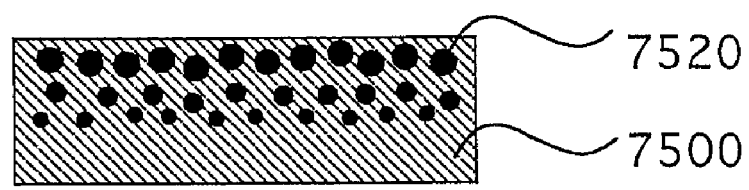
Figure 49D:
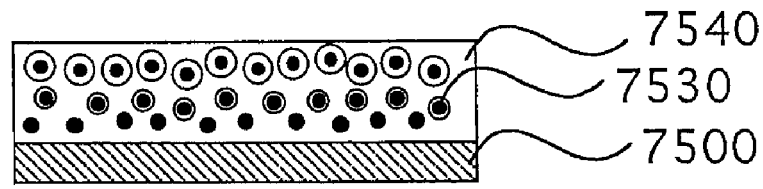

In this case, the silicon oxide film 7510 that serves as the pad oxide film is removed by oxide film etching. There are obtained silver particles 7520 distributed so that the particle size thereof becomes thinner in the depthwise direction from the neighborhood of the surface of the silicon substrate 7500 as shown in FIG. 49C. As the etching, either wet etching or dry etching can be used. In this example, the wet etching was carried out with a hydrofluoric acid solution of a concentration of 0.5%.

Subsequently, as in the example of FIG. 48, the oxidation of the silicon substrate 7500 and the insulation of the particles are carried out through a thermal oxidation process. In this process, the load-lock type oxidation furnace produced by Kokusai Electric Inc. was used. Through this thermal oxidation process, the silver oxide was formed thicker on the silver particles 7530 located near the surface of an insulator 7540. However, since the particles located near the surface of the insulator 7540 had a greater particle size before insulation, the silver particles 7530 came to have a smaller variation in the particle size after insulation than before insulation.

Moreover, an oxide film 7540 of a thickness of about 30 nm was formed on the surface of the silicon substrate 7500 through the thermal oxidation process.

FIGS. 50A to 50D are process diagrams showing still another formation method of particles. Generally, this example differs from the example of FIG. 49 in the sequence of the process of etching the pad oxide film and the heat treatment process.

That is, in this example, a substance for forming the particles is implanted via a pad oxide film, and thereafter, the pad oxide film is removed. Subsequently, heat treatment is carried out to form conductive particles. Subsequently, an oxidation process is carried out to oxidize the semiconductor substrate and oxidize the surface portions of the conductive particles.

FIGS. 50A to 50D are views concretely showing a method for forming silver particles as the conductive particles.

First of all, a silicon oxide film 7610 that serves as a pad oxide film is formed on the surface of a silicon substrate 7600 that serves as a semiconductor substrate through thermal oxidation. In this example, the film was formed to a thickness of about 25 nm.

Figure 50A:
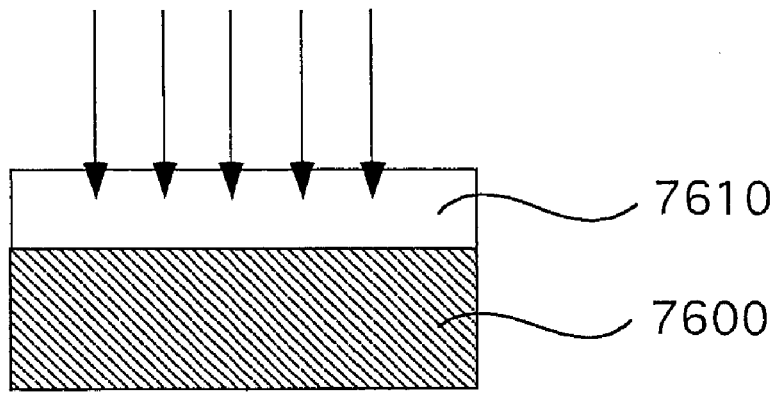
FIGS. 50A to 50D are process diagrams showing yet another formation method of particles.

Next, as shown in FIG. 50A, silver is introduced into the silicon oxide film 7610 and the silicon substrate 7600 by the ion implantation method. In this case, the implantation energy is set so that the maximum implantation depth of silver becomes located in the vicinity of the interface between the silicon oxide film 7610 and the silicon substrate 7600. In this example, the implantation was carried out so that the implantation depth became about 50 nm.

In this example, the implantation concentration of silver comes to have a distribution similar to the Gaussian distribution with a maximum concentration located at a depth of about 50 nm from the surface of the silicon oxide film 7610.

Figure 50B:
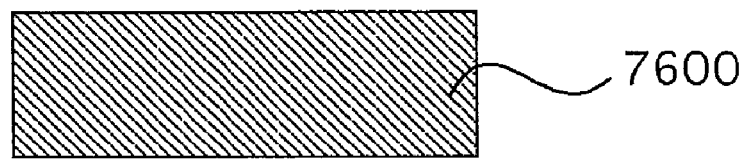

Next, as shown in FIG. 50B, the silicon oxide film 7610 is removed by oxide film etching, and processing is carried out so that the portion of the high implantation concentration of silver becomes located near the surface. As the etching, either wet etching or dry etching can be used. Since the pad film to be removed was silicon oxide in this example, the wet etching was carried out by using a hydrofluoric acid solution of a concentration of 0.5%.

It is sometimes the case where silver particles are formed at the point of time when silver ions are implanted depending on the condition.

Subsequently, heat treatment and an oxidation process are carried out.

Figure 50C:
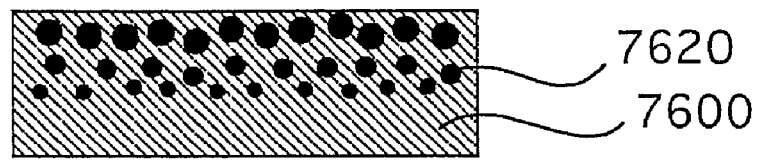

First of all, as shown in FIG. 50C, heat treatment is carried out to form particles 7620 distributed so that the particle size becomes smaller in the depthwise direction from the neighborhood of the surface of the silicon substrate 7600.

Figure 50D:
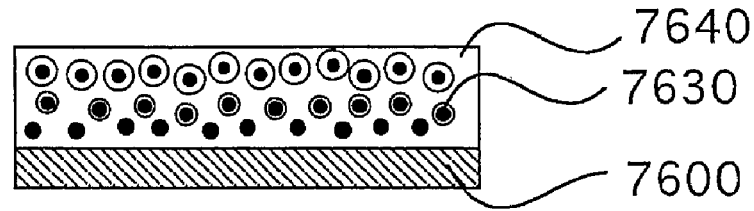

Then, the insulation process is carried out through thermal oxidation. In this example, a load-lock type oxidation furnace produced by Kokusai Electric Inc. was used. Consequently, as shown in FIG. 50D, a silicon oxide film 7640 of a thickness of about 30 nm is formed on the silicon substrate 7600. Moreover, the silver particles 7630 located near the surface of this silicon oxide film 7640 have a comparatively thick silver oxide formed on their surfaces, and the silver oxide formed on the surfaces of the silver particles 7630 had a thickness formed thinner in the depthwise direction of the silicon oxide film 7640. As a result, the silver particles 7630 after insulation were formed with variations comparatively smaller than those of the silver particles 7620 before insulation in the depthwise direction of the silicon oxide film 7640.

In the examples of FIGS. 45 to 50, silver is employed as the material of the conductive particles. However, it is acceptable to employ other metals such as gold, copper, aluminum, tin, nickel, platinum, zinc, hafnium, manganese, tantalum, titanium, tungsten and indium besides silver.

In particular, the substance of aluminum or the like for forming a fine oxide film on the surface thereof can enclose a particle with an insulator of few defects. Therefore, when electric charges are retained in this aluminum particle, the leakage phenomenon of electric charges can effectively be suppressed. Therefore, a memory function body of an excellent charge retention characteristic can be formed.

Moreover, it is also possible to employ a semiconductor of silicon, germanium or the like for the conductive particles or employ an alloy or compound other than the semiconductor.

Particularly, when silicon is employed as the conductive particles and this silicon particle is made insulative through oxidation or nitridation to form a silicon oxide film or a silicon nitride film on the surface of the silicon particle, the film can function as an effective barrier against electric charges retained in the silicon particle. That is, a memory function body that has an excellent retention characteristic almost free of leakage of electric charges can be formed.

In the above examples, in the process of implanting the material of the conductive particles into the insulator by ion implantation, the implantation may also be performed at an acute angle against the surface of the insulator.

More specifically, into the silicon oxide film formed on the silicon substrate, silver ions are implanted at an incident angle of about 70° with respect to the normal line of the surface of the silicon oxide film. The thickness of the silicon oxide film is about 100 nm. The implantation conditions for the silver negative ions are generally similar to those of the example of FIG. 50.

Subsequently, silver particles were formed by carrying out a heat treatment process as in the example of FIG. 50, and consequently the silver particles were formed distributed in a width narrower than in the example of FIG. 50 in the depthwise direction of the silicon oxide film. In this example, the silver particles were able to be formed in the region of a thickness about a half of that of the example of FIG. 50.

In this case, according to the implantation method employing positive ions, the insulator of the silicon oxide film or the like that undergoes the implantation is disadvantageously electrically charged, and it is often the case where the distribution of implantation of silver ions is expanded or the desired implantation depth cannot be obtained even if the implantation of silver ions is carried out at an acute angle. In contrast to this, this example employs the negative ion implantation method. Therefore, the silicon oxide film is not electrically charged with a high voltage, and the implanted silver ions can be distributed in conformity to the setting. As a result, particles can be formed in a comparatively narrow width of distribution at the desired depth. Therefore, if, for example, the silicon oxide film, which is formed on the silicon substrate and subjected to the implantation of silver ions, is formed into a thin film, it becomes possible to avoid the inconvenience that the silver ions are disadvantageously implanted into the silicon substrate.

As a result of forming silver particles in a specimen obtained by forming the silicon oxide film into a thin film of a thickness of about 50 nm under similar conditions, silver particles were able to be accurately formed throughout a region at a specified depth like the aforementioned silicon oxide film of a thickness of 100 nm. Moreover, by reducing the implantation energy or increasing the angle of implantation with respect to the surface of the silicon oxide film, it becomes possible to form the silicon oxide film into a thin film.

Figure 51A:
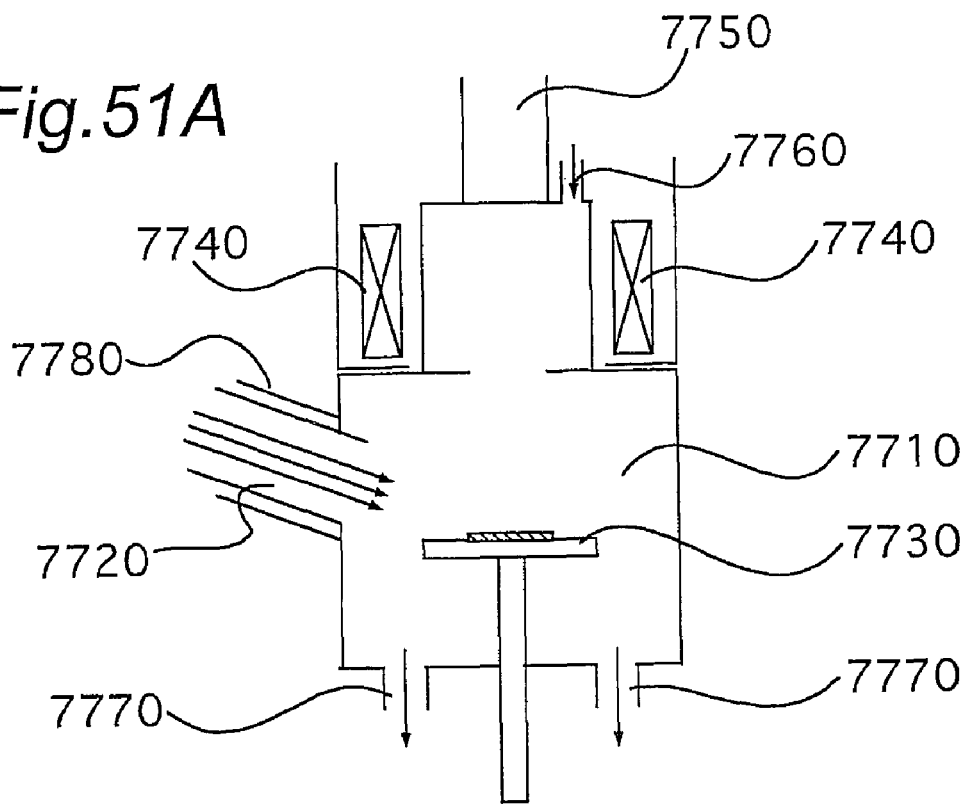
FIGS. 51A and 51B are schematic views showing equipment for implanting a material of conductive particles into an insulator.

FIG. 51A is a schematic view showing an apparatus for implanting the material of conductive particles into an insulator. With this equipment, the surface of the parent body in which conductive particles are formed is etched while implanting the material of conductive particles. For example, a silicon oxide film formed on a silicon substrate is subjected to anisotropic etching while implanting silver ions into the silicon oxide film.

As shown in FIG. 51A, this apparatus has a structure in which a reaction chamber 7710 of a dry etching system is provided with an outlet of a beam transport section 7720 of an ion implanter and concurrently serves as an implantation chamber of the ion implanter. This dry etching system has a coil 7740, a microwave waveguide 7750, an etching gas introducing tube 7760 and evacuation ports 7770. Moreover, in the present system, a magnetic shield 7780 is provided around the beam transport section 7720 to prevent the ion beam from being influenced by the external magnetic field from the coil 7740 and so on.

Figure 51B:
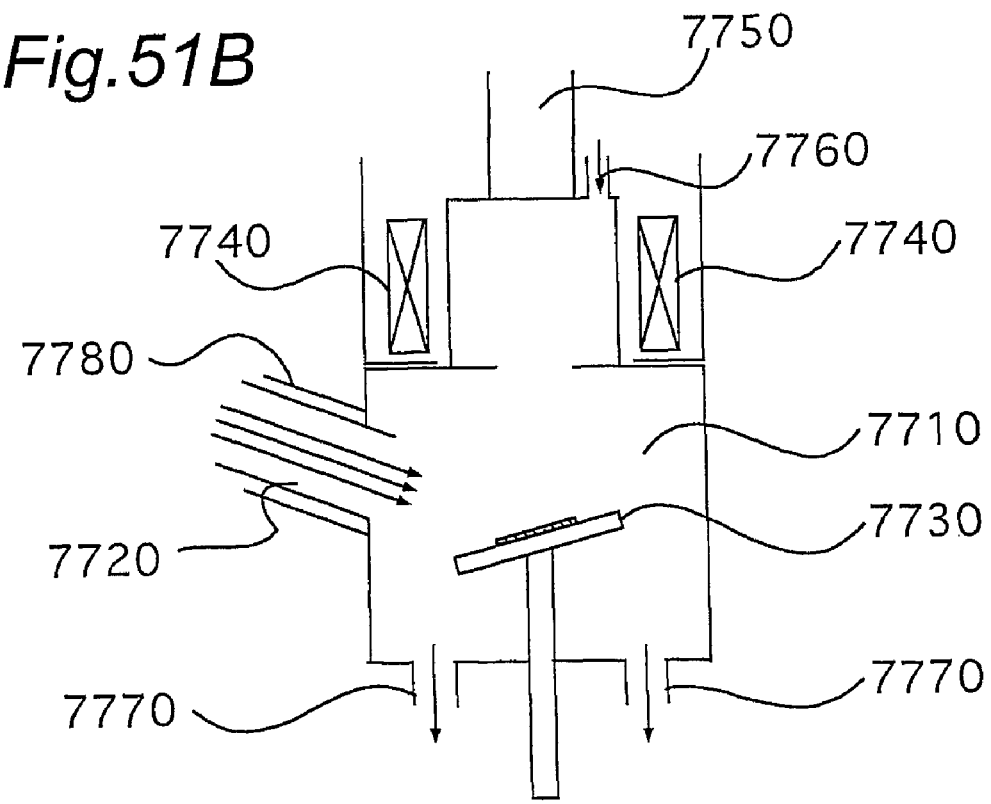

Moreover, in order to carry out oblique implantation of conductor ions into the insulator, the this example has a structure in which the direction of incidence of ions has an angle of about 70° with respect to the normal line of a substrate holding base 7730 as shown in FIG. 51B. Moreover, it is also possible to set the direction of implantation of the conductor ions in the desired direction by changing the direction of setting of the beam transport section 7720 or providing the beam transport section 7720 with a beam path change mechanism.

Otherwise, by changing the inclination of the substrate holding base 7730 with a movable mechanism provided for the substrate holding base 7730, the direction of implantation with respect to the insulator on the substrate can be arbitrarily set. FIG. 51B is a view schematically showing a state in which only the substrate holding base 7730 is inclined at an angle of about 15° from the state of FIG. 51A. Therefore, in the state of FIG. 51B, the angle of implantation of conductor ions is about 55°.

In this case, silver anions were implanted into the silicon oxide film of a film thickness of about 40 nm on the silicon substrate by about $1 \times 10^{15}/\text{cm}^2$ with an implantation energy of about 30 KeV by means of the system of FIG. 51A. In addition to this, the silicon oxide film was etched by about 10 nm at a constant rate by dry etching. In the present embodiment, the average current density of the beam was about 1 $\mu\text{A/cm}^2$, and the etching rate was about 4 nm/min.

Subsequently, heat treatment was carried out by a method similar to those of the examples of FIGS. 45 to 50. In the aforementioned examples, the particles of the largest particle size were formed at the specified depth from the surface of the silicon oxide film, and particles of a particle size smaller than that of the above-mentioned particles were formed above and below this specified depth. Moreover, there was the tendency that the density of the particles became nonuniform in the film-thickness direction of the silicon oxide film. However, in this example in which the apparatus of FIG. 51 is employed, a distribution of silver particles of comparatively uniform particle sizes was obtained in the region from the neighborhood of the surface of the silicon oxide film to a depth of about 10 nm, and the variations in the size and the density of the particles were reduced.

Moreover, in this example, the oblique implantation for implanting the particle material from the direction that makes an acute angle with respect to the surface of the insulator is carried out. Therefore, the region where the particles are formed can be set to a narrow range in the film-thickness direction of the insulator. Moreover, if the angle of implantation of the particle material is adjusted, then the range in which the particles are formed in the insulator can be adjusted. Further, the variation in the particle formation range can be further suppressed by using negative ions as in this example, and therefore, the particle formation range can be adjusted with satisfactory accuracy.

Further, by carrying out the process of making the particles insulative, the particle size of the conductive particles can be reduced as in the other embodiments, and the charge retention characteristic of the conductive particles can be improved. Particularly, in this example, the conductive particles can be formed in the narrow range in the film-thickness direction of the insulator, and therefore, the insulator can be formed into a thin film. Moreover, the conductive particles can be formed within the narrow range in the thickness direction of the thin film. Therefore, the surfaces of almost all the particles can be made insulative in a short time, and the time of the insulation process can be shortened. Moreover, since the variation in making the particle surfaces insulative can be suppressed, reliability and productivity can be improved.

Figure 52A:
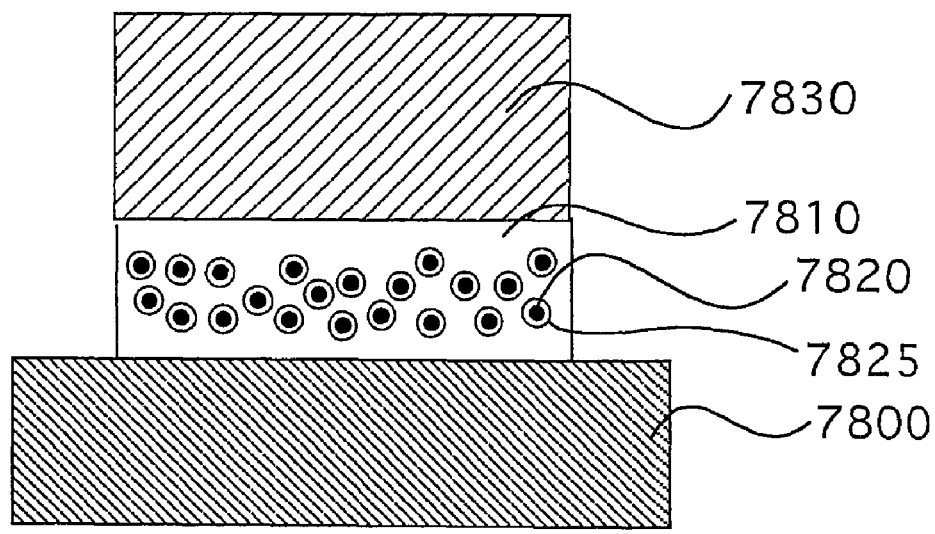
FIG. 52A is a schematic view showing a resistance-changing function body of one embodiment.
Figure 52B:
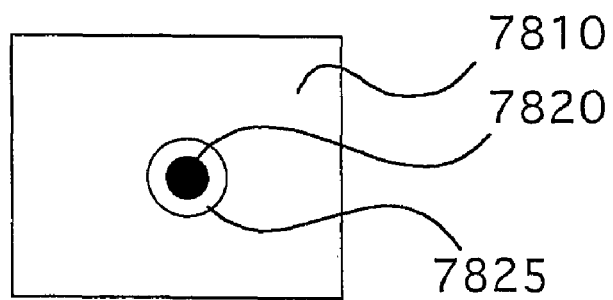
FIG. 52B is an enlarged view of part of FIG. 52A.

FIG. 52A is a schematic view showing a resistance-changing function body of one embodiment. FIG. 52B is an enlarged view of part of FIG. 52A. In this example, nanometer-size conductive particles produced by the particle forming method of the present invention were formed in an insulator on a conductive substrate, and an electrode was formed on the insulator by a usually adopted method, constructing a resistance-changing function body.

This resistance-changing function body is provided with a silicon oxide film 7810 on a substrate 7800 as a first conductor, and silver particles 7820 covered with a silver oxide film 7825 are formed in this silicon oxide film 7810. An electrode 7830 formed of aluminum that serves as a second conductor is provided on the silicon oxide film 7810.

Figure 53:
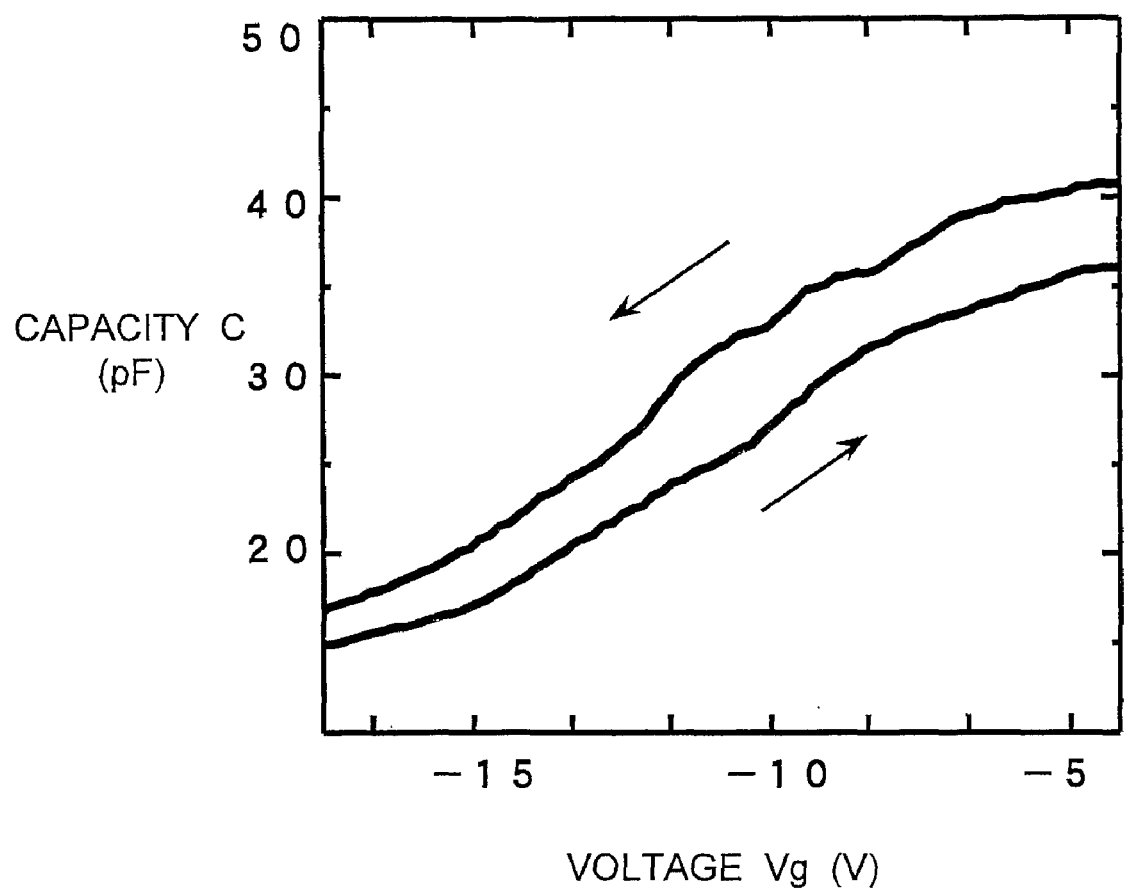
FIG. 53 is a view showing voltage-capacitance characteristics of the resistance-changing function body of FIG. 52A.

An experiment was carried out by measuring the capacity C of the silicon oxide film 7810 when a voltage Vg was applied across the silicon substrate 7800 and the aluminum electrode 7830 of the resistance-changing function body, and curves as shown in FIG. 53 were consequently obtained. In FIG. 53, the horizontal axis represents the voltage Vg(V), and the vertical axis represents a capacitance C(pF). As is apparent from FIG. 53, the resistance-changing function body exhibits a hysteresis characteristic. As described above, the silicon oxide film 7810 including the nanometer-size silver particles 7820 of this example has the hysteresis characteristic. Therefore, by comparison of the magnitude of the capacitance when same voltage is applied across the silicon substrate 7800 and the aluminum electrode 7830, it is possible to discriminate the binary value and produce the memory function.

Moreover, since the resistance-changing function body of the present embodiment is fabricated by using the negative ion implantation, the silicon oxide film 7810 has a quality equivalent to that of a single thermal oxide film. Therefore, this resistance-changing function body has very high reliability. The time necessary for the manufacturing is shorter than in the case where an insulation film and particles are formed by, for example, CVD (Chemical Vapor Deposition) method, and therefore, excellent productivity is possessed.

Moreover, since the silver ions are implanted by negative ion implantation, variation in the formation position of the silver particles due to electrical charge can be suppressed, and the silicon oxide film 7810 including the silver particles can be formed into a thin film and scaled down. Further, in comparison with the case where the thickness is comparatively great, an effective electric field applied to the silicon oxide film 7810 is strengthened even if same voltage is applied across the electrodes. This therefore makes it possible to lower the voltage of the resistance-changing function body and improve the productivity and low power consumption property.

Moreover, the implantation into the surface of the silicon oxide film 7810 is effected at an acute angle during the implantation of silver ions, and therefore, the expansion of the distribution of silver particles 7820 in the thickness direction of the silicon oxide film 7810 can be suppressed. Therefore, the silicon oxide film 7810 can be formed into a thin film, and the scale-down can be effectively achieved.

A specimen whose thickness was increased to 70 nm by increasing only the silicon oxide was formed by employing the silicon oxide film 7110 of FIG. 45 with regard to the thickness of the silicon oxide film 7810, and an experiment was carried out by giving a potential difference to this specimen. As a result, the film of the above-mentioned specimen did not operate as a memory function body unless the potential difference was increased close to about 10 V. Moreover, when the potential difference of 10 V was given, dielectric breakdown disadvantageously occurred. Therefore, the thickness of the silicon oxide film 7810 should preferably be less than 70 nm.

Moreover, if the resistance-changing function body is employed for the capacitor of the conventional DRAM, it becomes possible to provide a low power consumption DRAM that needs no refresh or is able to largely reduce at least the number of times of refresh. Moreover, since no special material as the ferroelectric body of the ferroelectric memory is needed, there can be obtained a DRAM that can be fabricated through simple processes and has excellent productivity.

The size of the silver particle 7820, which becomes hard to scale down when it is extremely large and of which the memory function is degraded when it is extremely small, should preferably have a nanometer size, i.e., a size smaller than 1 μm. In particular, it is preferred that a majority of the silver particles 7820 have a particle size within a range of not smaller than 0.1 nm and not greater than 4 nm.

A substance of a metal, polysilicon or the like having electrical conductivity can be employed for the electrode so long as the substance is a conductive substance.

In this example, there has been described the case where the silver particles 7820 that serve as conductive particles covered with the silver oxide 7825 are formed in the silicon oxide film 7810 that serves as the medium. However, the conductive particle may be formed of another material of gold, copper, silicon, germanium, aluminum, tungsten, niobium, zirconium, titanium, chromium, tin, cobalt, nickel, iron, antimony, lead or the like. According to this conductive particle material, it is proper to cover the conductive particle with an insulator obtained by oxidizing or nitriding the conductive particle. Moreover, the conductive particle and the medium (insulator) in which the insulator is formed are not limited to the aforementioned silicon oxide and may be formed of silicon nitride, a glass substrate, another semiconductor or the like.

Further, the resistance-changing function body may also be fabricated with a material different from that of the examples of FIG. 52. For example, silicon is implanted by a dosage of $1 \times 10^{15}$ to $1 \times 10^{16}/cm^2$ into the silicon thermal oxide film under implantation energy of 10 to 15 KeV in place of silver. Then, heat treatment is carried out in a nitriding atmosphere, forming SiN/Si particles obtained by covering the surfaces of the silicon particles with SiN. The heat treatment is carried out for several hours in an ammonia atmosphere at a temperature of about 900° C.

It was discovered that the resistance-changing function body fabricated in the present embodiment had a greater hysteresis (i.e., memory window is larger) and a more excellent charge retention characteristic than those of the resistance-changing function body fabricated by forming silicon particles by the conventional CVD. This is ascribed to the fact that the insulator, which becomes a medium containing particles, is a silicon thermal oxide film and therefore has a higher quality than the CVD film and the oxide film of polysilicon. Moreover, an SiN film is formed through an annealing process instead of an SiN film by CVD on the surface of the silicon particles. Accordingly, there is a reduced number of interface state densities formed between the silicon particle and the SiN film, and an excellent characteristic of reduced leakage of the retained charges can be obtained.

Further, conductive particles may also be formed of aluminum in place of silver. Heat treatment is carried out as in the above example by implanting aluminum into a silicon oxide film by a dosage of about $1 \times 10^{14}$ to $1 \times 10^{16}/cm^2$ with implantation energy of 5 to 15 KeV. The temperature of this heat treatment is not higher than 600° C. Through this process, a resistance-changing function body that had a silicon oxide film, in which $Al_2O_3/Al$ particles obtained by covering the surfaces of aluminum particles with alumina were discretely existed, was able to be fabricated.

The resistance-changing function body of this example has a greater hysteresis (i.e., memory window is larger) and a more excellent charge retention characteristic than those of the resistance-changing function body that has particles produced by the conventional method. This is ascribed to the fact that the charge storage capability of the conductive particles is excellent since aluminum of a metal is employed and the fact that the charge retention capability is excellent since the conductive particles are enclosed by alumina that is a satisfactory insulator. Moreover, the alumina is in the so-called passive state, and the oxidation scarcely progresses after alumina is formed through the oxidation of the surface of the aluminum particles. Therefore, the characteristics concerning electric charges scarcely change. As a result, a memory function body of stable memory operation and high reliability can be provided.

Further, conductive particles may also be formed by a method different from the ion implantation method. That is, a diffusion method was used instead of the ion implantation method as a method for adding a material for forming conductive particles in an insulator that serves as a medium. For example, after aluminum particles are formed in a silicon oxide film, a silicon oxide film is formed as in the example of FIG. 45. On this silicon oxide film, an aluminum film is fabricated by evaporating aluminum by means of a vacuum evaporation system. It is acceptable to use a sputtering method instead of the evaporation method and use any method so long as an aluminum film can be formed.

Subsequently, heat treatment was carried out at a temperature of about 400° C. to 600° C., diffusing aluminum in the silicon oxide film. Subsequently, heat treatment was carried out at a temperature lower than the temperature of diffusion, and thereafter, oxidation was further carried out.

Subsequently, an electrode was formed as in the following examples, by which a resistance-changing function body was formed. It was discovered that this resistance-changing function body had an excellent memory characteristic similar to those of the following examples.

According to this example, a resistance-changing function body of an excellent characteristic can be fabricated more easily by using the diffusion method than by the ion implantation method.

It is more preferable to employ an AlSi film in place of the aluminum film because the neighborhood of the surface of the insulator as the medium can be prevented from coming to have a very high concentration. Moreover, if a material, of which the oxide forms a passive state, as represented by aluminum, is employed as a conductive particle, then the surrounding of the particle can be covered with an insulation film of a good quality through oxidation, providing a further advantage than the other materials.

Figure 54:
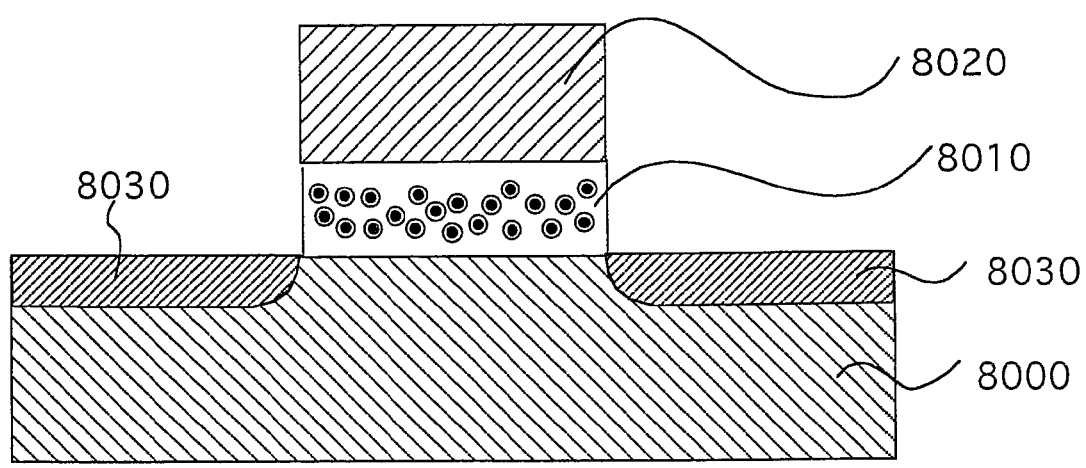
FIG. 54 is a schematic view showing a memory device of one embodiment.

FIG. 54 is a schematic view showing a memory device of one embodiment. In this example, nanometer-size conductive particles fabricated by the above particle forming method are formed in an insulator on a semiconductor substrate, and an electrode is further formed on the insulator by the normally used method. A substance, which has electrical conductivity, such as a metal or polysilicon, can be employed for the electrode so long as the substance is a conductive substance. Then, source and drain regions are formed on the semiconductor substrate by a method used for the normal transistor of a flash memory or the like to constitute a field-effect type transistor, by which the memory device of the present invention is fabricated.

More specifically, as shown in FIG. 54, for example, silver particles covered with a silver oxide film, are formed in a silicon oxide film 8010 on a silicon substrate 8000. An aluminum film is formed on this silicon oxide film 8010, and a gate electrode 8020 is fabricated from this aluminum film by photolithography and etching. Then, source and drain regions 8030 are formed on the silicon substrate 8000 by the normal ion implantation method. Further, an interconnection process is carried out by the normal method to form a transistor.

The memory device fabricated in this example was able to obtain a varied magnitude of the threshold value in correspondence with the varied magnitude of the capacitance described in connection with the example of FIG. 52. That is, in order to execute write and erase, a sufficiently large positive or negative voltage is applied to the gate electrode 8020 as in the floating-gate type memory. In order to execute read, it is proper to detect the current flowing between the source and drain regions 8030. In this memory device, there was generated a difference of about 2 V between an instant immediately after the application of a voltage of +15 V and an instant immediately after the application of a voltage of −15 V to the gate electrode 8020. Therefore, the memory device can execute memory operation similar to that of the flash memory or the like.

Moreover, the memory device is provided with a silicon oxide film 8010 in which particles are formed by the above particle forming method. Since this silicon oxide film 8010 can be formed into a thin film, it is possible to achieve scale-down and a reduction in the operating voltage. Furthermore, since neither complicated process of the flash memory nor a special material of the ferroelectric memory is employed, excellent productivity is possessed.

Although the thickness of the gate insulation film (silicon oxide film 8010) is set to about 50 nm in this example, it is a matter of course that the film thickness can be further reduced and a reduction in the film thickness can be achieved within a range in which the film thickness does not become smaller than the size of the particle. The gate electrode should preferably to smaller than 5 nm, and this makes it possible to reduce the voltage of the memory device and allow the device to be driven with a voltage lower than 10 V.

Further, a silicon thermal oxide film formed as thin as a thickness of about 5 to 10 nm may also be used as a gate insulation film. That is, by using such a gate insulation film formed as thin as a thickness of about 5 to 10 nm, field effect transistors are made up and a memory device is fabricated. The memory device has a construction similar to that of the example of FIG. 54 except for the gate insulation film.

The gate insulation film was fabricated by a method similar to that of the example of FIG. 52, and the silver ions were implanted at an incident angle of about 65 to 80° with respect to the normal line of the surface of the silicon thermal oxide film in the ion implantation process. Moreover, the thickness of the silicon thermal oxide film during the ion implantation was about 25 nm, and the silicon thermal oxide film was etched by about 10 to 20 nm for the formation of a thin film in the subsequent process.

As a result of subjecting this memory device to measurement as in the example of FIG. 52, a difference of about 2 V was generated, in terms of the threshold value, between an instant immediately after the application of a voltage of +3 V and an instant immediately after the application of a voltage of −3 V to the gate.

As described above, it was discovered that this memory device was able to perform memory operation equivalent to that of the flash memory or the like even at a low voltage with which the normal flash memory hardly operates.

The above is presumably ascribed to the fact that the conductive particles in this silicon oxide film are covered with the oxide in the silicon oxide film that operates as the gate insulation film to allow the quantum effect to remarkably appear and therefore electrons can be implanted into the particles at a low voltage. The above is presumably ascribed further to the fact that the leakage of electrons is suppressed by the Coulomb blockade effect and so on.

The memory device including the gate insulation film that has the particles formed by the above particle forming method should preferably have its gate insulation film thickness reduced to such an extent that the thickness does not become smaller than the size of the particles contained in this gate insulation film and more concretely be set smaller than 5 nm. This allows the memory device to be operable with a low voltage or made drivable at a voltage lower than 10 V.

Moreover, the memory device, which uses the above particle forming method, can easily be manufactured and has congeniality with the conventional silicon processes and therefore able to be integrated into any kind of electronic equipment employing an integrated circuit like, for example, a portable telephone or the like. The electronic equipment, which is provided with the above memory device, can effectively achieve downsizing and low power consumption.

In the above examples, examples in which inorganic substances are used have been given for an easier understanding. However, for example, using an organic substance is preferable in terms of various functions of organic substances and the degree of freedom of functional design. For instance, it is possible to perform a chemical modification by coupling an organic polymer to the surface of particles so that the particles of which the surfaces are covered with an organic substance are diffused into another substance. For example, particles the surfaces of which are covered by an organic substance are diffused into a solution, and the solution is applied onto a substrate, by which a resistance-changing function body of the present invention in which the first material is the solution, the third material is a material of which the particles are made, and the second material is the material of the particles chemically modified with the organic polymer can be provided.

For instance, when a gold particle is modified with a substance having a thiol group, e.g., alkylthiol ($CH_3$—$(CH_2)_n$—SH, where n is an integer), the gold particle is so structured that its surface is surrounded by the organic substance of alkylthiol. By mixing gold-thiol particle into, e.g., SOG (Spin-On Glass), a structure in which the gold-thiol particle is contained in an insulator can be fabricated.

Instead, by taking advantage of the properties that silicon oxide is hydrophilic and that chain organic molecules allow one end of the chain to be made hydrophilic and the other end to be made hydrophobic, it is also possible to oxidize the surface of a silicon particle and furthermore modify the surface with such an organic substance as shown above, thus fabricating a structure in which the silicon particle is covered with different two layers, silicon oxide and an organic substance.

Next, operation of the resistance-changing function body of the present invention is discussed by a model shown in the drawings.

Figure 55A:
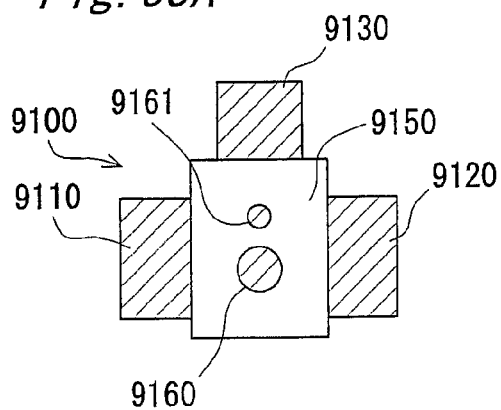
FIG. 55A is a view schematically showing a resistance-changing function body in which a pair of relatively small particle and relatively large particle are arranged in an insulator and in which three electrodes are in contact with the insulator.
Figure 55B:
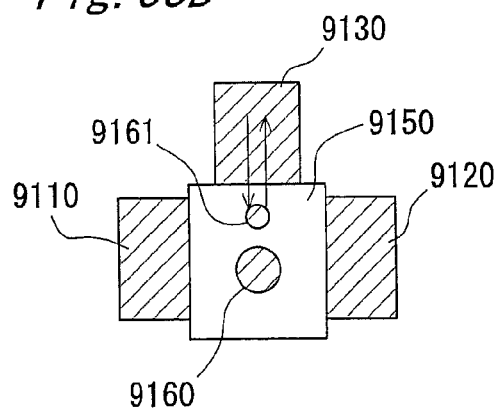
FIGS. 55B and 55C are views for explaining operation of the resistance-changing function body of FIG. 55A.
Figure 55C:
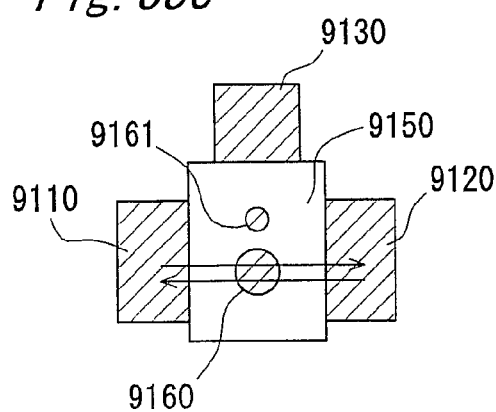
Figure 55D:
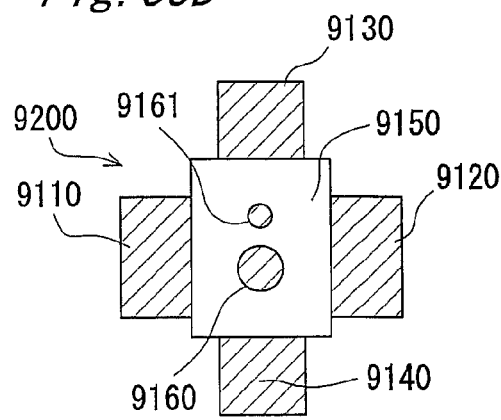
FIG. 55D is a view schematically showing a resistance-changing function body in which a pair of relatively small particle and relatively large particle are arranged in an insulator and in which four electrodes are in contact with the insulator.

FIGS. 55A and 55D schematically show resistance-changing function bodies 9100 and 9200 in each of which a pair of relatively small particle 9161 and relatively large particle 9160 are contained in an insulator 9150. The upper side in the figure, i.e., the relatively small particle 9161 is located on the lower side in the figure. In the resistance-changing function body 9100 of FIG. 55A, a first electrode 9110 and a second electrode 9120 are in contact with the insulator 9150 from left and right in the figure, respectively, while a third electrode 9130 is in contact with the insulator 9150 from above in the figure. In the resistance-changing function body 9200 of FIG. 55D, a fourth electrode 9140 is further in contact with the insulator 9150 from below in the figure.

As shown in FIG. 55C, when a voltage is applied to between the first electrode 9110 and the second electrode 9120, it is inferred that electric charge moves, i.e. a current (indicated by arrow in the figure) flows, mainly through the relatively large particle 9160. The relatively small particle 9161 is smaller in electric capacity, smaller in cross-sectional area and therefore higher in resistance, thus requiring larger voltage for move of the charge, than the relatively large particle 9160. For this reason, it is hard for charge to move through the relatively small particle 9161. Particularly when the particles are nanometer-sized particles, the Coulomb blockade effect may be effective by the size effect. In this case, it becomes even harder for charge to move through the small particle 9161, as compared with the large particle 9160.

Figure 55E:
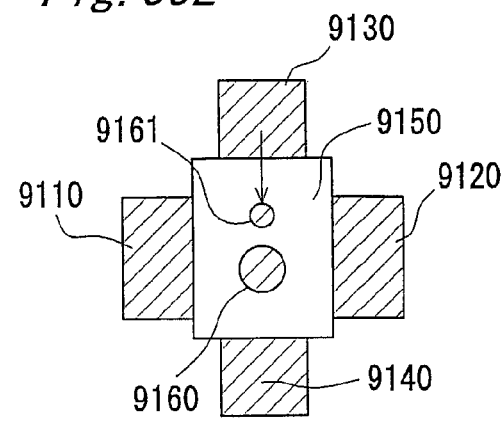
FIGS. 55E and 55F are views for explaining operation of the resistance-changing function body of FIG. 55D.
Figure 55F:
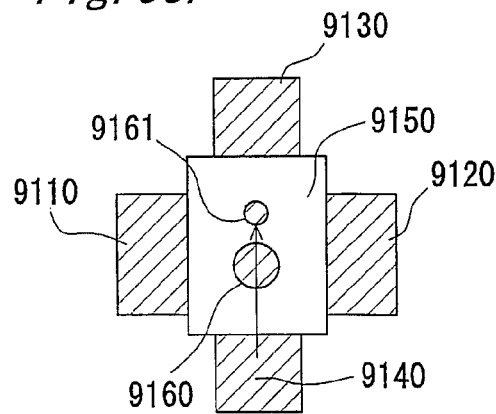

Meanwhile, it is more likely that charge which tends to move from the third electrode 9130 as shown in FIG. 55B or charge which tends to move between the third electrode 9130 and the fourth electrode 9140 as shown in FIGS. 55E and 55F moves through the relatively small particle 9161.

Preferably, at least two kinds of particles, a relatively small particle 9161 and a relatively large particle 9160, are present as the plurality of particles contained in the insulator 9150 as shown above, where the structure is such that the charge that moves between the first electrode 9110 and the second electrode 9120 is allowed to move through the relatively large particle 9160 while the charge that tends to move from the third electrode 9130 (or between the third electrode 9130 and the fourth electrode 9140) is highly likely to move through the relatively small particle 9161.

It is noted that arrows in the figures are intended for an easier understanding, where, for example, two arrows are intentionally shifted so as not to overlap each other for an easier viewing.

Figure 56A:
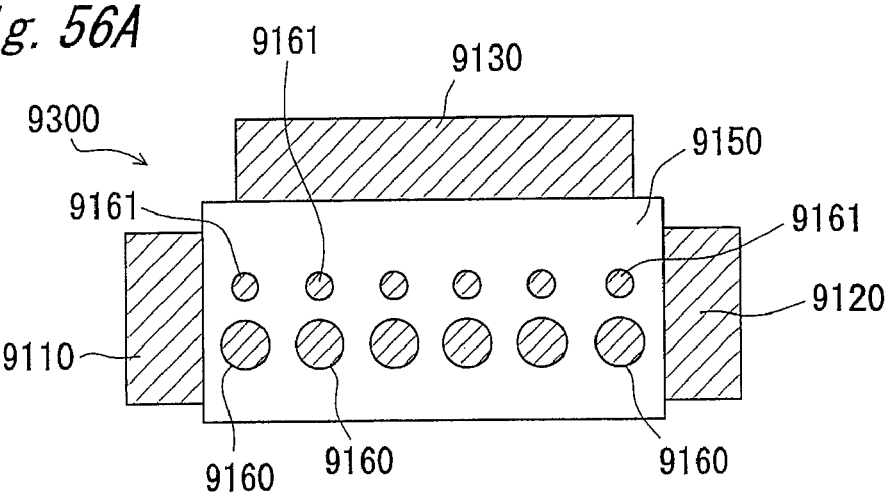
FIG. 56A is a view schematically showing a resistance-changing function body in which pairs of relatively small particle and relatively large particle are regularly arranged in an insulator.
Figure 56B:
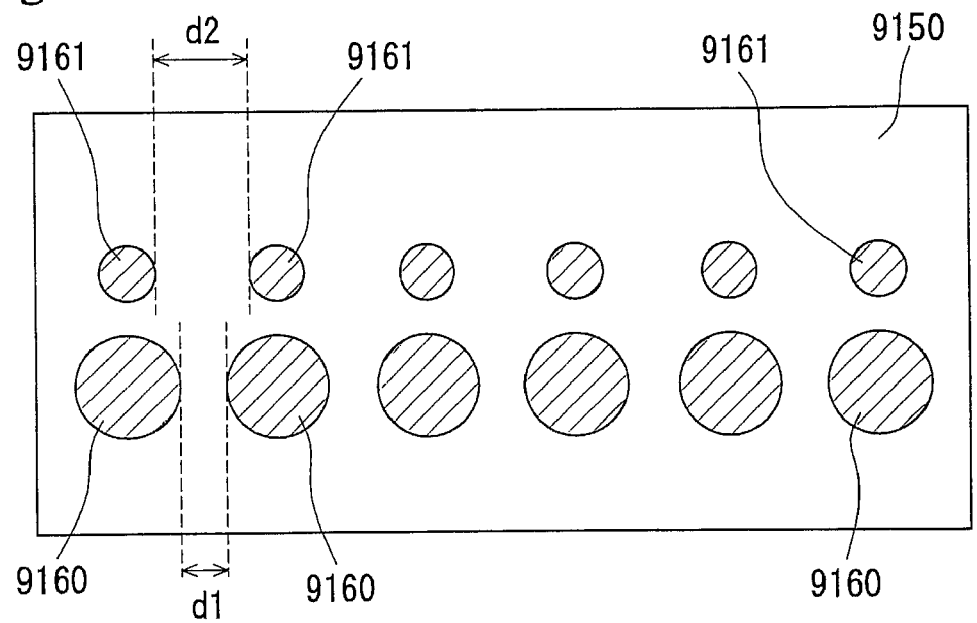
FIG. 56B is an enlarged view of the insulator in FIG. 56A.

FIG. 56A schematically shows a resistance-changing function body 9300 in which pairs of relatively small particle 9161 and relatively large particle 9160 are arranged so as to be arrayed at a constant pitch in a layer direction (transverse direction in the figure) in an insulator 9150. Like the foregoing example, the relatively small particle 9161 is located on the upper side in the figure while the relatively large particle 9160 is located on the lower side in the figure. With such a structure, as shown under magnification in FIG. 56B, a distance d2 between adjacent relatively small particles 9161 is larger than a distance d1 between adjacent relatively large particles 9160.

In this model, it is considered that when a voltage is applied to between the first electrode 9110 and the second electrode 9120 shown in FIG. 56A, charge transfers the large particle 9160 without transferring the small particle 9161.

Next, when a voltage is applied to the third electrode 9130 (to between the same and the fourth electrode 9140), it is easily surmised in consideration of the direction of voltage application that applying more than a certain voltage causes charge to tunnel through the surrounding insulator 9150 and be implanted even into the relatively small particles 9161.

It is considered that once charge has been implanted into these small particles 9161, the charge is retained on the small particles 9161 even with the voltage application to the third electrode 9130 (to between the same and the fourth electrode 9140) because the small particles 9161 are surrounded by the insulator 9150.

In this state, with the voltage applied again to between the first electrode 9110 and the second electrode 9120, since charges have been being retained on the small particles 9161 located near the relatively large particles 9160, through which the current would mostly flow, it is predicted that those charges would exert Coulomb interaction on charges which tend to transfer through the large particles 9160 and move on between the first electrode 9110 and the second electrode 9120, thus inhibiting the move of charges. That is, it is considered that the current flowing through between the first electrode 9110 and the second electrode 9120 is suppressed so as to be reduced as compared with its initial state. In other words, it is considered that the electrical resistance between the first electrode 9110 and the second electrode 9120 would be increased.

Figure 56C:
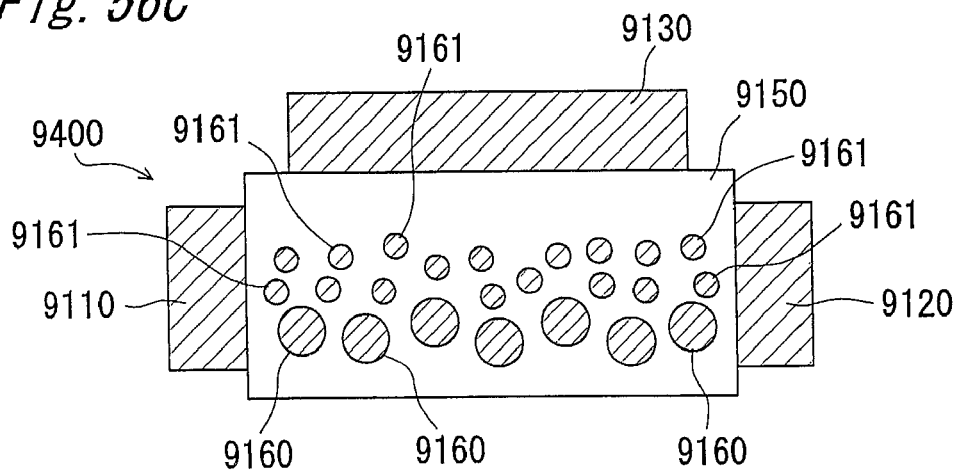
FIG. 56C is a view schematically showing a resistance-changing function body in which pluralities of relatively small particles and relatively large particles are distributed and arranged in an insulator.

Furthermore, this behavior would occur similarly also in a resistance-changing function body 9400, as shown in FIG. 56C, in which relatively small particles 9161 and relatively large particles 9160 are distributed in layer directions, respectively, in the insulator 9150.

In these resistance-changing function bodies 9300 and 9400 are able to discriminate binary data by reading the magnitude of a current by making use of resistance changes and be used as a memory. Moreover, the resistance-changing function body of the present invention can also be referred to as a local charge retaining function body for performing partial capturing of electric charges.

Figure 57A:
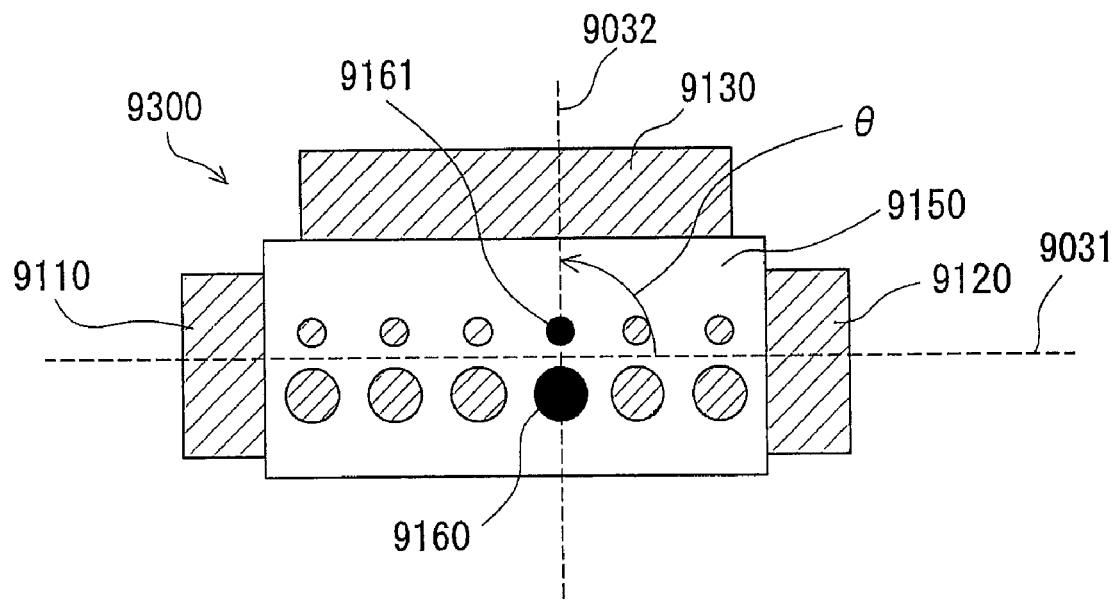
FIGS. 57A and 57B are views for explaining a positional relation between two particles of different sizes in the resistance-changing function bodies shown in FIGS. 56A and 56C, respectively.
Figure 57B:
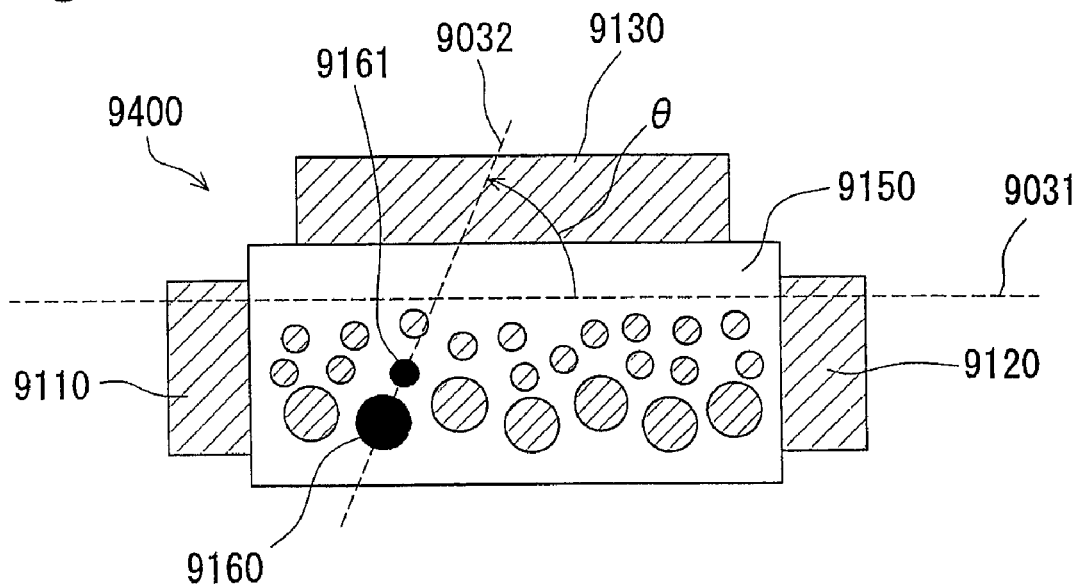

FIGS. 57A and 57B show positional relations between two particles 9160 and 9161 of different sizes in these resistance-changing function bodies 9300 and 9400. As shown in the figures, it is preferable that an angle θ at which a straight line 9032 that interconnects a relatively large particle 9160 and a relatively small particle 9161 intersects with a plane 9031 that extends along the layer direction is not less than 45°. This is because if the angle θ is less than 45°, then there is a possibility that charge may be implanted into the relatively small particle 9161 upon application of a voltage to between the first electrode 9110 and the second electrode 9120, and therefore the operation of the resistance-changing function bodies may become unstable. Accordingly, it is preferable that the relationship between the two particles 9160 and 9161 of different sizes in the resistance-changing function bodies meets the condition that the angle θ at which a straight line 9032 that interconnects a relatively large particle 9160 and a relatively small particle 9161 intersects with a plane roughly parallel to the layer in which the two particles 9160 and 9161 of different sizes are distributed is not less than 45°. It is noted that θ in FIG. 57A is expressed as about 90° and θ in FIG. 57B is expressed as about 65°.

FIGS. 58A to 58F show an example of resistance-changing function body fabrication methods that meet such conditions.

First of all, as shown in FIG. 58A, a surface of a silicon substrate 9000 (which makes a third electrode 9130) is thermally oxidized, by which a silicon oxide film 9151 is formed. On top of this, silicon is grown in a silane atmosphere having a temperature of 610° C. by LPCVD (Low-Pressure Chemical Vapor Deposition) process, where the film deposition is stopped before a film-like polysilicon is formed. As a result, silicon particles 9160 are formed as scattered dots on the silicon oxide film 9151. In this example, silane supply time was about 7 minutes according to the indication of the employed apparatus.

Next, as shown in FIG. 58B, a silicon oxide film 9152 is formed on the surface of the silicon particles 9160 by performing thermal oxidation at a temperature of 850° C. The diameter of remaining silicon particles 9160 in this case was about 4 to 8 nm.

Next, as shown in FIG. 58C, silicon is grown by LPCVD process in a silane atmosphere at a temperature of 610° C., and the film deposition is stopped before a film-like polysilicon is formed. As a result, silicon particles 9161 are formed on the silicon oxide film 9152 in correspondence to the silicon particles 9160, respectively. In this example, silane supply time was about 4 minutes according to the indication of the employed apparatus.

Next, as shown in FIG. 58D, a silicon oxide film 9153 is formed on the surfaces of the silicon particles 9161 by performing thermal oxidation at a temperature of 850° C. as in the foregoing step. The surfaces of the silicon particles were oxidized. The diameter of remaining silicon particles 9161 in this case was not more than about 2 nm.

Next, as shown in FIG. 58E, a silicon oxide film ($SiO_2$) 9154 is deposited as an interlayer insulator so as to bury the silicon particles 9160 and 9161. As a result, as shown in FIG. 58F, the silicon particles 9160, 9161 as conductive particles are disposed in pairs above and below in a silicon oxide film 9150 (including 9151, 9152, 9153 and 9154) as an insulator.

Thereafter, grooves 9158 and 9159 for electrode use are formed on opposite sides by using photolithography and dry etching, and metal interconnections that make a first electrode 9110 and a second electrode 9120 are formed within the grooves 9158 and 9159. Of course, the material of the first electrode and the second electrode has only to be one having electrical conductivity, for example, may be polysilicon other than metals.

FIGS. 59A to 59E show another example of resistance-changing function body manufacturing methods that meet the above-described conditions with respect to the positional relation between the two particles 9160 and 9161 of different sizes.

Figure 59A:
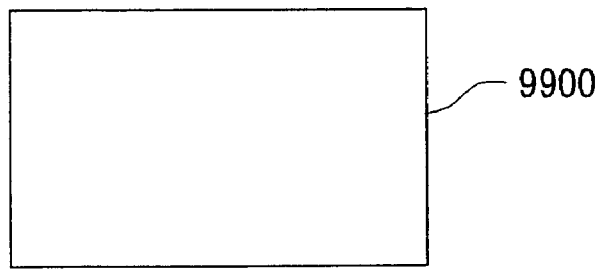
FIGS. 59A to 59E are views for explaining the fabrication processes of a resistance-changing function body of one embodiment of the invention.
Figure 59B:
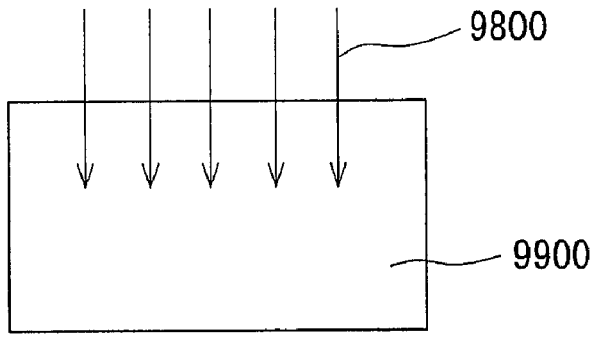
Figure 59C:
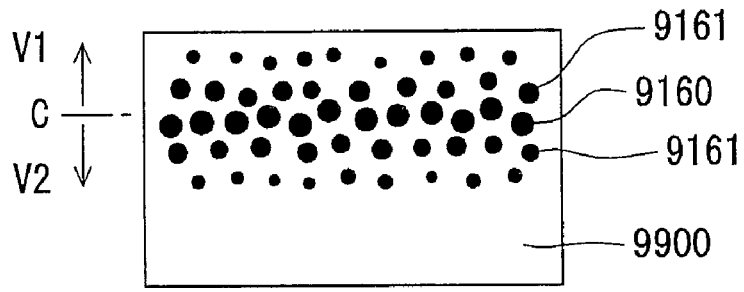

First of all, with a glass substrate 9900 prepared as shown in FIG. 59A, an element 9800 to constitute particles was ion implanted to a surface of the glass substrate 9900 as shown in FIG. 59B. In this example, by negative ion implantation of gold element, gold particle were formed so as to be distributed within a certain range with respect to the thickness directions V1 and V2 about a center which is one depth position C from the substrate surface as shown in FIG. 59C. The size, concentration and density of the gold particles are maximized in the position C and reduced away from the position C in the thickness directions. Reference numerals 9160 denotes relatively large particles and 9161 denotes relatively small particles.

Figure 59D:
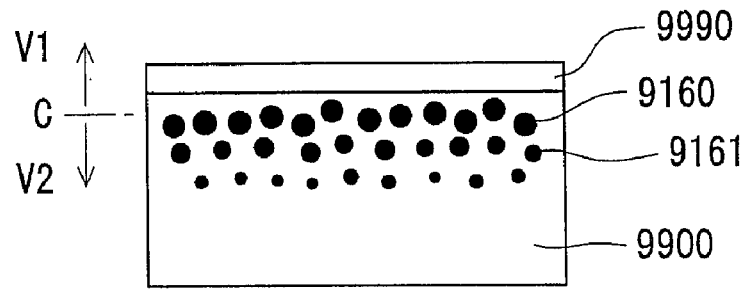

Next, as shown in FIG. 59D, the surface side of the glass substrate 9900 is etched and removed to the center of the implantation distribution, more precisely, to near the position C where the size of the particle is large. Then, on the etched surface, a silicon oxide film ($SiO_2$) is deposited for insulation.

Figure 59E:
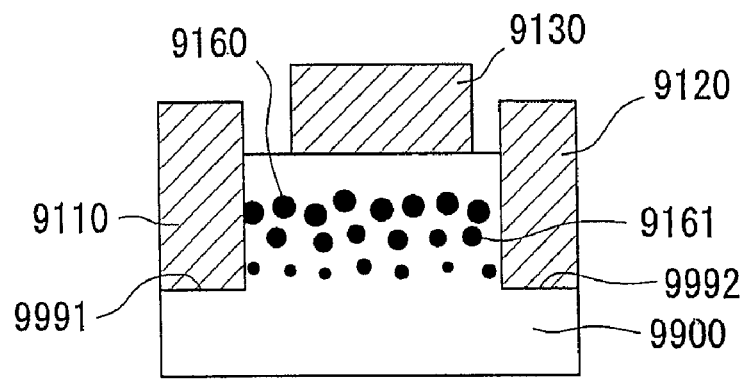

Thereafter, as shown in FIG. 59E, grooves 9991 and 9992 for electrode use are formed on opposite sides by using photolithography and dry etching, and metal interconnections that make a first electrode 9110 and a second electrode 9120 are formed within the grooves 9991 and 9992. Further, a third electrode 9130 is formed on a portion of the substrate surface between the first electrode 9110 and the second electrode 9120.

In the resistance-changing function body fabricated in this way, the size of particle gradually decreases as the depth from the certain depth position C (see FIG. 59D) increases. In this example, in regions where the relatively large particles 9160 were present in major part, a majority of the particles had diameters of about 3 to 4 nm and the density was higher. In regions where the relatively small particles 9161 were present in major part, a majority of the particle had diameters of about less than 2 nm. Interparticle distance in the regions where the relatively small particles 9161 were present in major part was larger than that in the regions where the relatively large particles 9160 were present in major part.

The resistance-changing function bodies fabricated by these manufacturing methods showed occurrence of a phenomenon that although differ in absolute value therebetween, the amount of the current flowing through between the first electrode 9110 and the second electrode 9120 decreased after the voltage application to the third electrode 9130.

Figure 60A:
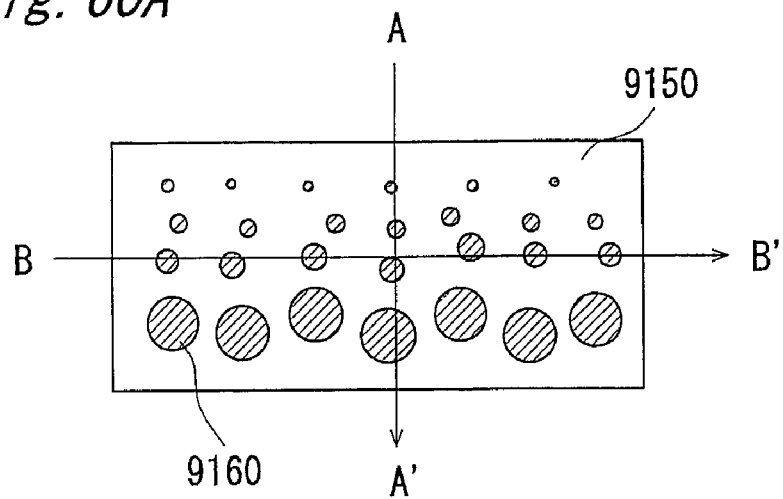
FIG. 60A is a view for explaining the structure of a resistance-changing function body of one embodiment of the invention.
Figure 60B:
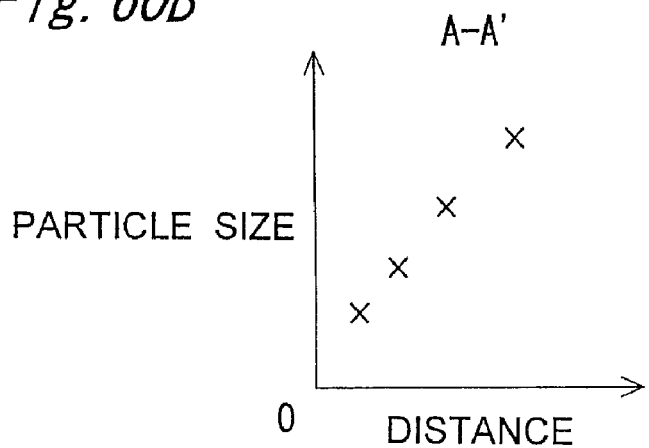
FIGS. 60B and 60C are views showing distributions of particle size taken along the lines A-A' and B-B', respectively, in FIG. 60A.
Figure 60C:
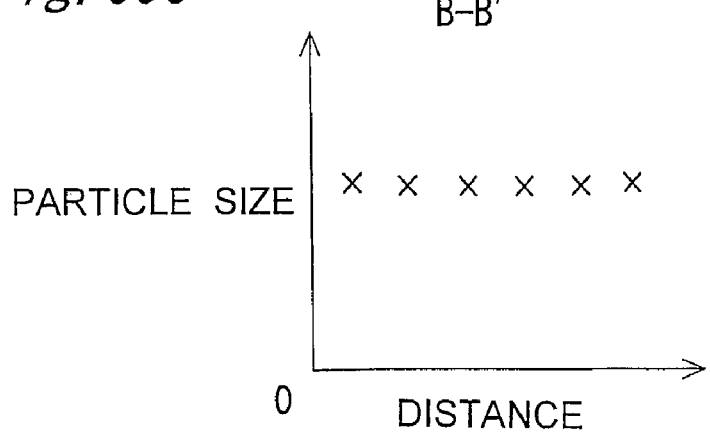
Figure 61A:
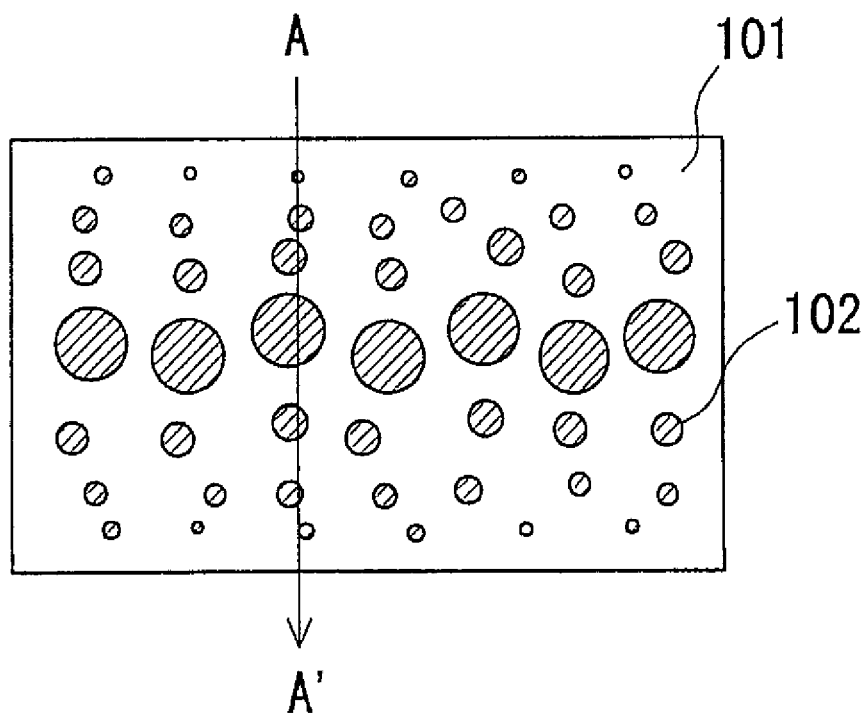
FIG. 61A is a view for explaining the structure of a resistance-changing function body of one embodiment of the invention.
Figure 61B:
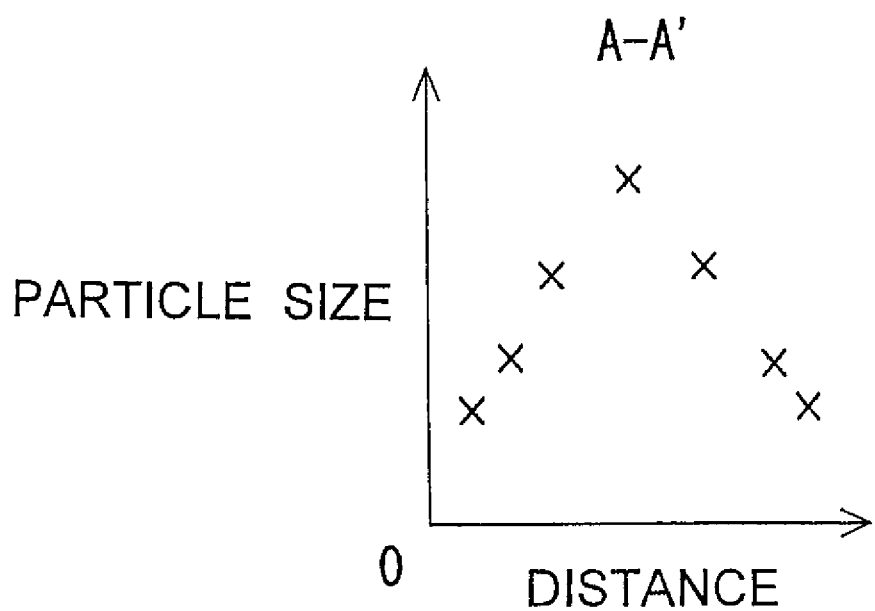
FIG. 61B is a view showing a distribution of particle size taken along the line A-A' in FIG. 61A.
Figure 62:
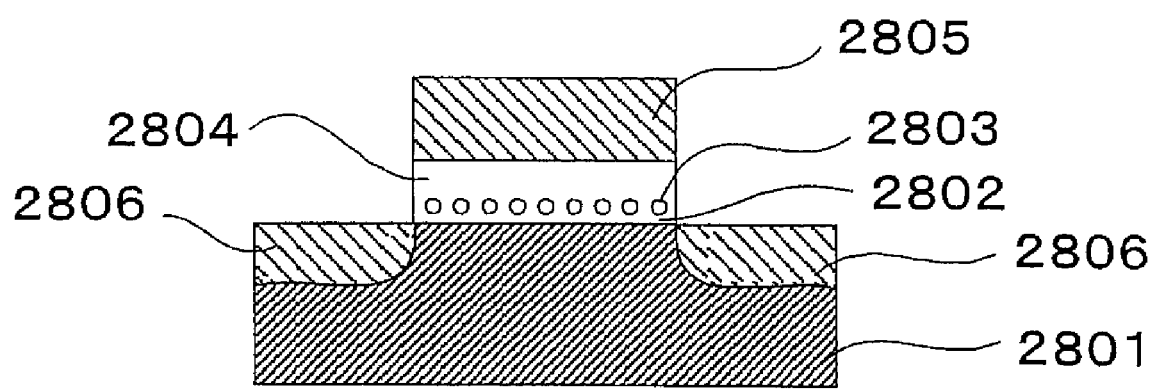
FIG. 62 is a view showing a conventional memory.

FIG. 60A shows, under magnification, an insulator (indicated by numeral 9150) of the resistance-changing function body fabricated by the manufacturing method of FIG. 59. FIGS. 60B and 60C are views showing distributions of particle size of particles (representatively indicated by numeral 9160) taken along the line A-A' extending in the thickness direction and the line B-B' extending in the layer direction, respectively, in FIG. 60A. It is noted that the thickness direction A-A' corresponds to a direction perpendicular to the substrate surface (or to a direction in which the third electrode 9130 faces), and the layer direction B-B' corresponds to a direction in which the first electrode 9110 and the second electrode 9120 are interconnected. As can be understood from these figures, there is a characteristic that the distribution of present of the particles 9160 is uniform in the layer direction B-B' but more asymmetrical in the thickness direction A-A'. That is, there is a characteristic that one particle is nearly equal in size to another particle adjacent thereto in the layer direction B-B' but unequal in size to another particle adjacent thereto in the thickness direction A-A'.

Furthermore, generally, particles of different sizes are also different in electric capacity from each other. Therefore, it can be said that the resistance-changing function body has asymmetrical electrical characteristics in the thickness direction A-A', i.e., in the direction in which the third electrode 9130 faces.

The asymmetry of electrical characteristics can be confirmed because the chart of current-voltage (I-V) characteristic or capacity-voltage (C-V) characteristic appear as a different curve when at least the voltage to be applied to the third electrode 9130 is reversed in positive and negative signs with the absolute value of the voltage unchanged and with the other conditions kept unchanged.

Also, as already described, one of the operating principles of this resistance-changing function body lies in that electric charge is less easily injected into the relatively small particles 9161 because of their small electric capacity. Accordingly, use of particles of smaller electric capacity and particles of larger electric capacity depending on their material, even if they are of nearly equal size, makes it possible to obtain the asymmetry of electrical characteristics. However, since the difficulty or easiness of injection of electric charge differs also depending on the interparticle distance as described above, it is advantageous that the magnitude correlation of spatial size and the magnitude correlation of electric capacity between two different particles should be coincident with each other.

In addition, in efficiently retaining electric charge on small particles by making use of a kind of Coulomb blockade effect of the size effect, the energy necessary for the charge to be separated away has to be sufficiently large, compared with thermal energy due to the ambient temperature, in consideration of the capacity of the particles in order that the Coulomb blockade effect becomes noticeable. For this purpose, on condition that a particle is a perfect conductor sphere, the radius of the particle is presumed to be about 0.5 nm to 1 nm. In addition, although the Coulomb blockade effect itself becomes increasingly noticeable with decreasing particle size of the particle, yet too small particle sizes of the particle would make it hard to attain the injection of charge, causing elevated voltage or deterioration of operating speed. Accordingly, preferably, smaller than necessary particles should not be used in terms of device application.

When the particle container described above, or the resistance-changing function body or memory function body using the particle container, is fabricated on a substrate, its occupation area (which refers to the projected area in three-dimensional fabrication) should be approximately 1 square millimeter or less, desirably 1 square micrometer or less, on the single unit base in terms of suitableness for integration.

The invention claimed is:

1. A memory comprising at least five memory cells including a resistance-changing function body, a select transistor for selecting the resistance-changing function body and a rectifying function body for determining a direction of a current that flows through the resistance-changing function body, the resistance-changing function body comprising:
an object made of a first substance and interposed between a first electrode and a second electrode; and
a plurality of particles made of a second substance and arranged within the object so that an electrical resistance between the first electrode and the second electrode is changed before and after application of a specified voltage to between the first electrode and the second electrode, wherein
the first substance makes an electrical barrier against the second substance,
each of the memory cells is connected between a bit line and a source line extended in a direction of column, and the select transistor of each of the memory cells is controlled by a word line extended in a direction of row, second and fourth cells are arranged mutually adjacently in the direction of row, and third and fifth cells are arranged mutually adjacently in the direction of column, with respect to a first cell of the five memory cells, the first cell and the second cell have a shared bit line, a shared word line and unshared source lines, the first cell and the third cell have a shared bit line, a shared source line and unshared word lines, the first cell and the fourth cell have a shared source line, a shared word line and unshared bit lines, and the first cell and the fifth cell have a shared word line, a source line of the first cell and a bit line of the fifth cell are shared, and a bit line of the first cell and a source line of the fifth cell are shared.

2. The memory as claimed in claim 1, wherein

In the resistance-changing function body, a third electrode which allows a voltage to be applied to the object made of the first substance in a direction substantially perpendicular to a direction in which the first electrode and the second electrode are opposed to each other is adjacent to the object made of the first substance.

3. The memory as claimed in claim 2, wherein electrical characteristics of the resistance-changing function body vary depending on whether the voltage applied to the third electrode is positive or negative.

4. The memory as claimed in claim 1, wherein

In the resistance-changing function body, the plurality of particles include at least two kinds of particles, which are a relatively small particle and a relatively large particle.

5. The memory as claimed in claim 2, wherein

In the resistance-changing function body, the particles are distributed uniformly with respect to a layer direction substantially parallel to the direction in which the first electrode and the second electrode are interconnected, and moreover the particles are distributed within a certain range with respect to a thickness direction perpendicular to the layer direction.

6. The memory as claimed in claim 5, wherein in the resistance-changing function body, concentration of an element constituting the particles is maximized in one position within the distribution and reduced away from the position in the thickness directions.

7. The memory as claimed in claim 5, wherein in the resistance-changing function body, density of the particles is maximized in one position within the distribution and reduced away from the position in the thickness directions.

8. A resistance-changing function body comprising:

an object made of a first substance and interposed between a first electrode and a second electrode; and a plurality of particles made of a second substance and arranged within the object so that an electrical resistance between the first electrode and the second electrode is changed before and after application of a specified voltage to between the first electrode and the second electrode, wherein the first substance makes an electrical barrier against the second substance, particle size of the particles is maximized in one position within a range where the particles are distributed, and is reduced away from the position in the thickness directions perpendicular to a direction in which the first electrode and the second electrode are interconnected.

9. The resistance-changing function body as claimed in claim 8, wherein the plurality of particles include at least two kinds of particles, which are a relatively small particle and a relatively large particle, and an angle at which a straight line interconnecting the two particles intersects with a plane extending along the layer direction is not less than 45 degrees.

10. The resistance-changing function body as claimed in claim 8, wherein distribution of particle sizes of the particles is asymmetrical between both sides of the position at which the particle size is maximized with respect to the thickness direction.

11. The resistance-changing function body as claimed in claim 8, wherein the object made of the first substance is an insulator, and film thickness of the insulator in the thickness direction is not less than 2 nm and less than 50 nm.

12. A memory having the resistance-changing function body as defined in claim 8, wherein the first electrode and the second electrode are diffusion regions, respectively, Banned on a surface of a semiconductor substrate, the object made of the first substance is formed in a region located between the diffusion regions within the surface of the semiconductor substrate, and a third electrode which allows a voltage to be applied to the object made of the first substance in a direction substantially perpendicular to a direction in which the first electrode and the second electrode are opposed to each other is provided on the object made of the first substance.

13. A memory having the resistance-changing function body as defined in claim 8, wherein the first electrode and the second electrode are conductors, respectively, formed on a substrate, the object made of the first substance is formed in a region interposed between the conductors, and a third electrode which allows a voltage to be applied to the object made of the first substance in a direction substantially perpendicular to a direction in which the first electrode and the second electrode are opposed to each other is provided on the insulator.

14. A resistance-changing function body comprising:

an object made of a first substance and interposed between a first electrode and a second electrode; and a plurality of particles made of a second substance and arranged within the object so that an electrical resistance between the first electrode and the second electrode is changed before and after application of a specified voltage to between the first electrode and the second electrode, wherein the first substance makes an electrical barrier against the second substance, a third electrode which allows a voltage to be applied to the object made of the first substance in a direction substantially perpendicular to a direction in which the first electrode and the second electrode are opposed to each other is adjacent to the object made of the first substance, a fourth electrode is provided at a position confronting the third electrode with the object made of the first substance interposed therebetween, the plurality of particles are so arranged that an electrical resistance between the first electrode and the second electrode is changed before and after application of a specified voltage to between the third electrode and the fourth electrode.

15. A memory in which at least two resistance-changing function bodies as defined in claim 14 are stacked in a direction perpendicular to the substrate.

16. A method for manufacturing the resistance-changing function body as defined in claim 1, comprising a step of implanting the second substance for forming the particles into the object made of the first substance by a negative ion implantation method.

17. The method for manufacturing the resistance-changing function body as claimed in claim 16, comprising a step of carrying out hydrogen sintering after the negative ion implantation ends.

18. The method for manufacturing the resistance-changing function body claimed in claim 16, comprising a step of carrying out heat treatment at a temperature of not lower than 500° C. after the negative ion implantation ends.

19. A memory having the resistance-changing function body as defined in claim 8.

20. A circuit having the memory as defined in claim 19.

21. Electronic equipment having the circuit as defined in claim 20.

22. A resistance-changing function body comprising:
 a medium made of a first material and formed between a first conductor and a second conductor; and
 at least one conductive particle which is made of a third material which is covered with a second material formed within the medium, wherein
 the second material is a material serving as a barrier against passage of electric charges therethrough, and
 the third material is a material having a function of retaining electric charges.

23. The resistance-changing function body as claimed in claim 22, wherein
 the second material is a material obtained by compositionally changing or chemically modifying the third material.

24. The resistance-changing function body as claimed in claim 22, wherein
 the second material is a material obtained by oxidizing or nitriding the third material.

25. The memory as claimed in claim 1, wherein
 a third electrode which allows a voltage to be applied to the object made of the first substance in a direction substantially perpendicular to a direction in which the first electrode and the second electrode are opposed to each other is adjacent to the object made of the first substance,
 a fourth electrode is provided at a position confronting the third electrode with the object made of the first substance interposed therebetween,
 the plurality of particles are so arranged that an electrical resistance between the first electrode and the second electrode is changed before and after application of a specified voltage to between the third electrode and the fourth electrode.

26. The memory as claimed in claim 1, wherein
 in the resistance-changing function body, particle size of the particles is maximized in one position within a range where the particles are distributed, and is reduced away from the position in the thickness directions perpendicular to a direction in which the first electrode and the second electrode are interconnected.

27. The resistance-changing function body as claimed in claim 8, wherein
 the particles are distributed uniformly with respect to a layer direction substantially parallel to the direction in which the first electrode and the second electrode are interconnected, and moreover the particles are distributed within a certain range with respect to the thickness direction perpendicular to the layer direction.

28. The resistance-changing function body as claimed in claim 8, wherein
 a third electrode which allows a voltage to be applied to the object made of the first substance in the thickness direction is adjacent to the object made of the first substance.

29. The resistance-changing function body as claimed in claim 28, wherein
 a fourth electrode is provided at a position confronting the third electrode with the object made of the first substance interposed therebetween,
 the plurality of particles are so arranged that an electrical resistance between the first electrode and the second electrode is changed before and after application of a specified voltage to between the third electrode and the fourth electrode.

30. A memory comprising at least five memory cells including the resistance-changing function body as defined in claim 8, a select transistor for selecting the resistance-changing function body and a rectifying function body for determining a direction of a current that flows through the resistance-changing function body, wherein
 each of the memory cells is connected between a bit line and a source line extended in a direction of column, and the select transistor of each of the memory cells is controlled by a word line extended in a direction of row,
 second and fourth cells are arranged mutually adjacently in the direction of row, and third and fifth cells are arranged mutually adjacently in the direction of column, with respect to a first cell of the five memory cells,
 the first cell and the second cell have a shared bit line, a shared word line and unshared source lines,
 the first cell and the third cell have a shared bit line, a shared source line and unshared word lines,
 the first cell and the fourth cell have a shared source line, a shared word line and unshared bit lines, and
 the first cell and the fifth cell have a shared word line, a source line of the first cell and a bit line of the fifth cell are shared, and a bit line of the first cell and a source line of the fifth cell are shared.

31. A memory comprising at least five memory cells including the resistance-changing function body as defined in claim 14, a select transistor for selecting the resistance-changing function body and a rectifying function body for determining a direction of a current that flows through the resistance-changing function body, wherein
 each of the memory cells is connected between a bit line and a source line extended in a direction of column, and the select transistor of each of the memory cells is controlled by a word line extended in a direction of row,
 second and fourth cells are arranged mutually adjacently in the direction of row, and third and fifth cells are arranged mutually adjacently in the direction of column, with respect to a first cell of the five memory cells,
 the first cell and the second cell have a shared bit line, a shared word line and unshared source lines,
 the first cell and the third cell have a shared bit line, a shared source line and unshared word lines,
 the first cell and the fourth cell have a shared source line, a shared word line and unshared bit lines, and the first cell and the fifth cell have a shared word line, a source line of the first cell and a bit line of the fifth cell are shared, and a bit line of the first cell and a source line of the fifth cell are shared.

32. The resistance-changing function body as claimed in claim 14, wherein particle size of the particles is maximized in one position within a range where the particles are distributed, and is reduced away from the position in the thickness directions perpendicular to a direction in which the first electrode and the second electrode are interconnected.

* * * * *

UNITED STATES PATENT AND TRADEMARK OFFICE
CERTIFICATE OF CORRECTION

PATENT NO. : 7,851,777 B2
APPLICATION NO. : 12/271837
DATED : December 14, 2010
INVENTOR(S) : Nobutoshi Arai et al.

It is certified that error appears in the above-identified patent and that said Letters Patent is hereby corrected as shown below:

ON THE TITLE PAGE:

Correct item (62), Related U.S. Application Data, to read as follows:

-- Division of application No. 10/528,052, filed as application No. PCT/JP2003/011877 on Sep. 18, 2003, now Pat. No. 7,462,857. --.

On the Title Page:

Insert the following information:

-- (30)    Foreign Application Priority Data

Sep. 19, 2002   (JP)   ............... 2002-273370
    Sep. 19, 2002   (JP)   ............... 2002-273384 --.

Signed and Sealed this
Fifteenth Day of March, 2011

David J. Kappos
*Director of the United States Patent and Trademark Office*